US012176278B2

(12) United States Patent
Yang et al.

(10) Patent No.: US 12,176,278 B2
(45) Date of Patent: Dec. 24, 2024

(54) 3D CHIP PACKAGE BASED ON VERTICAL-THROUGH-VIA CONNECTOR

(71) Applicant: iCometrue Company Ltd., Zhubei (TW)

(72) Inventors: Ping-Jung Yang, HsinChu (TW); Mou-Shiung Lin, Hsinchu (TW); Jin-Yuan Lee, HsinChu (TW); Hsin-Jung Lo, New Taipei (TW); Chiu-Ming Chou, Taoyuan City (TW)

(73) Assignee: iCometrue Company Ltd., Hsinchu County (TW)

( * ) Notice: Subject to any disclaimer, the term of this patent is extended or adjusted under 35 U.S.C. 154(b) by 215 days.

(21) Appl. No.: 17/827,358

(22) Filed: May 27, 2022

(65) Prior Publication Data

US 2022/0384326 A1 Dec. 1, 2022

Related U.S. Application Data

(60) Provisional application No. 63/195,033, filed on May 30, 2021.

(51) Int. Cl.
*H05K 1/14* (2006.01)
*H01L 21/48* (2006.01)
(Continued)

(52) U.S. Cl.
CPC .... *H01L 23/49822* (2013.01); *H01L 21/4857* (2013.01); *H01L 23/49833* (2013.01);
(Continued)

(58) Field of Classification Search
CPC .................................................... H05K 1/142
See application file for complete search history.

(56) References Cited

U.S. PATENT DOCUMENTS 4,870,302 A 9/1989 Freeman
5,272,368 A 12/1993 Turner et al.
(Continued)

FOREIGN PATENT DOCUMENTS

CN 103681367 3/2014
CN 104078453 10/2014
(Continued)

*Primary Examiner* — Jeremy C Norris

(57) ABSTRACT

A connector may include: a first substrate having a top surface, a bottom surface opposite to the top surface of the top substrate and a side surface joining an edge of the top surface of the first substrate and joining an edge of the bottom surface of the first substrate; a second substrate having a top surface, a bottom surface opposite to the top surface of the second substrate and a side surface joining an edge of the top surface of the second substrate and joining an edge of the bottom surface of the second substrate, wherein the side surface of the second substrate faces the side surface of the first substrate, wherein the top surfaces of the first and second substrates are coplanar with each other at a top of the connector and the bottom surfaces of the first and second substrates are coplanar with each other at a bottom of the connector; and a plurality of metal traces between, in a first horizontal direction, the side surfaces of the first and second substrates, wherein each of the plurality of metal traces has a top end at the top of the connector and a bottom end at the bottom of the connector.

27 Claims, 67 Drawing Sheets

(51) Int. Cl.

| | |
|---|---|
| ***H01L 23/00*** | (2006.01) |
| ***H01L 23/498*** | (2006.01) |
| ***H01L 23/538*** | (2006.01) |
| ***H01L 25/00*** | (2006.01) |
| *H01L 23/15* | (2006.01) |
| *H01L 25/065* | (2023.01) |
| *H01L 25/18* | (2023.01) |

(52) U.S. Cl.

CPC .... *H01L 23/49838* (2013.01); *H01L 23/5385* (2013.01); *H01L 24/20* (2013.01); *H01L 25/50* (2013.01); *H05K 1/142* (2013.01); *H01L 21/4853* (2013.01); *H01L 23/15* (2013.01); *H01L 23/49811* (2013.01); *H01L 24/05* (2013.01); *H01L 24/06* (2013.01); *H01L 24/08* (2013.01); *H01L 24/16* (2013.01); *H01L 24/32* (2013.01); *H01L 24/33* (2013.01); *H01L 24/48* (2013.01); *H01L 24/73* (2013.01); *H01L 25/0657* (2013.01); *H01L 25/18* (2013.01); *H01L 2224/0557* (2013.01); *H01L 2224/06181* (2013.01); *H01L 2224/08145* (2013.01); *H01L 2224/16227* (2013.01); *H01L 2224/2101* (2013.01); *H01L 2224/214* (2013.01); *H01L 2224/32145* (2013.01); *H01L 2224/32225* (2013.01); *H01L 2224/33181* (2013.01); *H01L 2224/48227* (2013.01); *H01L 2224/73204* (2013.01); *H01L 2224/73215* (2013.01); *H01L 2224/73265* (2013.01); *H01L 2225/0651* (2013.01); *H01L 2225/06513* (2013.01); *H01L 2225/06517* (2013.01); *H01L 2225/06541* (2013.01); *H01L 2225/06548* (2013.01); *H01L 2225/06562* (2013.01); *H01L 2225/06565* (2013.01); *H01L 2924/1433* (2013.01); *H01L 2924/1436* (2013.01); *H01L 2924/1437* (2013.01); *H01L 2924/1438* (2013.01); *H01L 2924/1441* (2013.01); *H01L 2924/1443* (2013.01); *H01L 2924/14511* (2013.01)

(56) References Cited

U.S. PATENT DOCUMENTS 5,587,603 A 12/1996 Kowshik
5,592,102 A 1/1997 Lane et al.
5,689,195 A 11/1997 Cliff et al.
5,796,662 A 8/1998 Kalter et al.
6,020,633 A 2/2000 Erikson
6,034,542 A 3/2000 Ridgeway
6,167,558 A 12/2000 Trimberger
6,356,478 B1 3/2002 McCollum
6,388,466 B1 5/2002 Wittig et al.
6,404,226 B1 6/2002 Schadt
6,687,167 B2 2/2004 Guaitini et al.
6,798,240 B1 9/2004 Pedersen
6,812,086 B2 11/2004 Murthy et al.
6,828,823 B1 12/2004 Tsui
6,943,580 B2 9/2005 Lewis et al.
6,998,872 B1 2/2006 Chirania et al.
7,030,652 B1 4/2006 Lewis et al.
7,061,271 B1 6/2006 Young et al.
7,126,214 B2 10/2006 Huppenthal et al.
7,190,190 B1 3/2007 Camarota et al.
7,193,433 B1 3/2007 Young
7,219,237 B1 5/2007 Trimberger
7,366,306 B1 4/2008 Trimberger
7,385,417 B1 6/2008 Agrawal et al.
7,420,390 B1 9/2008 Hutton et al.
7,550,994 B1 6/2009 Camarota
7,579,681 B2 8/2009 Chia et al.
7,598,555 B1 10/2009 Papworth Parkin
7,653,891 B1 1/2010 Anderson et al.
7,747,025 B1 6/2010 Trimberger
7,853,799 B1 12/2010 Trimberger
7,933,140 B2 4/2011 Wang et al.
7,944,231 B2 5/2011 Javerliac
7,948,266 B2 5/2011 Schmit et al.
7,973,556 B1 7/2011 Noguera Serra et al.
7,977,783 B1 7/2011 Park et al.
8,064,224 B2 11/2011 Mahajan et al.
8,081,079 B1 12/2011 Camarota
8,159,268 B1 4/2012 Madurawe
8,243,527 B2 8/2012 Hung et al.
8,354,297 B2 1/2013 Pagaila et al.
8,378,407 B2 2/2013 Audzeyeu et al.
8,531,032 B2 9/2013 Yu et al.
8,546,955 B1 10/2013 Wu
8,592,886 B2 11/2013 Hsu et al.
8,709,865 B2 4/2014 Hu et al.
8,742,579 B2 6/2014 Pagaila et al.
8,786,060 B2 7/2014 Yen et al.
8,796,137 B2 8/2014 Pagaila et al.
8,866,292 B2 10/2014 Beer et al.
8,872,349 B2 10/2014 Chiu et al.
8,878,360 B2 11/2014 Meyer et al.
8,883,561 B2 11/2014 Park et al.
8,885,334 B1 11/2014 Baxter
8,895,440 B2 11/2014 Choi et al.
8,912,822 B2 12/2014 Yasuda
8,916,421 B2 12/2014 Gong et al.
8,941,230 B2 1/2015 Kyozuka et al.
8,952,489 B2 2/2015 Elian et al.
8,952,521 B2 2/2015 Wojnowski et al.
8,987,918 B2 3/2015 Razdan et al.
8,993,377 B2 3/2015 Koo et al.
9,003,221 B1 4/2015 Abugharbieh et al.
9,082,806 B2 7/2015 Lin et al.
9,106,229 B1 8/2015 Hutton
9,135,185 B2 9/2015 Loh et al.
9,147,638 B2 9/2015 Liu et al.
9,224,647 B2 12/2015 Koo et al.
9,225,512 B1 12/2015 Trimberger
9,252,127 B1 2/2016 Shen et al.
9,263,370 B2 2/2016 Shenoy et al.
9,281,292 B2 3/2016 Hu et al.
9,324,672 B2 4/2016 Pagaila et al.
9,331,060 B2 5/2016 Otremba et al.
9,343,442 B2 5/2016 Chen et al.
9,349,703 B2 5/2016 Chiu et al.
9,349,713 B2 5/2016 Kim et al.
9,362,187 B2 6/2016 Ossimitz
9,368,458 B2 6/2016 Wu et al.
9,385,006 B2 7/2016 Lin
9,385,009 B2 7/2016 Lin et al.
9,385,105 B2 7/2016 Meyer et al.
9,396,998 B2 7/2016 Kurita et al.
9,397,050 B2 7/2016 Shin et al.
9,406,619 B2 8/2016 Pagaila et al.
9,406,658 B2 8/2016 Lee et al.
9,437,260 B2 9/2016 Prenat et al.
9,449,930 B2 9/2016 Kim et al.
9,455,218 B2 9/2016 Ooi et al.
9,508,626 B2 11/2016 Pagaila et al.
9,524,955 B2 12/2016 Huang et al.
9,543,276 B2 1/2017 Jee et al.
9,583,431 B1 2/2017 Rahman
9,593,009 B2 3/2017 Fuergut et al.
9,601,471 B2 3/2017 Zhai et al.
9,607,967 B1 3/2017 Shih
9,627,365 B1 4/2017 Yu et al.
9,640,259 B2 5/2017 Li et al.
9,679,863 B2 6/2017 Lin et al.
9,704,843 B2 7/2017 Kilger et al.
9,722,584 B1 8/2017 Chang et al.
9,735,113 B2 8/2017 Chi et al.
9,763,329 B1 9/2017 Mason
9,773,757 B2 9/2017 Yu et al.
9,806,058 B2 10/2017 Wei et al.
9,812,337 B2 11/2017 Chen et al.
9,818,720 B2 11/2017 Wei et al.
9,831,148 B2 11/2017 Yu et al.

(56) References Cited

U.S. PATENT DOCUMENTS 9,859,896 B1 1/2018 Gaide et al.
9,881,850 B2 1/2018 Yu et al.
9,887,206 B2 2/2018 Su et al.
9,893,732 B1 2/2018 Lewis
9,899,248 B2 2/2018 Yu et al.
9,899,355 B2 2/2018 Yuan et al.
9,935,113 B2 4/2018 Wu et al.
9,966,325 B2 5/2018 Beyne
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,559 B2 10/2018 Lin et al.
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,276,382 B2 4/2019 Hunt et al.
10,290,611 B2 5/2019 Yu et al.
10,325,882 B2 6/2019 Kang et al.
10,333,623 B1 6/2019 Liao et al.
10,340,249 B1 7/2019 Yu et al.
10,347,606 B2 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,476,505 B2 11/2019 Ngai
10,490,521 B2 11/2019 Hu et al.
10,490,540 B2 11/2019 Yu et al.
10,504,835 B1 12/2019 Wang et al.
10,510,634 B2 12/2019 Lin et al.
10,510,650 B2 12/2019 Yu et al.
10,522,449 B2 12/2019 Chen et al.
10,541,227 B2 1/2020 Yeh et al.
10,541,228 B2 1/2020 Chen et al.
10,622,321 B2 4/2020 Yu et al.
10,741,537 B2 8/2020 Lu et al.
10,784,248 B2 9/2020 Yu et al.
10,797,031 B2 10/2020 Liao et al.
10,867,965 B2 12/2020 Shih et al.
10,892,011 B2 1/2021 Lin et al.
10,892,291 B2 1/2021 Chhun et al.
10,943,869 B2 3/2021 Zhai et al.
11,056,463 B2 7/2021 Takahashi et al.
11,114,408 B2 9/2021 Shen et al.
11,211,334 B2 12/2021 Lin et al.
11,217,368 B2 1/2022 Choa et al.
11,276,661 B2 3/2022 Fang
2001/0045844 A1 11/2001 New et al.
2001/0051426 A1 12/2001 Pozder et al.
2002/0092307 A1 7/2002 Ghoshal
2003/0122578 A1 7/2003 Masui et al.
2004/0041584 A1 3/2004 Sunaga et al.
2004/0145850 A1 7/2004 Fukumoto et al.
2004/0222817 A1 11/2004 Madurawe
2005/0046002 A1 3/2005 Lee et al.
2005/0185457 A1 8/2005 Kim et al.
2005/0218929 A1 10/2005 Wang et al.
2006/0138509 A1 6/2006 Lee et al.
2007/0037379 A1 2/2007 Enquist et al.
2007/0164279 A1 7/2007 Lin et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0133704 A1 6/2010 Marimuthu et al.
2010/0157669 A1 6/2010 Audzeyeu
2010/0283085 A1 11/2010 Bemanian
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2013/0082399 A1 4/2013 Kim et al.
2013/0257477 A1 10/2013 Yasuda et al.
2013/0285253 A1 10/2013 Aoki et al.
2014/0017882 A1 1/2014 Lei
2014/0070380 A1 3/2014 Chiu et al.
2014/0070403 A1 3/2014 Pan et al.
2014/0131858 A1 5/2014 Pan et al.
2014/0183731 A1 7/2014 Lin et al.
2014/0185264 A1 7/2014 Chen et al.
2014/0203412 A1 7/2014 Wang et al.
2014/0210097 A1 7/2014 Chen
2014/0254232 A1 9/2014 Wu
2014/0302659 A1 10/2014 Phatak
2014/0339692 A1 11/2014 Kim et al.
2015/0008957 A1 1/2015 Olgiati et al.
2015/0014844 A1 1/2015 Wu et al.
2015/0085560 A1 3/2015 Candelier et al.
2015/0116965 A1 4/2015 Kim et al.
2015/0227662 A1 8/2015 Lepercq
2015/0287672 A1 10/2015 Yazdani
2015/0327367 A1 11/2015 Shen
2016/0079205 A1 3/2016 Lin et al.
2016/0118390 A1 4/2016 Liaw
2016/0133571 A1 5/2016 Lee et al.
2016/0141228 A1 5/2016 Leobandung
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0071552 A1 3/2017 Harpe et al.
2017/0117263 A1 4/2017 Yeh et al.
2017/0301650 A1 10/2017 Yu
2017/0358557 A1 12/2017 Chen et al.
2018/0053730 A1 2/2018 Shao
2018/0061742 A1 3/2018 Ananiev
2018/0068937 A1 3/2018 Marimuthu et al.
2018/0076179 A1 3/2018 Hsu et al.
2018/0102776 A1 4/2018 Chandrasekar et al.
2018/0150667 A1 5/2018 Yu et al.
2018/0151477 A1 5/2018 Yu et al.
2018/0151501 A1 5/2018 Yu et al.
2018/0158746 A1 6/2018 Lin
2018/0165396 A1 6/2018 Lin et al.
2018/0174865 A1 6/2018 Yu et al.
2018/0204810 A1 7/2018 Yu et al.
2018/0204828 A1 7/2018 Yu et al.
2018/0210799 A1 7/2018 Gao
2018/0226349 A1 8/2018 Yu et al.
2018/0226371 A1 8/2018 Enquist
2018/0247905 A1 8/2018 Yu et al.
2018/0269188 A1 9/2018 Yu et al.
2018/0275193 A1 9/2018 Rouge et al.
2018/0284186 A1 10/2018 Chadha
2018/0286776 A1 10/2018 Yu et al.
2018/0301351 A1 10/2018 Yu et al.
2018/0301376 A1 10/2018 Shih et al.
2018/0350629 A1 12/2018 Liu et al.
2018/0350763 A1 12/2018 Yu et al.
2018/0358312 A1 12/2018 Yu et al.

(56) References Cited

U.S. PATENT DOCUMENTS

| | | | |
|---|---|---|---|
| 2018/0374824 | A1 | 12/2018 | Yu et al. |
| 2019/0013276 | A1 | 1/2019 | Lee et al. |
| 2019/0019756 | A1 | 1/2019 | Yu et al. |
| 2019/0020343 | A1 | 1/2019 | Lin et al. |
| 2019/0051641 | A1 | 2/2019 | Lin et al. |
| 2019/0057931 | A1 | 2/2019 | Hsu et al. |
| 2019/0057932 | A1 | 2/2019 | Wu et al. |
| 2019/0067152 | A1 | 2/2019 | Wuu et al. |
| 2019/0097304 | A1 | 3/2019 | Hsiao et al. |
| 2019/0129817 | A1 | 5/2019 | Zhuo |
| 2019/0164834 | A1 | 5/2019 | Or-Bach et al. |
| 2019/0221547 | A1 | 7/2019 | Drab et al. |
| 2019/0238134 | A1 | 8/2019 | Lin et al. |
| 2019/0238135 | A1 | 8/2019 | Lin et al. |
| 2019/0245543 | A1 | 8/2019 | Lin et al. |
| 2019/0253056 | A1 | 8/2019 | Lin et al. |
| 2019/0304803 | A1 | 10/2019 | Hu et al. |
| 2019/0333871 | A1 | 10/2019 | Chen et al. |
| 2019/0347790 | A1 | 11/2019 | Lin et al. |
| 2019/0363715 | A1 | 11/2019 | Lin et al. |
| 2019/0371763 | A1 | 12/2019 | Agarwal et al. |
| 2019/0372574 | A1 | 12/2019 | Lin et al. |
| 2020/0006274 | A1 | 1/2020 | Chiang et al. |
| 2020/0058617 | A1 | 2/2020 | Wu et al. |
| 2020/0058626 | A1 | 2/2020 | Tai et al. |
| 2020/0082885 | A1 | 3/2020 | Lin et al. |
| 2020/0111734 | A1 | 4/2020 | Lin et al. |
| 2020/0144224 | A1 | 5/2020 | Lin et al. |
| 2020/0161242 | A1 | 5/2020 | Lin et al. |
| 2020/0243422 | A1 | 7/2020 | Kim et al. |
| 2020/0373215 | A1 | 11/2020 | Wu et al. |
| 2020/0395350 | A1 | 12/2020 | Wu et al. |
| 2021/0005592 | A1 | 1/2021 | Lin et al. |
| 2021/0043557 | A1* | 2/2021 | Lee .................... H01L 23/5385 |
| 2021/0050300 | A1 | 2/2021 | Lin et al. |
| 2021/0090983 | A1 | 3/2021 | Lin et al. |
| 2021/0159180 | A1 | 5/2021 | Zhai et al. |
| 2021/0217702 | A1 | 7/2021 | Dabral et al. |
| 2021/0232744 | A1 | 7/2021 | Lin et al. |
| 2022/0013504 | A1 | 1/2022 | Dabral et al. |
| 2022/0020729 | A1 | 1/2022 | Gao et al. |
| 2023/0352439 | A1 | 11/2023 | Chen et al. |

FOREIGN PATENT DOCUMENTS

| | | |
|---|---|---|
| CN | 104282650 | 1/2015 |
| CN | 105745752 | 7/2016 |
| CN | 104064556 | 4/2019 |
| TW | 200623398 | 7/2006 |
| TW | 201413842 | 4/2014 |
| WO | WO00/36748 | 6/2000 |
| WO | WO2005010976 | 2/2005 |
| WO | WO2016160063 | 10/2016 |
| WO | WO2018004092 | 1/2018 |

* cited by examiner

3D CHIP PACKAGE BASED ON VERTICAL-THROUGH-VIA CONNECTOR

PRIORITY CLAIM

This application claims priority benefits from U.S. provisional application No. 63/195,033, filed on May 30, 2021 and entitled "3D CHIP PACKAGE BASED ON VERTICAL-THROUGH-VIA CONNECTOR".

BACKGROUND OF THE DISCLOSURE

Field of the Disclosure

The present invention relates to a vertical-through-via connector for use in the chip package, and more particular relates to a vertical-through-via connector fabricated with a glass substrate and one or more interconnection metal layers on the glass substrate to act as one or more vertical through vias in the vertical-through-via connector when the vertical-through-via connector is turned in a vertical fashion.

Brief Description of the Related Art

For a multi-chip package, multiple semiconductor integrated-circuit (IC) chips are typically provided over a circuit substrate in a two-dimensional plane, wherein the circuit substrate may include multiple metal traces coupling the semiconductor integrated-circuit (IC) chips for signal transmission and power/ground delivery therebetween. When the size and dimension of the multi-chip package are scaled down to be smaller, its semiconductor integrated-circuit (IC) chips are inevitable to be arranged in a vertical fashion.

SUMMARY OF THE DISCLOSURE

One aspect of the disclosure provides a connector suitable for signal transmission and power/ground delivery in a vertical fashion in a chip package. The connector may include: a first substrate having a top surface, a bottom surface opposite to the top surface of the top substrate and a side surface joining an edge of the top surface of the first substrate and joining an edge of the bottom surface of the first substrate; a second substrate having a top surface, a bottom surface opposite to the top surface of the second substrate and a side surface joining an edge of the top surface of the second substrate and joining an edge of the bottom surface of the second substrate, wherein the side surface of the second substrate faces the side surface of the first substrate, wherein the top surfaces of the first and second substrates are coplanar with each other at a top of the connector and the bottom surfaces of the first and second substrates are coplanar with each other at a bottom of the connector; and a plurality of metal traces between, in a first horizontal direction, the side surfaces of the first and second substrates, wherein each of the plurality of metal traces has a top end at the top of the connector and a bottom end at the bottom of the connector.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
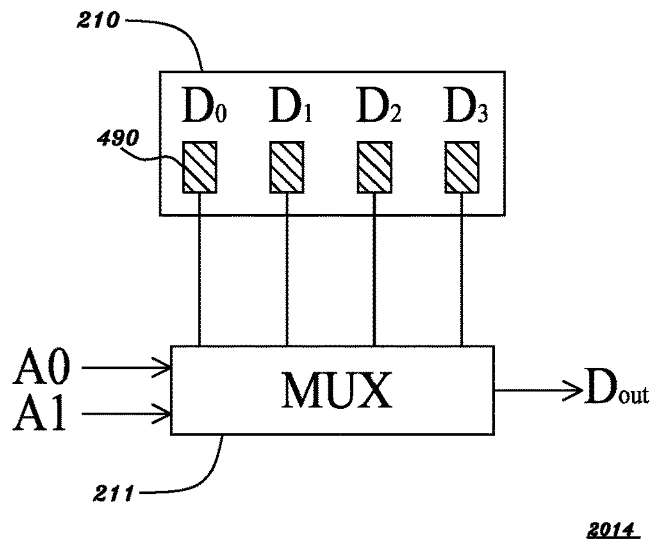
FIG. 1 is a schematic view showing a block diagram of a programmable logic cell in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Programmable Logic Blocks

FIG. 1 is a schematic view showing a block diagram of a programmable logic cell in accordance with an embodiment of the present application. Referring to FIG. 1, a programmable logic block (LB) or element may include one or a plurality of programmable logic cells (LC) 2014 each configured to perform logic operation on its input data set at its input points. Each of the programmable logic cells (LC) 2014 may include multiple memory cells 490, i.e., configuration-programming-memory (CPM) cells, each configured to save or store one of resulting values of a look-up table (LUT) 210 and a selection circuit 211, such as multiplexer (MUXER), having a first set of two input points arranged in parallel for a first input data set, e.g., A0 and A1, and a second set of four input points arranged in parallel for a second input data set, e.g., D0, D1, D2 and D3, each associated with one of the resulting values or programming codes of the look-up table (LUT) 210. The selection circuit 211 is configured to select, in accordance with its first input data set associated with the input data set of said each of the programmable logic cells (LC) 2014, a data input, e.g., D0, D1, D2 or D3, from its second input data set as a data output Dout at its output point acting as a data output of said each of the programmable logic cells (LC) 2014 at an output point of said each of the programmable logic cells (LC) 2014.

Referring to FIG. 1, the selection circuit 211 may have the second input data set, e.g., D0, D1, D2 and D3, each associated with a data output, i.e., configuration-programming-memory (CPM) data, of one of the memory cells 490, i.e., configuration-programming-memory (CPM) cells. For each of the programmable logic cells (LC) 2014, each of the resulting values or programing codes of its look-up table (LUT) 210 stored in one of its memory cells 490 that may be of a first type, i.e., volatile memory cell such as static random-access memory (SRAM) cell, may be associated with data saved or stored in a non-volatile memory cell, such as ferroelectric random-access-memory (FRAM) cell, magnetoresistive random access memory (MRAM) cell, resistive random access memory (RRAM) cell, anti-fuse or e-fuse. Alternatively, for each of the programmable logic cells (LC) 2014, each of its memory cells 490 may be of a second type, i.e., non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor.

Referring to FIG. 1, each of the programmable logic cells (LC) 2014 may have the memory cells 490, i.e., configuration-programming-memory (CPM) cells, configured to be programed to store or save the resulting values or programing codes of the look-up table (LUT) 210 to perform the logic operation, such as AND operation, NAND operation, OR operation, NOR operation, EXOR operation or other Boolean operation, or an operation combining two or more of the above operations. For this case, each of the programmable logic cells (LC) 2014 may perform the logic operation on its input data set, e.g., A0 and A1, at its input points as a data output Dout at its output point. For more elaboration, each of the programmable logic cells (LC) 2014 may include the number $2^n$ of memory cells 490, i.e., configuration-programming-memory (CPM) cells, each configured to save or store one of resulting values of the look-up table (LUT) 210 and the selection circuit 211 having a first set of the number n of input points arranged in parallel for a first input data set, e.g., A0-A1, and a second set of the number $2^n$ of input points arranged in parallel for a second input data set, e.g., D0-D3, each associated with one of the resulting values or programming codes of the look-up table (LUT) 210, wherein the number n may range from 2 to 8, such as 2 for this case. The selection circuit 211 is configured to select, in accordance with its first input data set associated with the input data set of said each of the programmable logic cells (LC) 2014, a data input, e.g., one of D0-D3, from its second input data set as a data output Dout at its output point acting as a data output of said each of the programmable logic cells (LC) 2014 at an output point of said each of the programmable logic cells (LC) 2014.

Specification for Programmable or Configurable Switch Cell

Figure 2:
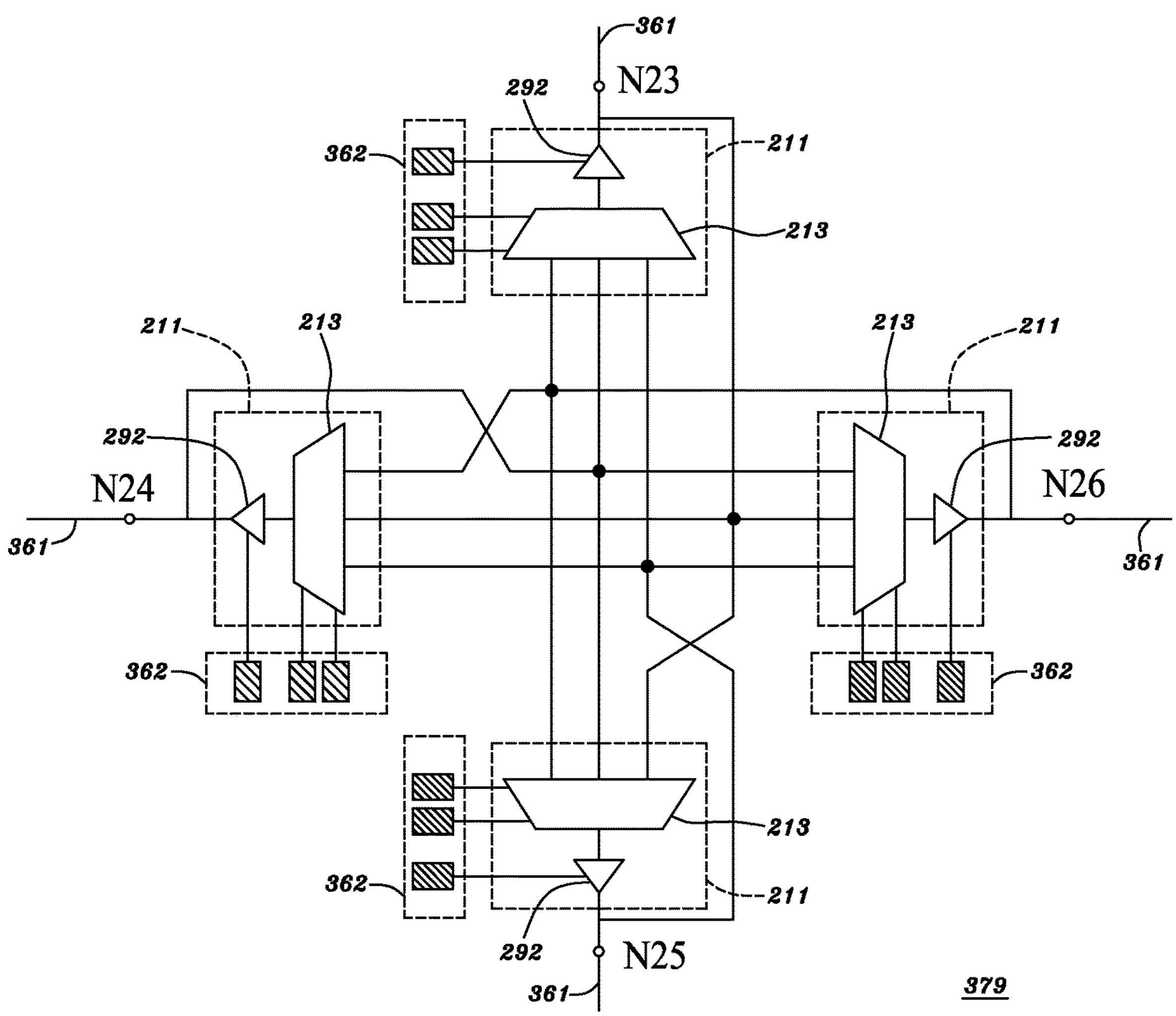
FIG. 2 is a circuit diagram illustrating programmable interconnects controlled by a programmable switch cell in accordance with an embodiment of the present application.

FIG. 2 is a circuit diagram illustrating programmable interconnects controlled by a programmable switch cell in accordance with an embodiment of the present application. Referring to FIG. 2, a cross-point switch may be provided for a programmable switch cell 379, i.e., configurable switch cell, including four selection circuits 211 at its top, bottom, left and right sides respectively, each having a multiplexer 213 and a pass/no-pass switch or switch buffer 292 coupling to the multiplexer 213 thereof, and four sets of memory cells 362 each configured to save or store programming codes to control the multiplexer 213 and pass/no-pass switch or switch buffer 292 of one of its four selection circuits 211. For the programmable switch cell 379, the multiplexer 213 of each of its four selection circuits 211 may be configured to select, in accordance with the first input data set thereof at the first set of input points thereof each associated with one of the programming codes saved or stored in its memory cells 362, a data input from the second input data set thereof at the second set of input points thereof as the data output thereof. The pass/no-pass switch 292 of each of its four selection circuits 211 is configured to control, in accordance with a first data input thereof associated with another of the programming codes saved or stored in its memory cells 362, coupling between the input point thereof for a second data input thereof associated with the data output of the multiplexer 213 of said each of its four selection circuits 211 and the output point thereof for a data output thereof and amplify the second data input thereof as the data output thereof to act as a data output of said each of its four selection circuits 211.

Each of the second set of three input points of the multiplexer 213 of one of its four selection circuits 211 may couple to one of the second set of three input points of the multiplexer 213 of each of another two of its four selection circuits 211 and to one of the four programmable interconnects 361 coupling to the output point of the other of its four selection circuits 211. Each of the four programmable interconnects 361 may couple to the output point of one of its four selection circuits 211 and one of the second set of three input points of the multiplexer 213 of each of the other three of its four selection circuits 211. Thereby, for each of the four selection circuits 211 of the programmable switch cell 379, its multiplexer 213 may select, in accordance with the first input data set thereof at the first set of input points thereof, a data input from the second input data set thereof at the second set of three input points thereof coupling to respective three of four nodes N23-N26 coupling to respective three of four programmable interconnects 361 extending in four different directions respectively, and its second type of pass/no-pass switch 292 is configured to generate the data output of said each of the four selection circuits 211 at the other of the four nodes N23-N26 coupling to the other of the four programmable interconnects 361.

For example, referring to FIG. 2, for the top one of the four selection circuits 211 of the programmable switch cell 379, its multiplexer 213 may select, in accordance with the first input data set thereof at the first set of input points thereof each associated with one of the programming codes saved or stored in the memory cells 362 of the programmable switch cell 379, a data input from the second input data set thereof at the second set of three input points thereof coupling to the respective three nodes N24-N26 coupling to the respective three programmable interconnects 361 extending in left, down and right directions respectively, and its pass/no-pass switch 292 is configured, in accordance with another of the programming codes saved or stored in the memory cells 362 of the programmable switch cell 379, to or not to generate the data output of the top one of the four selection circuits 211 of the programmable switch cell 379 at the node N23 coupling to the programmable interconnect 361 extending in an up direction. Thereby, data from one of the four programmable interconnects 361 may be switched by the programmable switch cell 379 to be passed to another one, two or three of the four programmable interconnects 361.

Referring to FIG. 2, for the programmable switch cell 379, each of the programming codes saved or stored in one of the memory cells 362 that may be of a first type, i.e., volatile memory cell such as static random-access memory (SRAM) cell, may be associated with data saved or stored in a non-volatile memory cell, such as ferroelectric random-access-memory (FRAM) cell, magnetoresistive random access memory (MRAM) cell, resistive random access memory (RRAM) cell, anti-fuse or e-fuse. Alternatively, for the programmable switch cell 379, each of its memory cells 362 may be of a second type, i.e., non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor.

Specification for Semiconductor Integrated-Circuit (IC) Chip

1. First Type of Semiconductor Integrated-Circuit (IC) Chip

Figure 3A:
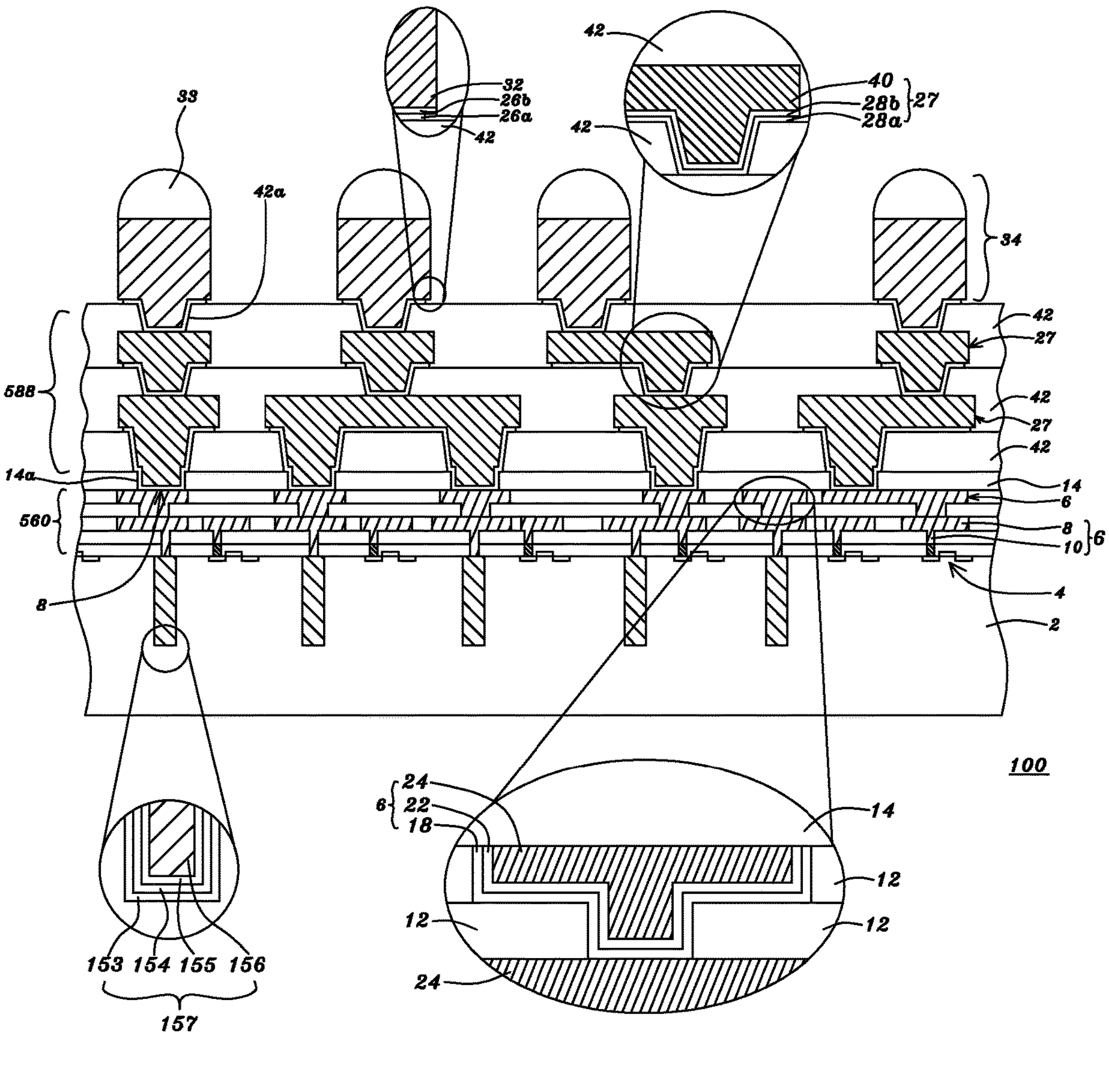
FIGS. 3A-3C are schematically cross-sectional views showing various types of semiconductor integrated-circuit (IC) chips in accordance with an embodiment of the present application.

FIG. 3A is a schematically cross-sectional view showing a first type of semiconductor integrated-circuit (IC) chip in accordance with an embodiment of the present application.

Referring to FIG. 3A, a first type of semiconductor chip 100 may include (1) a semiconductor substrate 2, such as silicon substrate, (2) multiple semiconductor devices 4, such as transistors or passive devices, at an active surface of its semiconductor substrate 2, (3) multiple through silicon vias (TSVs) 157 each vertically extending through a blind hole in its semiconductor substrate 2, (3) a first interconnection scheme 560 on the semiconductor substrate 2, wherein its first interconnection scheme 560 may include multiple insulating dielectric layers 12 and multiple interconnection metal layers 6 each in neighboring two of the insulating dielectric layers 12, wherein each of its interconnection metal layers 6 may couple to one or more of its semiconductor devices 4 and one or more of its through silicon vias (TSVs) 157, wherein each of the interconnection metal layers 6 of its first interconnection scheme 560 is patterned with multiple metal pads, lines or traces 8 in an upper one of the neighboring two of the insulating dielectric layers 12 of its first interconnection scheme 560 and multiple metal vias 10 in a lower one of the neighboring two of the insulating dielectric layers 12 of its first interconnection scheme 560, wherein between each neighboring two of the interconnection metal layers 6 of its first interconnection scheme 560 is provided one of the insulating dielectric layers 12 of its first interconnection scheme 560, wherein an upper one of the interconnection metal layers 6 of its first interconnection scheme 560 may couple to a lower one of the interconnection metal layers 6 of its first interconnection scheme 560 through an opening in one of the insulating dielectric layers 12 of its first interconnection scheme 560 between the upper and lower ones of the interconnection metal layers 6 of its first interconnection scheme 560, (4) a passivation layer 14 on its first interconnection scheme 560, wherein the topmost one of the interconnection metal layers 6 of its first interconnection scheme 560 may have the metal pads 8 at bottoms of multiple openings 14*a* in the passivation layer 14, wherein the passivation layer 14 includes a mobile ion-catching layer or layers, for example, a combination of silicon nitride, silicon oxynitride, and/or silicon carbon nitride layer or layers deposited by a chemical vapor deposition (CVD) process, wherein the passivation layer 14 may include a silicon-nitride layer having a thickness of more than 0.3 micrometers, and alternatively the passivation layer 14 may include a polymer layer, such as polyimide, having a thickness between 1 and 5 micrometers, (5) a second interconnection scheme 588 optionally provided over the passivation layer 14, wherein its second interconnection scheme 588 may include one or more interconnection metal layers 27 coupling to the metal pads 8 of the topmost one of the interconnection metal layers 6 of its first interconnection scheme 560 through the openings 14*a* in its passivation layer 14, and one or more polymer layers 42, i.e., insulating dielectric layers, each between neighboring two of the interconnection metal layers 27 of its second interconnection scheme 588, under a bottommost one of the interconnection metal layers 27 of its second interconnection scheme 588 or over a topmost one of the interconnection metal layers 27 of its second interconnection scheme 588, wherein an upper one of the interconnection metal layers 27 of its second interconnection scheme 588 may couple to a lower one of the interconnection metal layers 27 of its second interconnection scheme 588 through an opening in one of the polymer layers 42 of its second interconnection scheme 588 between the upper and lower ones of the interconnection metal layers 27 of its second interconnection scheme 588, wherein the topmost one of the interconnection metal layers 27 of its second interconnection scheme 588 may have multiple metal pads at bottoms of multiple openings 42*a* in the topmost one of the polymer layers 42 of its second interconnection scheme 588, and (6) multiple micro-bumps or micro-pads 34 on the metal pads of the topmost one of the interconnection metal layers 27 of its second interconnection scheme 588 at the bottoms of the openings 42*a* in the topmost one of the polymer layers 42 of its second interconnection scheme 588, or, in the case that its second interconnection scheme 588 is not provided, on the metal pads of the topmost one of the interconnection metal layers 6 of its first interconnection scheme 560 at the bottoms of the openings 14*a* in its passivation layer 14.

Referring to FIG. 3A, for the first type of semiconductor chip 100, each of its through silicon vias (TSVs) 157 may couple to one or more of its semiconductor devices 4 through one or more of the interconnection metal layers 6 of its first interconnection scheme 560. Each of its through silicon vias (TSVs) 157 may include (1) an insulating lining layer 153, such as a layer of thermally grown silicon oxide ($SiO_2$), a layer of CVD silicon nitride ($Si_3N_4$) or a combination thereof, on a sidewall and bottom of each of the blind holes in its semiconductor substrate 2, (2) a copper layer 156 electroplated in said each of the blind holes in its semiconductor substrate 2, (3) an adhesion layer 154, such as a layer of titanium (Ti) or titanium nitride (TiN) having a thickness between 1 nm to 50 nm, on the insulating lining layer 153, between the insulating lining layer 153 and copper layer 156 and at a sidewall and bottom of the copper layer 156, and (4) a seed layer 155, such as a layer of copper having a thickness between 3 nm and 200 nm, between the adhesion layer 154 and copper layer 156 and at a sidewall and bottom of the copper layer 156.

Referring to FIG. 3A, for the first interconnection scheme 560 of the first type of semiconductor chip 100, one of the metal pads, lines or traces 8 of each of its interconnection metal layers 6 may have a thickness between 3 nm and 500 nm and may have a width between 3 nm and 500 nm. A space or pitch between neighboring two of the metal pads, lines or traces 8 of each of its interconnection metal layers 6 may be between 3 nm and 500 nm. Each of its insulating dielectric layers 12 may include a layer of silicon oxide, silicon oxynitride or silicon oxycarbide having a thickness between 3 nm and 500 nm. Each of its interconnection metal layers 6 may include (1) a copper layer 24 having lower portions in openings in a lower one of the insulating dielectric layers 12, such as SiOC layer having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12. Alternatively, a topmost one of its interconnection metal layers 6 may be an aluminum layer having a thickness between 0.5 and 3 micrometers. For an example, the first interconnection scheme 560 may be formed with one or more passive devices, such as resistors, capacitors or inductors.

Referring to FIG. 3A, for the second interconnection scheme 588 of the first type of semiconductor chip 100, each of its interconnection metal layers 27 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of its interconnection metal layers 27 may have a metal line or trace with a thickness between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm and a width between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm. Each of its polymer layer 42 may be a layer of polyimide, BenzoCycloButene (BCB), parylene, polybenzoxazole (PBO), epoxy-based material or compound, photo epoxy SU-8, elastomer or silicone, having a thickness between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. One of its interconnection metal layers 27 may have two planes used respectively for power and ground planes of a power supply and/or used as a heat dissipater or spreader for the heat dissipation or spreading, wherein each of the two planes may have a thickness, for example, between 5 μm and 50 μm, 5 μm and 30 μm, 5 μm and 20 μm, or 5 μm and 15 μm, or greater than or equal to 5 μm, 10 μm, 20 μm, or 30 μm. The two planes may be layout as interlaced or interleaved shaped structures in a plane or may be layout in a fork shape.

Alternatively, referring to FIG. 3A, each of the first and second interconnection schemes 560 and 588 may be formed with one or more passive devices, such as resistors, capacitors or inductors.

Referring to FIG. 3A, for the first type of semiconductor chip 100, its micro-bumps or micro-pads 34 may be of various types, mentioned as below: A first type of micro bump or micro-pad 34 may include (1) an adhesion layer 26*a*, such as titanium (Ti) or titanium nitride (TiN) layer having a thickness between 1 nm and 50 nm, on the topmost one of the interconnection metal layers 27 of its second interconnection scheme 588 or, in the case that its second interconnection scheme 588 is not formed, on one of the metal pads 8 of its first interconnection scheme 560, (2) a seed layer 26*b*, such as copper, on its adhesion layer 26*a* and (3) a copper layer 32 having a thickness between 1 μm and 60 μm on its seed layer 26*b*.

Alternatively, a second type of micro-bump or micro-pad 34 may include the adhesion layer 26*a*, seed layer 26*b* and copper layer 32 as mentioned for the first type of micro-bump or micro-pad 34, and may further include a tin-containing solder cap 33 made of tin or a tin-silver alloy having a thickness between 1 μm and 50 μm on its copper layer 32.

Figure 12A:
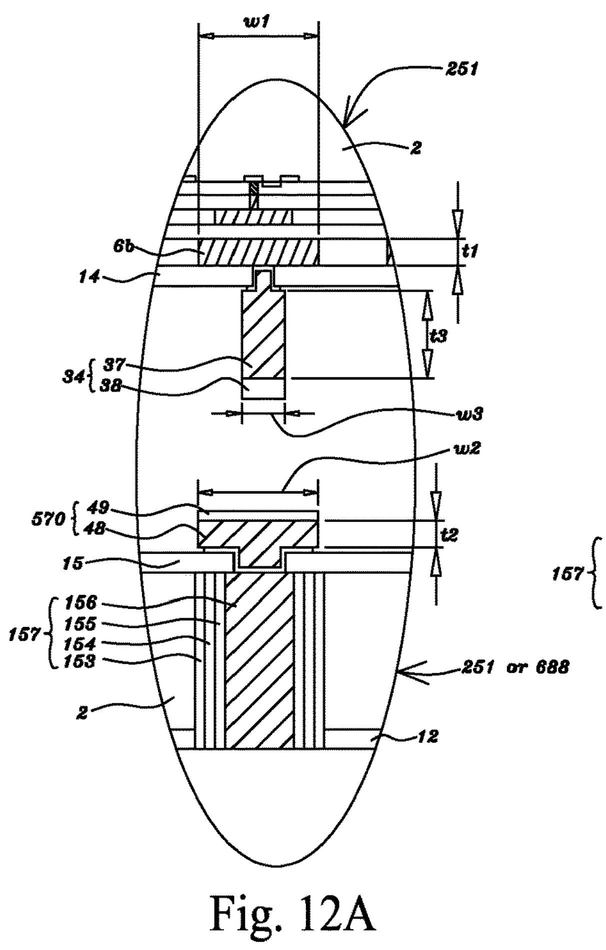
FIGS. 12A and 12B are schematically cross-sectional views showing a process of bonding a thermal compression bump to a thermal compression pad in accordance with an embodiment of the present application.
Figure 12B:
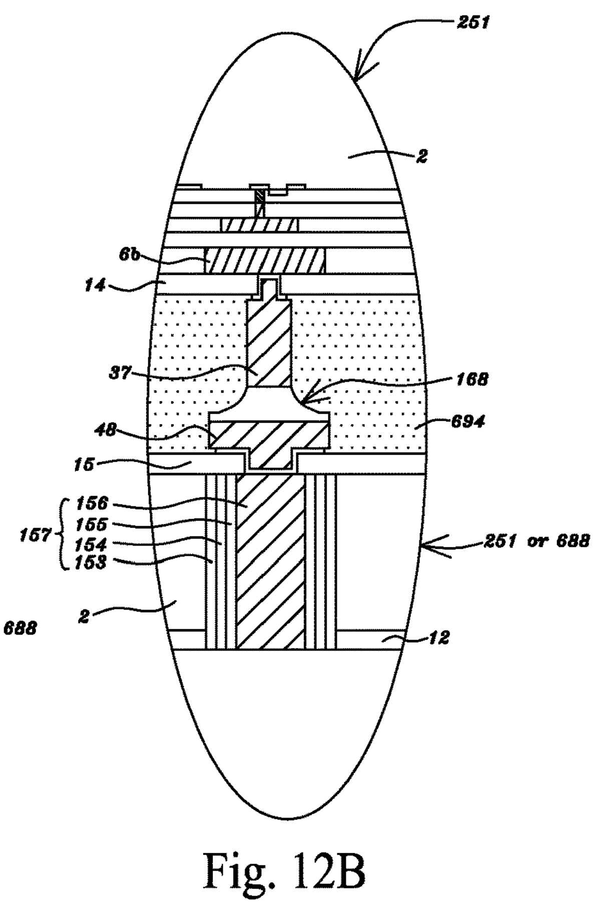

Alternatively, a third type of micro-bump or micro-pad 34 may be a thermal compression bump, including the adhesion layer 26*a* and seed layer 26*b* as mentioned for the first type of micro bump or micro-pad 34, and may further include, as seen in any of FIGS. 12A and 12B, a copper layer 37 having a thickness t3 between 2 μm and 20 μm and a largest transverse dimension w3, such as diameter in a circular shape, between 1 μm and 25 μm on its seed layer **26*b* and a solder cap 38 made of a tin-silver alloy, a tin-gold alloy, a tin-copper alloy, a tin-indium alloy, indium or tin, which has a thickness between 1 μm and 15 μm and a largest transverse dimension, such as diameter in a circular shape, between 1 μm and 15 μm on its copper layer 37. A pitch between neighboring two of the third type of micro-bumps or micro-pads 34** may be between 5 and 30 micrometers or between 10 and 25 micrometers.

Alternatively, a fourth type of micro-bump or micro-pad 34 may be a thermal compression pad, including the adhesion layer **26*a* and seed layer 26*b* as mentioned for the first type of micro-bump or micro-pad 34, and may further include, as seen in FIGS. 12A and 12B, a copper layer 48 having a thickness t2 between 1 μm and 20 μm or between 2 μm and 10 μm and a largest transverse dimension w2, such as diameter in a circular shape, between 5 μm and 50 μm, on its seed layer 26*b* and a solder cap 49 made of a tin-silver alloy, a tin-gold alloy, a tin-copper alloy, a tin-indium alloy, indium, tin or gold, which has a thickness between 0.1 μm and 5 μm on its copper layer 48. A pitch between neighboring two of the fourth type of micro-bumps or micro-pads 34** may be between 5 and 30 micrometers or between 10 and 25 micrometers.

2. Second Type of Semiconductor Integrated-Circuit (IC) Chip

Figure 3B:
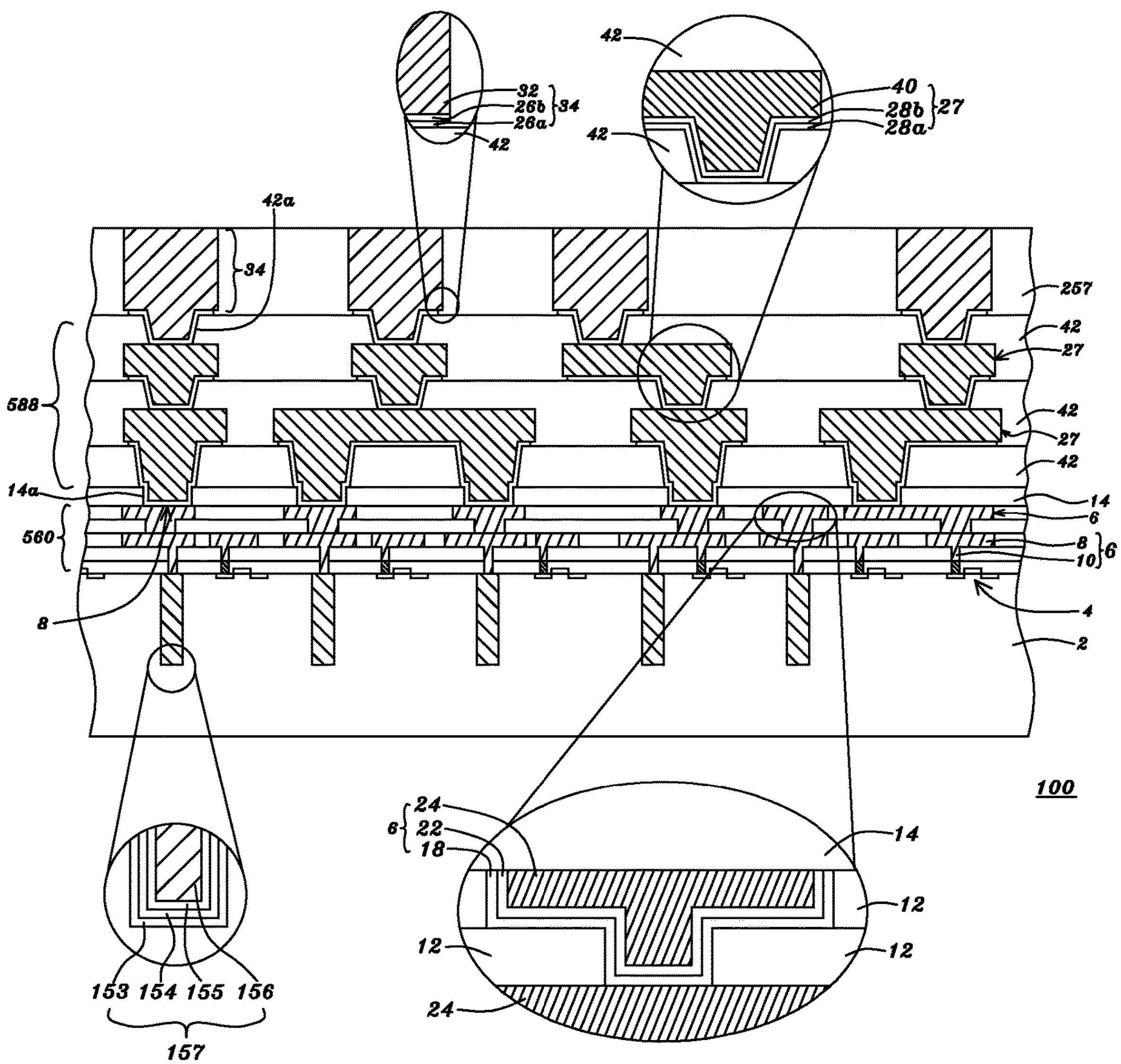

FIG. 3B is a schematically cross-sectional view showing a second type of semiconductor integrated-circuit (IC) chip in accordance with an embodiment of the present application. Referring to FIG. 3B, a second type of semiconductor integrated-circuit (IC) chip 100 may have a similar structure to the first type of semiconductor integrated-circuit (IC) chip 100 illustrated in FIG. 3A. For an element indicated by the same reference number shown in FIGS. 3A and 3B, the specification of the element as seen in FIG. 3B may be referred to that of the element as illustrated in FIG. 3A. The difference between the first and second types of semiconductor integrated-circuit (IC) chips 100 is that the second type of semiconductor integrated-circuit (IC) chip 100 may further include an insulating dielectric layer 257, such as polymer layer, on the topmost one of the polymer layers 42 of its second interconnection scheme 588 or, in the case that its second interconnection scheme 588 is not formed, on its passivation layer 14. For the second type of semiconductor integrated-circuit (IC) chip 100, its micro-bumps or micro-pads 34 may be of the first type as illustrated in FIG. 3A, and its insulating dielectric layer 257 may cover a sidewall of the copper layer 32 of each of its micro-bumps or micro-pads 34, wherein its insulating dielectric layer 257 may have a top surface coplanar with a top surface of the copper layer 32 of each of its micro-bumps or micro-pads 34, wherein its insulating dielectric layer 257 may be, for example, polyimide, BenzoCycloButene (BCB), parylene, polybenzoxazole (PBO), epoxy-based material or compound, photo epoxy SU-8, elastomer, or silicone; its insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan.

3. Third Type of Semiconductor Integrated-Circuit (IC) Chip

Figure 3C:
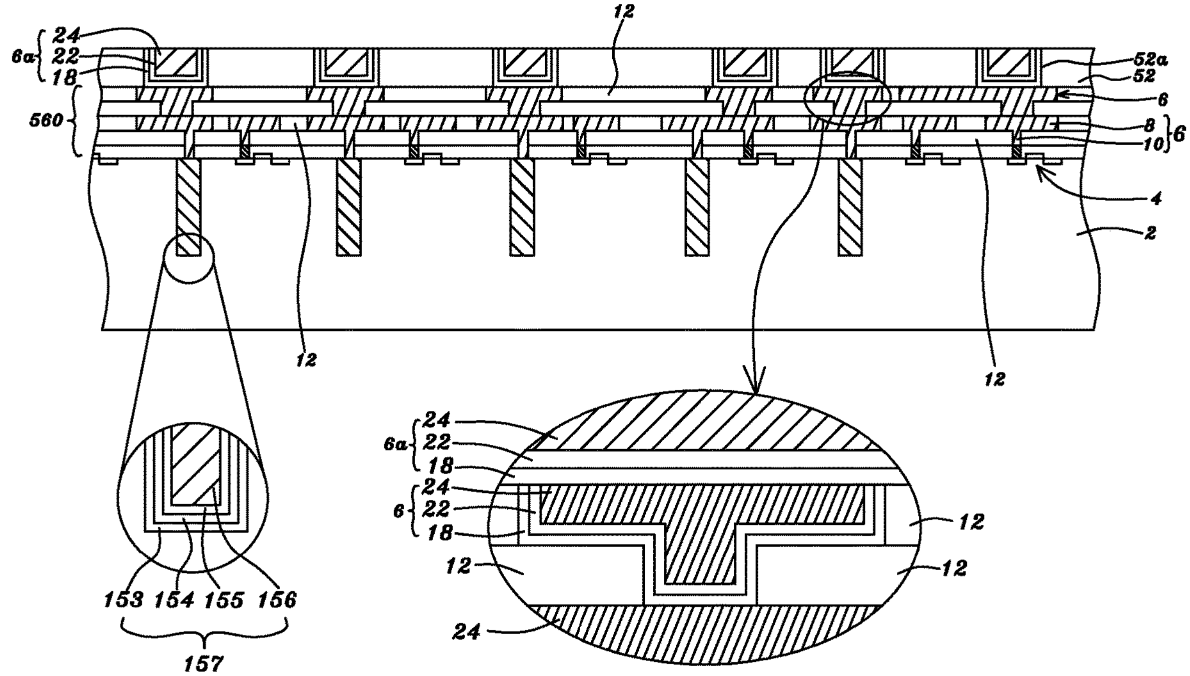

FIG. 3C is a schematically cross-sectional view showing a third type of semiconductor integrated-circuit (IC) chip in accordance with an embodiment of the present application. Referring to FIG. 3C, a third type of semiconductor integrated-circuit (IC) chip 100 may have a similar structure to the first type of semiconductor integrated-circuit (IC) chip 100 illustrated in FIG. 3A. For an element indicated by the same reference number shown in FIGS. 3A and 3C, the specification of the element as seen in FIG. 3C may be referred to that of the element as illustrated in FIG. 3A. The difference between the first and third types of semiconductor integrated-circuit (IC) chips 100 is that the third type of semiconductor integrated-circuit (IC) chip 100 may be provided with (1) an insulating bonding layer 52 at its active side and on the topmost one of the insulating dielectric layers 12 of its first interconnection scheme 560 and (2) multiple metal pads **6*a* at its active side and in multiple openings 52*a* in its insulating bonding layer 52 and on the topmost one of the interconnection metal layers 6 of its first interconnection scheme 560, instead of the passivation layer 14, second interconnection scheme 588 and micro-bumps or micro-pads 34 as seen in FIG. 3A. For the third type of semiconductor integrated-circuit (IC) chip 100, its insulating bonding layer 52 may include a silicon-dioxide layer having a thickness between 0.1 and 2 μm. Each of its metal pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*a*, and (3) a seed layer 22, such as copper, between the copper layer 24 and adhesion layer 18 of said each of its metal pads 6*a*, wherein the copper layer 24 of said each of its metal pads 6*a* may have a top surface substantially coplanar with a top surface of the silicon-oxide layer of its insulating bonding layer 52**.

Embodiment for Fine-Line Interconnection Bridge (FIB)

Figure 3D:
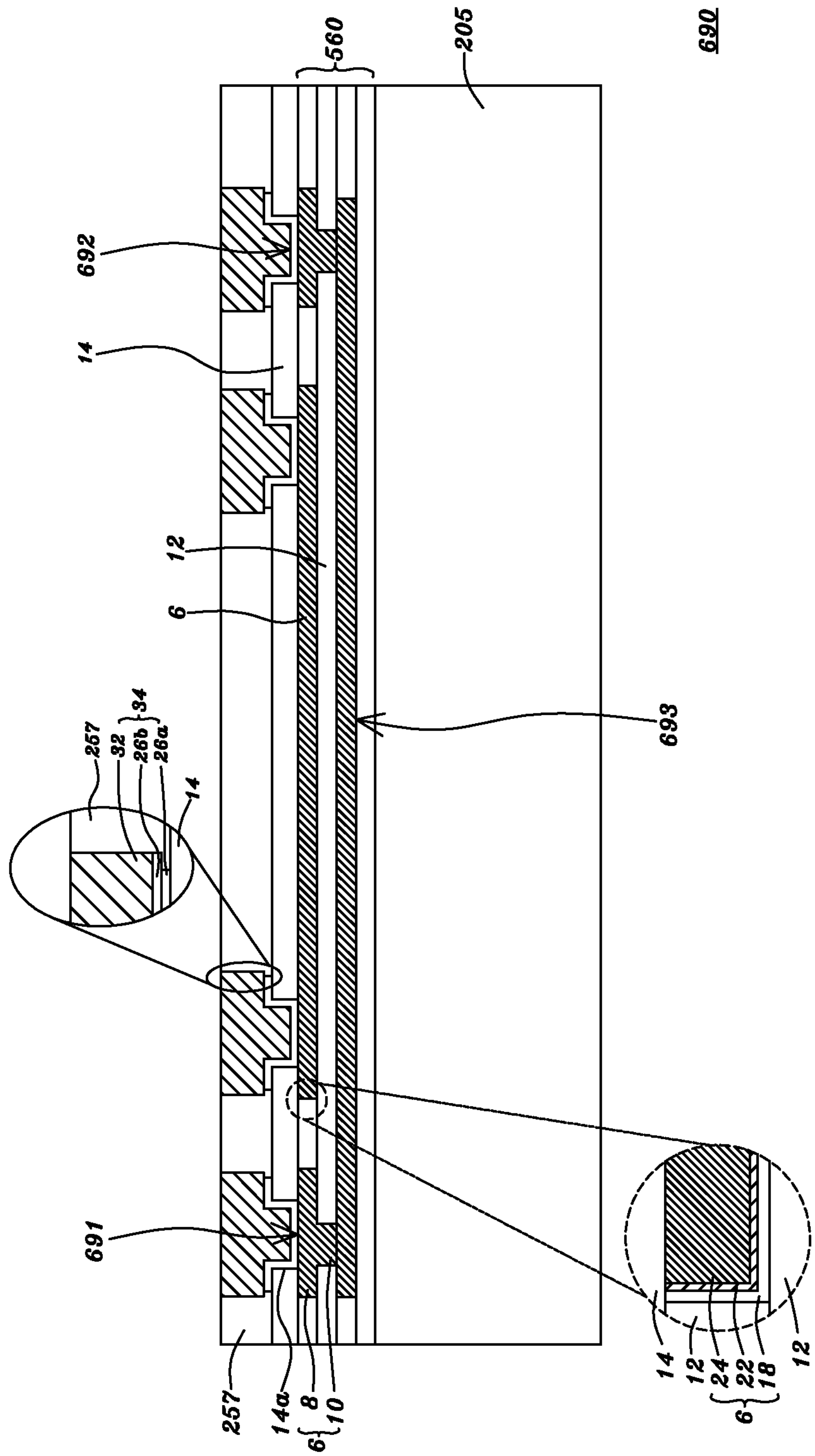
FIGS. 3D and 3E are schematically cross-sectional views showing various types of fine-line interconnection bridges in accordance with an embodiment of the present application.
Figure 3E:
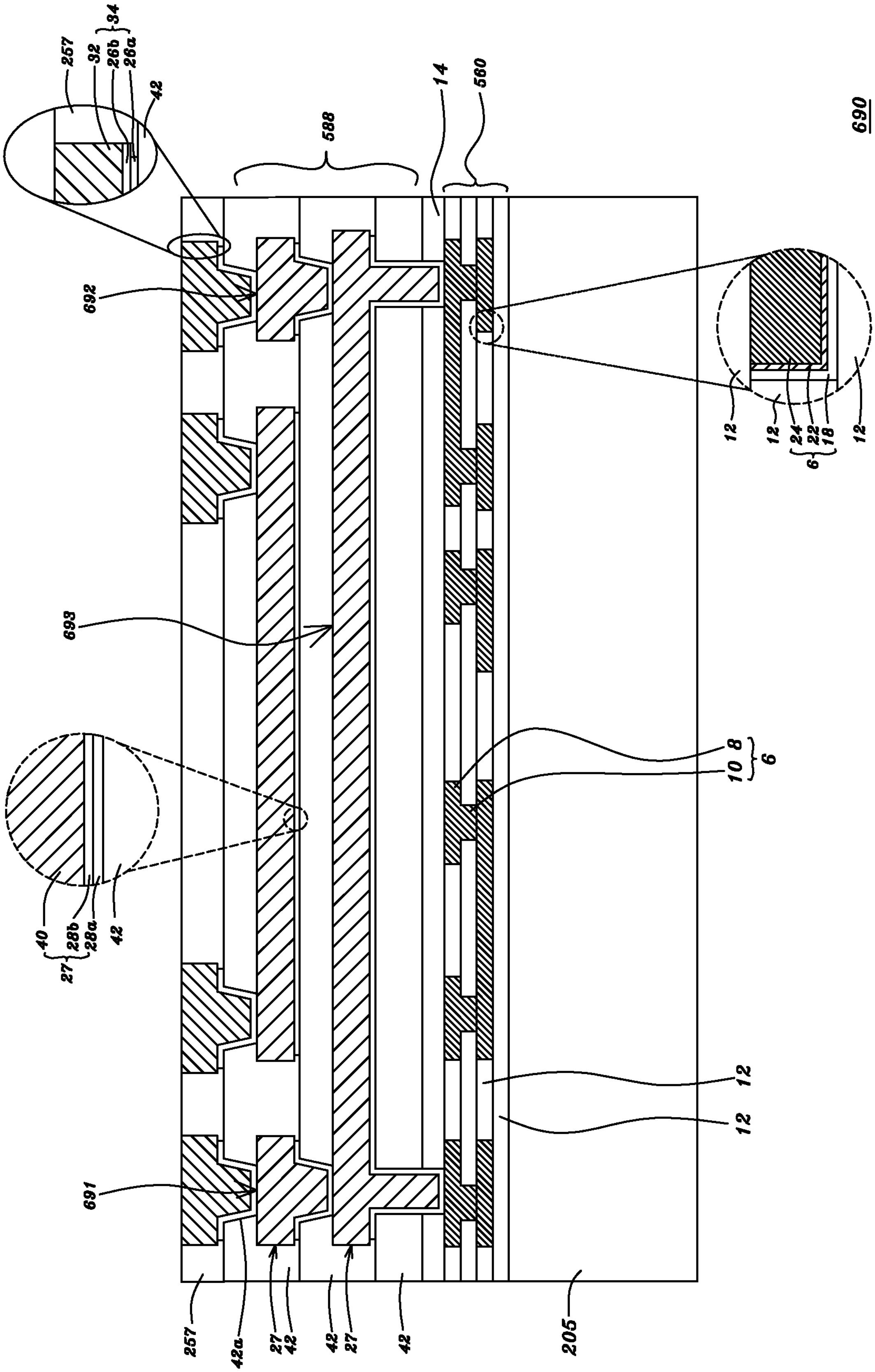

FIGS. 3D and 3E are schematically cross-sectional views showing various types of fine-line interconnection bridges in accordance with an embodiment of the present application. Referring to FIGS. 3D and 3E, a first or second type of fine-line interconnection bridge (FIB) 690 is provided for horizontal connection to transmit signals in a horizontal direction.

1. First Type of Fine-Line Interconnection Bridge (FIB)

Referring to FIG. 3D, a first type of fine-line interconnection bridge (FIB) 690 may include (1) a substrate 205, such as semiconductor substrate, silicon substrate or glass substrate, (2) a first interconnection scheme 560 on the substrate 2, wherein its first interconnection scheme 560 may include multiple insulating dielectric layers 12 and multiple interconnection metal layers 6 each in neighboring two of the insulating dielectric layers 12, wherein each of the interconnection metal layers 6 of its first interconnection scheme 560 is patterned with multiple metal pads, lines or traces 8 in an upper one of the neighboring two of the insulating dielectric layers 12 of its first interconnection scheme 560 and multiple metal vias 10 in a lower one of the neighboring two of the insulating dielectric layers 12 of its first interconnection scheme 560, wherein between each neighboring two of the interconnection metal layers 6 of its first interconnection scheme 560 is provided one of the insulating dielectric layers 12 of its first interconnection scheme 560, wherein an upper one of the interconnection metal layers 6 of its first interconnection scheme 560 may couple to a lower one of the interconnection metal layers 6 of its first interconnection scheme 560 through an opening in one of the insulating dielectric layers 12 of its first interconnection scheme 560 between the upper and lower ones of the interconnection metal layers 6 of its first interconnection scheme 560, wherein each of the interconnection metal layers 6 of its first interconnection scheme 560 may have the same specification as that of the interconnection metal layers 6 of the first type of semiconductor integrated-circuit (IC) chip 100 as illustrated in FIG. 3A and each of the insulating dielectric layers 12 of its first interconnection scheme 560 may have the same specification as that of the insulating dielectric layers 12 of the first type of semiconductor integrated-circuit (IC) chip 100 as illustrated in FIG. 3A, (3) a passivation layer 14 on its first interconnection scheme 560, wherein the topmost one of the interconnection metal layers 6 of its first interconnection scheme 560 may have the metal pads 8 at bottoms of multiple openings 14*a* in the passivation layer 14, wherein its passivation layer 14 may have the same specification as that of the passivation layer 14 of the first type of semiconductor integrated-circuit (IC) chip 100 as illustrated in FIG. 3A, (4) multiple micro-bumps or micro-pads 34, each of which may have the same specification as the first type of micro-bump or micro-pad 34 as illustrated in FIG. 3A, on the metal pads 8 of the topmost one of the interconnection metal layers 6 of its first interconnection scheme 560 at the bottoms of the openings 14*a* in its passivation layer 14, and (5) an insulating dielectric layer 257, such as polymer layer, on its passivation layer 14, wherein its insulating dielectric layer 257 may have a top surface coplanar with a top surface of the copper layer 32 of each of its micro-bumps or micro-pads 34, wherein its insulating dielectric layer 257 may have the same specification as that of the insulating dielectric layer 257 of the second type of semiconductor integrated-circuit (IC) chip 100 as illustrated in FIG. 3B.

Referring to FIG. 3D, for the first type of fine-line interconnection bridge (FIB) 690, each of a left group of its micro-bumps or micro-pads 34 arranged in an array may couple to one of a right group of its micro-bumps or micro-pads 34 arranged in an array through a metal line or trace 693 provided by the interconnection metal layers 6 of its first interconnection scheme 560.

2. Second Type of Fine-Line Interconnection Bridge (FIB)

Referring to FIG. 3E, a second type of fine-line interconnection bridge (FIB) 690 may have a structure similar to that as illustrated in FIG. 3D. For an element indicated by the same reference number shown in FIGS. 3D and 3E, the specification of the element as seen in FIG. 3E may be referred to that of the element as illustrated in FIG. 3D. The difference between the first and second types of fine-line interconnection bridges (FIB) 690 is that the second type of fine-line interconnection bridge (FIB) 690 may further include a second interconnection scheme 588 over the passivation layer 14, wherein the second interconnection scheme 588 may include one or more interconnection metal layers 27 coupling to the metal pads 8 of the topmost one of the interconnection metal layers 6 of its first interconnection scheme 560 through the openings 14*a* in its passivation layer 14, and one or more polymer layers 42, i.e., insulating dielectric layers, each between neighboring two of the interconnection metal layers 27 of its second interconnection scheme 588, under a bottommost one of the interconnection metal layers 27 of its second interconnection scheme 588 or over a topmost one of the interconnection metal layers 27 of its second interconnection scheme 588, wherein an upper one of the interconnection metal layers 27 of its second interconnection scheme 588 may couple to a lower one of the interconnection metal layers 27 of its second interconnection scheme 588 through an opening in one of the polymer layers 42 of its second interconnection scheme 588 between the upper and lower ones of the interconnection metal layers 27 of its second interconnection scheme 588, wherein the topmost one of the interconnection metal layers 27 of its second interconnection scheme 588 may have multiple metal pads at bottoms of multiple openings 42*a* in the topmost one of the polymer layers 42 of its second interconnection scheme 588, wherein each of the interconnection metal layers 27 of its second interconnection scheme 588 may have the same specification as that of the interconnection metal layers 27 of the first type of semiconductor integrated-circuit (IC) chip 100 as illustrated in FIG. 3A and each of the polymer layers 42 of its second interconnection scheme 588 may have the same specification as that of the polymer layers 42 of the first type of semiconductor integrated-circuit (IC) chip 100 as illustrated in FIG. 3A.

Referring to FIG. 3E, the second type of fine-line interconnection bridge (FIB) 690 may include multiple micro-bumps or micro-pads 34, each of which may have the same specification as the first type of micro-bump or micro-pad 34 as illustrated in FIG. 3A, on the metal pads of the topmost one of the interconnection metal layers 27 of its second interconnection scheme 588 at the bottoms of the openings 42*a* in the topmost one of the polymer layers 42 of its second interconnection scheme 588, and an insulating dielectric layer 257, such as polymer layer, on the topmost one of the polymer layers 42 of its second interconnection scheme 588, wherein its insulating dielectric layer 257 may have a top surface coplanar with a top surface of the copper layer 32 of each of its micro-bumps or micro-pads 34, wherein its insulating dielectric layer 257 may have the same specification as that of the insulating dielectric layer 257 of the second type of semiconductor integrated-circuit (IC) chip 100 as illustrated in FIG. 3B.

Referring to FIG. 3E, for the second type of fine-line interconnection bridge (FIB) 690, each of a left group of its micro bumps or micro-pads 34 arranged in an array may couple to one of a right group of its micro-bumps or micro-pads 34 arranged in an array through a metal line or trace 693 provided by the interconnection metal layers 6 of its first interconnection scheme 560 and/or the interconnection metal layers 27 of its second interconnection scheme 588.

Specification for Vertical-Through-Via (VTV) Connectors (Vertical-Interconnect-Elevator (VIE) Chips or Components) and Process for Fabricating the Same A vertical-through-via (VTV) connector is provided with multiple vertical through vias (VTVs) for vertical connection to transmit signals or clocks or deliver power or ground in a vertical direction. The vertical-through-via (VTV) connector may be of various types mentioned as below:

1. First Type of Vertical-Through-Via (VTV) Connector

Figure 4A:
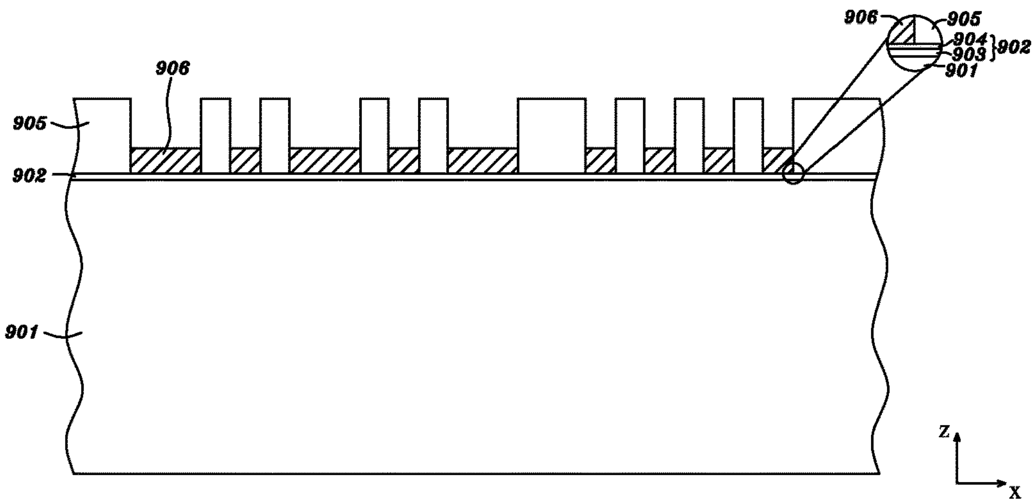
FIGS. 4A-4E are schematically cross-sectional views in an x-z plane showing a process for fabricating a first type of vertical-through-via (VTV) connector in accordance with an embodiment of the present application.

FIGS. 4A-4E are schematically cross-sectional views in an x-z plane showing a process for fabricating a first type of vertical-through-via (VTV) connector in accordance with an embodiment of the present application. Referring to FIG. 4A, a glass substrate 901, in a wafer form or panel form, having a thickness between 50 and 400 micrometers, between 100 and 300 micrometers, between 120 and 600 micrometers or between 150 and 500 micrometers may be provided as a supporting substrate 901. The glass substrate 901 may be made of an amorphous solid material, soda-lime glass, boro-silicate glass, alumo-silicate glass, fluoride glasses, phosphate glasses or chalcogen glasses. The glass substrate 901 may include between 60 and 95 percent by weight of $SiO_2$, between 60 and 74 percent by weight of $SiO_2$, between 70 and 85 percent by weight of $SiO_2$ or between 80 and 95 percent by weight of $SiO_2$. For example, the composition of the soda-lime glass may include 74 percent by weight of $SiO_2$, 13 percent by weight of $Na_2O$, 10.5 percent by weight of CaO, 1.3 percent by weight of $Al_2O_3$, 0.3 percent by weight of $K_2O$, 0.2 percent by weight of $SO_3$, 0.2 percent by weight of MgO, 0.04 percent by weight of $Fe_2O_3$ and 0.01 percent by weight of $TiO_2$; the composition of the boro-silicate glass may include 81 percent by weight of $SiO_2$, 12 percent by weight of $B_2O_3$, 4.5 percent by weight of $Na_2O$ and 2.0 percent by weight of $Al_2O_3$; the composition of the phosphate glasses may include between 3 and 10 percent by weight of $P_2O_5$ or between 5 and 20 percent by weight of $P_2O_5$. The glass substrate 901 may have a dielectric constant between 2 and 6, between 2 and 4 or smaller than 6 or 3. The glass substrate 901 may have a dissipation factor smaller than 0.005, 0.003 or 0.001 for signal transmission in a high frequency greater than 10, 20, 30, or 50 GHz, for example. The glass substrate 901 may be light transparent, opaque or translucent. The glass substrate 901 may be colorful, such as black, gray, blue or green. Alternatively, instead of the glass substrate, the supporting substrate 901 may include a silicon substrate, in a wafer form or panel form, having a thickness between 50 and 400 micrometers, between 100 and 300 micrometers, between 120 and 600 micrometers or between 150 and 500 micrometers and a layer of silicon dioxide ($SiO_2$) on the silicon substrate and at a top surface thereof.

Next, referring to FIG. 4A, an adhesion/seed metal layer 902 may be formed on the top surface of the supporting substrate 901 by sputtering or chemical vapor depositing an adhesion metal layer 903 of titanium or titanium nitride with a thickness between 1 and 50 nanometers or between 5 and 200 nanometers on the top surface of the supporting substrate 901 and sputtering a seed metal layer 904 of copper with a thickness between 1 and 500 nanometers or between 5 and 200 nanometers on the adhesion metal layer 903. Next, a photoresist layer 905 may be formed on the seed metal layer 904 by a spin-on coating or laminating process. Next, multiple openings 905*a* may be formed in the photoresist layer 905 to expose the seed metal layer 904 by an exposure and lithography process. Next, a bulk metal layer 906 may be formed on the seed metal layer 904 by electroplating a copper layer 906 with a thickness between 3 and 50 micrometers, between 3 and 10 micrometers, between 5 and 20 micrometers or between 10 and 50 micrometers on the seed metal layer 904.

Figure 4B:
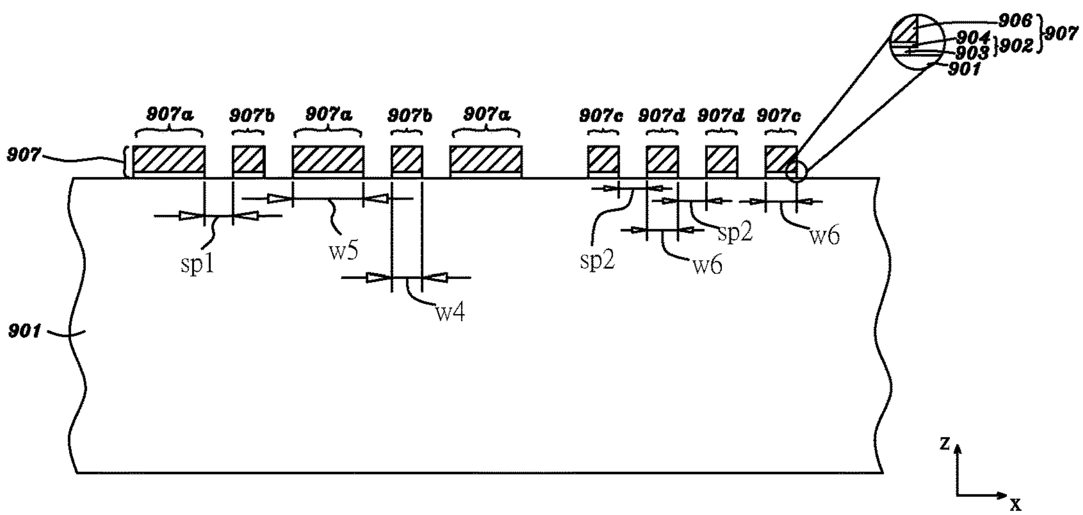
Figure 5A:
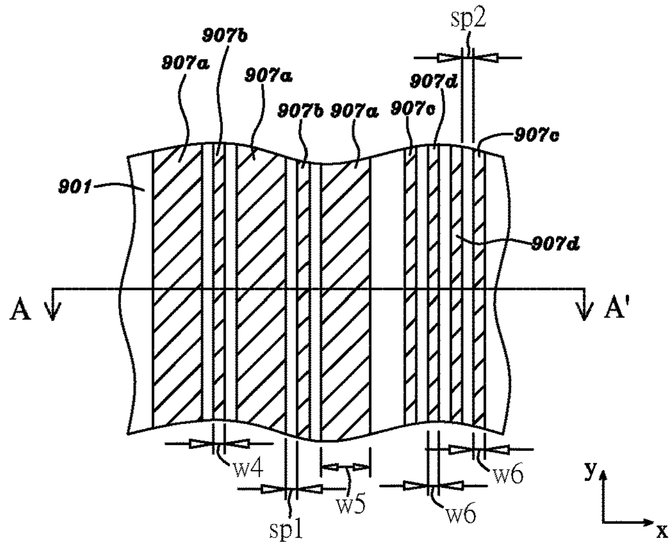
FIG. 5A is a schematically top view in an x-y plane showing an interconnection metal layer of a first type of vertical-through-via (VTV) connector in accordance with an embodiment of the present application.

Next, referring to FIGS. 4A and 4B, the photoresist layer 905 may be removed from the seed metal layer 904. Next, the adhesion metal layer 903 and seed metal layer 904 not under the bulk metal layer 906 may be removed to expose the top surface of the supporting substrate 901 by dry etching or wet etching. When the adhesion metal layer 903 and seed metal layer 904 not under the bulk metal layer 906 is removed by wet etching, each of the adhesion metal layer 903 and seed metal layer 904 may be recessed from a sidewall of the bulk metal layer 906 as seen in FIG. 4B to form an undercut at a sidewall of each of the adhesion metal layer 903 and seed metal layer 904 and under the bulk metal layer 906. When the adhesion metal layer 903 and seed metal layer 904 not under the bulk metal layer 906 is removed by dry etching, each of the adhesion metal layer 903 and seed metal layer 904 may have a sidewall aligned with a sidewall of the bulk metal layer 906 (not shown). Thereby, the adhesion metal layer 903, seed metal layer 904 and bulk metal layer 906 may compose an interconnection metal layer 907 having a thickness between 3 and 50 micrometers, between 3 and 10 micrometers, between 5 and 20 micrometers or between 10 and 50 micrometers. The interconnection metal layer 907 may be provided with a first group of circuits on a left side of the top surface of the supporting substrate 901 and a second group of circuits on a right side of the top surface of the supporting substrate 901 as seen in FIGS. 4B and 5A. FIG. 5A is a schematically top view in an x-y plane showing an interconnection metal layer of a first type of vertical-through-via (VTV) connector in accordance with an embodiment of the present application, wherein FIG. 4B is a cross-sectional view along a cross-sectional line A-A of FIG. 5A. Referring to FIGS. 4B and 5A, the first group of circuits may include multiple ground metal lines 907*a* for coupling to a voltage of ground reference and multiple transmission metal lines 907*b* each for transmitting signals with a first frequency greater than 10, 20, 30 or 50 GHz, wherein each of the transmission metal lines 907*b* may be arranged between neighboring two of the ground metal lines 907*a*, wherein said neighboring two of the ground metal lines 907*a* may extend in parallel with said each of the transmission metal lines 907*b*, wherein said each of the transmission metal lines 907*b* may have a width w4 between 3 and 50 micrometers, between 3 and 10 micrometers, between 5 and 20 micrometers, between 10 and 50 micrometers or smaller than 5, 10, 20, 30 or 60 micrometers, and each of said neighboring two of the ground metal lines 907*a* may have a width w5 greater than the width w4 of said each of the transmission metal lines 907*b*, wherein the width w5 of each of said neighboring two of the ground metal lines 907*a* may be between 5 and 50 micrometers, between 10 and 20 micrometers or between 15 and 30 micrometers. A space sp1 between said each of the transmission metal lines 907*b* and each of said neighboring two of the ground metal lines 907*a* may be substantially the same as the width w4 of said each of the transmission metal lines 907*b* and smaller than the width w5 of each of said neighboring two of the ground metal lines 907*a*, wherein the space sp1 between said each of the transmission metal lines 907*b* and each of said neighboring two of the ground metal lines 907*a* may be between 3 and 60 micrometers, between 5 and 30 micrometers, between 3 and 20 micrometers, between 10 and 40 micrometers, between 10 and 60 micrometers or smaller than 5, 10, 20, 30 or 60 micrometers. Alternatively, each of the ground metal lines 907*a* may be replaced with a power metal line for coupling to a voltage of power supply, which has the same specifications as those of said each of the ground metal lines 907*a*.

Referring to FIGS. 4B and 5A, the second group of circuits may include multiple ground metal lines 907*c* for coupling to a voltage of ground reference respectively and signal metal lines 907*d* each for transmitting signals with a second frequency lower than the first frequency. Each of the ground metal lines 907*c* and signal metal lines 907*d* may have a width w6 between 3 and 50 micrometers, between 3 and 10 micrometers, between 5 and 20 micrometers, between 10 and 50 micrometers or smaller than 5, 10, 20, 30 or 60 micrometers. A space sp2 between each neighboring two of the ground metal lines 907*c* and signal metal lines 907*d* may be substantially the same as the width w6 of said each of the ground metal lines 907*c* and signal metal lines 907*d*, the width w4 of said each of the transmission metal lines 907*b* and the space sp1 between said each of the transmission metal lines 907*b* and each of said neighboring two of the ground metal lines 907*a*, and smaller than the width w5 of each of said neighboring two of the ground metal lines 907*a*, wherein the space sp2 between said each neighboring two of the ground metal lines 907*c* and signal metal lines 907*d* may be between 3 and 60 micrometers, between 5 and 30 micrometers, between 3 and 20 micrometers, between 10 and 40 micrometers, between 10 and 60 micrometers or smaller than 5, 10, 20, 30 or 60 micrometers. Alternatively, each of the ground metal lines 907*c* may be replaced with a power metal line for coupling to a voltage of power supply, which has the same specifications as those of said each of the ground metal lines 907*c*.

Figure 4C:
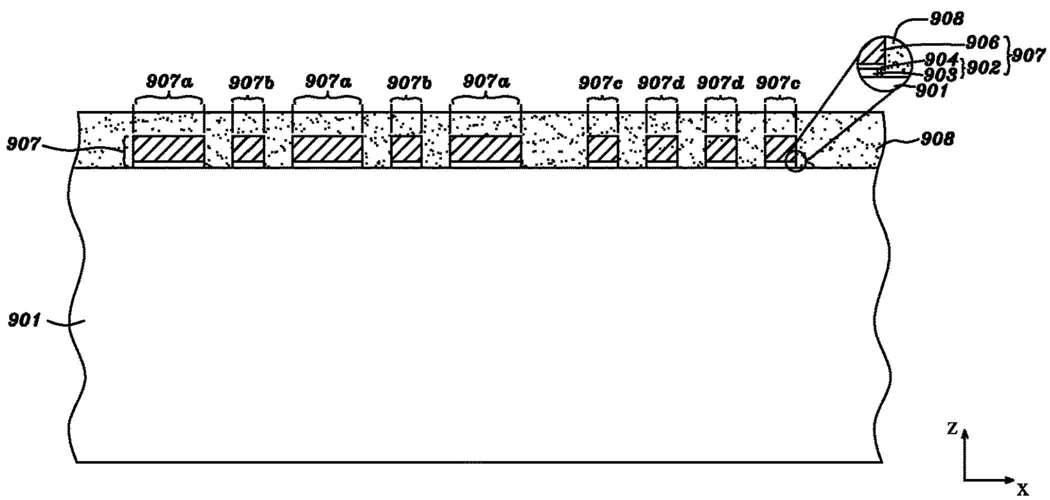

Next, referring to FIG. 4C, an insulating dielectric layer 908, or polymer layer, may be optionally formed on the top surface of the supporting substrate 901 with covering the interconnection metal layer 907 by spin-on coating, screen-printing or dispensing a precursor layer of polyimide, polybenzoxazole (PBO) or benzocyclobutene (BCB) on the top surface of the supporting substrate 901 with covering the interconnection metal layer 907 and curing and crosslinking the precursor layer by a heating process at a temperature higher than or equal to 50, 70, 90, 100, 125, 150, 175, 200, 225, 250, 275 or 300 degrees Celsius. The insulating dielectric layer 908 may have a thickness between 5 and 70 micrometers, between 5 and 20 micrometers, between 5 and 15 micrometers, between 10 and 30 micrometers or between 20 and 50 micrometers. The insulating dielectric layer 908 may have a dielectric constant between 2 and 10, between 3 and 8 or smaller than 7 or 4, and a dissipation factor between 0.0008 and 0.03, between 0.001 and 0.008, between 0.002 and 0.005, or smaller than 0.005, 0.002 or 0.0008.

Figure 4D:
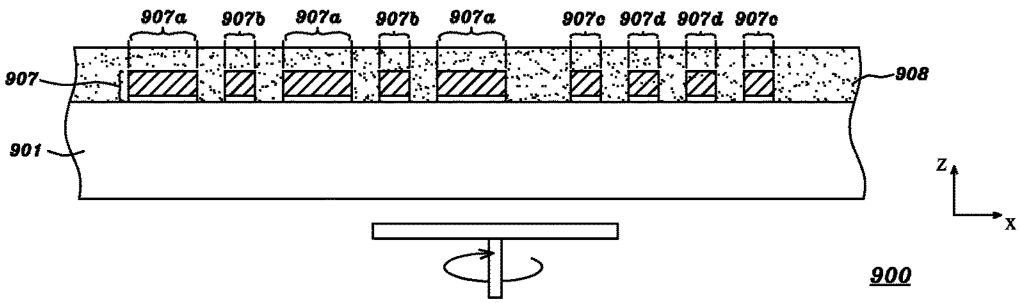

Next, referring to FIG. 4D, a chemical mechanical polishing (CMP), polishing or grinding process may be optionally applied to remove a bottom portion of the supporting substrate 901, planarize a bottom surface of the supporting substrate 901 and thin the supporting substrate 901 to make the supporting substrate 901 to be thinned with a thickness between 30 and 400 micrometers, between 50 and 200 micrometers or between 30 and 100 micrometers. The structure as seen in FIG. 4D is called herein as a first type of metal-trance-on-substrate (MTOSub) unit 900.

Figure 4E:
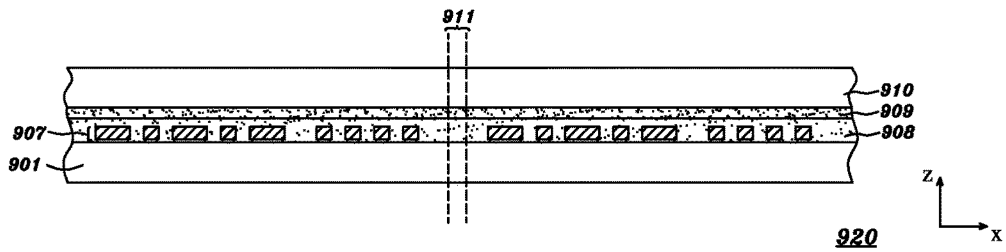
Figure 4F:
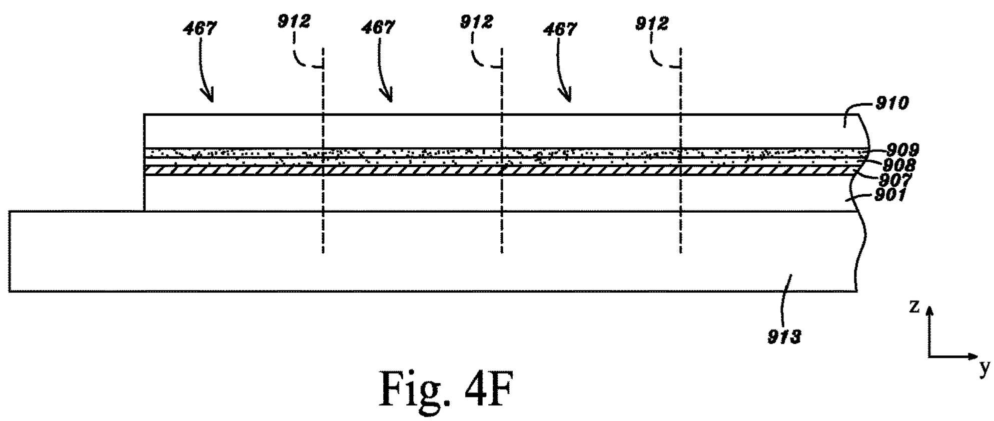
FIGS. 4F-4I are schematically cross-sectional views in a y-z plane showing a process for fabricating a first type of vertical-through-via (VTV) connector in accordance with an embodiment of the present application.

Next, referring to FIG. 4E, if the first type of metal-trance-on-substrate (MTOSub) unit 900 is formed with the insulating dielectric layer 908, an adhesive polymer layer 909 may be provided to mount a covering substrate 910 to the first type of metal-trance-on-substrate (MTOSub) unit 900 by a first step of laminating a dry film of polyimide, epoxy, polybenzoxazole (PBO) or benzocyclobutene (BCB) onto a top surface of the insulating dielectric layer 908, next placing the covering substrate 910 on a top surface of the dry film and then curing or crosslinking the dry film into the adhesive polymer layer 909 to bond the adhesive polymer layer 909 to a bottom surface of the covering substrate 910 and bond the adhesive polymer layer 909 to the top surface of the insulating dielectric layer 908, or of spin-on coating, screen-printing or dispensing a precursor layer of polyimide, epoxy, polybenzoxazole (PBO) or benzocyclobutene (BCB) on the top surface of the insulating dielectric layer 908, next placing the covering substrate 910 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the insulating dielectric layer 908. Alternatively, if the first type of metal-trance-on-substrate (MTOSub) unit 900 is formed without the insulating dielectric layer 908, the adhesive polymer layer 909 may be provided to mount the covering substrate 910 to the first type of metal-trance-on-substrate (MTOSub) unit 900 by a second step of laminating a dry film of polyimide, epoxy, polybenzoxazole (PBO) or benzocyclobutene (BCB) onto a top surface of the supporting substrate 901 and a top surface of the interconnection metal layer 907, next placing the covering substrate 910 on a top surface of the dry film and then curing or crosslinking the dry film into the adhesive polymer layer 909 to bond the adhesive polymer layer 909 to the bottom surface of the covering substrate 910 and bond the adhesive polymer layer 909 to the top surface of the supporting substrate 901 and the top surface of the interconnection metal layer 907, or of spin-on coating, screen-printing or dispensing a precursor layer of polyimide, epoxy, polybenzoxazole (PBO) or benzocyclobutene (BCB) on the top surface of the supporting substrate 901 and the top surface of the interconnection metal layer 907, next placing the covering substrate 910 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the supporting substrate 901 and the top surface of the interconnection metal layer 907. The adhesive polymer layer 909 may have a thickness between 5 and 70 micrometers, between 5 and 15 micrometers, between 5 and 20 micrometers, between 10 and 30 micrometers or between 20 and 50 micrometers. The covering substrate 910 may be a glass substrate having the same specification as illustrated in FIG. 4A for the supporting substrate 901. Alternatively, the covering substrate 910 may be a silicon substrate having a thickness between 50 and 600 micrometers, between 50 and 400 micrometers, between 100 and 300 micrometers, between 120 and 600 micrometers or between 150 and 500 micrometers. The structure as seen in FIG. 4E is called herein as a first type of vertical-through-via (VTV) substrate, panel or wafer 920.

Figure 4G:
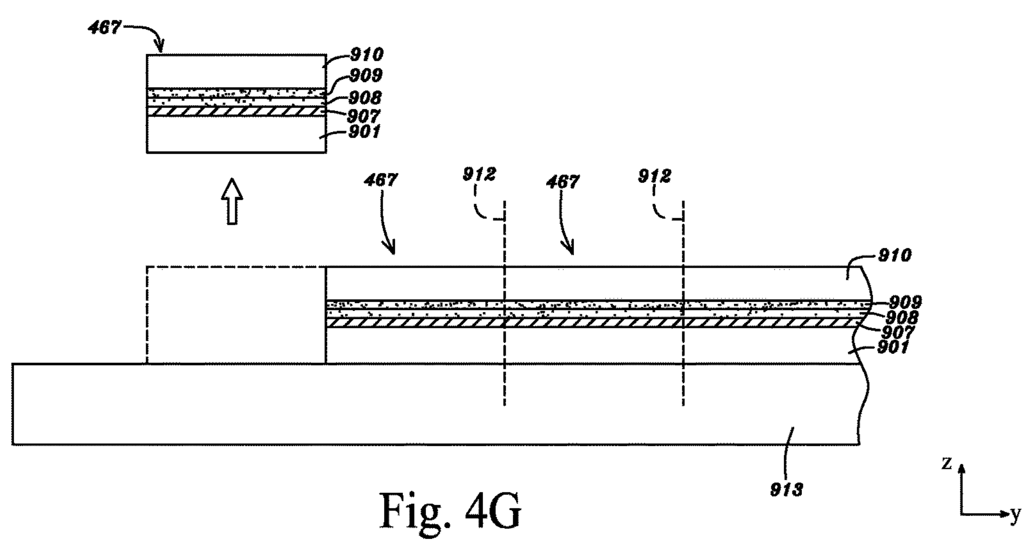
Figure 4H:
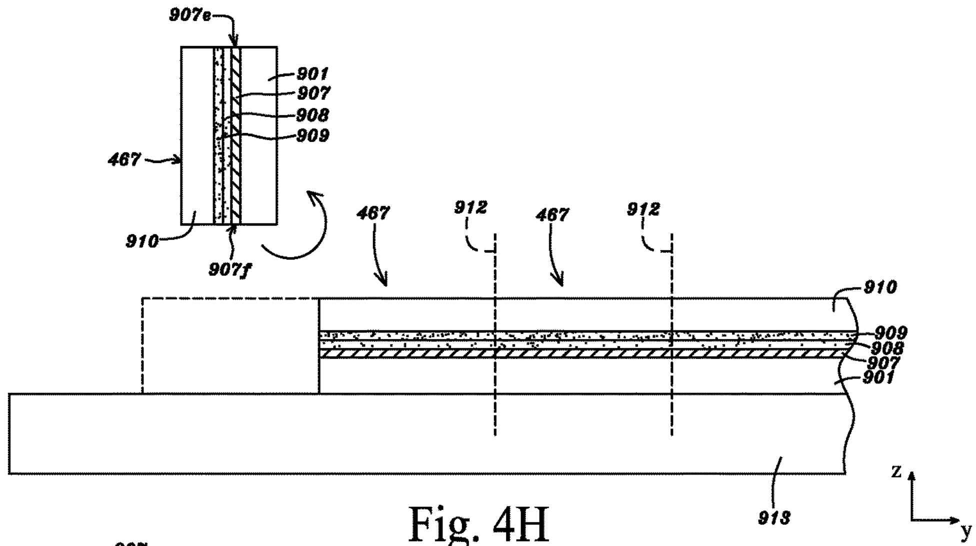
Figure 4I:
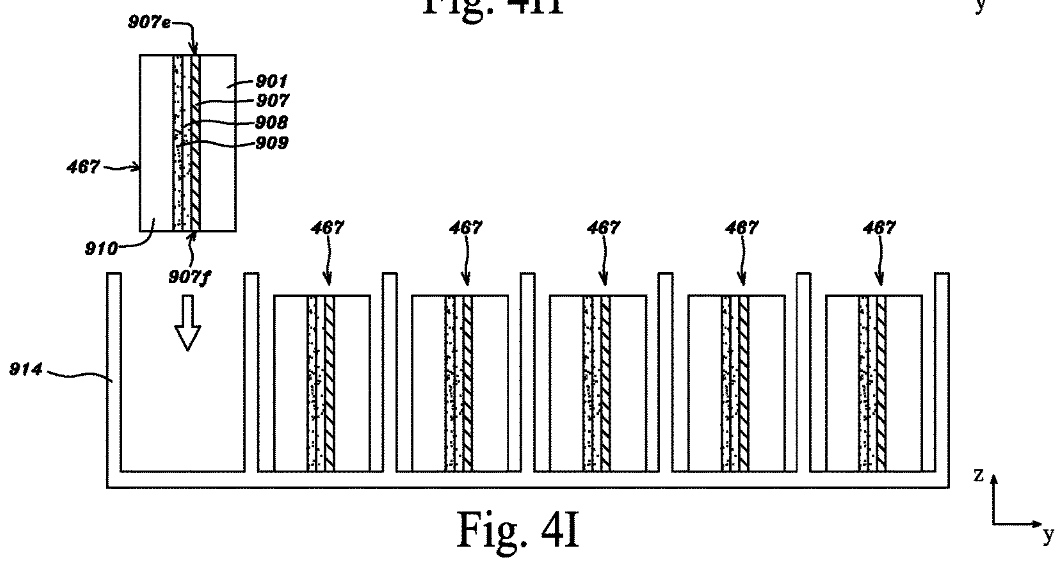
Figure 5B:
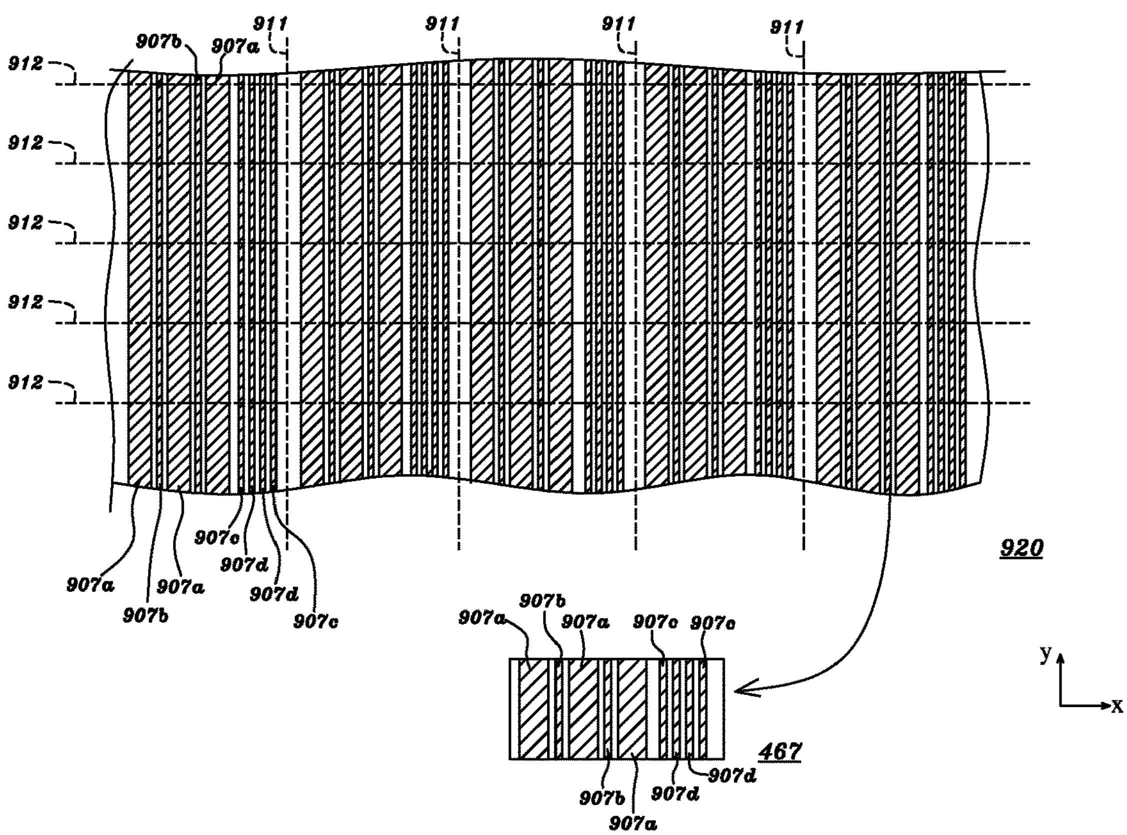
FIGS. 5B and 5C are schematically top views in an x-y plane showing an arrangement of reserved scribe lines and interconnection metal layer of a first type of vertical-through-via (VTV) substrate, panel or wafer for multiple first type of vertical-through-via (VTV) connectors with various shapes in accordance with an embodiment of the present application.
Figure 5C:
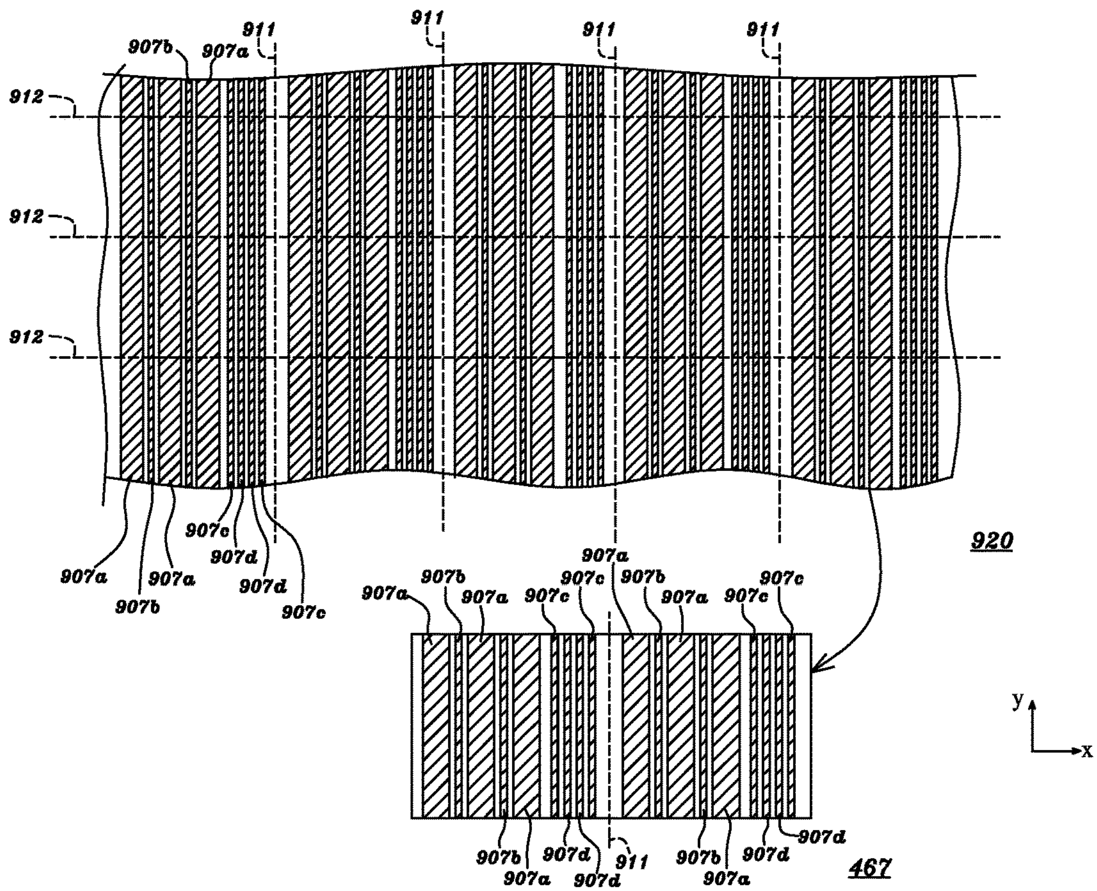

FIGS. 5B and 5C are schematically top views in an x-y plane showing an arrangement of reserved scribe lines and interconnection metal layer of a first type of vertical-through-via (VTV) substrate, panel or wafer for multiple first type of vertical-through-via (VTV) connectors with various shapes in accordance with an embodiment of the present application. FIGS. 4F-4I are schematically cross-sectional views in a y-z plane showing a process for fabricating a first type of vertical-through-via (VTV) connector in accordance with an embodiment of the present application. Referring to FIGS. 4E, 4F, 5B and 5C, the first type of vertical-through-via (VTV) substrate, panel or wafer 920 may be defined with multiple first reserved scribe lines 911 extending in a y direction and multiple second reserved scribe lines 912 extending in a x direction vertical to the y direction, wherein its interconnection metal layer 907 may include multiple duplicated circuit portions having the same circuit pattern, each between neighboring two of its first reserved scribe lines 911, and a space between each neighboring two of its second reserved scribe lines 912 may be arbitrarily determined by customers.

Next, referring to FIGS. 4E, 4F, 5B and 5C, the first type of vertical-through-via (VTV) connector 467 to be processed from the first type of vertical-through-via (VTV) substrate, panel or wafer 920 as seen in FIGS. 4E, 4F, 5B and 5C may have a size to be selected or determined from various sizes after the interconnection metal layer 907 of the second type of vertical-through-via (VTV) substrate, panel or wafer 920 are formed. When a size for the first type of vertical-through-via (VTV) connectors 467 is selected or determined, the first type of vertical-through-via (VTV) substrate, panel or wafer 920 as seen in FIGS. 4E, 4F, 5B and 5C may be placed onto a dicing tape or carrier 913 and then cut or diced therethrough along some or all of the first reserved scribe lines 911 and all of the second reserved scribe lines 912 to separate the first type of vertical-through-via (VTV) connectors 467 in a single-die type by a laser cutting process or by a mechanical cutting process. Accordingly, each of the first type of vertical-through-via (VTV) connectors 467 may be arranged with a width in an x direction for containing one of the duplicated circuit portions and a length in a y direction arbitrarily determined by customers as seen in FIG. 5B; alternatively, each of the first type of vertical-through-via (VTV) connectors 467 may be arranged with a width in the x direction for containing two of the duplicated circuit portions and a length in the y direction arbitrarily determined by customers as seen in FIG. 5C, wherein one of the first reserved scribe lines 911 is arranged between said two of the duplicated circuit portions. The first type of vertical-through-via (VTV) substrate, panel or wafer 920 as seen in FIGS. 4E, 4F, 5B and 5C may have a fixed pattern of design and layout for the interconnection metal layer 907, and may be cut or diced to form a number of the first type of vertical-through-via (VTV) connectors 467 in a single-die type, having various dimensions or shapes and various numbers of the ground metal lines 907*a* and 907*c*, transmission metal lines 907*b* and signal metal lines 907*d*.

In other words, each of the first type of vertical-through-via (VTV) connectors 467 may be customized with any dimension in the y direction. For example, the first type of vertical-through-via (VTV) substrate, panel or wafer 920 may be cut or diced to form the first type of vertical-through-via (VTV) connector 467 as seen in FIG. 5B or 5C with a length yM or yN in the y direction respectively and a width in the x direction xM or xN respectively, wherein the length yM may be smaller than the length yN and the ratio of the length yN to yM may be any positive value that could be an integer value or non-integer value, and wherein the width xM may be smaller than the width xN and the ratio of the width xN to xM may be a positive integer.

Next, referring to FIG. 4G, each of the first type of vertical-through-via (VTV) connectors 467 may have a first surface in an x-y plane at a top thereof to be picked up by a pick-up tip and then moved in a z direction. Next, said each of the first type of vertical-through-via (VTV) connectors 467 may be rotated by the pick-up tip by 90 degrees clockwise in a y-z plane as seen in FIG. 4H. Next, referring to FIG. 4H, said each of the first type of vertical-through-via (VTV) connectors 467 may have a second surface in an x-y plane at a top thereof to be picked up by a place tip and then to be placed in a tray 914 as seen in FIG. 4I. Thereby, referring to FIG. 4I, for each of the first type of vertical-through-via (VTV) connectors 467, each of its ground metal lines 907*a* and 907*c*, transmission metal lines 907*b* and signal metal lines 907*d* may include a top metal pad or contact 907*e* having a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and a bottom metal pad or contact 907*f* having a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910. A vertical distance between the top and bottom surfaces of each of its supporting substrate 901 and covering substrate 910 may be between 20 and 500 micrometers or between 20 and 3,000 micrometers. In this case, each of its ground metal lines 907*a* and 907*c*, transmission metal lines 907*b* and signal metal lines 907*d* may extend, from the top surface of the top metal pad or contact 907*e* thereof to the bottom surface of the bottom metal pad or contact 907*f* thereof, in a straight line.

2. Second Type of Vertical-Through-Via (VTV) Connector

Figure 6A:
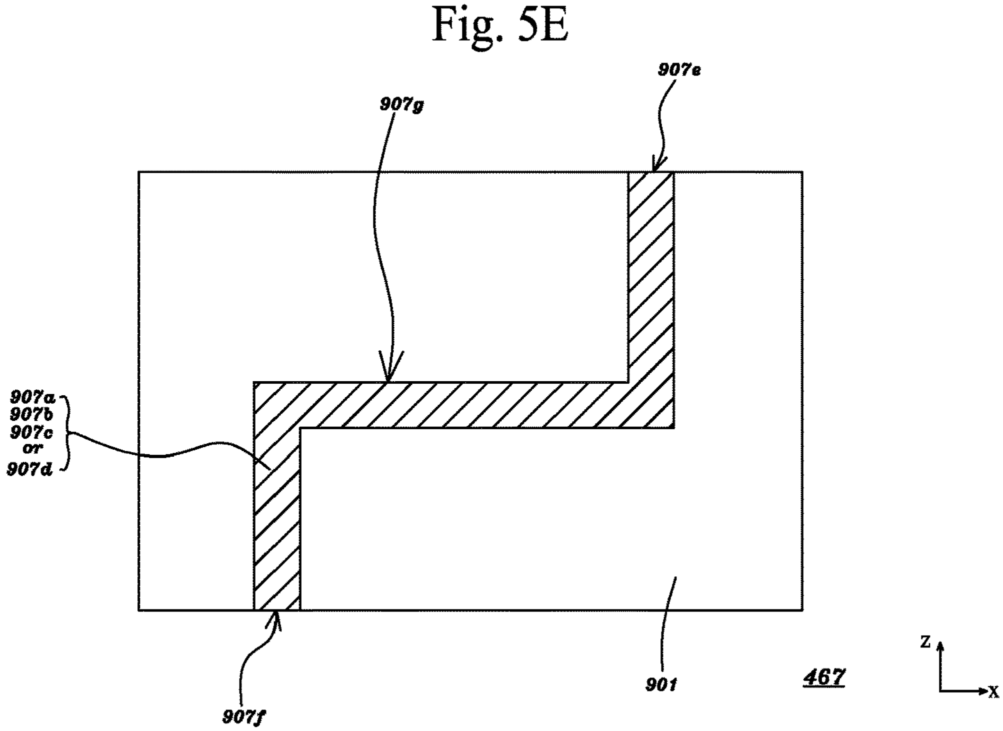
FIGS. 6A-6F are schematically cross-sectional views in an x-z plane showing second through seventh types of vertical-through-via (VTV) connectors in accordance with an embodiment of the present application.

FIG. 6A is a schematically cross-sectional view in an x-z plane showing a second type of vertical-through-via (VTV) connector in accordance with an embodiment of the present application. The process for fabricating a second type of vertical-through-via (VTV) connector 467 as seen in FIG. 6A may have the same steps as illustrated in FIGS. 4A-4I and 5A-5C, but the interconnection metal layer 907 for the second type of vertical-through-via (VTV) connector 467 as seen in FIG. 6A may have a different layout from that for the first type of vertical-through-via (VTV) connector 467 as seen in FIGS. 4A-4I and 5A-5C. For an element indicated by the same reference number shown in FIGS. 4A-4I, 5A-5C and 6A, the specification of the element as seen in FIG. 6A may be referred to that of the element as illustrated in FIGS. 4A-4I and 5A-5C. Referring to FIG. 6A, for the second type of vertical-through-via (VTV) connector 467 fabricated as illustrated in FIGS. 4A-4I and 5A-5C to be finally placed in the tray 914 as seen in FIG. 4I, each of its ground metal lines 907*a* and 907*c*, transmission metal lines 907*b* and signal metal lines 907*d* may include the top and bottom metal pads or contacts 907*e* and 907*f* not vertically aligned with each other and having a horizontal offset therebetween in the x direction, wherein said each of its ground metal lines 907*a* and 907*c*, transmission metal lines 907*b* and signal metal lines 907*d* may have a longitudinal portion 907*g* horizontally extending in the x direction and coupling from the top metal pad or contact 907*e* thereof to the bottom metal pad or contact 907*f* thereof.

3. Third Type of Vertical-Through-Via (VTV) Connector

Figure 6B:
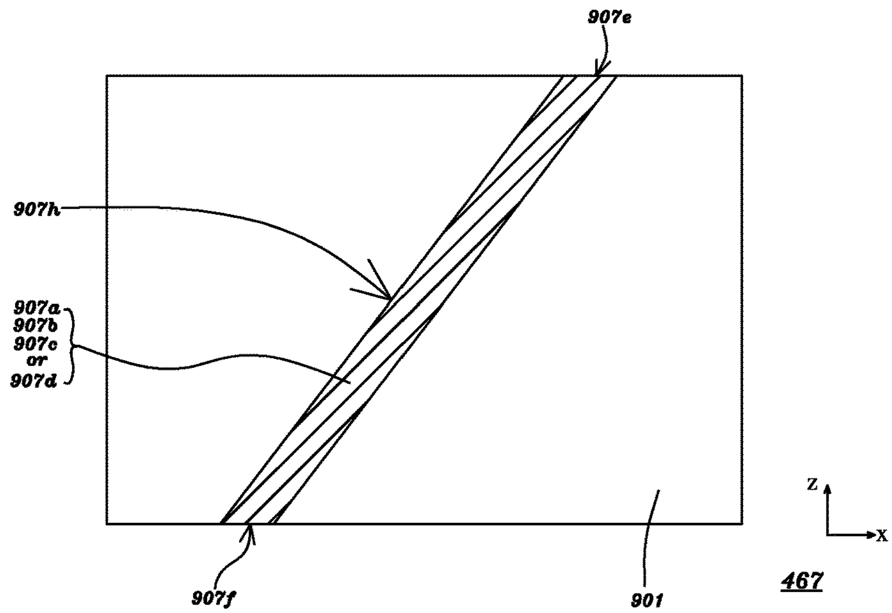

FIG. 6B is a schematically cross-sectional view in an x-z plane showing a third type of vertical-through-via (VTV) connector in accordance with an embodiment of the present application. The process for fabricating a third type of vertical-through-via (VTV) connector 467 as seen in FIG. 6B may have the same steps as illustrated in FIGS. 4A-4I and 5A-5C, but the interconnection metal layer 907 for the third type of vertical-through-via (VTV) connector 467 as seen in FIG. 6B may have a different layout from that for the first type of vertical-through-via (VTV) connector 467 as seen in FIGS. 4A-4I and 5A-5C. For an element indicated by the same reference number shown in FIGS. 4A-4I, 5A-5C and 6B, the specification of the element as seen in FIG. 6B may be referred to that of the element as illustrated in FIGS. 4A-4I and 5A-5C. Referring to FIG. 6B, for the third type of vertical-through-via (VTV) connector 467 fabricated as illustrated in FIGS. 4A-4I and 5A-5C to be finally placed in the tray 914 as seen in FIG. 4I, each of its ground metal lines 907*a* and 907*c*, transmission metal lines 907*b* and signal metal lines 907*d* may include the top and bottom metal pads or contacts 907*e* and 907*f* not vertically aligned with each other and having a horizontal offset therebetween in the x direction, wherein said each of its ground metal lines 907*a* and 907*c*, transmission metal lines 907*b* and signal metal lines 907*d* may have a longitudinal portion 907*h* extending in the x-z plane with an acute angle from a horizontal plane coplanar with its top and bottom surfaces and coupling from the top metal pad or contact 907*e* thereof to the bottom metal pad or contact 907*f* thereof.

4. Fourth Type of Vertical-Through-Via (VTV) Connector

Figure 6C:
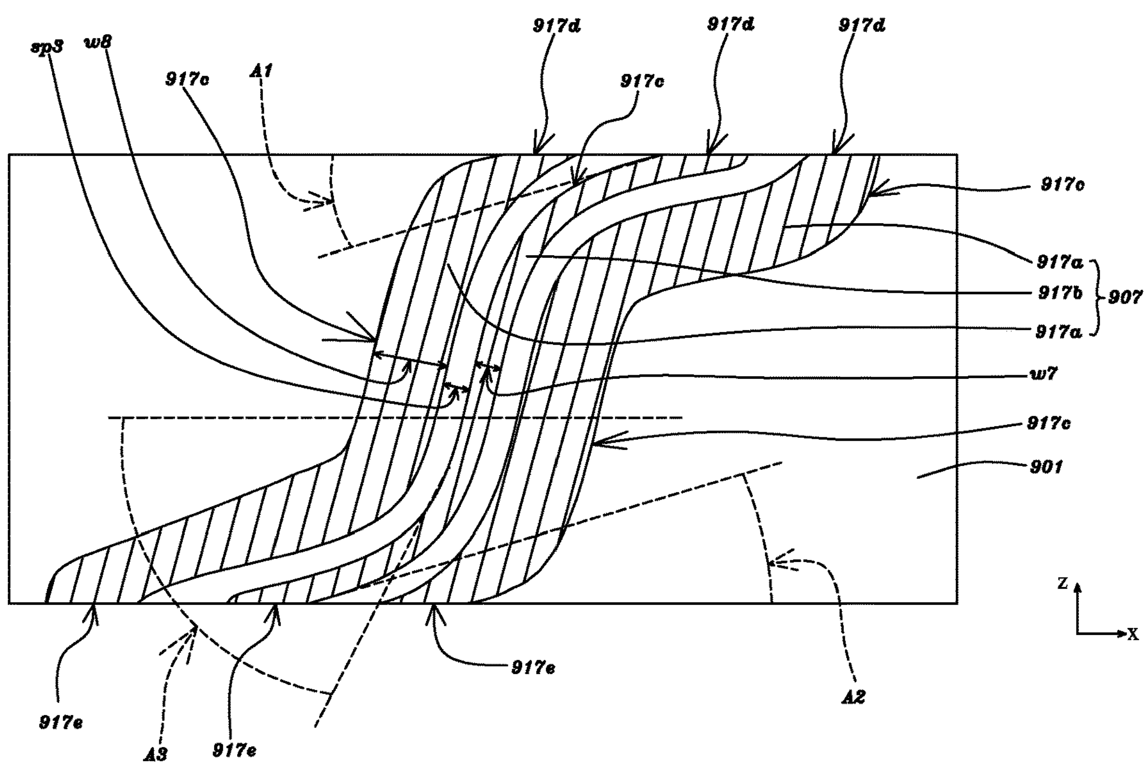

FIG. 6C is a schematically cross-sectional view in an x-z plane showing a fourth type of vertical-through-via (VTV) connector in accordance with an embodiment of the present application. The process for fabricating a fourth type of vertical-through-via (VTV) connector 467 as seen in FIG. 6C may have the same steps as illustrated in FIGS. 4A-4I and 5A-5C, but the interconnection metal layer 907 for the fourth type of vertical-through-via (VTV) connector 467 as seen in FIG. 6C may have a different layout from that for the first type of vertical-through-via (VTV) connector 467 as seen in FIGS. 4A-4I and 5A-5C. For an element indicated by the same reference number shown in FIGS. 4A-4I, 5A-5C and 6A-6C, the specification of the element as seen in FIG. 6C may be referred to that of the element as illustrated in FIGS. 4A-4I, 5A-5C, 6A and 6B. Referring to FIG. 6C, for the fourth type of vertical-through-via (VTV) connector 467 fabricated as illustrated in FIGS. 4A-4I and 5A-5C to be finally placed in the tray 914 as seen in FIG. 4I, its interconnection metal layer 907 may include (1) the ground metal lines 907*c* and signal metal lines 907*d* as illustrated in FIGS. 4A-4I, 5A-5C, 6A and 6B and (2) multiple ground metal lines 917*a* and transmission metal lines 917*b* to replace the ground metal lines 907*a* and transmission metal lines 907*b* respectively as illustrated in FIGS. 4A-4I, 5A-5C, 6A and 6B. Each of the ground metal lines 917*a* and transmission metal lines 917*b* of its interconnection metal layer 907 may include an S-shaped curved portion 917*c* extending from a top metal pad or contact 917*d* thereof with an acute angle A1 from its top surface to a bottom metal pad or contact 917*e* thereof with an acute angle A2 from its bottom surface, wherein the top metal pad or contact 917*d* thereof may have a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and the bottom metal pad or contact 917*e* thereof may have a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910, wherein each of the acute angles A1 and A2 may range from 10 to 60 degrees, from 10 to 30 degrees, from 15 to 45 degrees or from 20 to 60 degrees, wherein the S-shaped curved portion 917*c* thereof may extend, horizontally farther away from the top metal pad or contact 917*d* thereof in the x direction with a gradually larger slope in the x-z plane, from the top metal pad or contact 917*d* thereof to an inflection point thereof and then extend, horizontally more farther away from the top metal pad or contact 917*d* thereof with a gradually smaller slope in the x-z plane, from the inflection point thereof to the bottom metal pad or contact 917*e* thereof, wherein the top metal pad or contact 917*d* thereof may be horizontally offset in the x direction from the bottom metal pad or contact 907*e* thereof, wherein an angle A3 between the S-shaped curved portion 917*c* at the inflection point thereof and a horizontal plane coplanar with its top and bottom surfaces may range from 30 to 85 degrees, from 45 to 70 degrees or from 50 to 85 degrees.

Referring to FIG. 6C, for the fourth type of vertical-through-via (VTV) connector 467, each of its ground metal lines 917*a* may couples to a voltage of ground reference and each of its transmission metal lines 917*b* may be used to transmit signals with a first frequency greater than 10, 20, 30 or 50 GHz, wherein each of its transmission metal lines 917*b* may be arranged between neighboring two of its ground metal lines 917*a*, wherein said neighboring two of its ground metal lines 917*a* may extend in parallel with said each of its transmission metal lines 917*b*, wherein said each of its transmission metal lines 917*b* may have a width w7 between 3 and 50 micrometers, between 3 and 10 micrometers, between 5 and 20 micrometers, between 10 and 50 micrometers or smaller than 5, 10, 20, 30 or 60 micrometers, and each of said neighboring two of its ground metal lines 917*a* may have a width w8 greater than the width w7 of said each of its transmission metal lines 917*b*, wherein the width w8 of each of said neighboring two of its ground metal lines 917*a* may be between 5 and 50 micrometers, between 10 and 20 micrometers or between 15 and 30 micrometers. A space sp3 between said each of its transmission metal lines 917*b* and each of said neighboring two of its ground metal lines 917*a* may be substantially the same as the width w7 of said each of its transmission metal lines 917*b* and smaller than the width w8 of each of said neighboring two of its ground metal lines 917*a*, wherein the space sp3 between said each of its transmission metal lines 917*b* and each of said neighboring two of its ground metal lines 917*a* may be between 5 and 60 micrometers, between 5 and 30 micrometers, between 3 and 20 micrometers, between 10 and 40 micrometers, between 10 and 60 micrometers or smaller than 5, 10, 20, 30 or 60 micrometers. Alternatively, each of its ground metal lines 917*a* may be replaced with a power metal line for coupling to a voltage of power supply, which has the same specifications as those of said each of its ground metal lines 917*a*.

5. Fifth Type of Vertical-Through-Via (VTV) Connector

Figure 6D:
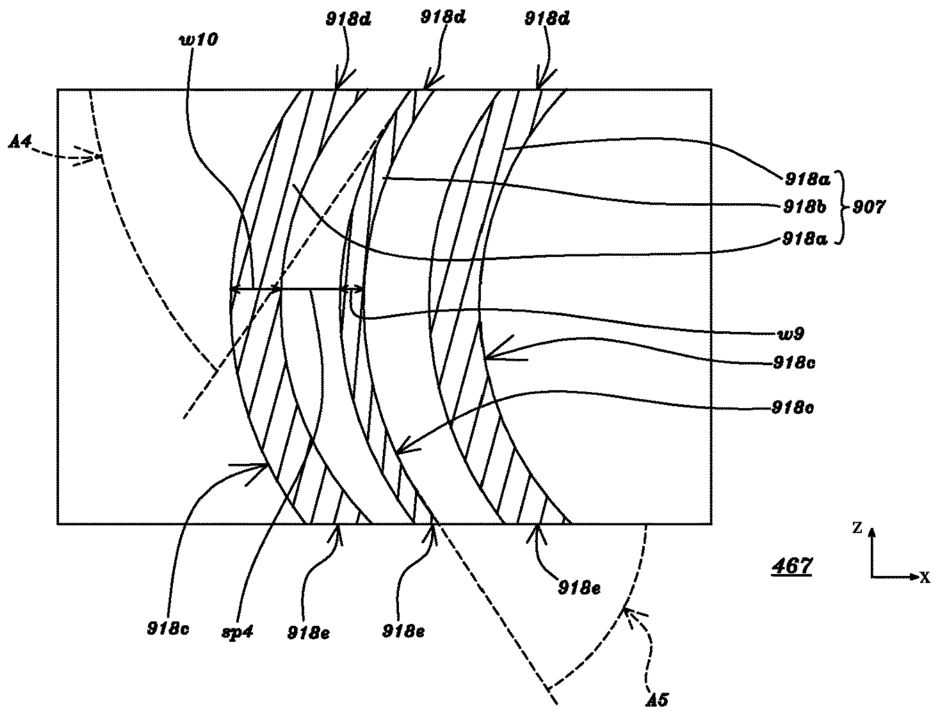

FIG. 6D is a schematically cross-sectional view in an x-z plane showing a fifth type of vertical-through-via (VTV) connector in accordance with an embodiment of the present application. The process for fabricating a fifth type of vertical-through-via (VTV) connector 467 as seen in FIG. 6D may have the same steps as illustrated in FIGS. 4A-4I and 5A-5C, but the interconnection metal layer 907 for the fifth type of vertical-through-via (VTV) connector 467 as seen in FIG. 6D may have a different layout from that those for the first type of vertical-through-via (VTV) connector 467 as seen in FIGS. 4A-4I and 5A-5C. For an element indicated by the same reference number shown in FIGS. 4A-4I, 5A-5C, 6A, 6B and 6D, the specification of the element as seen in FIG. 6D may be referred to that of the element as illustrated in FIGS. 4A-4I, 5A-5C, 6A and 6B. Referring to each of FIG. 6D, for the fifth type of vertical-through-via (VTV) connector 467 fabricated as illustrated in FIGS. 4A-4I and 5A-5C to be finally placed in the tray 914 as seen in FIG. 4I, its interconnection metal layer 907 may include (1) the ground metal lines 907*c* and signal metal lines 907*d* as illustrated in FIGS. 4A-4I, 5A-5C, 6A and 6B and (2) multiple ground metal lines 918*a* and transmission metal lines 918*b* to replace the ground metal lines 907*a* and transmission metal lines 907*b* respectively as illustrated in FIGS. 4A-4I, 5A-5C, 6A and 6B. Each of the ground metal lines 918*a* and transmission metal lines 918*b* of its interconnection metal layer 907 may include a C-shaped curved portion 918*c* extending from a top metal pad or contact 918*d* thereof with an acute angle A4 from its top surface to a bottom metal pad or contact 918*e* thereof with an acute angle A5 from its bottom surface, wherein the top metal pad or contact 918*d* thereof may have a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and the bottom metal pad or contact 918*e* thereof may have a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910, wherein each of the acute angles A4 and A5 may range from 10 to 60 degrees, from 10 to 30 degrees, from 15 to 45 degrees or from 20 to 60 degrees, wherein the C-shaped curved portion 918*c* thereof may extend, horizontally farther away from the top metal pad or contact 918*d* thereof in the x direction with a gradually larger slope in the x-z plane, from the top metal pad or contact 918*d* thereof to a vertical point thereof with a vertical angle from a horizontal plane coplanar with its top and bottom surfaces and then extend, horizontally closer to the top metal pad or contact 918*d* thereof in the x direction with a gradually smaller slope in the x-z plane, from the vertical point thereof to the bottom metal pad or contact 918*e* thereof, wherein the top metal pad or contact 918*d* thereof may be vertically aligned in the z direction with the bottom metal pad or contact 918*e* thereof, and alternatively, the top metal pad or contact 918*d* thereof may be horizontally offset in the x direction from the bottom metal pad or contact 918*e* thereof.

Referring to FIG. 6D, for the fifth type of vertical-through-via (VTV) connector 467, each of its ground metal lines 918*a* may couples to a voltage of ground reference and each of its transmission metal lines 918*b* may be used to transmit signals with a first frequency greater than 10, 20, 30 or 50 GHz, wherein each of its transmission metal lines 918*b* may be arranged between neighboring two of its ground metal lines 918*a*, wherein said neighboring two of its ground metal lines 918*a* may extend in parallel with said each of its transmission metal lines 918*b*, wherein said each of its transmission metal lines 918*b* may have a width w9 between 3 and 50 micrometers, between 3 and 10 micrometers, between 5 and 20 micrometers, between 10 and 50 micrometers or smaller than 5, 10, 20, 30 or 60 micrometers, and each of said neighboring two of its ground metal lines 918*a* may have a width w10 greater than the width w9 of said each of its transmission metal lines 918*b*, wherein the width w10 of each of said neighboring two of its ground metal lines 918*a* may be between 5 and 50 micrometers, between 10 and 20 micrometers or between 15 and 30 micrometers. A space sp4 between said each of its transmission metal lines 918*b* and each of said neighboring two of its ground metal lines 918*a* may be substantially the same as the width w9 of said each of its transmission metal lines 918*b* and smaller than the width w10 of each of said neighboring two of its ground metal lines 918*a*, wherein the space sp4 between said each of its transmission metal lines 918*b* and each of said neighboring two of its ground metal lines 918*a* may be between 5 and 60 micrometers, between 5 and 30 micrometers, between 3 and 20 micrometers, between 10 and 40 micrometers, between 10 and 60 micrometers or smaller than 5, 10, 20, 30 or 60 micrometers. Alternatively, each of its ground metal lines 918*a* may be replaced with a power metal line for coupling to a voltage of power supply, which has the same specifications as those of said each of its ground metal lines 918*a*.

6. Sixth Type of Vertical-Through-Via (VTV) Connector

Figure 6E:
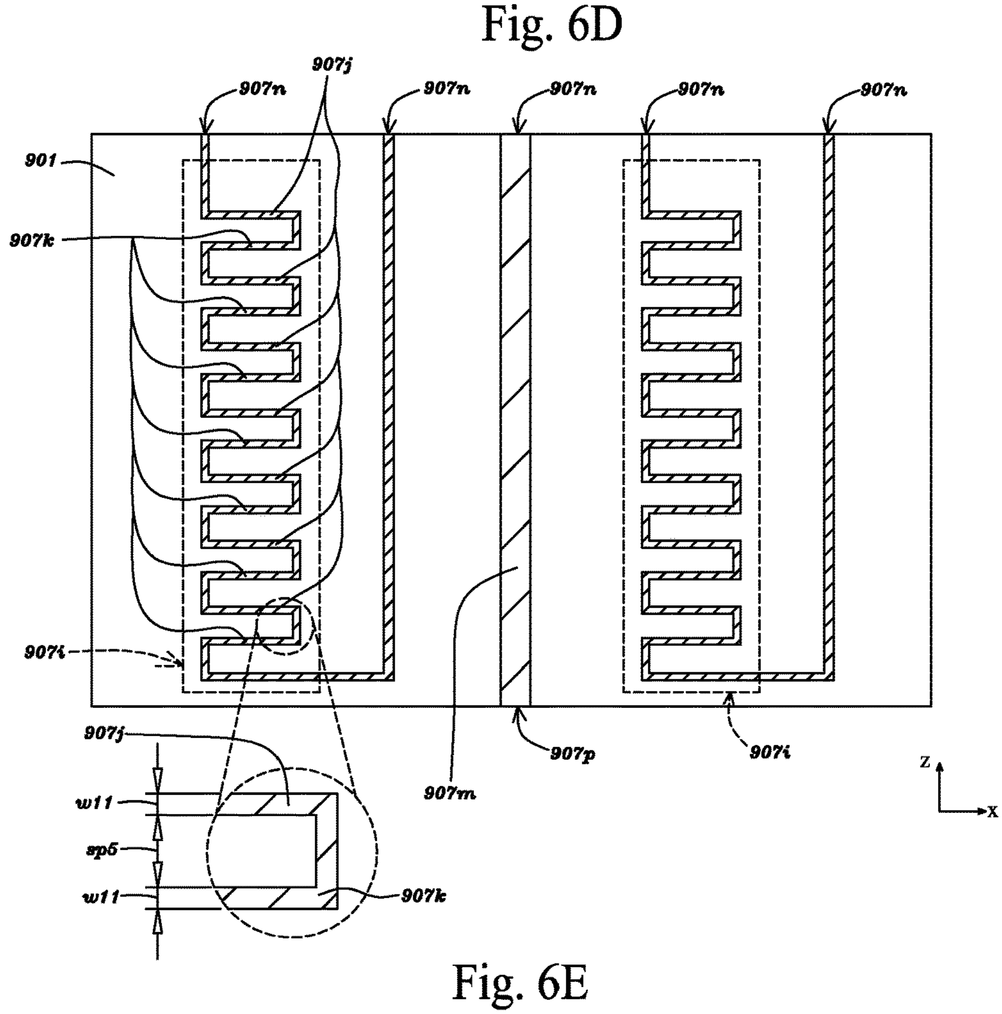

FIG. 6E is a schematically cross-sectional view in an x-z plane showing a sixth type of vertical-through-via (VTV) connector in accordance with an embodiment of the present application. The process for fabricating a sixth type of vertical-through-via (VTV) connector 467 as seen in FIG. 6E may have the same steps as illustrated in FIGS. 4A-4I and 5A-5C, but the interconnection metal layer 907 for the sixth type of vertical-through-via (VTV) connector 467 as seen in FIG. 6E may have a different layout from that for the first type of vertical-through-via (VTV) connector 467 as seen in FIGS. 4A-4I and 5A-5C. For an element indicated by the same reference number shown in FIGS. 4A-4I, 5A-5C and 6A-6E, the specification of the element as seen in FIG. 6E may be referred to that of the element as illustrated in FIGS. 4A-4I, 5A-5C and 6A-6D. Referring to each of FIG. 6E, for the sixth type of vertical-through-via (VTV) connector 467 fabricated as illustrated in FIGS. 4A-4I and 5A-5C to be finally placed in the tray 914 as seen in FIG. 4I, its interconnection metal layer 907 may include (1) the ground metal lines 907*a* and 907*c*, transmission metal lines 907*b* and signal metal lines 907*d* as illustrated in FIGS. 4A-4I, 5A-5C, 6A and 6B, (2) the ground metal lines 907*c* and 917*a*, transmission metal lines 917*b* and signal metal lines 907*d* as illustrated in FIGS. 4A-4I, 5A-5C and 6A-6C or (3) the ground metal lines 907*c* and 918*a*, transmission metal lines 918*b* and signal metal lines 907*d* as illustrated in FIGS. 4A-4I, 5A-5C, 6A, 6B and 6D, and may further include (1) multiple planar antennas 907*i* each having a first group of horizontally longitudinal portions 907*j* extending in the x direction and in parallel and a second group of horizontally longitudinal portions 907*k* extending in the x direction and in parallel, wherein each of the second group of horizontally longitudinal portions 907*k* may be arranged between neighboring two of the first group of horizontally longitudinal portions 907*j* and have a right terminal coupling to a right terminal of an upper one of the neighboring two of the first group of horizontally longitudinal portions 907*j* and a left terminal coupling to a left terminal of a lower one of the neighboring two of the first group of horizontally longitudinal portions 907*k*, wherein each of the first and second groups of horizontally longitudinal portions 907*j* and 907*k* may have a width w11 between 3 and 50 micrometers, between 3 and 10 micrometers, between 5 and 20 micrometers, between 10 and 50 micrometers or smaller than 5, 10, 20, 30 or 60 micrometers, and a space sp5 between said each of the second group of horizontally longitudinal portions 907*k* and each of the neighboring two of the first group of horizontally longitudinal portions 907*j* may be between 5 and 60 micrometers, between 5 and 30 micrometers, between 3 and 20 micrometers, between 10 and 40 micrometers, between 10 and 60 micrometers or smaller than 5, 10, 20, 30 or 60 micrometers, (2) one or more ground metal lines 907*m* vertically extending in the z direction each between neighboring two of the planar antennas 907*i*, (3) multiple top metal pads or contacts 907*n* each having a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, wherein each of its planar antennas 907*i* may have an upper terminal coupling to one of its top metal pads or contacts 907*n* and a lower terminal coupling to another of its top metal pads or contacts 907*n*, and (4) multiple bottom metal pads or contacts 907*p* each having a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910, wherein each of its ground metal lines 907*m* may couple to one of its top metal pads or contacts 907*n* at a top thereof and to one of its bottom metal pads or contacts 907*p* at a bottom thereof. Alternatively, each of its ground metal lines 907*m* may be replaced with a power metal line for coupling to a voltage of power supply, which has the same specifications as those of said each of its ground metal lines 907*m*.

7. Seventh Type of Vertical-Through-Via (VTV) Connector

Figure 6F:
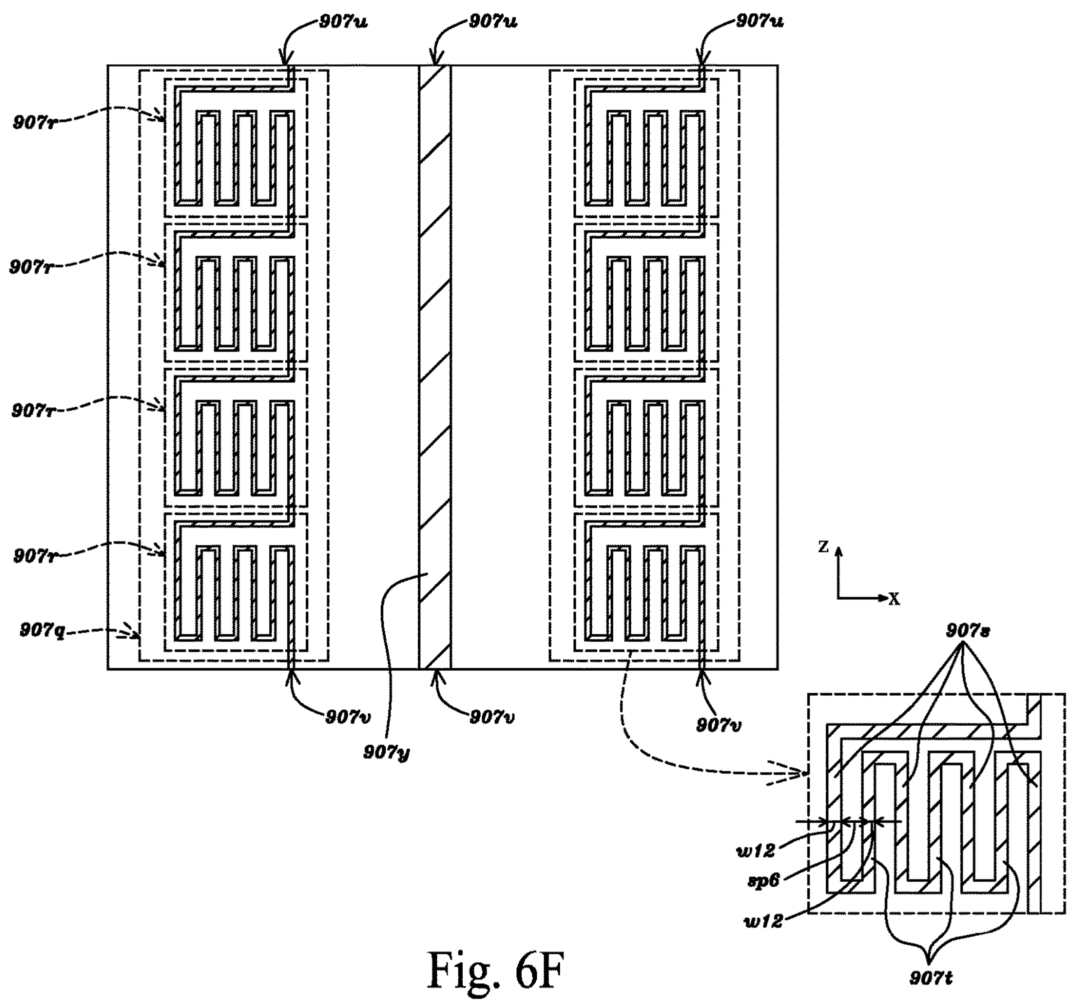

FIG. 6F is a schematically cross-sectional view in an x-z plane showing a seventh type of vertical-through-via (VTV) connector in accordance with an embodiment of the present application. The process for fabricating a seventh type of vertical-through-via (VTV) connector 467 as seen in FIG. 6F may have the same steps as illustrated in FIGS. 4A-4I and 5A-5C, but the interconnection metal layer 907 for the seventh type of vertical-through-via (VTV) connector 467 as seen in FIG. 6F may have a different layout from that for the first type of vertical-through-via (VTV) connector 467 as seen in FIGS. 4A-4I and 5A-5C. For an element indicated by the same reference number shown in FIGS. 4A-4I, 5A-5C, 6A-6D and 6F, the specification of the element as seen in FIG. 6F may be referred to that of the element as illustrated in FIGS. 4A-4I, 5A-5C and 6A-6D. Referring to each of FIG. 6F, for the seventh type of vertical-through-via (VTV) connector 467 fabricated as illustrated in FIGS. 4A-4I and 5A-5C to be finally placed in the tray 914 as seen in FIG. 4I, its interconnection metal layer 907 may include (1) the ground metal lines 907*a* and 907*c*, transmission metal lines 907*b* and signal metal lines 907*d* as illustrated in FIGS. 4A-4I, 5A-5C, 6A and 6B, (2) the ground metal lines 907*c* and 917*a*, transmission metal lines 917*b* and signal metal lines 907*d* as illustrated in FIGS. 4A-4I, 5A-5C and 6A-6C or (3) the ground metal lines 907*c* and 918*a*, transmission metal lines 918*b* and signal metal lines 907*d* as illustrated in FIGS. 4A-4I, 5A-5C, 6A, 6B and 6D, and may further include (1) multiple planar antennas 907*q* each including multiple antenna units 907*r* arranged in a line and coupled in series, wherein each of the antenna units 907*r* may have a first group of vertically longitudinal portions 907*s* extending in the z direction and in parallel and a second group of vertically longitudinal portions 907*t* extending in the z direction and in parallel, wherein each of the second group of vertically longitudinal portions 907*t* may be arranged between neighboring two of the first group of vertically longitudinal portions 907*s* and have a bottom terminal coupling to a bottom terminal of a left one of the neighboring two of the first group of vertically longitudinal portions 907*s* and a top terminal coupling to a top terminal of a right one of the neighboring two of the first group of vertically longitudinal portions 907*s*, wherein each of the first and second groups of horizontally longitudinal portions 907*s* and 907*t* may have a width w12 between 3 and 50 micrometers, between 3 and 10 micrometers, between 5 and 20 micrometers, between 10 and 50 micrometers or smaller than 5, 10, 20, 30 or 60 micrometers, and a space sp6 between said each of the second group of vertically longitudinal portions 907*t* and each of the neighboring two of the first group of vertically longitudinal portions 907*s* may be between 5 and 60 micrometers, between 5 and 30 micrometers, between 3 and 20 micrometers, between 10 and 40 micrometers, between 10 and 60 micrometers or smaller than 5, 10, 20, 30 or 60 micrometers, wherein a lower one of the antenna units 907*r* of each of the planar antennas 907*q* may have the leftmost one of the first group of vertically longitudinal portions 907*s* coupling to the rightmost one of the first group of vertically longitudinal portions 907*s* of an upper one of the antenna units 907*r* of said each of the planar antennas 907*q*, (2) one or more ground metal lines 907*y* vertically extending in the z direction each between neighboring two of the planar antennas 907*q*, (3) multiple top metal pads or contacts 907*u* each having a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and (4) multiple bottom metal pads or contacts 907*v* each having a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910. A topmost one of the antenna units 907*r* of each of its planar antennas 907*q* may have the leftmost one of the first group of vertically longitudinal portions 907*s* coupling to one of its top metal pads or contacts 907*u*, and a bottommost one of the antenna units 907*r* of said each of its planar antennas 907*q* may have the rightmost one of the first group of vertically longitudinal portions 907*s* coupling to one of its bottom metal pads or contacts 907*v*, wherein said one of its top metal pads or contacts 907*u* may be vertically aligned in the z direction with said one of its bottom metal pads or contacts 907*v*, and alternatively, said one of its top metal pads or contacts 907*u* may be horizontally offset in the x direction from said one of its bottom metal pads or contacts 907*v*. Each of its ground metal lines 907*y* may couple to one of its top metal pads or contacts 907*u* at a top thereof and to one of its bottom metal pads or contacts 907*v* at a bottom thereof. Alternatively, each of its ground metal lines 907*y* may be replaced with a power metal line for coupling to a voltage of power supply, which has the same specifications as those of said each of its ground metal lines 907*y*.

8. Eighth Type of Vertical-Through-Via (VTV) Connector

Figure 7A:
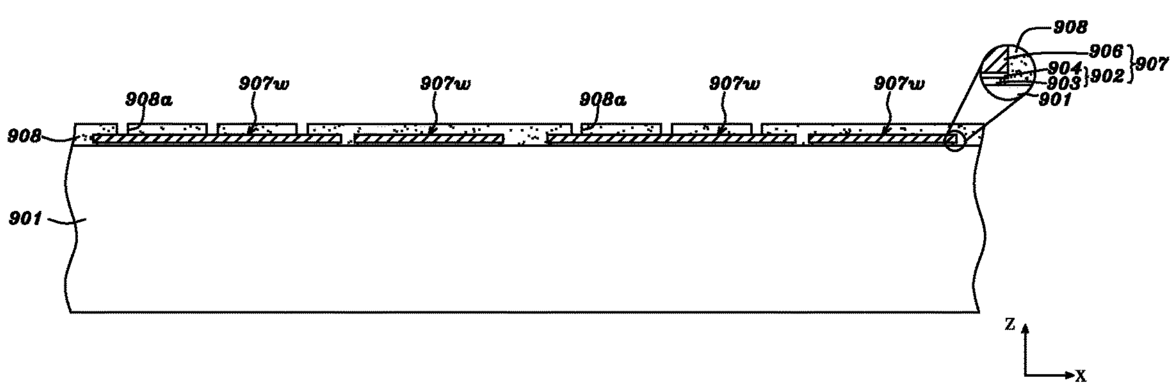
FIGS. 7A-7F and 7H are schematically cross-sectional views in an x-z plane showing a process for fabricating an eighth type of vertical-through-via (VTV) connector in accordance with an embodiment of the present application.

FIGS. 7A-7F and 7H are schematically cross-sectional views in an x-z plane showing a process for fabricating an eighth type of vertical-through-via (VTV) connector in accordance with an embodiment of the present application. FIGS. 7G and 7I are schematically cross-sectional views in a y-z plane showing a process for fabricating an eighth type of vertical-through-via (VTV) connector in accordance with an embodiment of the present application. Referring to FIG. 7A, a supporting substrate 901 as illustrated in FIG. 4A may be provided. Next, a lower interconnection metal layer 907 may be formed on a top surface of the supporting substrate 901 by the same process as is performed to form the interconnection metal layer 907 as illustrated in FIGS. 4A and 4B, but may have a different layout from that for the first type of vertical-through-via (VTV) connector 467 as seen in FIGS. 4A-4I and 5A-5C. For example, the lower interconnection metal layer 907 may include multiple ground planes 907*w* for coupling to a voltage of ground reference. Alternatively, each of the ground planes 907*w* may be replaced with a power plane for coupling to a voltage of power supply, which has the same specifications as those of said each of the ground planes 907*w*. Next, a lower insulating dielectric layer 908, or polymer layer, may be formed on the top surface of the supporting substrate 901 with covering the lower interconnection metal layer 907 by the same process as is performed to form the insulating dielectric layer 908 as illustrated in FIG. 4C, but may have a different pattern from that for the first type of vertical-through-via (VTV) connector 467 as seen in FIGS. 4A-4I and 5A-5C. For example, multiple openings 908*a* may be formed in the lower insulating dielectric layer 908, and each of the openings 908*a* in the lower insulating dielectric layer 908 may expose one of the ground planes 907*w*.

Figure 7B:
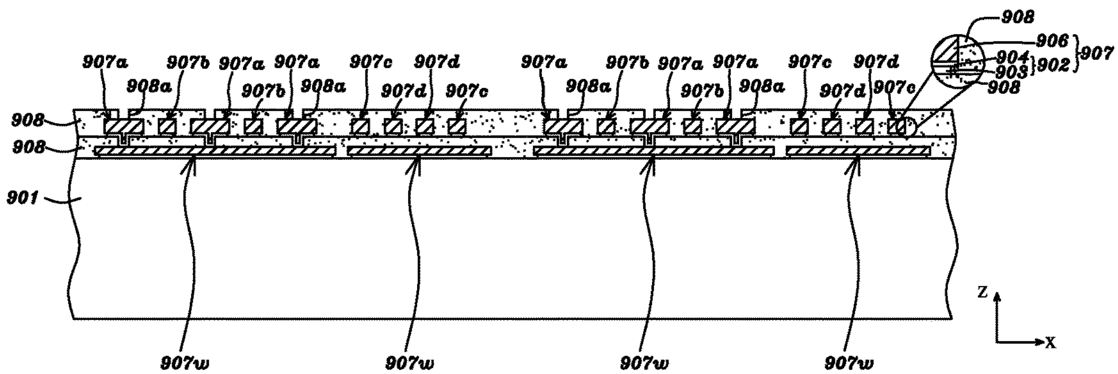

Next, referring to FIG. 7B, a middle interconnection metal layer 907 may be formed on the lower insulating dielectric layer 908 and over the lower interconnection metal layer 907 by the same process as is performed to form the interconnection metal layer 907 as illustrated in FIGS. 4A and 4B, and may have the same layout as that for the first type of vertical-through-via (VTV) connector 467 as seen in FIGS. 4A-4I and 5A-5C. Alternatively, the middle interconnection metal layer 907 may have the same layout as that for any of the second through seventh types of vertical-through-via (VTV) connectors 467 as seen in FIGS. 6A-6F. Each of the ground metal lines 907*a*, 907*c*, 907*m*, 907*t*, 917*a* or 918*a* of the middle interconnection metal layer 907 having the layout as illustrated in FIGS. 4A-4I, 5A-5C and 6A-6F may couple to one of the ground planes 907*w* of the lower interconnection metal layer 907 through one or more of the openings 908*a* in the lower insulating dielectric layer 908. Next, a middle insulating dielectric layer 908, or polymer layer, may be formed on a top surface of the lower insulating dielectric layer 908 with covering the middle interconnection metal layer 907 by the same process as is performed to form the insulating dielectric layer 908 as illustrated in FIG. 4C, but may have a different pattern from that for the first type of vertical-through-via (VTV) connector 467 as seen in FIGS. 4A-4I and 5A-5C. For example, multiple openings 908*a* may be formed in the middle insulating dielectric layer 908, and each of the openings 908*a* in the middle insulating dielectric layer 908 may expose one of the ground metal lines 907*a*, 907*c*, 907*m*, 907*t*, 917*a* or 918*a* of the middle interconnection metal layer 907.

Figure 7C:
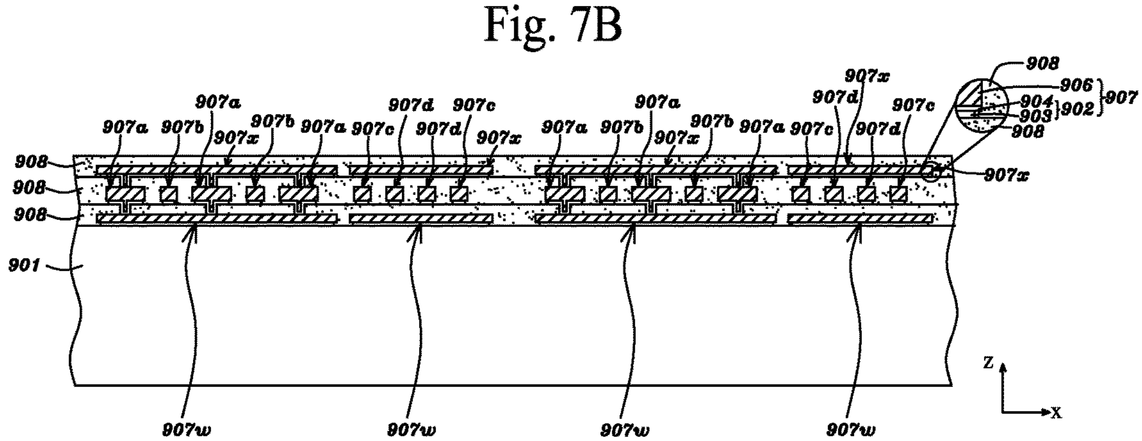

Next, referring to FIG. 7C, an upper interconnection metal layer 907 may be formed on the middle insulating dielectric layer 908 and over the middle interconnection metal layer 907 by the same process as is performed to form the interconnection metal layer 907 as illustrated in FIGS. 4A and 4B, but may have a different layout from that for the first type of vertical-through-via (VTV) connector 467 as seen in FIGS. 4A-4I and 5A-5C. For example, the upper interconnection metal layer 907 may include multiple ground planes 907*x* for coupling to a voltage of ground reference. Each of the ground metal lines 907*a*, 907*c*, 907*m*, 907*t*, 917*a* or 918*a* of the middle interconnection metal layer 907 having the layout as illustrated in FIGS. 4A-4I, 5A-5C and 6A-6F may couple to one of the ground planes 907*x* of the upper interconnection metal layer 907 through one or more of the openings 908*a* in the middle insulating dielectric layer 908. Accordingly, each of the transmission metal lines 907*b*, 917*b* and 918*b* may be arranged in a surrounding structure composed of two of the ground metal lines 907*a*, 917*a* or 918*a* at its left and right sides, one of the ground planes 907*w* at its lower side, one of the ground planes 907*x* at its upper side, multiple metal vias in multiple of the openings 908*a* in the middle insulating dielectric layer 908 coupling said two of the ground metal lines 907*a*, 917*a* or 918*a* to said one of the ground planes 907*x*, and multiple metal vias in multiple of the openings 908*a* in the lower insulating dielectric layer 908 coupling said two of the ground metal lines 907*a*, 917*a* or 918*a* to said one of the ground planes 907*w*. Alternatively, each of the ground metal lines 907*a*, 907*c*, 907*m*, 907*t*, 917*a* or 918*a* of the middle interconnection metal layer 907 having the layout as illustrated in FIGS. 4A-4I, 5A-5C and 6A-6F may be replaced with a power metal line for coupling to a voltage of power supply, and each of the ground planes 907*w* and 907*x* may be replaced with a power plane for coupling to the voltage of power supply. Next, an upper insulating dielectric layer 908, or polymer layer, may be optionally formed on a top surface of the middle insulating dielectric layer 908 with covering the upper interconnection metal layer 907 by the same process as is performed to form the insulating dielectric layer 908 as illustrated in FIG. 4C.

Figure 7D:
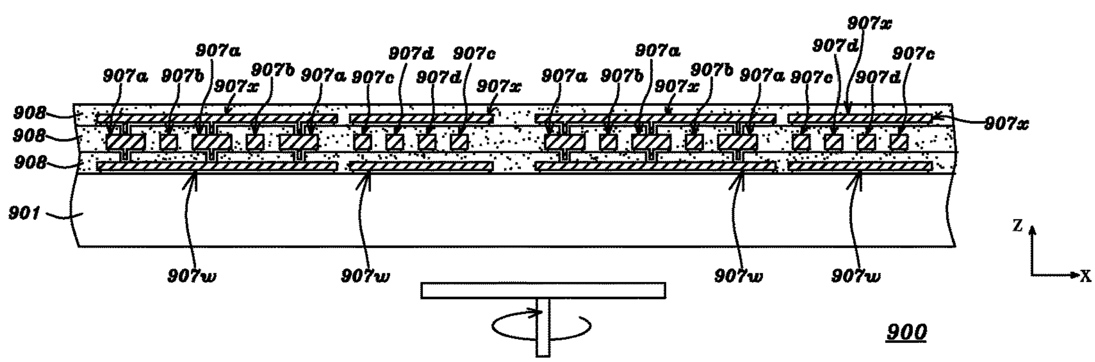

Next, referring to FIG. 7D, a chemical mechanical polishing (CMP), polishing or grinding process may be optionally applied to remove a bottom portion of the supporting substrate 901, planarize a bottom surface of the supporting substrate 901 and to thin the supporting substrate 901 to make the supporting substrate 901 thinned with a thickness between 30 and 400 micrometers, between 50 and 200 micrometers or between 30 and 100 micrometers. The structure as seen in FIG. 7D is called herein as a second type of metal-trance-on-substrate (MTOSub) unit 900.

Figure 7E:
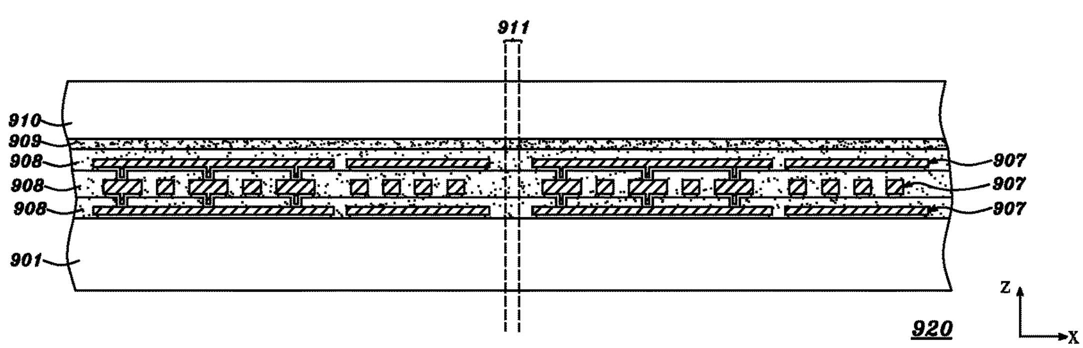
Figure 7F:
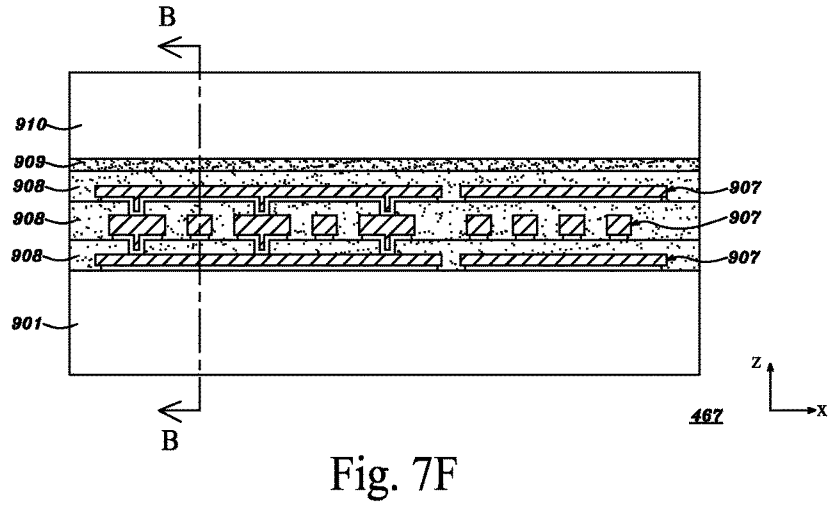

Next, referring to FIG. 7E, if the second type of metal-trance-on-substrate (MTOSub) unit 900 is formed with the upper insulating dielectric layer 908, an adhesive polymer layer 909 may be provided to mount a covering substrate 910 to the second type of metal-trance-on-substrate (MTOSub) unit 900 by laminating a dry film of polyimide, epoxy, polybenzoxazole (PBO) or benzocyclobutene (BCB) onto a top surface of the upper insulating dielectric layer 908 of the second type of metal-trance-on-substrate (MTOS) unit 900, next placing the covering substrate 910 on a top surface of the dry film and then curing or crosslinking the dry film into the adhesive polymer layer 909 to bond the adhesive polymer layer 909 to a bottom surface of the covering substrate 910 and bond the adhesive polymer layer 909 to the top surface of the upper insulating dielectric layer 908 of the second type of metal-trance-on-substrate (MTOS) unit 900, or by spin-on coating, screen-printing or dispensing a precursor layer of polyimide, epoxy, polybenzoxazole (PBO) or benzocyclobutene (BCB) on the top surface of the upper insulating dielectric layer 908 of the second type of metal-trance-on-substrate (MTOS) unit 900, next placing the covering substrate 910 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the upper insulating dielectric layer 908 of the second type of metal-trance-on-substrate (MTOS) unit 900. Alternatively, if the second type of metal-trance-on-substrate (MTOSub) unit 900 is formed without the upper insulating dielectric layer 908, the adhesive polymer layer 909 may be provided to mount the covering substrate 910 to the second type of metal-trance-on-substrate (MTOSub) unit 900 by laminating a dry film of polyimide, epoxy, polybenzoxazole (PBO) or benzocyclobutene (BCB) onto a top surface of the middle insulating dielectric layer 908 of the second type of metal-trance-on-substrate (MTOS) unit 900 and a top surface of the upper interconnection metal layer 907 of the second type of metal-trance-on-substrate (MTOS) unit 900, next placing the covering substrate 910 on a top surface of the dry film and then curing or crosslinking the dry film into the adhesive polymer layer 909 to bond the adhesive polymer layer 909 to the bottom surface of the covering substrate 910 and bond the adhesive polymer layer 909 to the top surface of the middle insulating dielectric layer 908 of the second type of metal-trance-on-substrate (MTOS) unit 900 and the top surface of the upper interconnection metal layer 907 of the second type of metal-trance-on-substrate (MTOS) unit 900, or by spin-on coating, screen-printing or dispensing a precursor layer of polyimide, epoxy, polybenzoxazole (PBO) or benzocyclobutene (BCB) on the top surface of the middle insulating dielectric layer 908 of the second type of metal-trance-on-substrate (MTOS) unit 900 and the top surface of the upper interconnection metal layer 907 of the second type of metal-trance-on-substrate (MTOS) unit 900, next placing the covering substrate 910 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the middle insulating dielectric layer 908 of the second type of metal-trance-on-substrate (MTOS) unit 900 and the top surface of upper the interconnection metal layer 907 of the second type of metal-trance-on-substrate (MTOS) unit 900. The adhesive polymer layer 909 may have the same specification as one illustrated in FIG. 4E and the covering substrate 910 may have the same specification as one illustrated in FIG. 4E. The structure as seen in FIG. 7E is called herein as a second type of vertical-through-via (VTV) substrate, panel or wafer 920. The second type of vertical-through-via (VTV) substrate, panel or wafer 920 may be defined with multiple first reserved scribe lines 911 extending in a y direction and multiple second reserved scribe lines (not shown but similar to ones 912 of the first type of vertical-through-via (VTV) substrate, panel or wafer 920 as illustrated in FIGS. 4A-4I and 5A-5C) extending in a x direction vertical to the y direction, wherein each of its lower, middle and upper interconnection metal layers 907 may include multiple duplicated circuit portions having the same circuit pattern, each between neighboring two of its first reserved scribe lines 911, and a space between each neighboring two of its second reserved scribe lines may be arbitrarily determined by customers in case of its middle interconnection metal layer 907 having the same layout as the interconnection metal layer 907 of the first type of vertical-through-via (VTV) substrate, panel or wafer 920 as illustrated in FIGS. 4A-4I and 5A-5C.

Next, an eighth type of vertical-through-via (VTV) connector 467 to be processed from the second type of vertical-through-via (VTV) substrate, panel or wafer 920 as seen in FIG. 7E may have a size to be selected or determined from various sizes after the lower, middle and upper interconnection metal layers 907 of the second type of vertical-through-via (VTV) substrate, panel or wafer 920 are formed. When a size for the eighth type of vertical-through-via (VTV) connectors 467 is selected or determined, the second type of vertical-through-via (VTV) substrate, panel or wafer 920 as seen in FIG. 7E may be placed onto a dicing tape or carrier (not shown but like one 913 shown in FIG. 4F) and then cut or diced therethrough along some or all of the first reserved scribe lines 911 and all of the second reserved scribe lines 912 to separate the eighth type of vertical-through-via (VTV) connectors 467 in a single-die type as seen in FIG. 7F by a laser cutting process or by a mechanical cutting process.

Figure 7H:
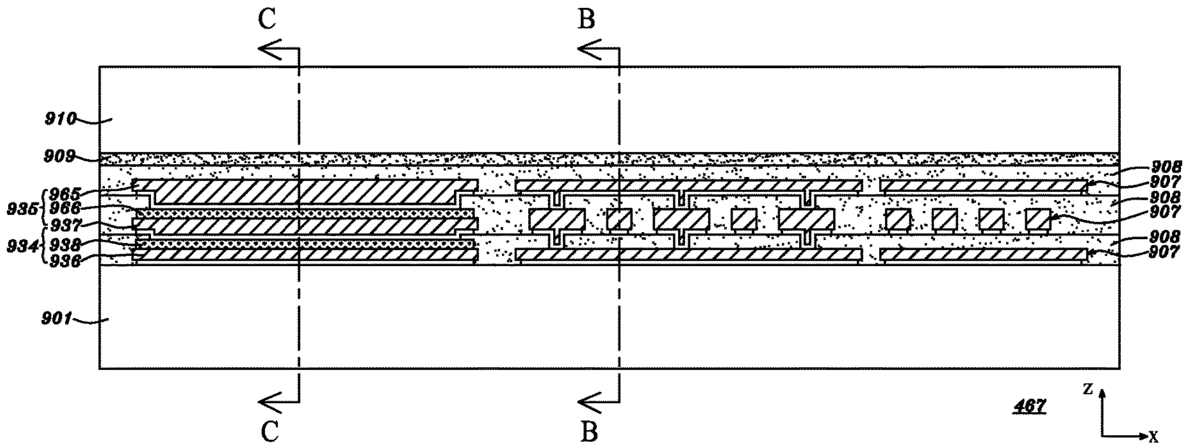
Figure 7G:
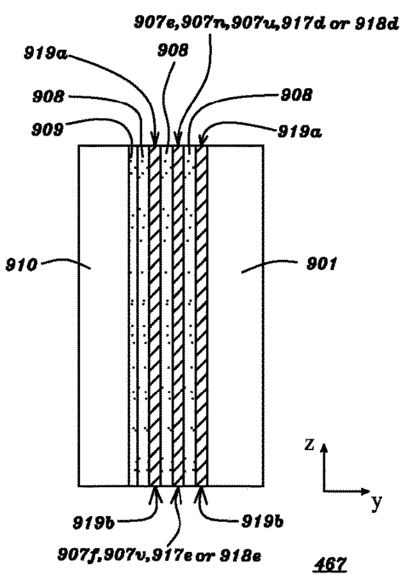
FIGS. 7G and 7I are schematically cross-sectional views in a y-z plane showing a process for fabricating an eighth type of vertical-through-via (VTV) connector in accordance with an embodiment of the present application.
Figure 7I:
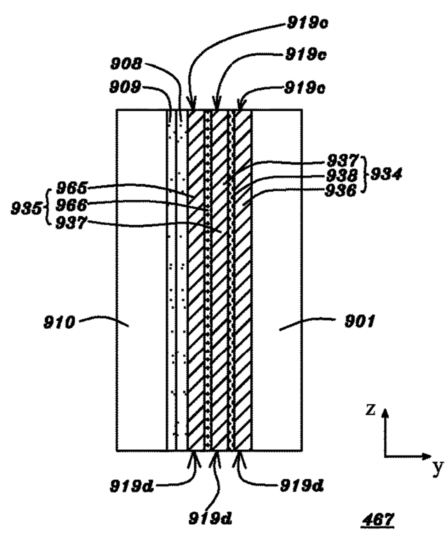

Furthermore, referring to FIG. 7H, the eighth type of vertical-through-via (VTV) connector 467 may be formed with two capacitors, i.e., first and second capacitors 934 and 935, aligned in the z direction. For the eighth type of vertical-through-via (VTV) connector 467, its first capacitor 934 may include (1) two electrodes 936 and 937 provided by its lower and middle interconnection metal layers 907 respectively and (2) a dielectric layer 938 between the two electrodes 936 and 937 of its first capacitor 934. Its second capacitor 935 may include (1) two electrodes 937 and 965 provided by its middle and upper interconnection metal layers 907 respectively and (2) a dielectric layer 966 between the two electrodes 937 and 965 of its second capacitor 935. The dielectric layer 938 or 966 of each of its first and second capacitors 934 and 935 may be formed of a single layer of titanium dioxide, tantalum pentoxide, silicon nitride, silicon dioxide or a polymer, or a composite layer made of the previously described materials, with a thickness in the z direction larger than 10 angstroms, such as between 10 and 50 angstroms, between 50 and 1,000 angstroms or between 100 and 10,000 angstroms, by a chemical vapor deposition (CVD) process. For an example, the electrode 936 of its first capacitor 934 and the electrode 965 of its second capacitor 935 may couple to a voltage of ground reference and the common electrode 937 of its first and second capacitors 934 and 935 may couple to a voltage of power supply. For another example, the electrode 936 of its first capacitor 934 and the electrode 965 of its second capacitor 935 may couple to a voltage of power supply and the common electrode 937 of its first and second capacitors 934 and 935 may couple to a voltage of ground reference.

Next, referring to FIGS. 7F and 7H, each of the eighth type of vertical-through-via (VTV) connectors 467 may have a first surface in an x-y plane at a top thereof to be picked up by a pick-up tip and then moved in a z direction. Next, said each of the eighth type of vertical-through-via (VTV) connectors 467 may be rotated by the pick-up tip by 90 degrees clockwise in a y-z plane as seen in FIGS. 7G and 7I, wherein FIG. 7G is a cross-sectional view along a cross-sectional line B-B of each of FIGS. 7F and 7H and FIG. 7I is a cross-sectional view along a cross-sectional line C-C of FIG. 7H. Next, said each of the eighth type of vertical-through-via (VTV) connectors 467 may have a second surface in an x-y plane at a top thereof to be picked up by a place tip and then to be placed in a tray (not shown but like one 914 shown in FIG. 4I). Thereby, for each of the eighth type of vertical-through-via (VTV) connectors 467, each of its top metal pads or contacts 907*e*, 907*n*, 907*u*, 917*d* and 918*d* as illustrated in FIGS. 4A-4I, 5A-5C and 6A-6F may have a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and each of its bottom metal pads or contacts 907*f*, 907*v*, 917*e* and 918*e* as illustrated in FIGS. 4A-4I, 5A-5C and 6A-6F may have a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910. Each of its ground planes 907*w* and 907*x* may include a top metal pad or contact 919*a* having a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and a bottom metal pad or contact 919*b* having a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910. Each of the electrodes 936, 937 and 965 of its first and second capacitors 934 and 935 may include a top metal pad or contact 919*c* having a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and a bottom metal pad or contact 919*d* having a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910. A vertical distance between the top and bottom surfaces of each of its supporting substrate 901 and covering substrate 910 may be between 20 and 500 micrometers or between 20 and 3,000 micrometers.

9. Ninth Type of Vertical-Through-Via (VTV) Connector

Figure 8A:
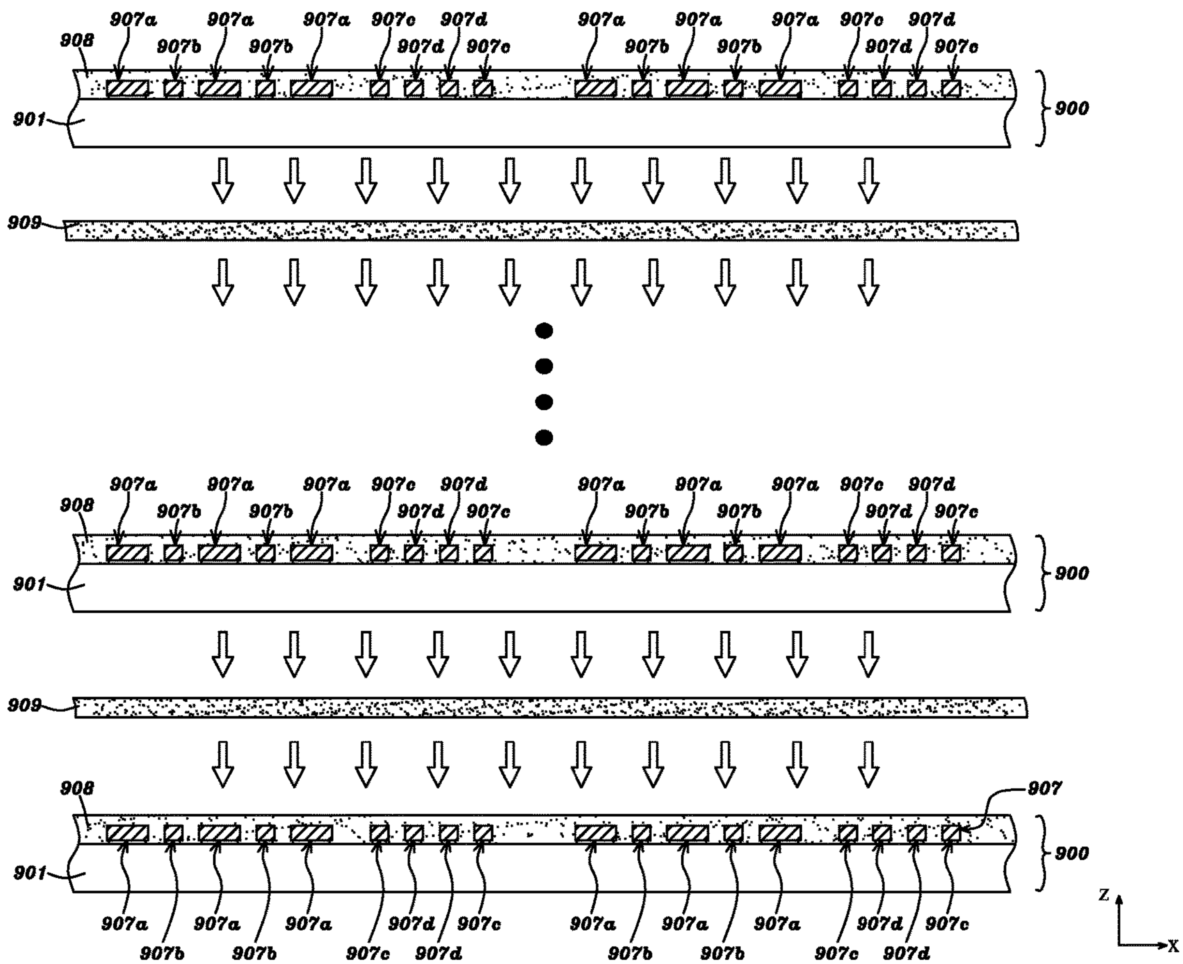
FIGS. 8A-8D are schematically cross-sectional views in an x-z plane showing a process for fabricating a ninth type of vertical-thro ugh-via (VTV) connector in accordance with an embodiment of the present application.
Figure 8B:
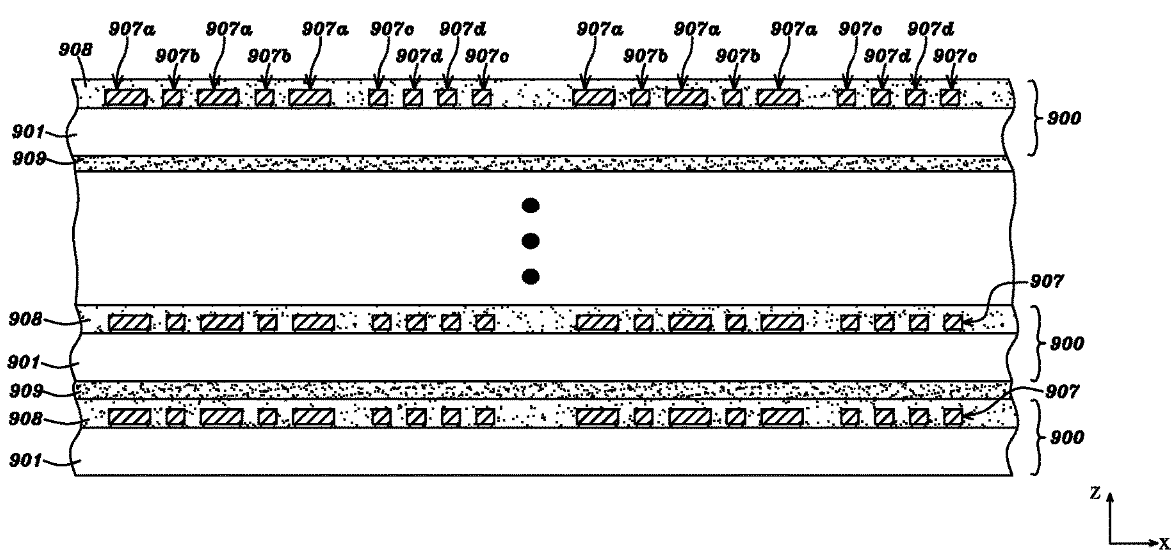

FIGS. 8A-8D are schematically cross-sectional views in an x-z plane showing a process for fabricating a ninth type of vertical-thro ugh-via (VTV) connector in accordance with an embodiment of the present application. FIG. 8E is a schematically cross-sectional view in a y-z plane showing a process for fabricating a ninth type of vertical-through-via (VTV) connector in accordance with an embodiment of the present application. Multiple first and/or second types of metal-trance-on-substrate (MTOSub) units 900 as illustrated in FIGS. 4D and/or 7D may be stacked with each other or one another, that is, either of the first and second types of metal-trance-on-substrate (MTOSub) units 900 may be stacked over either of the first and second types of metal-trance-on-substrate (MTOSub) units 900. In particular, FIGS. 8A-8E show multiple of the first type of metal-trance-on-substrate (MTOSub) units 900 as illustrated in FIG. 4D are provided to be stacked with each other or one another to fabricate the ninth type of vertical-through-via (VTV) connector; FIG. 8F shows a ninth type of vertical-through-via (VTV) connector processed from two of the first type of metal-trance-on-substrate (MTOSub) units 900 as illustrated in FIG. 4D and one of the second type of metal-trance-on-substrate (MTOSub) units 900 as illustrated in FIG. 7D arranged between said two of the first type of metal-trance-on-substrate (MTOSub) units 900. Referring to FIGS. 4D, 7D, 8A and 8F, if a lower one of the first and/or second types of metal-trance-on-substrate (MTOSub) units 900 is formed with the or the upper insulating dielectric layer 908, an adhesive polymer layer 909 may be provided to mount the supporting substrate 901 of an upper one of the first and/or second types of metal-trance-on-substrate (MTOSub) units 900 to the lower one of the first and/or second types of metal-trance-on-substrate (MTOSub) units 900 by laminating a dry film of polyimide, epoxy, polybenzoxazole (PBO) or benzocyclobutene (BCB) onto a top surface of the or the upper insulating dielectric layer 908 of the lower one of the first and/or second types of metal-trance-on-substrate (MTOSub) units 900, next placing the upper one of the first and/or second types of metal-trance-on-substrate (MTOSub) units 900 on a top surface of the dry film and then curing or crosslinking the dry film into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to a bottom surface of the supporting substrate 901 of the upper one of the first and/or second types of metal-trance-on-substrate (MTOSub) units 900 and bond the adhesive polymer layer 909 to the top surface of the or the upper insulating dielectric layer 908 of the lower one of the first and/or second types of metal-trance-on-substrate (MTOSub) units 900, as seen in FIGS. 8B and 8F, or by spin-on coating, screen-printing or dispensing a precursor layer of polyimide, epoxy, polybenzoxazole (PBO) or benzocyclobutene (BCB) on the top surface of the or the upper insulating dielectric layer 908 of the lower one of the first and/or second types of metal-trance-on-substrate (MTOSub) units 900, next placing the upper one of the first and/or second types of metal-trance-on-substrate (MTOSub) units 900 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the supporting substrate 901 of the upper one of the first and/or second types of metal-trance-on-substrate (MTOSub) units 900 and bond the adhesive polymer layer 909 to the top surface of the or the upper insulating dielectric layer 908 of the lower one of the first and/or second types of metal-trance-on-substrate (MTOSub) units 900, as seen in FIGS. 8B and 8F. The adhesive polymer layer 909 may have the same specification as one illustrated in FIG. 4E.

Alternatively, if a lower one of the first and/or second types of metal-trance-on-substrate (MTOSub) units 900 is formed without the or the upper insulating dielectric layer 908, an adhesive polymer layer 909 may be provided to mount the supporting substrate 901 of an upper one of the first and/or second types of metal-trance-on-substrate (MTOSub) units 900 to the lower one of the first and/or second types of metal-trance-on-substrate (MTOSub) units 900 by laminating a dry film of polyimide, epoxy, polybenzoxazole (PBO) or benzocyclobutene (BCB) onto a top surface of the supporting substrate 901 or middle insulating dielectric layer 908 of the lower one of the first and/or second types of metal-trance-on-substrate (MTOS) units 900 and a top surface of the or the upper interconnection metal layer 907 of the lower one of the first and/or second types of metal-trance-on-substrate (MTOS) units 900, next placing the upper one of the first and/or second types of metal-trance-on-substrate (MTOS) units 900 on a top surface of the dry film and then curing or crosslinking the dry film into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the supporting substrate 901 of the upper one of the first and/or second types of metal-trance-on-substrate (MTOS) units 900 and bond the adhesive polymer layer 909 to the top surface of the supporting substrate 901 or middle insulating dielectric layer 908 of the lower one of the first and/or second types of metal-trance-on-substrate (MTOS) units 900 and the top surface of the or the upper interconnection metal layer 907 of the lower one of the first and/or second types of metal-trance-on-substrate (MTOS) units 900, or by spin-on coating, screen-printing or dispensing a precursor layer of polyimide, epoxy, polybenzoxazole (PBO) or benzocyclobutene (BCB) on the top surface of the supporting substrate 901 or middle insulating dielectric layer 908 of the lower one of the first and/or second types of metal-trance-on-substrate (MTOS) units 900 and the top surface of the or the upper interconnection metal layer 907 of the lower one of the first and/or second types of metal-trance-on-substrate (MTOS) units 900, next placing the upper one of the first and/or second types of metal-trance-on-substrate (MTOS) units 900 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the supporting substrate 901 of the upper one of the first and/or second types of metal-trance-on-substrate (MTOS) units 900 and bond the adhesive polymer layer 909 to the top surface of the supporting substrate 901 or middle insulating dielectric layer 908 of the lower one of the first and/or second types of metal-trance-on-substrate (MTOS) units 900 and the top surface of the or the upper interconnection metal layer 907 of the lower one of the first and/or second types of metal-trance-on-substrate (MTOS) units 900. The adhesive polymer layer 909 may have the same specification as one illustrated in FIG. 4E.

Figure 8C:
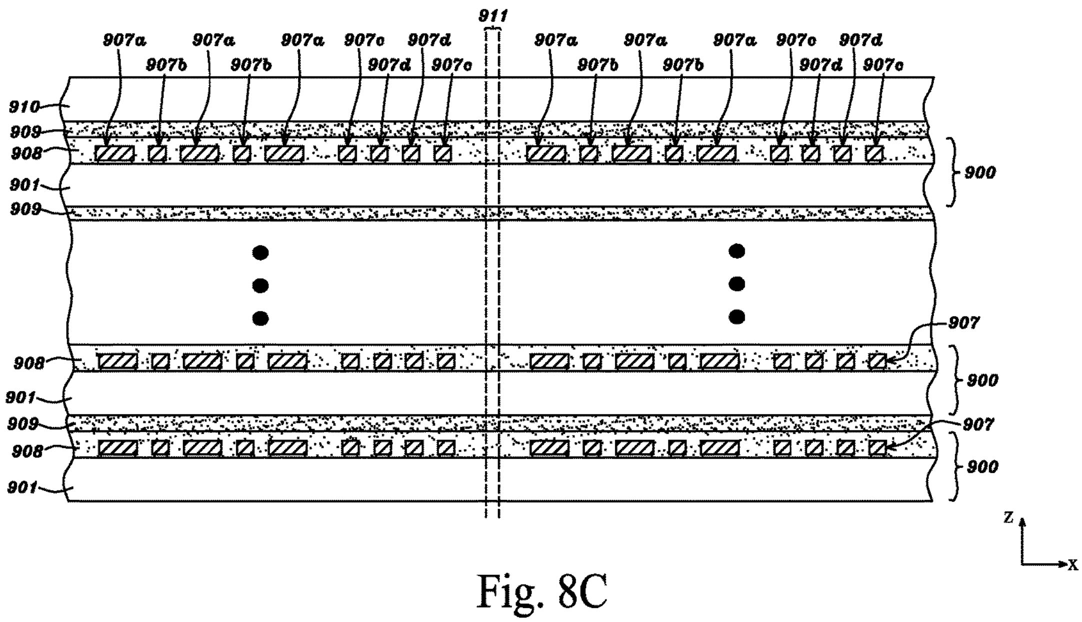
Figure 8D:
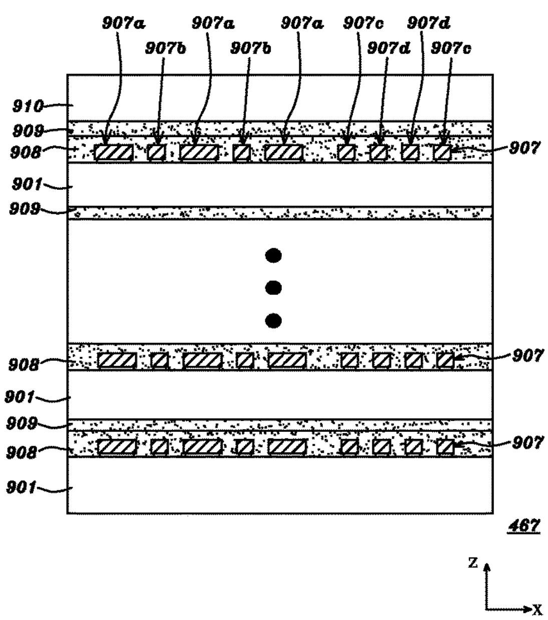
Figure 8E:
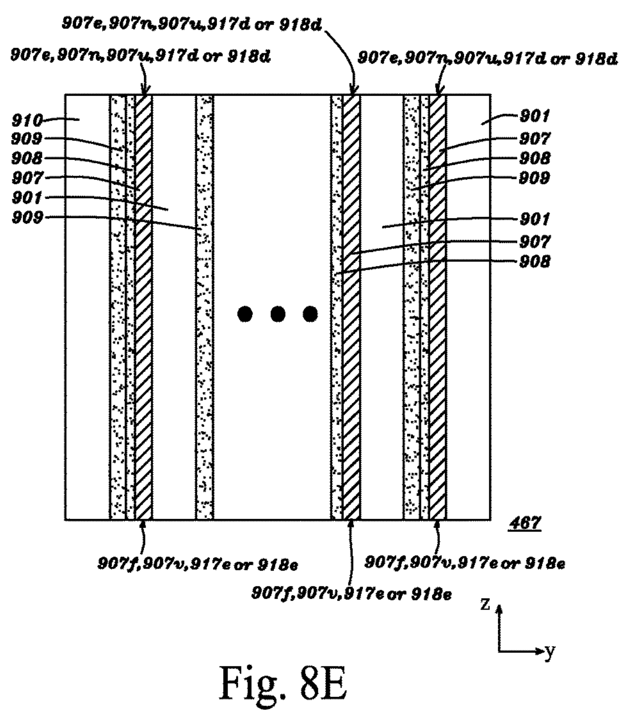
FIGS. 8E and 8F are schematically cross-sectional views in a y-z plane showing various processes for fabricating a ninth type of vertical-through-via (VTV) connectors in accordance with an embodiment of the present application.
Figure 8F:
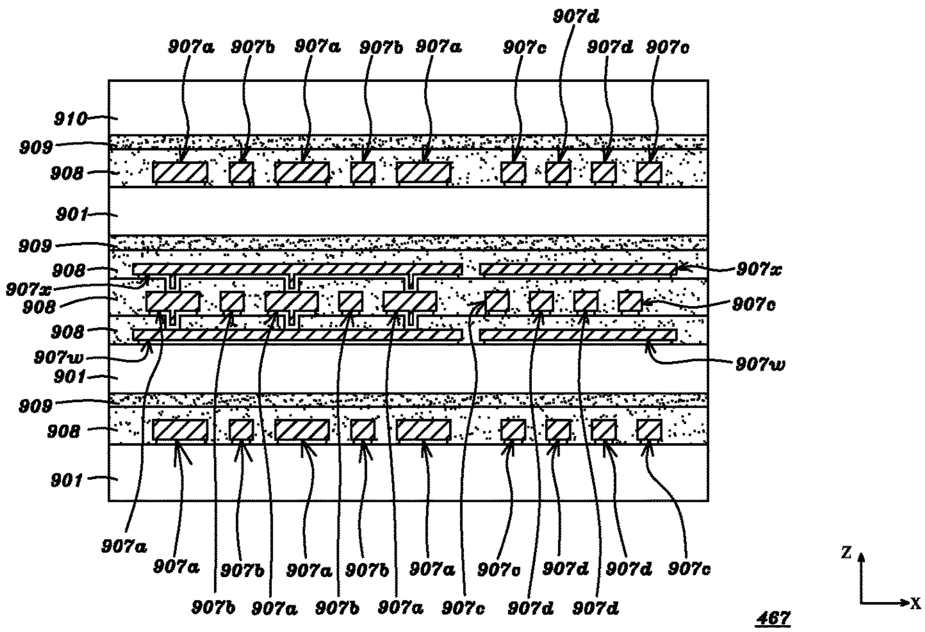

Next, referring to FIGS. 8C and 8F, if the topmost one of the first and/or second types of metal-trance-on-substrate (MTOSub) units 900 is formed with the or the upper insulating dielectric layer 908, an adhesive polymer layer 909 may be provided to mount a covering substrate 910 to the topmost one of the first and/or second types of metal-trance-on-substrate (MTOSub) units 900 by laminating a dry film of polyimide, epoxy, polybenzoxazole (PBO) or benzocyclobutene (BCB) onto a top surface of the or the upper insulating dielectric layer 908 of the topmost one of the first and/or second types of metal-trance-on-substrate (MTOSub) units 900, next placing the covering substrate 910 on a top surface of the dry film and then curing or crosslinking the dry film into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to a bottom surface of the covering substrate 910 and bond the adhesive polymer layer 909 to the top surface of the or the upper insulating dielectric layer 908 of the topmost one of the first and/or second types of metal-trance-on-substrate (MTOSub) units 900, or by spin-on coating, screen-printing or dispensing a precursor layer of polyimide, epoxy, polybenzoxazole (PBO) or benzocyclobutene (BCB) on the top surface of the or the upper insulating dielectric layer 908 of the topmost one of the first and/or second types of metal-trance-on-substrate (MTOSub) units 900, next placing the covering substrate 910 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the or the upper insulating dielectric layer 908 of the topmost one of the first and/or second types of metal-trance-on-substrate (MTOSub) units 900. Alternatively, if the topmost one of the first and/or second types of metal-trance-on-substrate (MTOSub) units 900 is formed without the or the upper insulating dielectric layer 908, the adhesive polymer layer 909 may be provided to mount the covering substrate 910 to the topmost one of the first and/or second types of metal-trance-on-substrate (MTOSub) units 900 by laminating a dry film of polyimide, epoxy, polybenzoxazole (PBO) or benzocyclobutene (BCB) onto a top surface of the supporting substrate 901 or middle insulating dielectric layer 908 of the topmost one of the first and/or second types of metal-trance-on-substrate (MTOSub) units 900 and a top surface of the or the upper interconnection metal layer 907 of the topmost one of the first and/or second types of metal-trance-on-substrate (MTOSub) units 900, next placing the covering substrate 910 on a top surface of the dry film and then curing or crosslinking the dry film into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the supporting substrate 901 or middle insulating dielectric layer 908 of the topmost one of the first and/or second types of metal-trance-on-substrate (MTOSub) units 900 and the top surface of the or the upper interconnection metal layer 907 of the topmost one of the first and/or second types of metal-trance-on-substrate (MTOSub) units 900, or by spin-on coating, screen-printing or dispensing a precursor layer of polyimide, epoxy, polybenzoxazole (PBO) or benzocyclobutene (BCB) on the top surface of the supporting substrate 901 or middle insulating dielectric layer 908 of the topmost one of the first and/or second types of metal-trance-on-substrate (MTOSub) units 900 and the top surface of the or the upper interconnection metal layer 907 of the topmost one of the first and/or second types of metal-trance-on-substrate (MTOSub) units 900, next placing the covering substrate 910 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the supporting substrate 901 or middle insulating dielectric layer 908 of the topmost one of the first and/or second types of metal-trance-on-substrate (MTOSub) units 900 and the top surface of the or the upper interconnection metal layer 907 of the topmost one of the first and/or second types of metal-trance-on-substrate (MTOSub) units 900. The adhesive polymer layer 909 may have the same specification as one illustrated in FIG. 4E and the covering substrate 910 may have the same specification as one illustrated in FIG. 4E. The structure as seen in FIG. 8C is called herein as a third type of vertical-through-via (VTV) substrate, panel or wafer 920. The third type of verticalthrough-via (VTV) substrate, panel or wafer 920 may be defined with multiple first reserved scribe lines 911 extending in a y direction and multiple second reserved scribe lines (not shown but similar to ones 912 of the first type of vertical-through-via (VTV) substrate, panel or wafer 920 as illustrated in FIGS. 4A-4I and 5A-5C) extending in a x direction vertical to the y direction, wherein the or the middle interconnection metal layer 907 of each of its first and/or second types of metal-trance-on-substrate (MTOSub) units 900 may include multiple duplicated circuit portions having the same circuit pattern, each between neighboring two of its first reserved scribe lines 911, and a space between each neighboring two of its second reserved scribe lines may be arbitrarily determined by customers in case of the or the middle interconnection metal layer 907 of each of its first and/or second types of metal-trance-on-substrate (MTOSub) units 900 having the same layout as the interconnection metal layer 907 of the first type of vertical-through-via (VTV) substrate, panel or wafer 920 as illustrated in FIGS. 4A-4I and 5A-5C.

Next, a ninth type of vertical-through-via (VTV) connector 467 to be processed from the third type of vertical-through-via (VTV) substrate, panel or wafer 920 as seen in FIG. 8C may have a size to be selected or determined from various sizes after the third type of vertical-through-via (VTV) substrate, panel or wafer 920 are formed. When a size for the ninth type of vertical-through-via (VTV) connectors 467 is selected or determined, the third type of vertical-through-via (VTV) substrate, panel or wafer 920 as seen in FIG. 8C may be placed onto a dicing tape or carrier (not shown but like one 913 shown in FIG. 4F) and then cut or diced therethrough along some or all of the first reserved scribe lines 911 and all of the second reserved scribe lines 912 to separate the ninth type of vertical-through-via (VTV) connectors 467 in a single-die type as seen in FIGS. 8D and 8F by a laser cutting process or by a mechanical cutting process.

Next, referring to FIGS. 8D and 8F, each of the ninth type of vertical-through-via (VTV) connectors 467 may have a first surface in an x-y plane at a top thereof to be picked up by a pick-up tip and then moved in a z direction. Next, said each of the ninth type of vertical-through-via (VTV) connectors 467 may be rotated by the pick-up tip by 90 degrees clockwise in a y-z plane as seen in FIG. 8E. Next, said each of the ninth type of vertical-through-via (VTV) connectors 467 may have a second surface in an x-y plane at a top thereof to be picked up by a place tip and then to be placed in a tray (not shown but like one 914 shown in FIG. 4I). Thereby, for each of the ninth type of vertical-through-via (VTV) connectors 467, each of its top metal pads or contacts 907*e*, 907*n*, 907*u*, 917*d*, 918*d*, 919*a* and/or 919*c* as illustrated in FIGS. 4A-4I, 5A-5C, 6A-6F and 7A-7I may have a top surface coplanar with a top surface of each of its supporting substrates 901, i.e., a top surface of the glass substrate for each of its supporting substrates 901 or a top surface of the silicon substrate for each of its supporting substrates 901, and to a top surface of its covering substrate 910, i.e., a top surface of the glass substrate for its covering substrate 910 or a top surface of the silicon substrate for its covering substrate 910, and each of its bottom metal pads or contacts 907*f*, 907*v*, 917*e*, 918*e*, 919*b* and/or 919*d* as illustrated in FIGS. 4A-4I, 5A-5C, 6A-6F and 7A-7I may have a bottom surface coplanar with a bottom surface of each of its supporting substrates 901, i.e., a bottom surface of the glass substrate for each of its supporting substrates 901 or a bottom surface of the silicon substrate for each of its supporting substrates 901, and to a bottom surface of its covering substrate 910, i.e., a bottom surface of the glass substrate for its covering substrate 910 or a bottom surface of the silicon substrate for its covering substrate 910. A vertical distance between the top and bottom surfaces of each of its supporting substrates 901 and covering substrate 910 may be between 20 and 500 micrometers or between 20 and 3,000 micrometers.

10. Tenth Type of Vertical-Through-Via (VTV) Connector

Figure 9A:
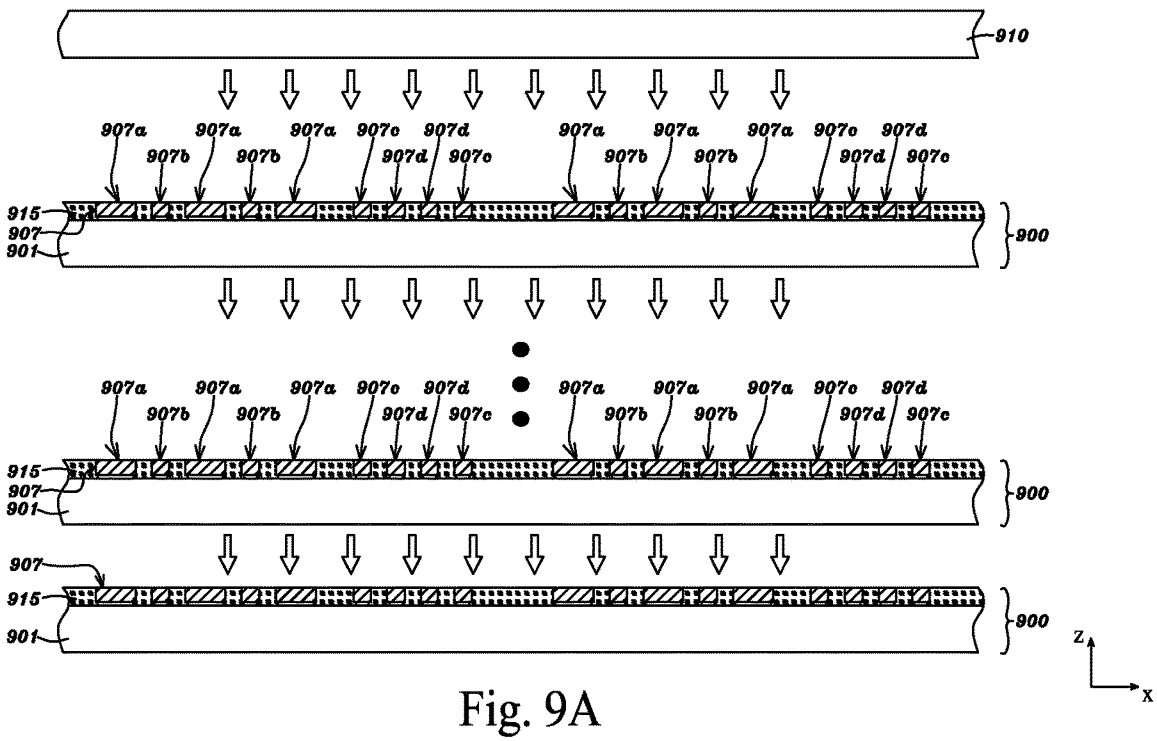
FIGS. 9A-9C are schematically cross-sectional views in an x-z plane showing a process for fabricating a tenth type of vertical-through-via (VTV) connector in accordance with an embodiment of the present application.
Figure 9B:
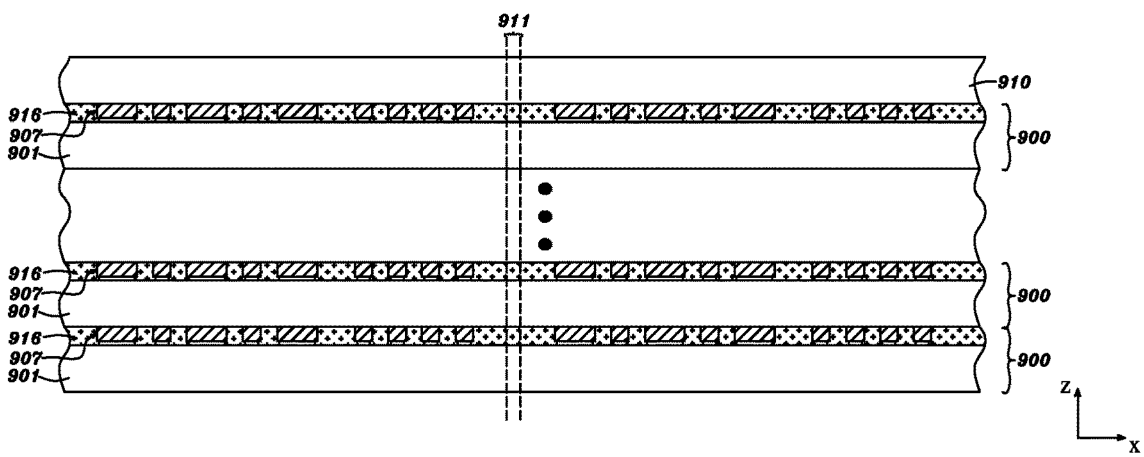
Figure 9C:
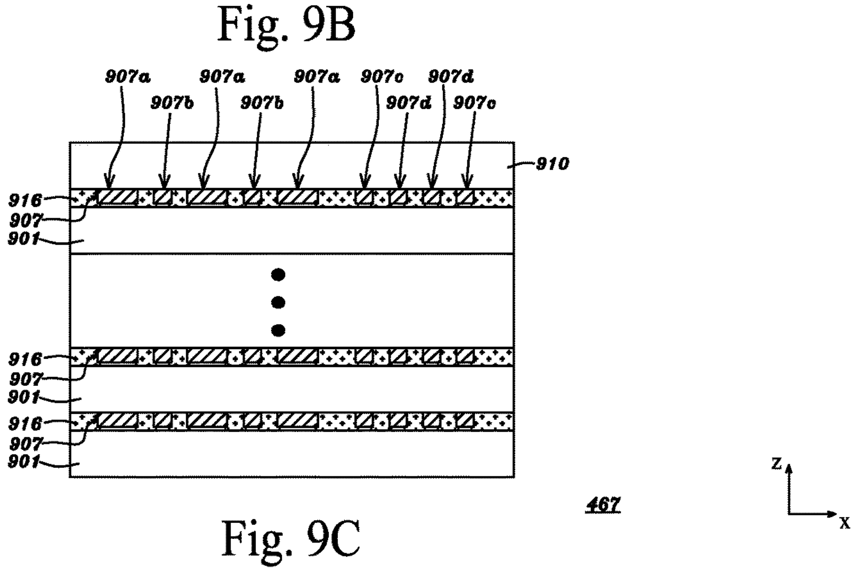
Figure 9D:
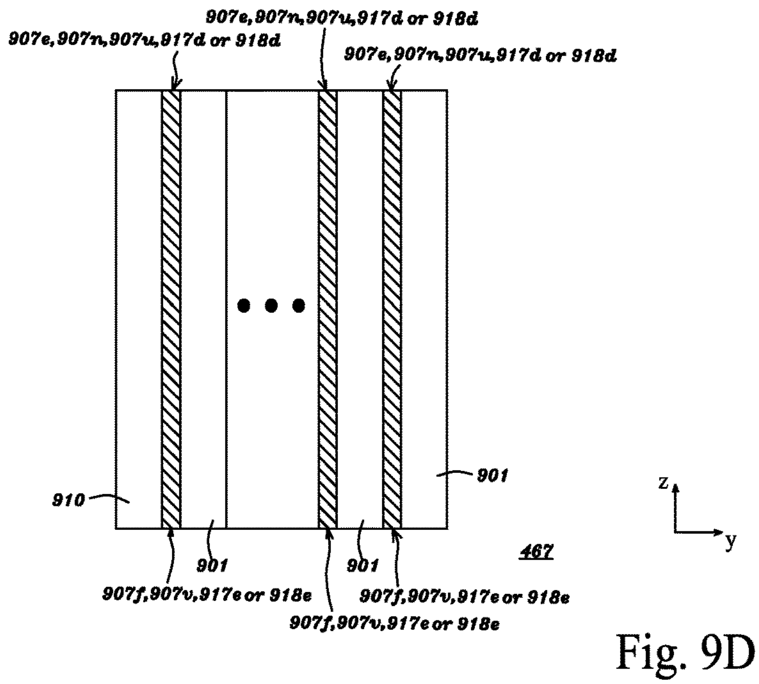
FIG. 9D is a schematically cross-sectional view in a y-z plane showing a process for fabricating a tenth type of vertical-through-via (VTV) connector in accordance with an embodiment of the present application.

FIGS. 9A-9C are schematically cross-sectional views in an x-z plane showing a process for fabricating a tenth type of vertical-through-via (VTV) connector in accordance with an embodiment of the present application. FIG. 9D is a schematically cross-sectional view in a y-z plane showing a process for fabricating a tenth type of vertical-through-via (VTV) connector in accordance with an embodiment of the present application. Referring to FIG. 9A, each of the first and/or second types of metal-trance-on-substrate (MTOSub) units 900 as seen in FIGS. 4D and/or 7D may be formed without the or the upper insulating dielectric layer 908, but formed with a layer 915 of glass paste or powder on or to a top surface of the supporting substrate 901 or middle insulating dielectric layer 908 of each of the first and/or second types of metal-trance-on-substrate (MTOS) units 900 and in or to each gap between neighboring two metal portions of the or the upper interconnection metal layer 907 of each of the first and/or second types of metal-trance-on-substrate (MTOS) units 900, wherein the layer 915 of glass paste or powder may include between 60 and 95 percent by weight of $SiO_2$, between 60 and 74 percent by weight of $SiO_2$, between 70 and 85 percent by weight of $SiO_2$ or between 80 and 95 percent by weight of $SiO_2$. Multiple of the first and/or second types of metal-trance-on-substrate (MTOSub) units 900 may be stacked with each other or one another, that is, either of the first and second types of metal-trance-on-substrate (MTOSub) units 900 may be stacked over either of the first and second types of metal-trance-on-substrate (MTOSub) units 900. In particular, FIGS. 9A-9D show multiple of the first type of metal-trance-on-substrate (MTOSub) units 900 are provided to be stacked with each other or one another to fabricate the tenth type of vertical-through-via (VTV) connector.

Referring to FIG. 9A, an upper one of the first and/or second types of metal-trance-on-substrate (MTOSub) units 900 may be placed on a top surface of the layer 915 of glass paste or powder of a lower one of the first and/or second types of metal-trance-on-substrate (MTOS) units 900 and a top surface of the or the upper interconnection metal layer 907 of the lower one of the first and/or second types of metal-trance-on-substrate (MTOS) units 900, and a covering substrate 910 may be placed on a top surface of the layer 915 of glass paste or powder of the topmost one of the first and/or second types of metal-trance-on-substrate (MTOS) units 900 and a top surface of the or the upper interconnection metal layer 907 of the topmost one of the first and/or second types of metal-trance-on-substrate (MTOS) units 900. The covering substrate 910 may have the same specification as one illustrated in FIG. 4E. Next, a heating process may be performed at a bonding temperature between 500 and 1,000 degrees Celsius or between 600 and 900 degrees in a vacuum to soften the layer 915 of glass paste or powder of each of the first and/or second types of metal-trance-on-substrate (MTOS) units 900 into a glass bonding layer 916 as seen in FIG. 9B, wherein the glass bonding layer 916 may include between 60 and 95 percent by weight of $SiO_2$, between 60 and 74 percent by weight of $SiO_2$, between 70 and 85 percent by weight of $SiO_2$ or between 80 and 95 percent by weight of $SiO_2$. Each of the glass bonding layers 916 may be bonded to a bottom surface of the supporting substrate 901 of an upper one of the first and/or second types of metal-trance-on-substrate (MTOSub) units 900 and to the top surface of the supporting substrate 901 or middle insulating dielectric layer 908 of a lower one of the first and/or second types of metal-trance-on-substrate (MTOS) units 900, but the topmost one of the glass bonding layers 916 may be bonded to a bottom surface of the covering substrate 910 and to the top surface of the supporting substrate 901 or middle insulating dielectric layer 908 of the topmost one of the first and/or second types of metal-trance-on-substrate (MTOS) units 900. The structure as seen in FIG. 9B is called herein as a fourth type of vertical-through-via (VTV) substrate, panel or wafer 920. The fourth type of vertical-through-via (VTV) substrate, panel or wafer 920 may be defined with multiple first reserved scribe lines 911 extending in a y direction and multiple second reserved scribe lines (not shown but similar to ones 912 of the first type of vertical-through-via (VTV) substrate, panel or wafer 920 as illustrated in FIGS. 4A-4I and 5A-5C) extending in a x direction vertical to the y direction, wherein the or the middle interconnection metal layer 907 of each of its first and/or second types of metal-trance-on-substrate (MTOSub) units 900 may include multiple duplicated circuit portions having the same circuit pattern, each between neighboring two of its first reserved scribe lines 911, and a space between each neighboring two of its second reserved scribe lines may be arbitrarily determined by customers in case of the or the middle interconnection metal layer 907 of each of its first and/or second types of metal-trance-on-substrate (MTOSub) units 900 having the same layout as the interconnection metal layer 907 of the first type of vertical-through-via (VTV) substrate, panel or wafer 920 as illustrated in FIGS. 4A-4I and 5A-5C.

Next, a tenth type of vertical-through-via (VTV) connector 467 to be processed from the fourth type of vertical-through-via (VTV) substrate, panel or wafer 920 as seen in FIG. 9B may have a size to be selected or determined from various sizes after the fourth type of vertical-through-via (VTV) substrate, panel or wafer 920 are formed. When a size for the tenth type of vertical-through-via (VTV) connectors 467 is selected or determined, the fourth type of vertical-through-via (VTV) substrate, panel or wafer 920 as seen in FIG. 9B may be placed onto a dicing tape or carrier (not shown but like one 913 shown in FIG. 4F) and then cut or diced therethrough along some or all of the first reserved scribe lines 911 and all of the second reserved scribe lines 912 to separate the tenth type of vertical-through-via (VTV) connectors 467 in a single-die type as seen in FIG. 9C by a laser cutting process or by a mechanical cutting process.

Next, referring to FIG. 9C, each of the tenth type of vertical-through-via (VTV) connectors 467 may have a first surface in an x-y plane at a top thereof to be picked up by a pick-up tip and then moved in a z direction. Next, said each of the tenth type of vertical-through-via (VTV) connectors 467 may be rotated by the pick-up tip by 90 degrees clockwise in a y-z plane as seen in FIG. 9D. Next, said each of the ninth type of vertical-through-via (VTV) connectors 467 may have a second surface in an x-y plane at a top thereof to be picked up by a place tip and then to be placed in a tray (not shown but like one 914 shown in FIG. 4I). Thereby, for each of the tenth type of vertical-through-via (VTV) connectors 467, each of its top metal pads or contacts 907*e*, 907*n*, 907*u*, 917*d*, 918*d*, 919*a* and/or 919*c* as illustrated in FIGS. 4A-4I, 5A-5C, 6A-6F and 7A-7I may have a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and each of its bottom metal pads or contacts 907*f*, 907*v*, 917*e*, 918*e*, 919*b* and/or 919*d* as illustrated in FIGS. 4A-4I, 5A-5C, 6A-6F and 7A-7I may have a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910. A vertical distance between the top and bottom surfaces of each of its supporting substrates 901 and covering substrate 910 may be between 20 and 500 micrometers or between 20 and 3,000 micrometers.

Alternatively, if the glass substrates are provided for the supporting substrate 901 of each of the first and/or second types of metal-trance-on-substrate (MTOSub) units 900 and the covering substrate 910, the layers 915 of glass paste or powder may not be formed for the glass bonding layers 916, but the supporting substrate 901 of an upper one of the first and/or second types of metal-trance-on-substrate (MTOSub) units 900 may be deformed, by a heating process to a bonding temperature between 500 and 1,000 degrees Celsius or between 600 and 900 degrees in a vacuum, to have a bottom surface joining the top surface of the supporting substrate 901 or middle insulating dielectric layer 908 of a lower one of the first and/or second types of metal-trance-on-substrate (MTOS) units 900, and the covering substrate 910 may be deformed, by the heating process to the bonding temperature in the vacuum, to have a bottom surface joining the top surface of the supporting substrate 901 or middle insulating dielectric layer 908 of the topmost one of the first and/or second types of metal-trance-on-substrate (MTOS) units 900. A vertical distance between the top and bottom surfaces of each of its supporting substrate(s) 901 and covering substrate 910 may be between 20 and 500 micrometers or between 20 and 3,000 micrometers.

Specification for Rerouted Vertical-Through-Via (VTV) Connector

1. First Type of Rerouted Vertical-Through-Via (VTV) Connector

Figure 10A:
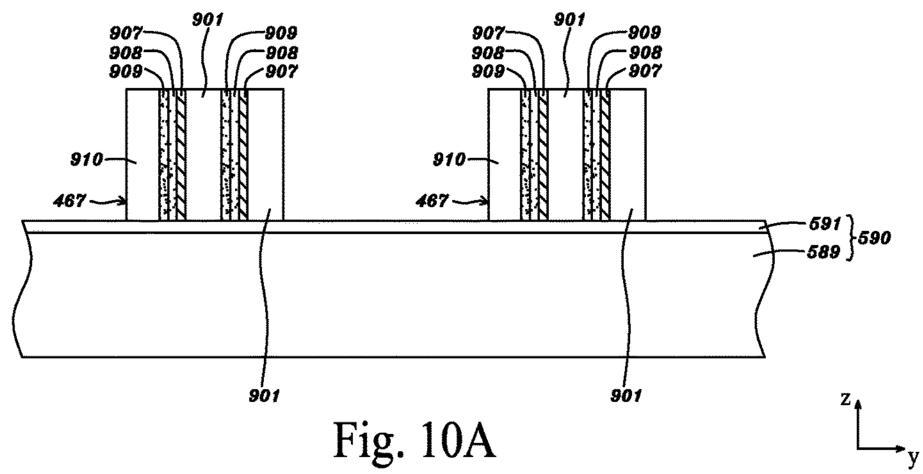
FIGS. 10A-10F are schematically cross-sectional views in a y-z plane showing a process for fabricating a first type of rerouted vertical-through-via (VTV) connector in accordance with an embodiment of the present application.
Figure 10B:
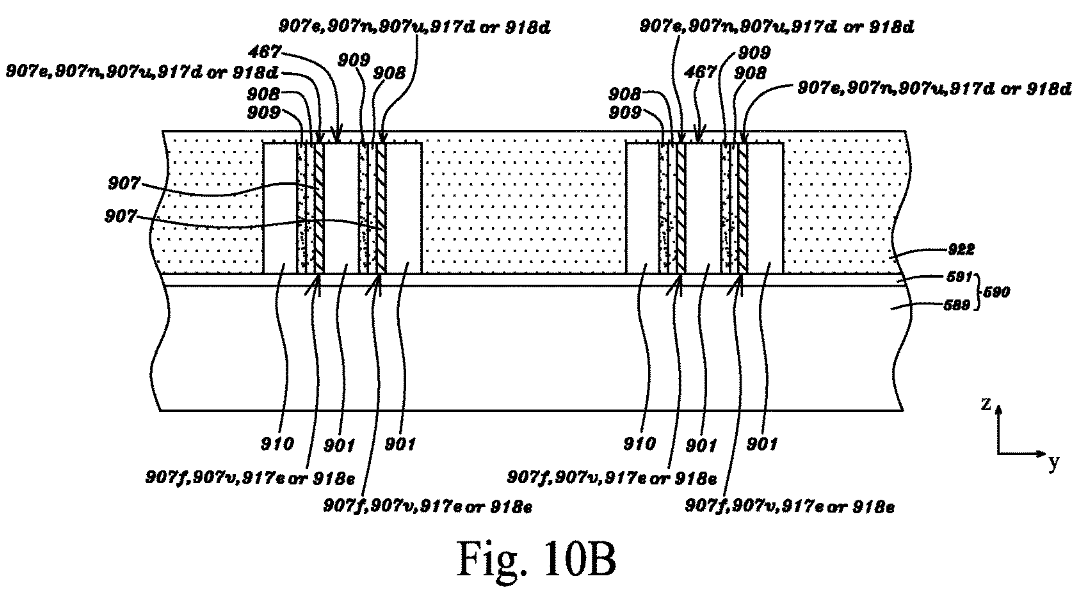
Figure 10C:
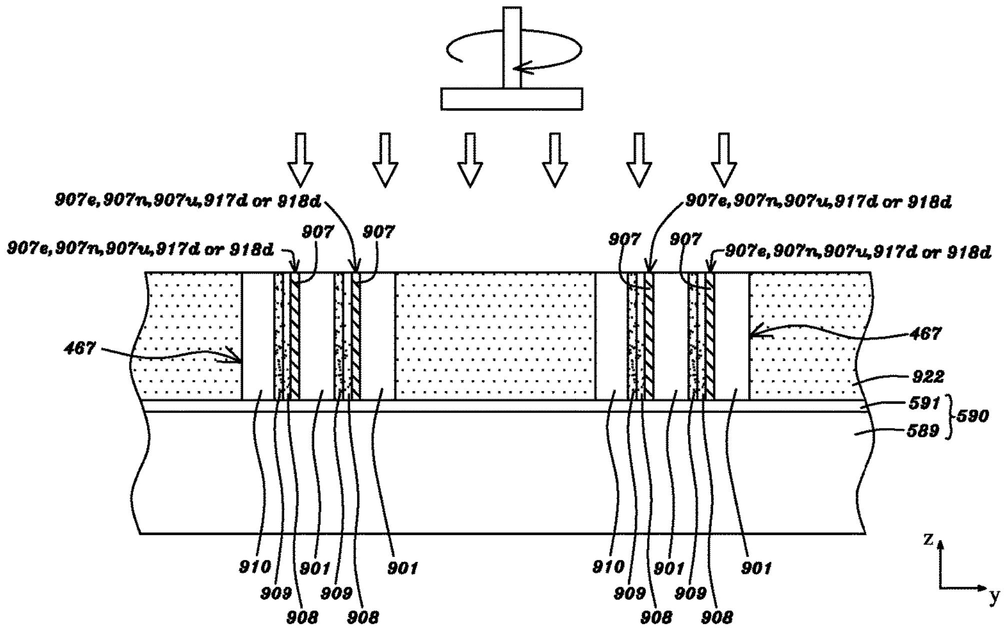
Figure 10D:
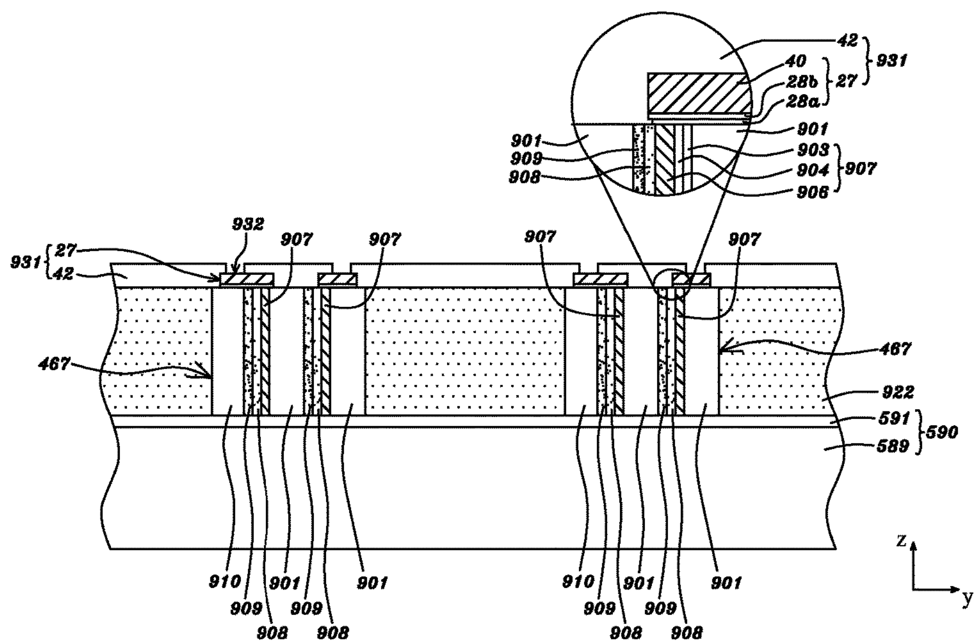
Figure 10E:
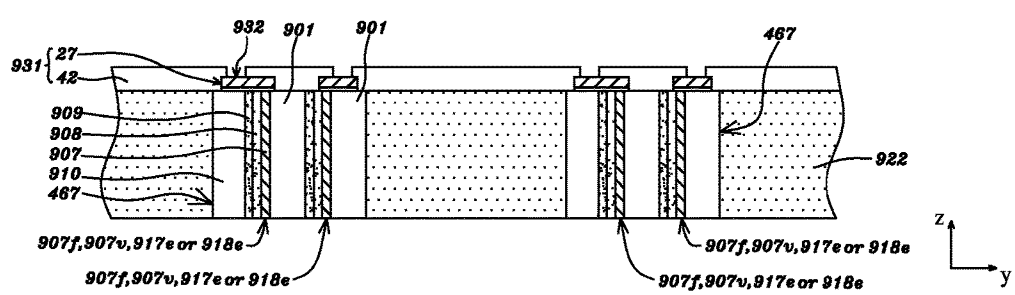
Figure 10F:
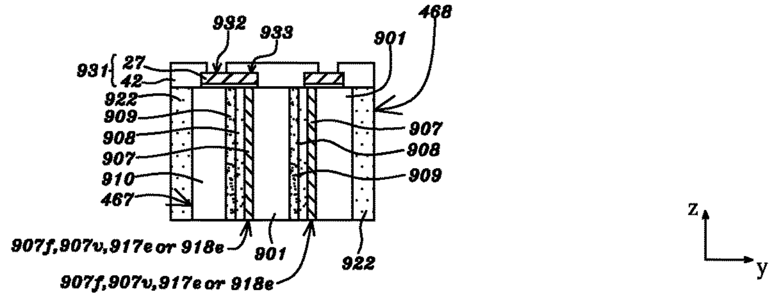
Figure 10G:
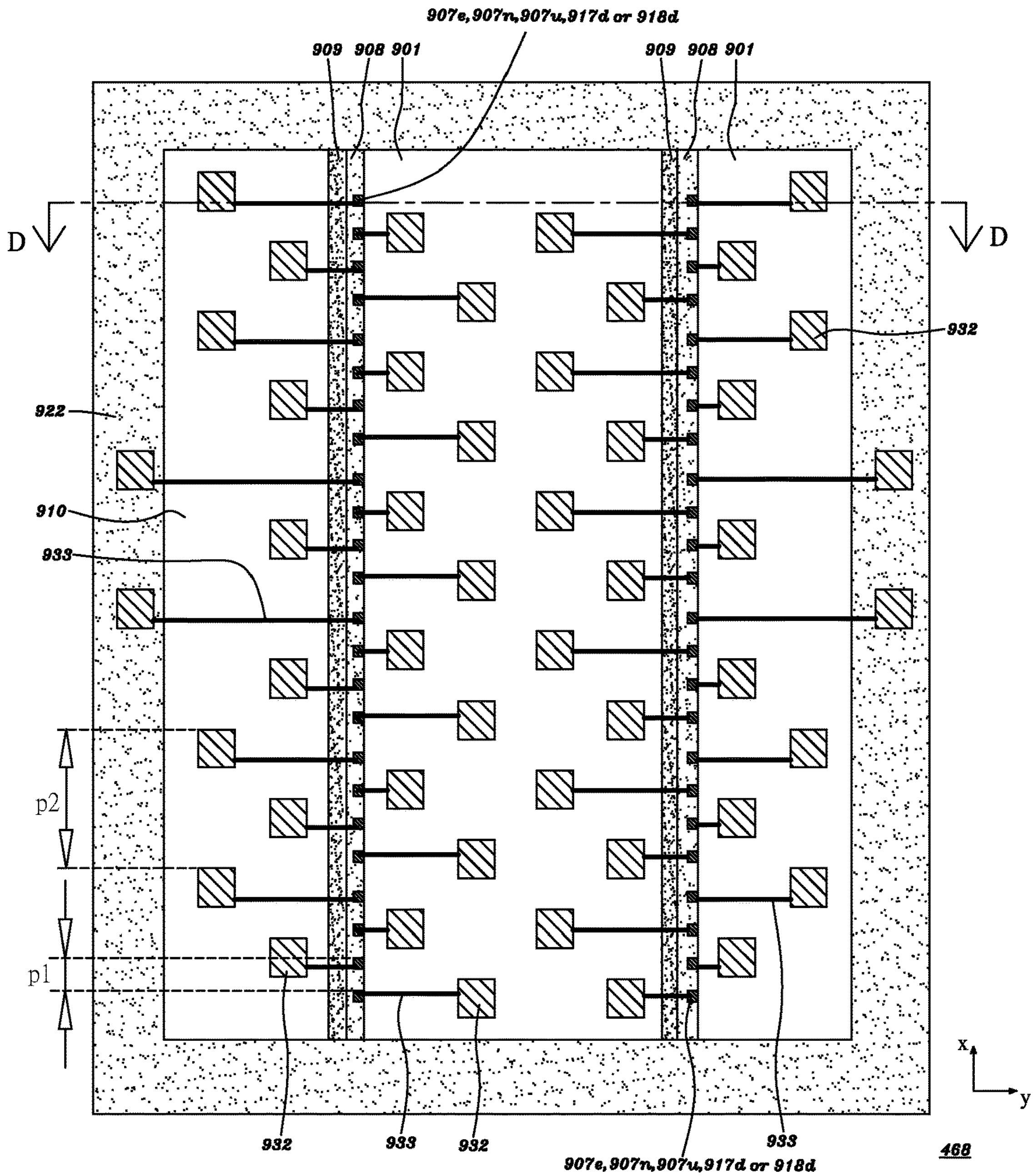
FIG. 10G is a schematically top view in an x-y plane showing an interconnection metal layer of a first type of rerouted vertical-through-via (VTV) connector in accordance with an embodiment of the present application.

FIGS. 10A-10F are schematically cross-sectional views in a y-z plane showing a process for fabricating a first type of rerouted vertical-through-via (VTV) connector in accordance with an embodiment of the present application. FIG. 10G is a schematically top view in an x-y plane showing an interconnection metal layer of a first type of rerouted vertical-through-via (VTV) connector in accordance with an embodiment of the present application, wherein FIG. 10F is a cross-sectional view along a cross-sectional line D-D of FIG. 10G. Referring to FIG. 10A, a temporary substrate 590 may be provided with a glass or silicon substrate 589 and a sacrificial bonding layer 591 formed on the glass or silicon substrate 589. The sacrificial bonding layer 591 may have the glass or silicon substrate 589 to be easily debonded or released from a structure subsequently formed on the sacrificial bonding layer 591. For example, the sacrificial bonding layer 591 may be a material of light-to-heat conversion (LTHC) that may be deposited on the glass or silicon substrate 589 by printing or spin-on coating and then cured or dried with a thickness of about 1 micrometer or between 0.5 and 2 micrometers. The LTHC material may be a liquid ink containing carbon black and binder in a mixture of solvents.

Next, referring to FIG. 10A, multiple vertical-through-via (VTV) connectors 467, each of which may have the same specification as any of the first through tenth types of vertical-through-via (VTV) connectors 467 as illustrated in FIGS. 4A-4I, 5A-5C, 6A-6F, 7A-7I, 8A-8F and 9A-9D, may be provided each with the bottom surface attached to a top surface of the sacrificial bonding layer 591 of the temporary substrate 590. In particular, FIGS. 10A-10G show multiple of the ninth type of vertical-through-via (VTV) connectors 467 each formed with two of the first type of metal-trance-on-substrate (MTOSub) units 900 stacked with each other as illustrated in FIGS. 8A-8F may be provided to fabricate the first type of rerouted vertical-through-via (VTV) connector.

Next, referring to FIG. 10B, a polymer layer 922, or insulating dielectric layer, may be applied to fill a gap between each neighboring two of the vertical-through-via (VTV) connectors 467, on the top surface of each of the vertical-through-via (VTV) connectors 467 and on the top surface of the sacrificial bonding layer 591 by methods, for example, spin-on coating, screen-printing, dispensing or molding. The polymer layer 922 may be, for example, polyimide, BenzoCycloButene (BCB), parylene, polybenzoxazole (PBO), epoxy-based resin or compound, photo epoxy SU-8, elastomer, or silicone. The polymer layer 922 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Next, referring to FIG. 10C, a chemical mechanical polishing (CMP), polishing or grinding process may be applied to remove a top portion of the polymer layer 922 and to planarize a top surface of the polymer layer 922 and the top surface of each of the vertical-through-via (VTV) connectors 467. Thereby, for each of the vertical-through-via (VTV) connectors 467, the top surface of each of its top metal pads or contacts 907*e*, 907*n*, 907*u*, 917*d*, 918*d*, 919*a* and/or 919*c*, the top surface of its supporting substrate 901, i.e., the top surface of the glass substrate for its supporting substrate 901 or the top surface of the silicon substrate for its supporting substrate 901, and the top surface of its covering substrate 910, i.e., the top surface of the glass substrate for its covering substrate 910 or the top surface of the silicon substrate for its covering substrate 910, may be exposed to be coplanar with a top surface of the polymer layer 922.

Next, referring to FIG. 10D, an interconnection scheme 931 may be formed on each of the vertical-through-via (VTV) connectors 467, that is, on the top surface of each of the top metal pads or contacts 907*e*, 907*n*, 907*u*, 917*d*, 918*d*, 919*a* and/or 919*c* thereof, the top surface of each of the supporting substrate(s) 901 thereof and the top surface of the covering substrate 910 thereof, and on the top surface of the polymer layer 922. The interconnection scheme 931 may include (1) an interconnection metal layer 27 on each of the vertical-through-via (VTV) connectors 467, that is, on the top surface of each of the top metal pads or contacts 907*e*, 907*n*, 907*u*, 917*d*, 918*d*, 919*a* and/or 919*c* thereof, the top surface of each of the supporting substrate(s) 901 thereof and the top surface of the covering substrate 910 thereof, and on the top surface of the polymer layer 922, wherein the interconnection metal layer 27 of the interconnection scheme 931 couples to each of the top metal pads or contacts 907*e*, 907*n*, 907*u*, 917*d*, 918*d*, 919*a* and/or 919*c* of each of the vertical-through-via (VTV) connectors 467, and (2) a polymer layers 42, i.e., insulating dielectric layer, on each of the vertical-through-via (VTV) connectors 467, that is, on the top surface of each of the supporting substrate(s) 901 thereof and the top surface of the covering substrate 910 thereof, on the top surface of the polymer layer 922 and on a bottom surface of the interconnection metal layer 27 of the interconnection scheme 931, wherein the interconnection metal layer 27 of the interconnection scheme 931 may be patterned with multiple metal pads at bottoms of multiple openings in the polymer layers 42 of the interconnection scheme 931 respectively. The interconnection metal layer 27 of the interconnection scheme 931 may include (1) an adhesion layer 28*a*, such as titanium or titanium nitride having a thickness of between 1 nm and 50 nm, on each of the vertical-through-via (VTV) connectors 467, that is, on the top surface of each of the top metal pads or contacts 907*e*, 907*n*, 907*u*, 917*d*, 918*d*, 919*a* and/or 919*c* thereof, the top surface of each of the supporting substrate(s) 901 thereof and the top surface of the covering substrate 910 thereof, and on the top surface of the polymer layer 922, (2) a seed layer 28*b*, such as copper, on a top surface of the adhesion layer 28*a*, and (3) a copper layer 40 having a thickness of between 0.3 μm and 20 μm on a top surface of the seed layer 28*b*, wherein the copper layer 40 may have a sidewall not covered by the adhesion layer 28*a*. The interconnection metal layer 27 of the interconnection scheme 931 may have the same specification as that of the second interconnection scheme 588 of the first type of semiconductor integrated-circuit (IC) chip 100 as illustrated in FIG. 3A, and the polymer layers 42 of the interconnection scheme 931 may have the same specification as that of the second interconnection scheme 588 of the first type of semiconductor integrated-circuit (IC) chip 100 as illustrated in FIG. 3A. The interconnection metal layer 27 of the interconnection scheme 931 may extend horizontally across an edge of each of the vertical-through-via (VTV) connectors 467.

Next, the glass or silicon substrate 589 as seen in FIG. 10D may be released from the sacrificial bonding layer 591. For example, in the case that the sacrificial bonding layer 591 is the material of light-to-heat conversion (LTHC) and the substrate 589 is made of glass, a laser light, such as YAG laser having a wavelength of about 1064 nm, an output power between 20 and 50 W and a spot size of 0.3 mm in diameter at a focal point, may be generated to pass from the backside of the glass substrate 589 to the sacrificial bonding layer 591 through the glass substrate 589 to scan the sacrificial bonding layer 591 at a speed of 8.0 m/s, for example, such that the sacrificial bonding layer 591 may be decomposed and thus the glass substrate 589 may be easily released from the sacrificial bonding layer 591. Next, an adhesive peeling tape (not shown) may be attached to a bottom surface of the remainder of the sacrificial bonding layer 591. Next, the adhesive peeling tape may be peeled off to pull off the remainder of the sacrificial bonding layer 591 attached to the adhesive peeling tape off such that a bottom surface of each of the vertical-through-via (VTV) connectors 467 and a bottom surface of the polymer layer 922 may be exposed as seen in FIG. 10E; for each of the vertical-through-via (VTV) connectors 467, the bottom surface of each of its bottom metal pads or contacts 907*f*, 907*v*, 917*e*, 918*e*, 919*b* and/or 919*d*, the bottom surface of each of its supporting substrate(s) 901, i.e., the bottom surface of the glass substrate for each of its supporting substrate(s) 901 or the bottom surface of the silicon substrate for each of its supporting substrate(s) 901, and the bottom surface of its covering substrate 910, i.e., the bottom surface of the glass substrate for its covering substrate 910 or the bottom surface of the silicon substrate for its covering substrate 910, may be exposed and coplanar with the bottom surface of the polymer layer 922. Next, the polymer layer 42 of the interconnection scheme 931 and the polymer layer 922 may be cut or diced to separate multiple individual units each for a first type of rerouted vertical-through-via (VTV) connector 468 as shown in FIG. 10F by a laser cutting process or mechanical cutting process.

Referring to FIGS. 10F and 10G, for each of the first type of rerouted vertical-through-via (VTV) connectors 468, the interconnection metal layer 27 of its interconnection scheme 931 may be patterned with (1) multiple rerouted metal pads 932 on the top surface of the supporting substrate(s) 901 of its vertical-through-via (VTV) connector 467, the top surface of the covering substrate 910 of its vertical-through-via (VTV) connector 467 and the top surface of its polymer layer 922, and (2) multiple rerouted metal traces 933 on the top surface of the top metal pads or contacts 907*e*, 907*n*, 907*u*, 917*d*, 918*d*, 919*a* and/or 919*c* of its vertical-through-via (VTV) connector 467, the top surface of the supporting substrate(s) 901 of its vertical-through-via (VTV) connector 467, the top surface of the covering substrate 910 of its vertical-through-via (VTV) connector 467 and the top surface of its polymer layer 922, wherein each of its rerouted metal traces 933 may couple one of its rerouted metal pads 932 to one of the top metal pads or contacts 907*e*, 907*n*, 907*u*, 917*d*, 918*d*, 919*a* and/or 919*c* of its vertical-through-via (VTV) connector 467. For example, neighboring two of the top metal pads or contacts 907*e*, 907*n*, 907*u*, 917*d*, 918*d*, 919*a* and/or 919*c* of its vertical-through-via (VTV) connector 467 may have a pitch p1, such as between 3 and 60 micrometers, between 5 and 30 micrometers, between 3 and 20 micrometers, between 10 and 40 micrometers, between 10 and 60 micrometers or smaller than 5, 10, 20, 30 or 60 micrometers, smaller than a pitch p2 of neighboring two of its rerouted metal pads 932, wherein the pitch p2 may be between 20 and 300 micrometers, between 30 and 250 micrometers, between 50 and 200 micrometers, between 60 and 180 micrometers or greater than 60, 100, 150 or 200 micrometers, and a ratio of the pitch p2 to the pitch p1 may be between 3 and 10, between 4 and 8, between 4 and 6 or greater than 4, 6 or 8.

2. Second Type of Rerouted Vertical-Through-Via (VTV) Connector

Figure 10H:
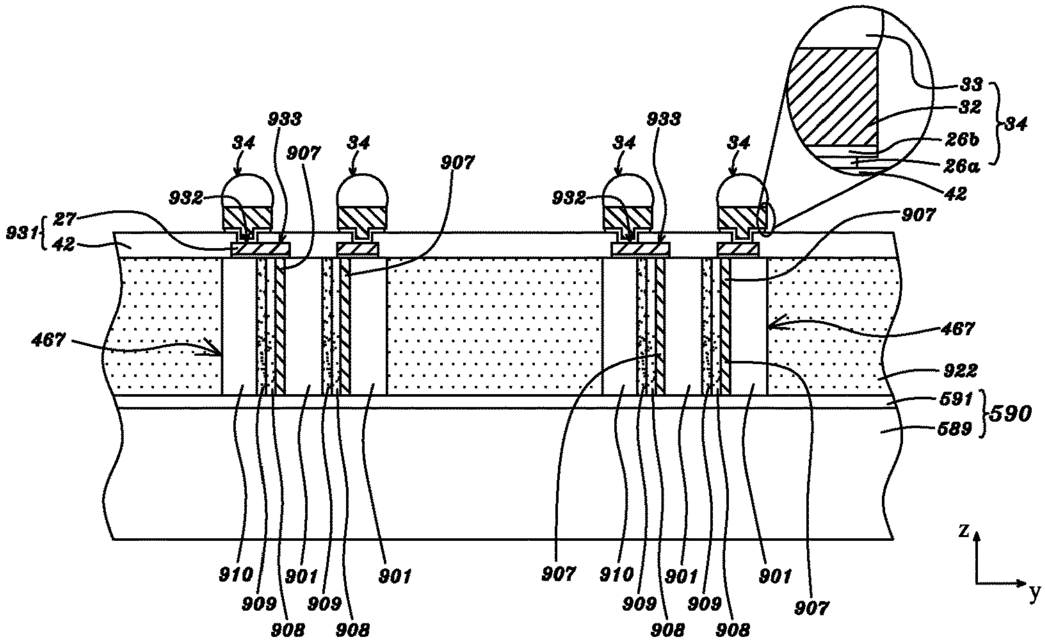
FIGS. 10H-10J are schematically cross-sectional views in a y-z plane showing a process for fabricating a second type of rerouted vertical-through-via (VTV) connector in accordance with an embodiment of the present application.
Figure 10I:
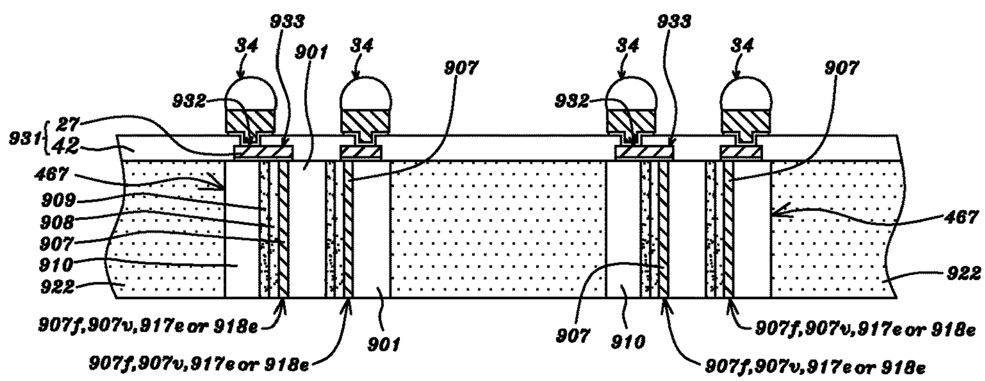
Figure 10J:
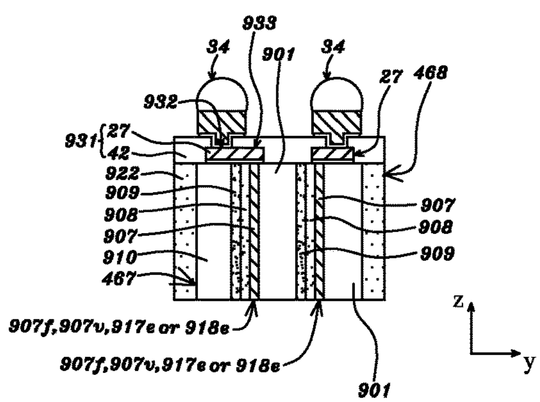

FIGS. 10H-10J are schematically cross-sectional views in a y-z plane showing a process for fabricating a second type of rerouted vertical-through-via (VTV) connector in accordance with an embodiment of the present application. The process for fabricating a second type of rerouted vertical-through-via (VTV) connector 468 as seen in FIGS. 10H-10J is similar to that for fabricating the first type of rerouted vertical-through-via (VTV) connector 468 as illustrated in FIGS. 10A-10G, but the second type of rerouted vertical-through-via (VTV) connector 468 is further formed with multiple micro-bumps or micro-pads 34 on its rerouted metal pads 932. For an element indicated by the same reference number shown in FIGS. 10A-10J, the specification of the element as seen in FIG. 10H-10J may be referred to that of the element as illustrated in FIGS. 10A-10G.

Regarding to the process for fabricating the second type of rerouted vertical-through-via (VTV) connector 468 as seen in FIG. 10J, after the interconnection scheme 931 is formed as illustrated in FIG. 10D, each of the micro bumps or micro-pads 34 may be formed on one of the rerouted metal pads 932 of the interconnection scheme 931 as seen in FIG. 10H. Each of the micro-bumps or micro-pads 34 may have various types, i.e., first, second, third and fourth types, which may have the same specification as the first, second, third and fourth types of micro-bumps or micro-pads 34 respectively as illustrated in FIG. 3A, having the adhesion layer 26*a* formed on a top surface of the copper layer 40 of the interconnection metal layer 27 of the interconnection scheme 931.

Next, referring to FIG. 10I, the glass or silicon substrate 589 as seen in FIG. 10H may be released from the sacrificial bonding layer 591, which may be referred to the step as illustrated in FIG. 10E. Next, the remainder of the sacrificial bonding layer 591 may be pulled off, which may be referred to the step as illustrated in FIG. 10E. Next, the polymer layer 42 of the interconnection scheme 931 and the polymer layer 922 may be cut or diced to separate multiple individual units each for the second type of rerouted vertical-through-via (VTV) connector 468 as shown in FIG. 10J by a laser cutting process or mechanical cutting process. For each of the second type of rerouted vertical-through-via (VTV) connectors 468, the top metal pads or contacts 907*e*, 907*n*, 907*u*, 917*d*, 918*d*, 919*a* and/or 919*c* of its vertical-through-via (VTV) connector 467 may have the pitch p1 as illustrated in FIG. 10G smaller than a pitch of neighboring two of its micro-bumps or micro-pads 34, wherein the pitch of said neighboring two of its micro-bumps or micro-pads 34 may be between 20 and 300 micrometers, between 30 and 250 micrometers, between 50 and 200 micrometers, between 60 and 180 micrometers or greater than 60, 100, 150 or 200 micrometers, and a ratio of the pitch of said neighboring two of its micro-bumps or micro-pads 34 to the pitch p1 may be between 3 and 10, between 4 and 8, between 4 and 6 or greater than 4, 6 or 8.

3. Third Type of Rerouted Vertical-Through-Via (VTV) Connector

Figure 10K:
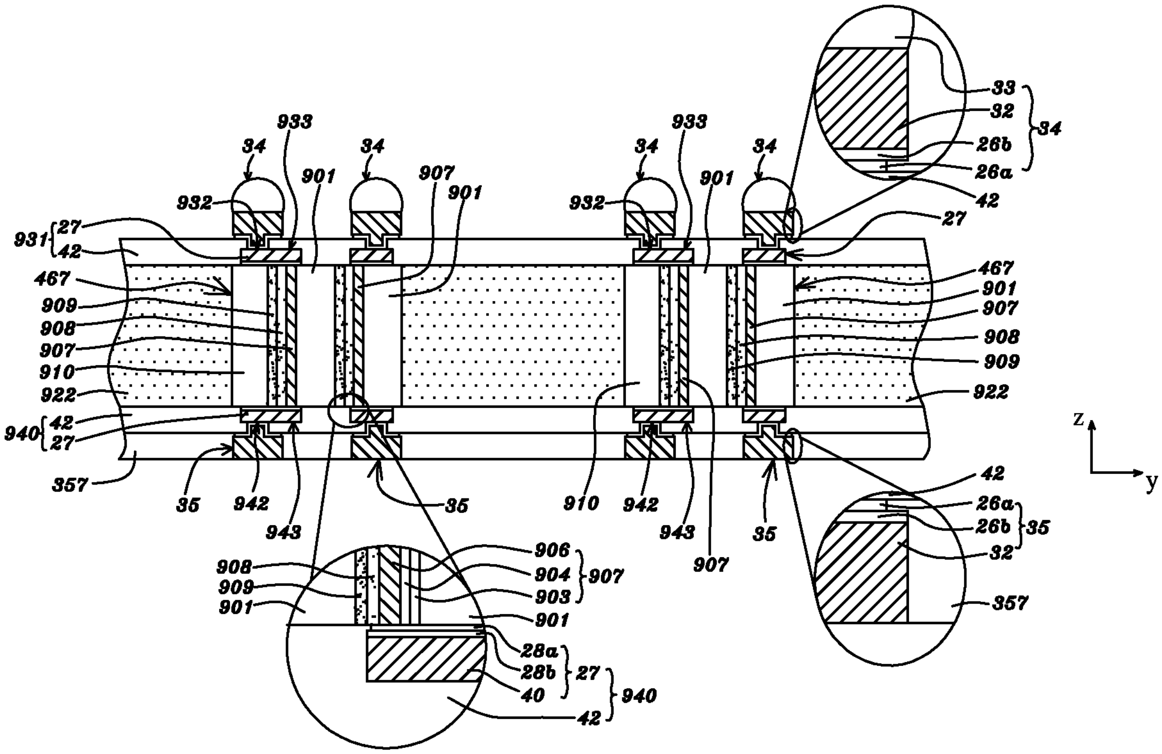
FIGS. 10K and 10L are schematically cross-sectional views in a y-z plane showing a process for fabricating a third type of rerouted vertical-through-via (VTV) connector in accordance with an embodiment of the present application.
Figure 10L:
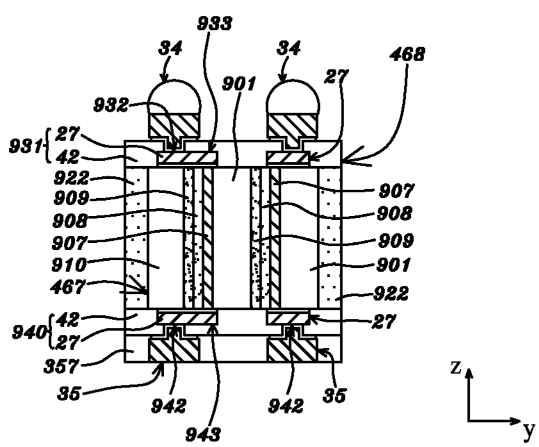

FIGS. 10K and 10L are schematically cross-sectional views in a y-z plane showing a process for fabricating a third type of rerouted vertical-through-via (VTV) connector in accordance with an embodiment of the present application. The process for fabricating a third type of rerouted vertical-through-via (VTV) connector 468 as seen in FIGS. 10K and 10L is similar to that for fabricating the second type of rerouted vertical-through-via (VTV) connector 468 as illustrated in FIGS. 10A-10J, but the third type of rerouted vertical-through-via (VTV) connector 468 is further formed with another interconnection scheme 940 under its vertical-through-via (VTV) connector 467 and its polymer layer 922. For an element indicated by the same reference number shown in FIGS. 10A-10L, the specification of the element as seen in FIGS. 10K and 10L may be referred to that of the element as illustrated in FIGS. 10A-10J.

Regarding to the process for fabricating the third type of rerouted vertical-through-via (VTV) connector 468 as seen in FIG. 10L, after the remainder of the sacrificial bonding layer 591 is pulled off as seen in FIG. 10I, the interconnection scheme 940 may be formed as seen in FIG. 10K under and on each of the vertical-through-via (VTV) connectors 467, that is, on the bottom surface of each of the bottom metal pads or contacts 907*f*, 907*v*, 917*e*, 918*e*, 919*b* and/or 919*d* thereof, the bottom surface of each of the supporting substrate(s) 901 thereof and the bottom surface of the covering substrate 910 thereof, and on the bottom surface of the polymer layer 922. The interconnection scheme 940 may include (1) an interconnection metal layer 27 under and on each of the vertical-through-via (VTV) connectors 467, that is, on the bottom surface of each of the bottom metal pads or contacts 907*f*, 907*v*, 917*e*, 918*e*, 919*b* and/or 919*d* thereof, the bottom surface of each of the supporting substrate(s) 901 thereof and the bottom surface of the covering substrate 910 thereof, and on the bottom surface of the polymer layer 922, wherein the interconnection metal layer 27 of the interconnection scheme 940 couples to each of the bottom metal pads or contacts 907*f*, 907*v*, 917*e*, 918*e*, 919*b* and/or 919*d* of each of the vertical-through-via (VTV) connectors 467, and (2) a polymer layers 42, i.e., insulating dielectric layer, under and on each of the vertical-through-via (VTV) connectors 467, that is, on the bottom surface of each of the supporting substrate(s) 901 thereof and the bottom surface of the covering substrate 910 thereof, on the bottom surface of the polymer layer 922 and on a bottom surface of the interconnection metal layer 27 of the interconnection scheme 940, wherein the interconnection metal layer 27 of the interconnection scheme 940 may be patterned with multiple metal pads at tops of multiple openings in the polymer layers 42 of the interconnection scheme 940 respectively. The interconnection metal layer 27 of the interconnection scheme 940 may include (1) an adhesion layer 28*a*, such as titanium or titanium nitride having a thickness of between 1 nm and 50 nm, under and on each of the vertical-through-via (VTV) connectors 467, that is, on the bottom surface of each of the bottom metal pads or contacts 907*f*, 907*v*, 917*e*, 918*e*, 919*b* and/or 919*d* thereof, the bottom surface of each of the supporting substrate(s) 901 thereof and the bottom surface of the covering substrate 910 thereof, and on the bottom surface of the polymer layer 922, (2) a seed layer 28*b*, such as copper, on a bottom surface of the adhesion layer 28*a*, and (3) a copper layer 40 having a thickness of between 0.3 μm and 20 μm on a bottom surface of the seed layer 28*b*, wherein the copper layer 40 may have a sidewall not covered by the adhesion layer 28*a*. The interconnection metal layer 27 of the interconnection scheme 940 may have the same specification as that of the second interconnection scheme 588 of the first type of semiconductor integrated-circuit (IC) chip 100 as illustrated in FIG. 3A, and the polymer layers 42 of the interconnection scheme 931 may have the same specification as that of the second interconnection scheme 588 of the first type of semiconductor integrated-circuit (IC) chip 100 as illustrated in FIG. 3A. The interconnection metal layer 27 of the interconnection scheme 940 may extend horizontally across an edge of each of the vertical-through-via (VTV) connectors 467. The interconnection metal layer 27 of the interconnection scheme 940 may be patterned with (1) multiple rerouted metal pads 942 on the bottom surface of the supporting substrate(s) 901 of its vertical-through-via (VTV) connector 467, the bottom surface of the covering substrate 910 of its vertical-through-via (VTV) connector 467 and the bottom surface of its polymer layer 922, and (2) multiple rerouted metal traces 943 on the bottom surface of the bottom metal pads or contacts 907*f*, 907*v*, 917*e*, 918*e*, 919*b* and/or 919*d* of its vertical-through-via (VTV) connector 467, the bottom surface of the supporting substrate(s) 901 of its vertical-through-via (VTV) connector 467, the bottom surface of the covering substrate 910 of its vertical-through-via (VTV) connector 467 and the bottom surface of its polymer layer 922, wherein each of its rerouted metal traces 943 may couple one of its rerouted metal pads 942 to one of the bottom metal pads or contacts 907*f*, 907*v*, 917*e*, 918*e*, 919*b* and/or 919*d* of its vertical-through-via (VTV) connector 467.

Next, multiple micro-bumps or micro-pads 35, each of which may have the same specification as the first type of micro-bumps or micro-pads 34 as illustrated in FIG. 3A, each may have the adhesion layer 26*a* formed on a bottom surface of one of the rerouted metal pads 942 of the interconnection scheme 940, i.e., on a bottom surface of the copper layer 40 of the interconnection metal layer 27 of the interconnection scheme 940. Next, an insulating dielectric layer 357, such as polymer layer, may be formed on a bottom surface of the polymer layer 42 of the interconnection scheme 940, covering a sidewall of the copper layer 32 of each of the micro-bumps or micro-pads 35, wherein the insulating dielectric layer 357 may have a bottom surface coplanar with a bottom surface of the copper layer 32 of each of the micro-bumps or micro-pads 35. The insulating dielectric layer 357 may have the same specification as the insulating dielectric layer 257 of the second type of semiconductor integrated-circuit (IC) chip 100 illustrated in FIG. 3B. Next, the polymer layers 42 of the interconnection schemes 931 and 940, the insulating dielectric layer 357 and the polymer layer 922 may be cut or diced to separate multiple individual units each for the third type of rerouted vertical-through-via (VTV) connector 468 as shown in FIG. 10L by a laser cutting process or mechanical cutting process.

Figure 10M:
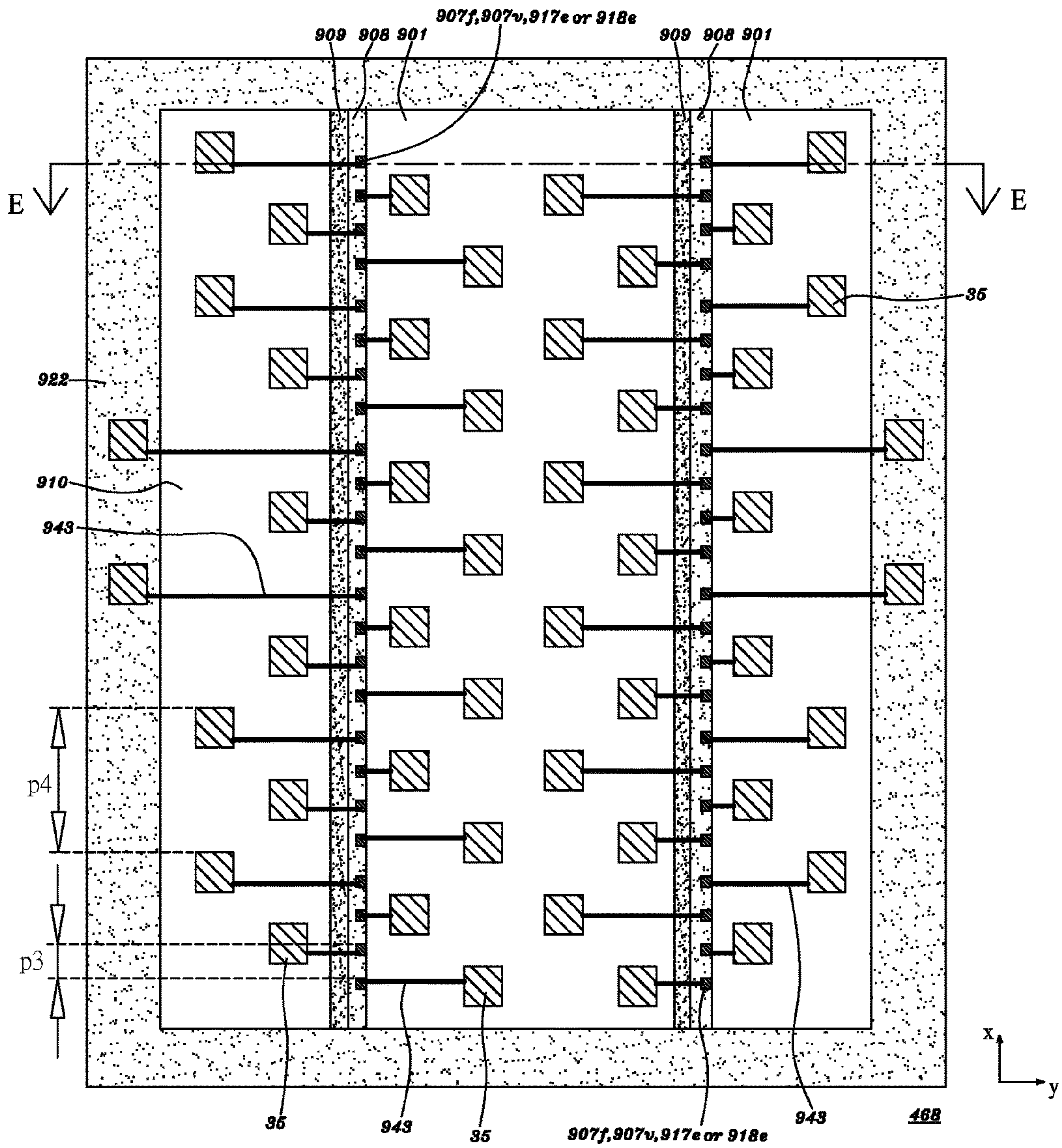
FIG. 10M is a schematically bottom view in an x-y plane showing an interconnection metal layer and multiple micro-bumps or micro-pads of a third type of rerouted vertical-through-via (VTV) connector in accordance with an embodiment of the present application.

FIG. 10M is a schematically bottom view in an x-y plane showing an interconnection metal layer and multiple micro-bumps or micro-pads of a third type of rerouted vertical-through-via (VTV) connector in accordance with an embodiment of the present application, wherein FIG. 10L is a cross-sectional view along a cross-sectional line E-E of FIG. 10M. Referring to FIGS. 10L and 10M, for each of the third type of rerouted vertical-through-via (VTV) connectors 468, neighboring two of the bottom metal pads or contacts 907*f*, 907*v*, 917*e*, 918*e*, 919*b* and/or 919*d* of its vertical-through-via (VTV) connector 467 may have a pitch p3, such as between 3 and 60 micrometers, between 5 and 30 micrometers, between 3 and 20 micrometers, between 10 and 40 micrometers, between 10 and 60 micrometers or smaller than 5, 10, 20, 30 or 60 micrometers, smaller than a pitch p4 of neighboring two of its micro-bumps or micro-pads 35, wherein the pitch p4 may be between 20 and 300 micrometers, between 30 and 250 micrometers, between 50 and 200 micrometers, between 60 and 180 micrometers or greater than 60, 100, 150 or 200 micrometers, and a ratio of the pitch p4 to the pitch p3 may be between 3 and 10, between 4 and 8, between 4 and 6 or greater than 4, 6 or 8.

4. Fourth Type of Rerouted Vertical-Through-Via (VTV) Connector

Figure 10N:
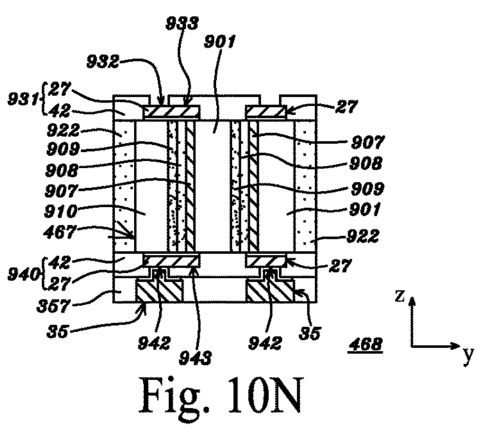
FIG. 10N is a schematically cross-sectional view in a y-z plane showing a fourth type of rerouted vertical-through-via (VTV) connector in accordance with an embodiment of the present application.

FIG. 10N is a schematically cross-sectional view in a y-z plane showing a fourth type of rerouted vertical-through-via (VTV) connector in accordance with an embodiment of the present application. The process for fabricating a fourth type of rerouted vertical-through-via (VTV) connector 468 as seen in FIG. 10N is similar to that for fabricating the third type of rerouted vertical-through-via (VTV) connector 468 as illustrated in FIGS. 10A-10M, but the micro-bumps or micro-pads 34 fabricated for the third type of rerouted vertical-through-via (VTV) connector 468 is not formed for the fourth type of rerouted vertical-through-via (VTV) connector 468. For an element indicated by the same reference number shown in FIGS. 10A-10N, the specification of the element as seen in FIG. 10N may be referred to that of the element as illustrated in FIGS. 10A-10M.

5. Fifth Type of Rerouted Vertical-Through-Via (VTV) Connector

Figure 10O:
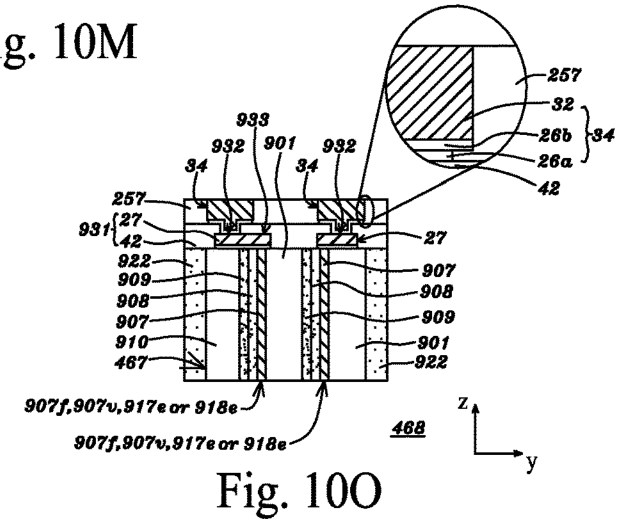
FIG. 10O is a schematically cross-sectional view in a y-z plane showing a fifth type of rerouted vertical-through-via (VTV) connector in accordance with an embodiment of the present application.

FIG. 10O is a schematically cross-sectional view in a y-z plane showing a fifth type of rerouted vertical-through-via (VTV) connector in accordance with an embodiment of the present application. The process for fabricating a fifth type of rerouted vertical-through-via (VTV) connector 468 as seen in FIG. 10O is similar to that for fabricating the second type of rerouted vertical-through-via (VTV) connector 468 as illustrated in FIGS. 10H-10J, but the fifth type of rerouted vertical-through-via (VTV) connector 468 is further formed with an insulating dielectric layer 257 on the polymer layer 42 of its interconnection scheme 931.

Regarding to the process for fabricating the fifth type of rerouted vertical-through-via (VTV) connector 468 as seen in FIG. 10O, after the interconnection scheme 931 is formed as illustrated in FIG. 10D, each of the micro-bumps or micro-pads 34 may be formed on one of the rerouted metal pads 932 of the interconnection scheme 931 as seen in FIG. 10H. Each of the micro-bumps or micro-pads 34 may have the same specification as the first type of micro-bumps or micro-pads 34 as illustrated in FIG. 3A, having the adhesion layer 26*a* formed on a top surface of the copper layer 40 of the interconnection metal layer 27 of the interconnection scheme 931.

Next, an insulating dielectric layer 257, such as polymer layer, may be formed on a top surface of the polymer layer 42 of the interconnection scheme 931, covering a sidewall of the copper layer 32 of each of the micro-bumps or micro-pads 34, wherein the insulating dielectric layer 257 may have a top surface coplanar with a top surface of the copper layer 32 of each of the micro-bumps or micro-pads 34. The insulating dielectric layer 257 may have the same specification as the insulating dielectric layer 257 of the second type of semiconductor integrated-circuit (IC) chip 100 illustrated in FIG. 3B. Next, the glass or silicon substrate 589 as seen in FIG. 10H may be released from the sacrificial bonding layer 591, which may be referred to the step as illustrated in FIG. 10E. Next, the remainder of the sacrificial bonding layer 591 may be pulled off, which may be referred to the step as illustrated in FIG. 10E. Next, the insulating dielectric layer 257, the polymer layer 42 of the interconnection scheme 931 and the polymer layer 922 may be cut or diced to separate multiple individual units each for the fifth type of rerouted vertical-through-via (VTV) connector 468 as shown in FIG. 10O by a laser cutting process or mechanical cutting process. For each of the fifth type of rerouted vertical-through-via (VTV) connectors 468, the top metal pads or contacts 907*e*, 907*n*, 907*u*, 917*d*, 918*d*, 919*a* and/or 919*c* of its vertical-through-via (VTV) connector 467 may have the pitch p1 as illustrated in FIG. 10G smaller than a pitch of neighboring two of its micro-bumps or micro-pads 34, wherein the pitch of said neighboring two of its micro bumps or micro-pads 34 may be between 20 and 300 micrometers, between 30 and 250 micrometers, between 50 and 200 micrometers, between 60 and 180 micrometers or greater than 60, 100, 150 or 200 micrometers, and a ratio of the pitch of said neighboring two of its micro-bumps or micro-pads 34 to the pitch p1 may be between 3 and 10, between 4 and 8, between 4 and 6 or greater than 4, 6 or 8.

Specification for Pad-Enlarged Vertical-Through-Via (VTV) Connector

1. First Type of Pad-Enlarged Vertical-Through-Via (VTV) Connector

Figure 4J:
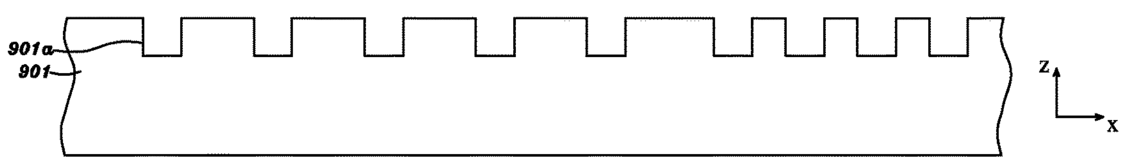
FIGS. 4J-4M are schematically cross-sectional views in a x-z plane showing a process for fabricating a first type of pad-enlarged vertical-through-via (VTV) connector in accordance with an embodiment of the present application.
Figure 4K:
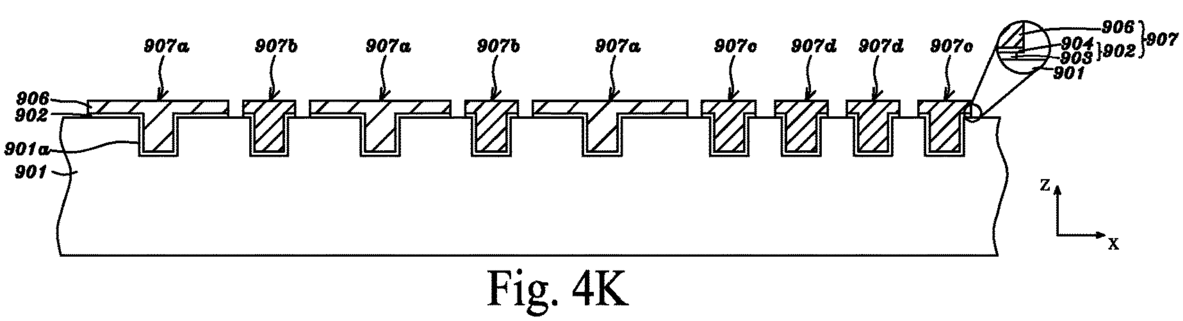

FIGS. 4J-4M are schematically cross-sectional views in a x-z plane showing a process for fabricating a first type of pad-enlarged vertical-through-via (VTV) connector in accordance with an embodiment of the present application. FIG. 5D is a top view in an x-y plane showing a process for fabricating a first type of pad-enlarged vertical-through-via (VTV) connector in accordance with an embodiment of the present application, wherein FIG. 4K is a cross-sectional view along a cross-sectional line F-F of FIG. 5D. Referring to FIG. 4J, the supporting substrate 901 is provided with the same specification as one illustrated in FIG. 4A. Next, multiple blind holes 901*a* may be formed in the supporting substrate 901 by lithographic and etching processes, sand blasting process or mechanical-drilling or laser-drilling process, wherein each of the blind holes 901*a* may have a depth between 10 and 150 micrometers, between 20 and 100 micrometers or between 30 and 60 micrometers, from a top surface of the supporting substrate 901.

Next, referring to FIG. 4K, the interconnection metal layer 907 as illustrated in FIGS. 4A and 4B may be formed on the top surface of the supporting substrate 901 and in the blind holes in the supporting substrate 901. The interconnection metal layer 907 may include (1) the adhesion metal layer 903 of titanium or titanium nitride with a thickness between 1 and 50 nanometers or between 5 and 200 nanometers on the top surface of the supporting substrate 901 and the bottom and sidewall of each of the blind holes in the supporting substrate 901, (2) the seed metal layer 904 of copper with a thickness between 1 and 500 nanometers or between 5 and 200 nanometers on the adhesion metal layer 903 and in each of the blind holes in the supporting substrate 901, and (3) the bulk metal layer 906 of copper with a thickness between 3 and 50 micrometers, between 3 and 10 micrometers, between 5 and 20 micrometers or between 10 and 50 micrometers on the seed metal layer 904 and in each of the blind holes in the supporting substrate 901.

Referring to FIGS. 4K and 5D, the interconnection metal layer 907 may be provided with a first group of circuits including multiple ground metal lines 907*a* for coupling to a voltage of ground reference and multiple transmission metal lines 907*b* each for transmitting signals with a first frequency greater than 10, 20, 30 or 50 GHz. Each of the transmission metal lines 907*b* may be arranged between neighboring two of the ground metal lines 907*a*, wherein said neighboring two of the ground metal lines 907*a* may extend in parallel with said each of the transmission metal lines 907*b*, wherein said each of the transmission metal lines 907*b* may have a width w4 between 3 and 50 micrometers, between 3 and 10 micrometers, between 5 and 20 micrometers, between 10 and 50 micrometers or smaller than 5, 10, 20, 30 or 60 micrometers, and each of said neighboring two of the ground metal lines 907*a* may have a width w5 greater than the width w4 of said each of the transmission metal lines 907*b*, wherein the width w5 of each of said neighboring two of the ground metal lines 907*a* may be between 5 and 50 micrometers, between 10 and 20 micrometers or between 15 and 30 micrometers. A space sp1 between said each of the transmission metal lines 907*b* and each of said neighboring two of the ground metal lines 907*a* may be substantially the same as the width w4 of said each of the transmission metal lines 907*b* and smaller than the width w5 of each of said neighboring two of the ground metal lines 907*a*, wherein the space sp1 between said each of the transmission metal lines 907*b* and each of said neighboring two of the ground metal lines 907*a* may be between 3 and 60 micrometers, between 5 and 30 micrometers, between 3 and 20 micrometers, between 10 and 40 micrometers, between 10 and 60 micrometers or smaller than 5, 10, 20, 30 or 60 micrometers. Alternatively, each of the ground metal lines 907*a* may be replaced with a power metal line for coupling to a voltage of power supply, which has the same specifications as those of said each of the ground metal lines 907*a*.

Furthermore, the interconnection metal layer 907 may be provided with a second group of circuits including multiple ground metal lines 907*c* for coupling to a voltage of ground reference respectively and signal metal lines 907*d* each for transmitting signals with a second frequency lower than the first frequency. Each of the ground metal lines 907*c* and signal metal lines 907*d* may have a width w6 between 3 and 50 micrometers, between 3 and 10 micrometers, between 5 and 20 micrometers, between 10 and 50 micrometers or smaller than 5, 10, 20, 30 or 60 micrometers. A space sp2 between each neighboring two of the ground metal lines 907*c* and signal metal lines 907*d* may be substantially the same as the width w6 of said each of the ground metal lines 907*c* and signal metal lines 907*d*, the width w4 of said each of the transmission metal lines 907*b* and the space sp1 between said each of the transmission metal lines 907*b* and each of said neighboring two of the ground metal lines 907*a*, and smaller than the width w5 of each of said neighboring two of the ground metal lines 907*a*, wherein the space sp2 between said each neighboring two of the ground metal lines 907*c* and signal metal lines 907*d* may be between 3 and 60 micrometers, between 5 and 30 micrometers, between 3 and 20 micrometers, between 10 and 40 micrometers, between 10 and 60 micrometers or smaller than 5, 10, 20, 30 or 60 micrometers. Alternatively, each of the ground metal lines 907*c* may be replaced with a power metal line for coupling to a voltage of power supply, which has the same specifications as those of said each of the ground metal lines 907*c*.

Figure 4L:
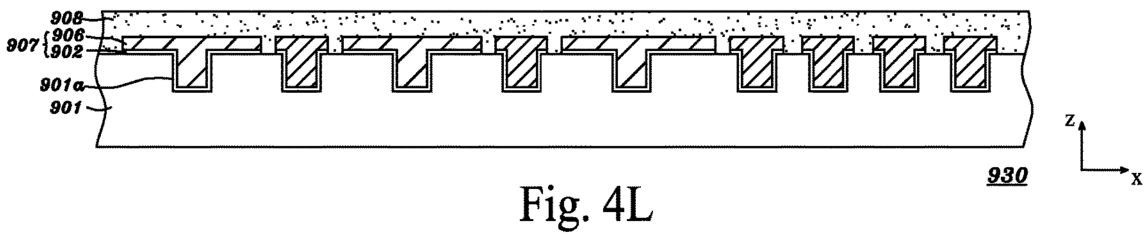
Figure 5D:
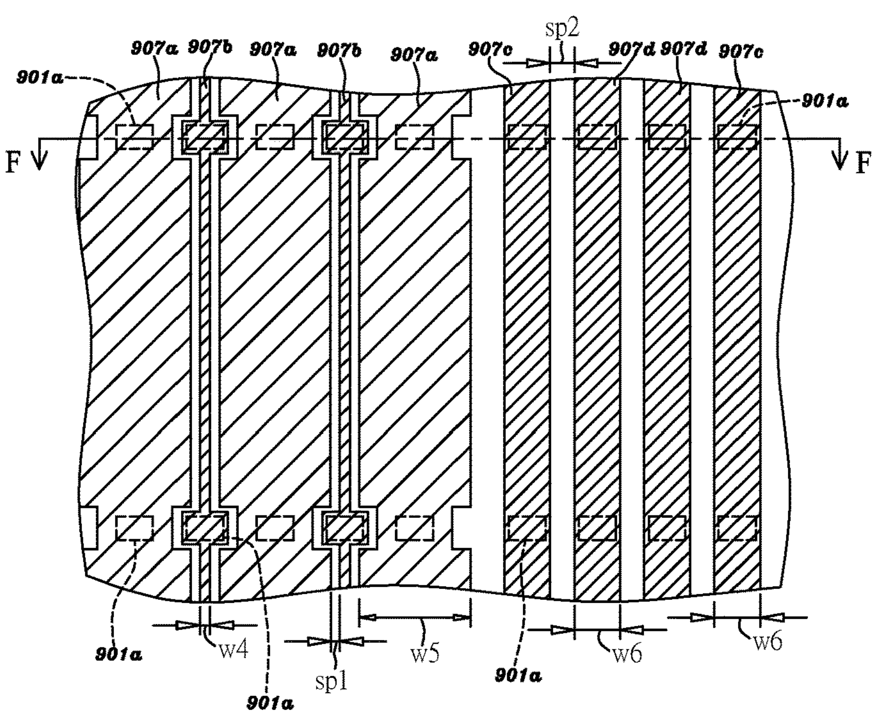
FIG. 5D is a top view in an x-y plane showing a process for fabricating a first type of pad-enlarged vertical-through-via (VTV) connector in accordance with an embodiment of the present application

Next, referring to FIG. 4L, the insulating dielectric layer 908, or polymer layer, having the same specification as one illustrated in FIG. 4C may be optionally formed on the top surface of the supporting substrate 901 with covering the interconnection metal layer 907. Next, a chemical mechanical polishing (CMP), polishing or grinding process may be optionally applied to remove a bottom portion of the supporting substrate 901, planarize a bottom surface of the supporting substrate 901 and thin the supporting substrate 901 to make the supporting substrate 901 to be thinned with a thickness between 30 and 400 micrometers, between 50 and 200 micrometers or between 30 and 100 micrometers. So far, a pad-enlarged metal-trance-on-substrate (MTOSub) unit 930 may be formed.

Figure 4M:
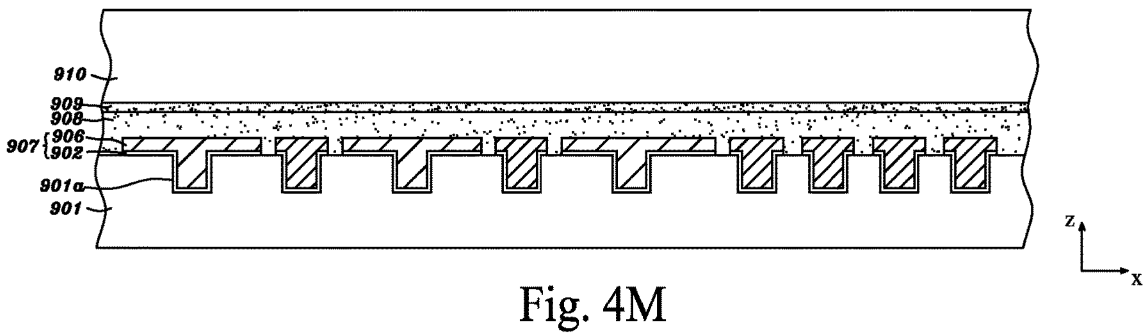

Next, referring to FIG. 4M, if the pad-enlarged metal-trance-on-substrate (MTOSub) unit 930 is formed with the insulating dielectric layer 908, the adhesive polymer layer 909 may be provided to mount the covering substrate 910 to the pad-enlarged metal-trance-on-substrate (MTOSub) unit 930 by the first step as illustrated in FIG. 4E. Alternatively, if the pad-enlarged metal-trance-on-substrate (MTOSub) unit 930 is formed without the insulating dielectric layer 908, the adhesive polymer layer 909 may be provided to mount the covering substrate 910 to the pad-enlarged metal-trance-on-substrate (MTOSub) unit 930 by the second step as illustrated in FIG. 4E. The adhesive polymer layer 909 may have a thickness between 5 and 70 micrometers, between 5 and 15 micrometers, between 5 and 20 micrometers, between 10 and 30 micrometers or between 20 and 50 micrometers. The covering substrate 910 may be a glass substrate having the same specification as illustrated in FIG. 4A for the supporting substrate 901. Alternatively, the covering substrate 910 may be a silicon substrate having a thickness between 50 and 600 micrometers, between 50 and 400 micrometers, between 100 and 300 micrometers, between 120 and 600 micrometers or between 150 and 500 micrometers. So far, a pad-enlarged vertical-through-via (VTV) substrate, panel or wafer is formed.

Figure 4N:
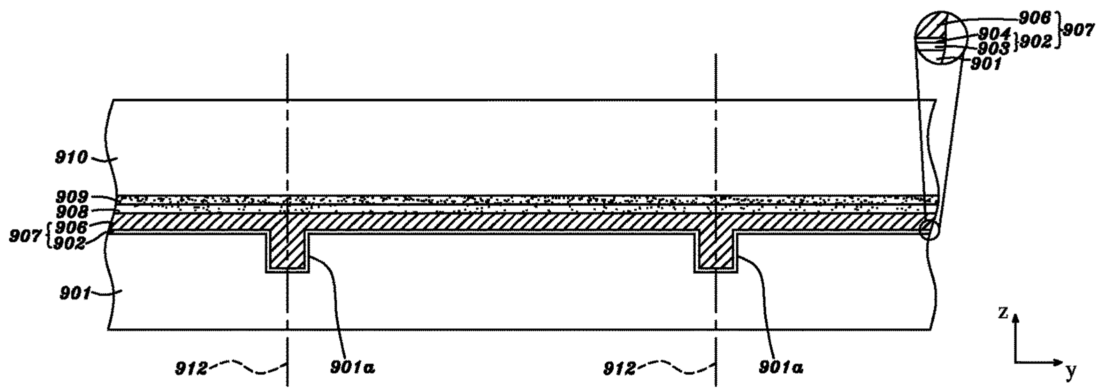
FIGS. 4N-4P are schematically cross-sectional views in a y-z plane showing a process for fabricating a first type of pad-enlarged vertical-through-via (VTV) connector in accordance with an embodiment of the present application.
Figure 4O:
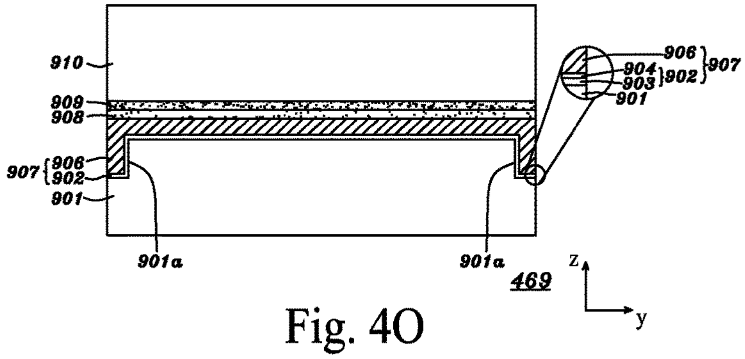
Figure 4P:
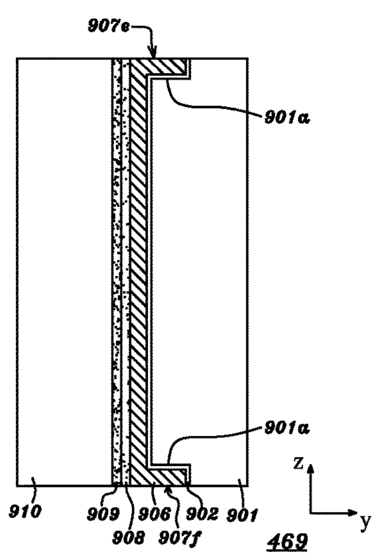
Figure 5E:
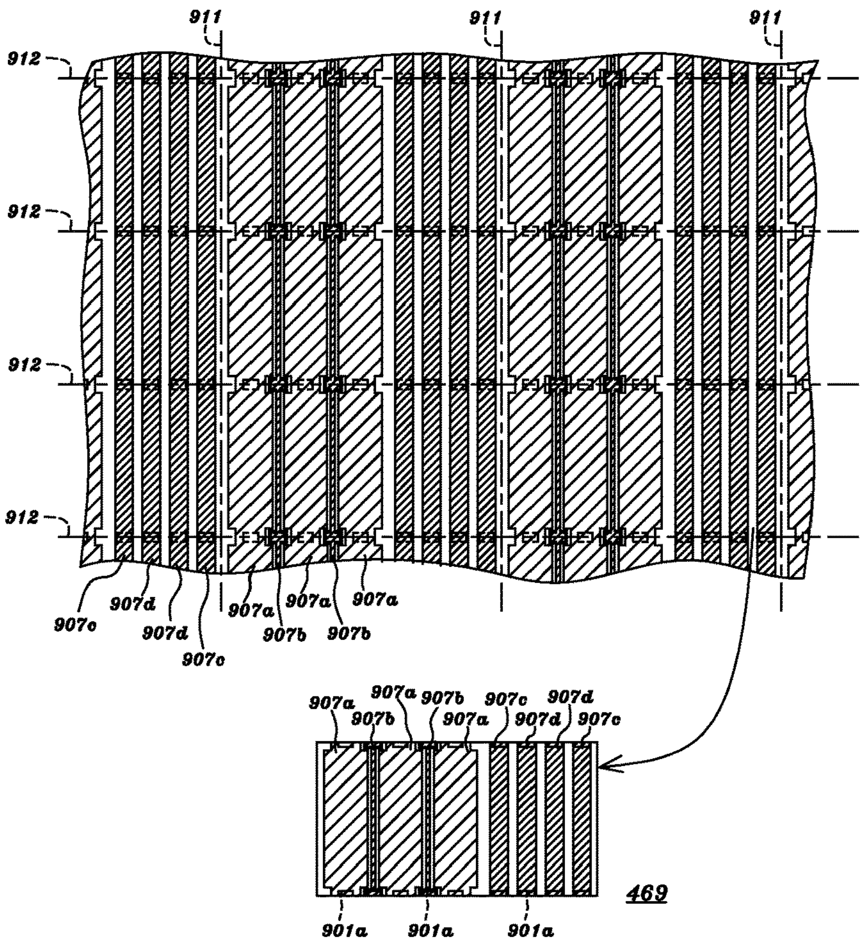
FIG. 5E is a schematically top view in an x-y plane showing an arrangement of reserved scribe lines and interconnection metal layer of a pad-enlarged vertical-through-via (VTV) substrate, panel or wafer for multiple first type of pad-enlarged vertical-through-via (VTV) connectors with various shapes in accordance with an embodiment of the present application.

FIG. 5E is a schematically top view in an x-y plane showing an arrangement of reserved scribe lines and interconnection metal layer of a pad-enlarged vertical-through-via (VTV) substrate, panel or wafer for multiple first type of pad-enlarged vertical-through-via (VTV) connectors with various shapes in accordance with an embodiment of the present application. FIGS. 4N-4P are schematically cross-sectional views in a y-z plane showing a process for fabricating a first type of pad-enlarged vertical-through-via (VTV) connector in accordance with an embodiment of the present application. Referring to FIGS. 4M and 5E, multiple first reserved scribe lines 911 extending in a y direction and multiple second reserved scribe lines 912 passing through multiple of the blind holes aligned in a line in a x direction vertical to the y direction are defined, wherein the interconnection metal layer 907 may include multiple duplicated circuit portions having the same circuit pattern, each between neighboring two of its first reserved scribe lines 911 and neighboring two of its second reserved scribe lines 912. Next, referring to FIGS. 4N and 5E, multiple first type of pad-enlarged vertical-through-via (VTV) connectors 469 may be separated each as seen in FIG. 4O by cutting or dicing the covering substrate 910, the supporting substrate 901 and the interconnection metal layer 907 in and over the blind holes 901 along some or all of the first reserved scribe lines 911 and some or all of the second reserved scribe lines 912. Accordingly, each of the first type of pad-enlarged vertical-through-via (VTV) connectors 469 may be arranged with a width in an x direction for containing one or more of the duplicated circuit portions and a length in a y direction for containing one or more of the duplicated circuit portions. The pad-enlarged vertical-through-via (VTV) substrate, panel or wafer as seen in FIGS. 4M, 4N and 5E may have a fixed pattern of design and layout for the interconnection metal layer 907, and may be cut or diced to form a number of the first type of pad-enlarged vertical-through-via (VTV) connectors 469 in a single-die type, having various dimensions or shapes and various numbers of the ground metal lines 907*a* and 907*c*, transmission metal lines 907*b* and signal metal lines 907*d*.

Next, referring to FIG. 4O, each of the first type of pad-enlarged vertical-through-via (VTV) connectors 469 may have a first surface in an x-y plane at a top thereof to be picked up by a pick-up tip and then moved in a z direction. Next, said each of the first type of pad-enlarged vertical-through-via (VTV) connectors 469 may be rotated by the pick-up tip by 90 degrees clockwise in a y-z plane as seen in FIG. 4P. Next, referring to FIG. 4P, said each of the first type of pad-enlarged vertical-through-via (VTV) connectors 469 may have a second surface in an x-y plane at a top thereof to be picked up by a place tip and then to be placed in a tray 914 as seen in FIG. 4I. Thereby, for each of the first type of pad-enlarged vertical-through-via (VTV) connectors 469, each of its ground metal lines 907*a* and 907*c*, transmission metal lines 907*b* and signal metal lines 907*d* may be formed with a top enlarged metal pad or contact 927*e*, in and at a top one of the blind holes 901*a* in its supporting substrate 901, having a top surface coplanar with a top surface of its supporting substrate 901, i.e., a top surface of the glass substrate for its supporting substrate 901 or a top surface of the silicon substrate for its supporting substrate 901, and to a top surface of its covering substrate 910, i.e., a top surface of the glass substrate for its covering substrate 910 or a top surface of the silicon substrate for its covering substrate 910, and a bottom enlarged metal pad or contact 927*f*, in and at a bottom one of the blind holes 901*a* in its supporting substrate 901, having a bottom surface coplanar with a bottom surface of its supporting substrate 901, i.e., a bottom surface of the glass substrate for its supporting substrate 901 or a bottom surface of the silicon substrate for its supporting substrate 901, and to a bottom surface of its covering substrate 910, i.e., a bottom surface of the glass substrate for its covering substrate 910 or a bottom surface of the silicon substrate for its covering substrate 910. Each of the top and bottom enlarged metal pads or contacts 927*e* and 927*f* of each of its ground metal lines 907*a* and 907*c*, transmission metal lines 907*b* and signal metal lines 907*d* may have a width in the y direction, such as between 10 and 100 micrometers or between 20 and 60 micrometers, greater than a thickness, in the y direction, of said each of its ground metal lines 907*a* and 907*c*, transmission metal lines 907*b* and signal metal lines 907*d*. A vertical distance between the top and bottom surfaces of each of its supporting substrate 901 and covering substrate 910 may be between 20 and 500 micrometers or between 20 and 3,000 micrometers. In this case, each of its ground metal lines 907*a* and 907*c*, transmission metal lines 907*b* and signal metal lines 907*d* may extend, from the top surface of the top metal pad or contact 927*e* thereof to the bottom surface of the bottom metal pad or contact 927*f* thereof, in a straight line.

2. Second Type of Pad-Enlarged Vertical-Through-Via (VTV) Connector

Figure 8G:
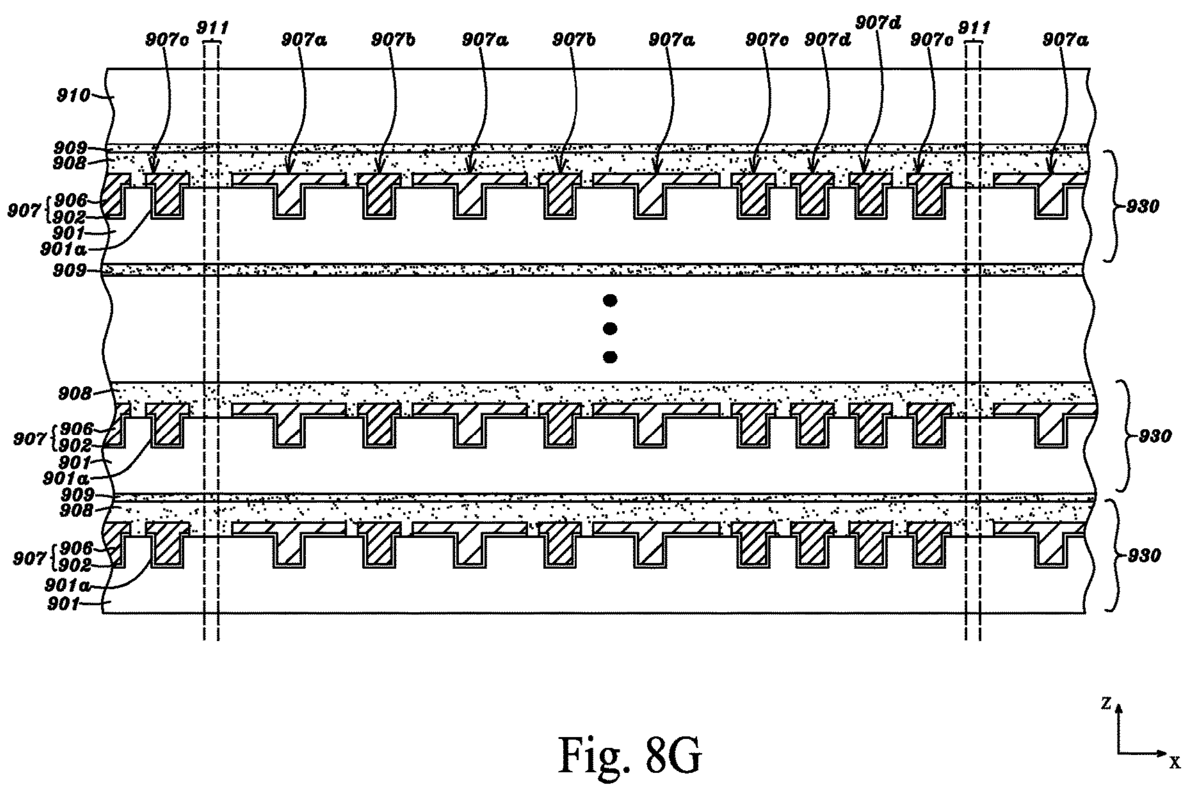
FIGS. 8G and 8H are schematically cross-sectional views in an x-z plane showing a process for fabricating a second type of pad-enlarged vertical-through-via (VTV) connector in accordance with an embodiment of the present application.
Figure 8H:
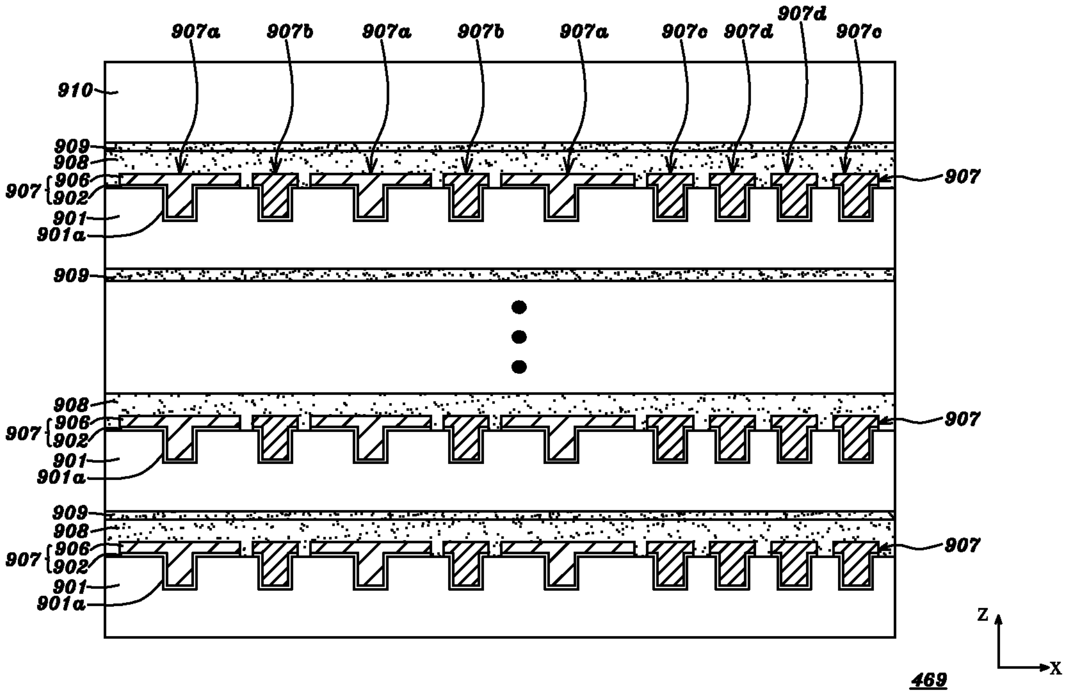
Figure 8I:
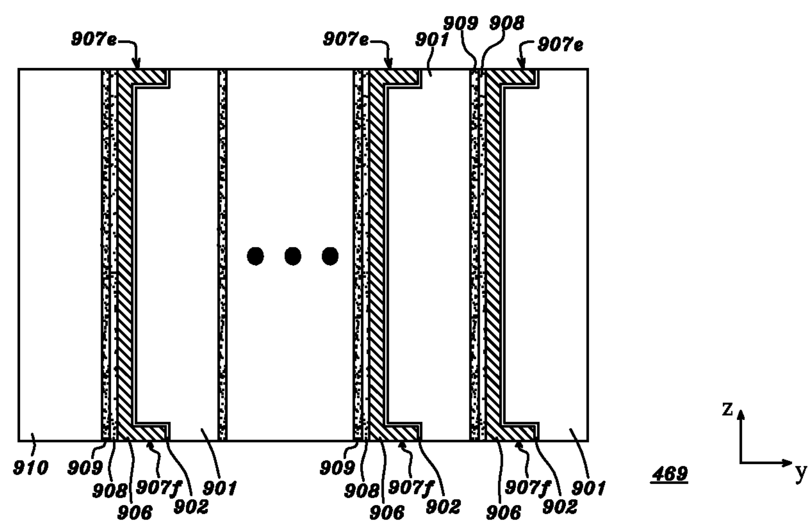
FIG. 8I is a schematically cross-sectional view in a y-z plane showing a second type of pad-enlarged vertical-through-via (VTV) connector in accordance with an embodiment of the present application.

FIGS. 8G and 8H are schematically cross-sectional views in an x-z plane showing a process for fabricating a second type of pad-enlarged vertical-through-via (VTV) connector in accordance with an embodiment of the present application. FIG. 8I is a schematically cross-sectional view in a y-z plane showing a second type of pad-enlarged vertical-through-via (VTV) connector in accordance with an embodiment of the present application. Referring to FIG. 8G, multiple pad-enlarged metal-trance-on-substrate (MTOSub) units 930 each as illustrated in FIG. 4L may be provided to be stacked with each other or one another to fabricate a second type of pad-enlarged vertical-through-via (VTV) connector 469. If a lower one of the pad-enlarged metal-trance-on-substrate (MTOSub) units 930 is formed with the insulating dielectric layer 908, an adhesive polymer layer 909 may be provided to mount the supporting substrate 901 of an upper one of the pad-enlarged metal-trance-on-substrate (MTOSub) units 930 to the lower one of the pad-enlarged metal-trance-on-substrate (MTOSub) units 930 by laminating a dry film of polyimide, epoxy, polybenzoxazole (PBO) or benzocyclobutene (BCB) onto a top surface of the insulating dielectric layer 908 of the lower one of the pad-enlarged metal-trance-on-substrate (MTOSub) units 930, next placing the upper one of the pad-enlarged metal-trance-on-substrate (MTOSub) units 930 on a top surface of the dry film and then curing or crosslinking the dry film into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to a bottom surface of the supporting substrate 901 of the upper one of the pad-enlarged metal-trance-on-substrate (MTOSub) units 930 and bond the adhesive polymer layer 909 to the top surface of the insulating dielectric layer 908 of the lower one of the pad-enlarged metal-trance-on-substrate (MTOSub) units 930, or by spin-on coating, screen-printing or dispensing a precursor layer of polyimide, epoxy, polybenzoxazole (PBO) or benzocyclobutene (BCB) on the top surface of the insulating dielectric layer 908 of the lower one of the pad-enlarged metal-trance-on-substrate (MTOSub) units 930, next placing the upper one of the pad-enlarged metal-trance-on-substrate (MTOSub) units 930 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the supporting substrate 901 of the upper one of the pad-enlarged metal-trance-on-substrate (MTOSub) units 930 and bond the adhesive polymer layer 909 to the top surface of the insulating dielectric layer 908 of the lower one of the pad-enlarged metal-trance-on-substrate (MTOSub) units 930. The adhesive polymer layer 909 may have the same specification as one illustrated in FIG. 4E.

Alternatively, if a lower one of the pad-enlarged metal-trance-on-substrate (MTOSub) units 930 is formed without the insulating dielectric layer 908, an adhesive polymer layer 909 may be provided to mount the supporting substrate 901 of an upper one of the pad-enlarged metal-trance-on-substrate (MTOSub) units 930 to the lower one of the pad-enlarged metal-trance-on-substrate (MTOSub) units 930 by laminating a dry film of polyimide, epoxy, polybenzoxazole (PBO) or benzocyclobutene (BCB) onto a top surface of the supporting substrate 901 of the lower one of the pad-enlarged metal-trance-on-substrate (MTOSub) units 930 and a top surface of the interconnection metal layer 907 of the lower one of the pad-enlarged metal-trance-on-substrate (MTOSub) units 930, next placing the upper one of the pad-enlarged metal-trance-on-substrate (MTOSub) units 930 on a top surface of the dry film and then curing or crosslinking the dry film into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the supporting substrate 901 of the upper one of the pad-enlarged metal-trance-on-substrate (MTOSub) units 930 and bond the adhesive polymer layer 909 to the top surface of the supporting substrate 901 of the lower one of the pad-enlarged metal-trance-on-substrate (MTOSub) units 930 and the top surface of the interconnection metal layer 907 of the lower one of the pad-enlarged metal-trance-on-substrate (MTOSub) units 930, or by spin-on coating, screen-printing or dispensing a precursor layer of polyimide, epoxy, polybenzoxazole (PBO) or benzocyclobutene (BCB) on the top surface of the supporting substrate 901 of the lower one of the pad-enlarged metal-trance-on-substrate (MTOSub) units 930 and the top surface of the interconnection metal layer 907 of the lower one of the pad-enlarged metal-trance-on-substrate (MTOSub) units 930, next placing the upper one of the pad-enlarged metal-trance-on-substrate (MTOSub) units 930 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the supporting substrate 901 of the upper one of the pad-enlarged metal-trance-on-substrate (MTOSub) units 930 and bond the adhesive polymer layer 909 to the top surface of the supporting substrate 901 of the lower one of the pad-enlarged metal-trance-on-substrate (MTOSub) units 930 and the top surface of the interconnection metal layer 907 of the lower one of the pad-enlarged metal-trance-on-substrate (MTOSub) units 930. The adhesive polymer layer 909 may have the same specification as one illustrated in FIG. 4E.

Next, referring to FIG. 8G, if the topmost one of the pad-enlarged metal-trance-on-substrate (MTOSub) units 930 is formed with the insulating dielectric layer 908, an adhesive polymer layer 909 may be provided to mount a covering substrate 910 to the topmost one of the pad-enlarged metal-trance-on-substrate (MTOSub) units 930 by laminating a dry film of polyimide, epoxy, polybenzoxazole (PBO) or benzocyclobutene (BCB) onto a top surface of the insulating dielectric layer 908 of the topmost one of the pad-enlarged metal-trance-on-substrate (MTOSub) units 930, next placing the covering substrate 910 on a top surface of the dry film and then curing or crosslinking the dry film into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to a bottom surface of the covering substrate 910 and bond the adhesive polymer layer 909 to the top surface of the insulating dielectric layer 908 of the topmost one of the pad-enlarged metal-trance-on-substrate (MTOSub) units 930, or by spin-on coating, screen-printing or dispensing a precursor layer of polyimide, epoxy, polybenzoxazole (PBO) or benzocyclobutene (BCB) on the top surface of the insulating dielectric layer 908 of the topmost one of the pad-enlarged metal-trance-on-substrate (MTOSub) units 930, next placing the covering substrate 910 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the insulating dielectric layer 908 of the topmost one of the pad-enlarged metal-trance-on-substrate (MTOSub) units 930. Alternatively, if the topmost one of the pad-enlarged metal-trance-on-substrate (MTOSub) units 930 is formed without the insulating dielectric layer 908, the adhesive polymer layer 909 may be provided to mount the covering substrate 910 to the topmost one of the pad-enlarged metal-trance-on-substrate (MTOSub) units 930 by laminating a dry film of polyimide, epoxy, polybenzoxazole (PBO) or benzocyclobutene (BCB) onto a top surface of the supporting substrate 901 of the topmost one of the pad-enlarged metal-trance-on-substrate (MTOSub) units 930 and a top surface of the interconnection metal layer 907 of the topmost one of the pad-enlarged metal-trance-on-substrate (MTOSub) units 930, next placing the covering substrate 910 on a top surface of the dry film and then curing or crosslinking the dry film into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the supporting substrate 901 of the topmost one of the pad-enlarged metal-trance-on-substrate (MTOSub) units 930 and the top surface of the interconnection metal layer 907 of the topmost one of the pad-enlarged metal-trance-on-substrate (MTOSub) units 930, or by spin-on coating, screen-printing or dispensing a precursor layer of polyimide, epoxy, polybenzoxazole (PBO) or benzocyclobutene (BCB) on the top surface of the supporting substrate 901 of the topmost one of the pad-enlarged metal-trance-on-substrate (MTOSub) units 930 and the top surface of the interconnection metal layer 907 of the topmost one of the pad-enlarged metal-trance-on-substrate (MTOSub) units 930, next placing the covering substrate 910 on the precursor layer, and next curing or crosslinking the precursor layer into the adhesive polymer layer 909 by a heating process at a temperature higher than or equal to 50, 70, 90, 100, 125, 150, 175, 200, 225, 250, 275 or 300 degrees Celsius to bond the adhesive polymer layer 909 to the bottom surface of the covering substrate 910 and bond the adhesive polymer layer 909 to the top surface of the supporting substrate 901 of the topmost one of the pad-enlarged metal-trance-on-substrate (MTOSub) units 930 and the top surface of the interconnection metal layer 907 of the topmost one of the pad-enlarged metal-trance-on-substrate (MTOSub) units 930. The adhesive polymer layer 909 may have the same specification as one illustrated in FIG. 4E and the covering substrate 910 may have the same specification as one illustrated in FIG. 4E. Multiple first reserved scribe lines 911 extending in a y direction and multiple second reserved scribe lines (not shown) passing through multiple of the blind holes aligned in a line in a x direction vertical to the y direction are defined, wherein the interconnection metal layer 907 of each of the pad-enlarged metal-trance-on-substrate (MTOSub) units 930 may include multiple duplicated circuit portions having the same circuit pattern, each between neighboring two of the first reserved scribe lines 911 and neighboring two of the second reserved scribe lines. Next, multiple second type of pad-enlarged vertical-through-via (VTV) connectors 469 may be separated each as seen in FIG. 8H by cutting or dicing the covering substrate 910, the supporting substrate 901 of each of the pad-enlarged metal-trance-on-substrate (MTOSub) units 930 and the interconnection metal layer 907 of each of the pad-enlarged metal-trance-on-substrate (MTOSub) units 930 in and over the blind holes 901 in the supporting substrate 901 thereof along some or all of the first reserved scribe lines 911 and all of the second reserved scribe lines.

Next, referring to FIG. 8H, each of the second type of pad-enlarged vertical-through-via (VTV) connectors 469 may have a first surface in an x-y plane at a top thereof to be picked up by a pick-up tip and then moved in a z direction. Next, said each of the second type of pad-enlarged vertical-through-via (VTV) connectors 469 may be rotated by the pick-up tip by 90 degrees clockwise in a y-z plane as seen in FIG. 8I. Next, referring to FIG. 8I, said each of the second type of pad-enlarged vertical-through-via (VTV) connectors 469 may have a second surface in an x-y plane at a top thereof to be picked up by a place tip and then to be placed in a tray 914 as seen in FIG. 4I. Thereby, for each of the second type of pad-enlarged vertical-through-via (VTV) connectors 469, each of the ground metal lines 907*a* and 907*c*, transmission metal lines 907*b* and signal metal lines 907*d* of each of its interconnection metal layers 907 may be formed with a top enlarged metal pad or contact 927*e*, in and at a top one of the blind holes 901*a* in one of its supporting substrates 901, having a top surface coplanar with a top surface of each of its supporting substrates 901, i.e., a top surface of the glass substrate for each of its supporting substrates 901 or a top surface of the silicon substrate for each of its supporting substrates 901, and to a top surface of its covering substrate 910, i.e., a top surface of the glass substrate for its covering substrate 910 or a top surface of the silicon substrate for its covering substrate 910, and a bottom enlarged metal pad or contact 927*f*, in and at a bottom one of the blind holes 901*a* in said one of its supporting substrates 901, having a bottom surface coplanar with a bottom surface of each of its supporting substrates 901, i.e., a bottom surface of the glass substrate for each of its supporting substrates 901 or a bottom surface of the silicon substrate for each of its supporting substrates 901, and to a bottom surface of its covering substrate 910, i.e., a bottom surface of the glass substrate for its covering substrate 910 or a bottom surface of the silicon substrate for its covering substrate 910. Each of the top and bottom enlarged metal pads or contacts 927*e* and 927*f* of each of the ground metal lines 907*a* and 907*c*, transmission metal lines 907*b* and signal metal lines 907*d* of each of its interconnection metal layers 907 may have a width in the y direction, such as between 10 and 100 micrometers or between 20 and 60 micrometers, greater than a thickness, in the y direction, of said each of its ground metal lines 907*a* and 907*c*, transmission metal lines 907*b* and signal metal lines 907*d*. A vertical distance between the top and bottom surfaces of each of its supporting substrate 901 and covering substrate 910 may be between 20 and 500 micrometers or between 20 and 3,000 micrometers. In this case, each of its ground metal lines 907*a* and 907*c*, transmission metal lines 907*b* and signal metal lines 907*d* may extend, from the top surface of the top metal pad or contact 927*e* thereof to the bottom surface of the bottom metal pad or contact 927*f* thereof, in a straight line.

Specification for Memory Module or Unit

1. First Type of Memory Module or Unit

Figure 11A:
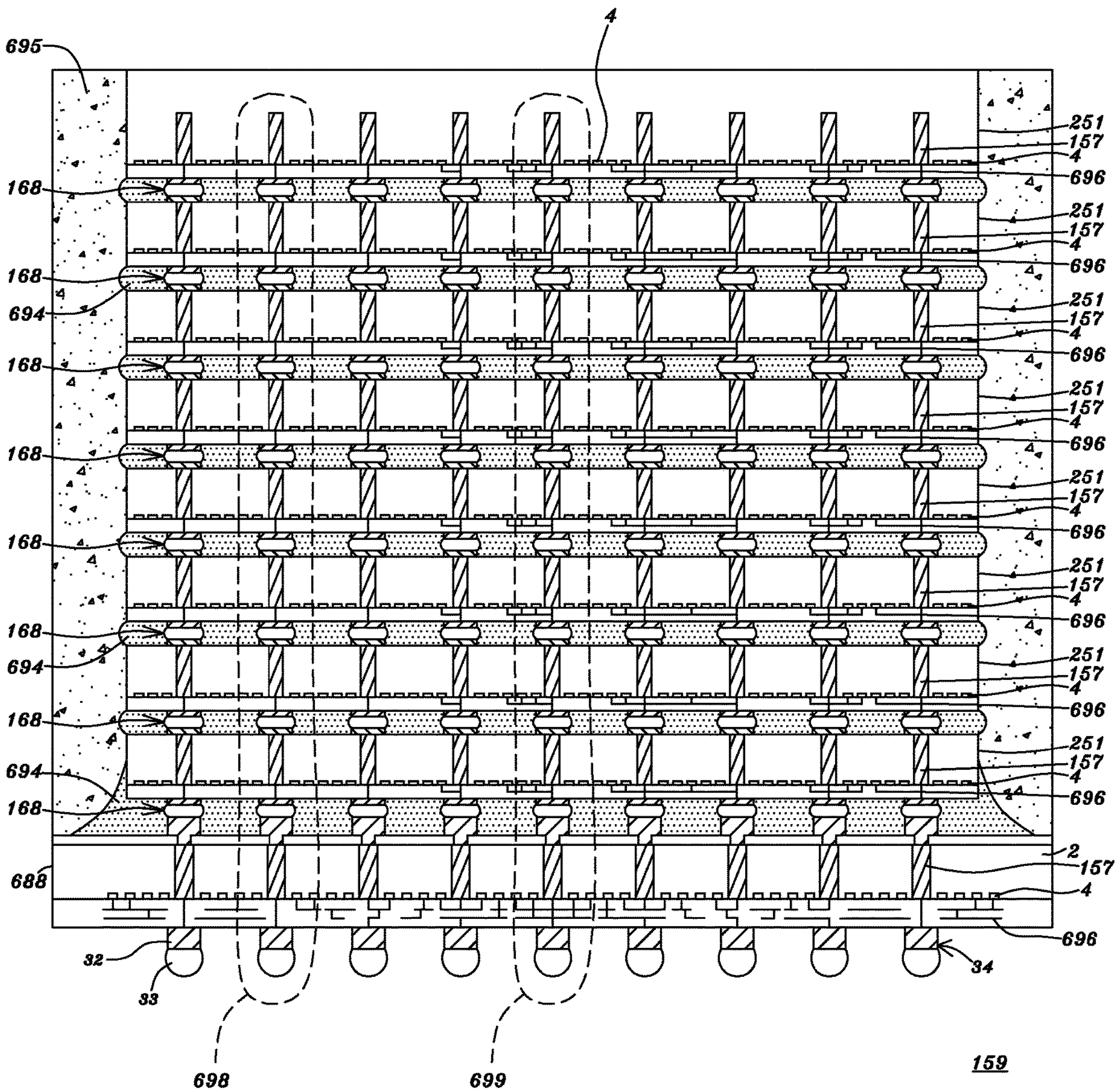
FIG. 11A-11D are schematically cross-sectional views showing various types of memory modules in accordance with an embodiment of the present application.

FIG. 11A is a schematically cross-sectional view showing a first type of memory module in accordance with an embodiment of the present application. Referring to FIG. 11A, a memory module 159 may include (1) multiple memory chips 251, such as volatile-memory (VM) integrated circuit (IC) chips for a VM module, dynamic-random-access-memory (DRAM) IC chips for a high-bitwidth memory (HBM) module, statistic-random-access-memory (SRAM) IC chips for a SRAM module, magnetoresistive random-access-memory (MRAM) IC chips for a MRAM module, resistive random-access-memory (RRAM) IC chips for a RRAM module, ferroelectric random-access-memory (FRAM) IC chips for a FRAM module or phase change random access memory (PCM) IC chips for a PCM module, vertically stacked together, wherein the number of its memory chips 251 may have the number equal to or greater than 2, 4, 8, 16, 32, (2) a control chip 688, i.e., ASIC or logic chip, under its memory chips 251 stacked thereover, and (3) multiple bonded metal bumps or contacts 168 between neighboring two of its memory chips 251 and between the bottommost one of its memory chips 251 and its control chip 688.

Referring to FIG. 11A, each of the memory chips 251 and control chip 688 may be provided with the same specification as the first type of semiconductor integrated-circuit (IC) chip 100 illustrated in FIG. 3A and turned upside down. For an element indicated by the same reference number shown in FIGS. 3B and 11A, the specification of the element as seen in FIG. 11A may be referred to that of the element as illustrated in FIG. 3B. Referring to FIGS. 3B and 5A, for each of the memory chips 251 and control chip 688 of the first type of memory module 159, its semiconductor substrate 2 may be ground or polished from a top surface thereof at its backside, other than the topmost one of the memory chips 251, to have a top surface of the copper layer 156 of each of its through silicon vias (TSVs) 157 exposed at its backside, wherein the top surface of the copper layer 156 of each of its through silicon vias (TSVs) 157 may be coplanar with the top surface of its semiconductor substrate 2, and each of its through silicon vias (TSVs) 157 may be aligned with one of its micro-bumps or micro-pads 34.

FIGS. 12A and 12B are schematically cross-sectional views showing a process of bonding a thermal compression bump to a thermal compression pad in accordance with an embodiment of the present application. Referring to FIGS. 3B, 11A, 12A and 12B, each of upper ones of the memory chips 251 may be bonded to a lower one of the memory chips 251 or to the control chip 688. Each of the lower ones of the memory chips 251 and the control chip 688 may be formed with (1) a passivation layer 15 on the top surface of its semiconductor substrate 2 at its backside as seen in FIGS. 12A and 12B, wherein each opening 15*a* in its passivation layer 15 may be aligned with the top surface of the copper layer 156 of one of its through silicon vias (TSVs) 157 and its passivation layer 15 may have the same specification as the passivation layer 14 as illustrated in FIG. 3A, and (2) multiple micro bumps or micro-pads 570 each on the top surface of the copper layer 156 of one of its through silicon vias (TSVs) 157, wherein each of its micro-bumps or micro-pads 570 may be of one of the first through fourth types having the same specifications as the first through fourth types of micro-bumps or micro-pads 34 as illustrated in FIG. 3A respectively, having the adhesion layer 26*a* formed on the top surface of the copper layer 156 of one of its through silicon vias (TSVs) 157.

For a first case, referring to FIGS. 11A, 12A and 12B, an upper one of the memory chips 251 may have the third type of micro-bumps or micro-pads 34 to be bonded to the fourth type of micro-bumps or micro-pads 570 of a lower one of the memory chips 251 or the control chip 688. For example, the third type of micro-bumps or micro-pads 34 of the upper one of the memory chips 251 may have the solder caps 38 to be thermally compressed, at a temperature between 240 and 300 degrees Celsius, at a pressure between 0.3 and 3 MPa and for a time period between 3 and 15 seconds, onto the metal caps 49 of the fourth type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. A force applied to the upper one of the memory chips 251 in the thermal compression process may be substantially equal to the pressure times a contact area between one of the third type of micro-bumps or micro-pads 34 and one of the fourth type of micro-bumps or micro-pads 570 times the total number of the third type of micro-bumps or micro-pads 34 of the upper one of the memory chips 251. Each of the third type of micro-bumps or micro-pads 34 of the upper one of the memory chips 251 may have the copper layer 37 having the thickness t3 greater than the thickness t2 of the copper layer 48 of each of the fourth type of micro-bumps or micro-pads 570 of the lower one of the memory chips 251 or the control chip 688 and having the largest transverse dimension w3 equal to between 0.7 and 0.1 times of the largest transverse dimension w2 of the copper layer 48 of each of the fourth type of micro-bumps or micro-pads 570 of the lower one of the memory chips 251 or the control chip 688. Alternatively, each of the third type of micro-bumps or micro-pads 34 may be provided with the copper layer 37 having a cross-sectional area equal to between 0.5 and 0.01 times of the cross-sectional area of the copper layer 48 of each of the fourth type of micro-bumps or micro-pads 570 of the lower one of the memory chips 251 or the control chip 688. For example, for the upper one of the memory chips 251, its third type of micro-bumps or micro-pads 34 may be formed respectively on a front surface of the metal pads 6*b* provided by the frontmost one of the interconnection metal layers 27 of its second interconnection scheme 588 or by, if the second interconnection scheme 588 is not provided, the frontmost one of the interconnection metal layers 6 of its first interconnection scheme 560, wherein each of the metal pads 6*b* may have a thickness t1 between 1 and 10 micrometers or between 2 and 10 micrometers and a largest transverse dimension w1, such as diameter in a circular shape, between 1 μm and 25 μm and each of its third type of micro-bumps or micro-pads 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pads 34 may be provided with the copper layer 37 having a cross-sectional area equal to between 0.5 and 0.01 times of the cross-sectional area of its metal pads 6*b*. A bonded solder between the copper layers 37 and 48 of each of the bonded metal bumps or contacts 168 may be mostly kept on a top surface of the copper layer 48 of one of the fourth type of micro-bumps or micro-pads 570 of the lower one of the memory chips 251 or the control chip 688 and extends out of the edge of the copper layer 48 of said one of the fourth type of micro-bumps or micro-pads 570 of the lower one of the memory chips 251 or the control chip 688 less than 0.5 micrometers. Thus, a short between neighboring two of the bonded metal bumps or contacts 168 even in a fine-pitched fashion may be avoided.

Alternatively, for a second case, referring to FIG. 11A, an upper one of the memory chips 251 may have the second type of micro-bumps or micro-pads 34 to be bonded to the first type of micro-bumps or micro-pads 570 of a lower one of the memory chips 251 or the control chip 688. For example, the second type of micro bumps or micro-pads 34 of the upper one of the memory chips 251 may have the solder caps 33 to be bonded onto the copper layer 32 of the first type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the second type of micro-bumps or micro-pads 34 of the upper one of the memory chips 251 may have the copper layer 32 having a thickness greater than that of the copper layer 32 of each of the first type of micro-bumps or micro-pads 570 of the lower one of the memory chips 251 or the control chip 688.

Alternatively, for a third case, referring to FIG. 11A, an upper one of the memory chips 251 may have the first type of micro-bumps or micro-pads 34 to be bonded to the second type of micro-bumps or micro-pads 570 of a lower one of the memory chips 251 or the control chip 688. For example, the first type of micro-bumps or micro-pads 34 of the upper one of the memory chips 251 may have the electroplated metal layer 32, e.g. copper layer, to be bonded onto the solder caps 33 of the second type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the first type of micro-bumps or micro-pads 34 of the upper one of the memory chips 251 may have the copper layer 32 having a thickness greater than that of the copper layer 32 of each of the second type of micro bumps or micro-pads 570 of the lower one of the memory chips 251 or the control chip 688.

Alternatively, for a fourth case, referring to FIG. 11A, an upper one of the memory chips 251 may have the second type of micro-bumps or micro-pads 34 to be bonded to the second type of micro-bumps or micro-pads 570 of a lower one of the memory chips 251 or the control chip 688. For example, the second type of micro-bumps or micro-pads 34 of the upper one of the memory chips 251 may have the solder caps 33 to be bonded onto the solder caps 33 of the second type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the second type of micro-bumps or micro-pads 34 of the upper one of the memory chips 251 may have the copper layer 32 having a thickness greater than that of the copper layer 32 of each of the second type of micro-bumps or micro-pads 570 of the lower one of the memory chips 251 or the control chip 688.

Referring to FIG. 11A, each of the through silicon vias (TSVs) 157 of each of the memory chips 251 and control chip 688, other than the topmost one of the memory chips 251, may be aligned with and connected to one of the bonded metal bumps or contacts 168 at the backside thereof. The through silicon vias (TSVs) 157 of the memory chips 251, which are aligned in a vertical direction, may couple to each other or one another through the bonded metal bumps or contacts 168 therebetween aligned with the through silicon vias (TSVs) 157 thereof in the vertical direction. Each of the memory chips 251 and control chip 688 may include multiple interconnects 696 each provided by the interconnection metal layers 6 of its first interconnection scheme 560 and/or the interconnection metal layers 27 of its second interconnection scheme 588 to connect one or more of its through silicon vias (TSVs) 157 to one or more of the bonded metal bumps or contacts 168 at its bottom surface. An underfill 694, e.g., polymer layer, may be provided between each neighboring two of the memory chips 251 to enclose the bonded metal bumps or contacts 168 therebetween and between the bottommost one of the memory chips 251 and the control chip 688 to enclose the bonded metal bumps or contacts 168 therebetween. A molding compound 695, e.g. a polymer, may be formed around the memory chips 251 and over the control chip 688, wherein the topmost one of the memory chips 251 may have a top surface coplanar with a top surface of the molding compound 695.

Referring to FIG. 11A, for the first type of memory module 159, each of its memory chips 251 may have a data bit-width, equal to or greater than 64, 128, 256, 512, 1024, 2048, 4096, 8K, or 16K, with external circuits of the first type of memory module 159 via the micro-bumps or micro-pads 34 of its control chip 688.

The first type of memory module 159 may include multiple vertical interconnects 699 each composed of one of the through silicon vias (TSVs) 157 of each of the memory chips 251 and control chip 688 of the first type of memory module 159, wherein the through silicon vias (TSVs) 157 for each of the vertical interconnects 699 of the first type of memory module 159 may be aligned with each other or one another and connected to one or more transistors of the semiconductor devices 4 of each of the memory chips 251 and control chip 688 of the first type of memory module 159. The first type of memory module 159 may further include multiple dedicated vertical bypasses 698 each composed of one of the through silicon vias (TSVs) 157 of each of the memory chips 251 and control chip 688 of the first type of memory module 159, wherein the through silicon vias (TSVs) 157 for each of the dedicated vertical bypasses 698 of the first type of memory module 159 may be aligned with each other or one another but not connected to any transistor of each of the memory chips 251 and control chip 688 of the first type of memory module 159. Each of the memory chips 251 and control chip 688 may be provided with one or more small I/O circuits, each having driving capability, loading, output capacitance or input capacitance between 0.05 pF and 2 pF, or 0.05 pF and 1 pF, or smaller than 2 pF or 1 pF, coupling to one of the vertical interconnects 699 of the first type of memory module 159; alternatively each of the small input/output (I/O) circuits may have an I/O power efficiency smaller than 0.5 pico-Joules per bit, per switch or per voltage swing, or between 0.01 and 0.5 pico-Joules per bit, per switch or per voltage swing, coupling to one of the vertical interconnects 699 of the first type of memory module 159.

Referring to FIG. 11A, the control chip 688 may be configured to control data access to the memory chips 251. The control chip 688 may be used for buffering and controlling the memory chips 251. Each of the through silicon vias (TSVs) 157 of the control chip 688 may be aligned with and connected to one of the micro-bumps or micro-pads 34 of the control chip 688 at the bottom surface thereof.

2. Second Type of Memory Module or Unit

Figure 11B:
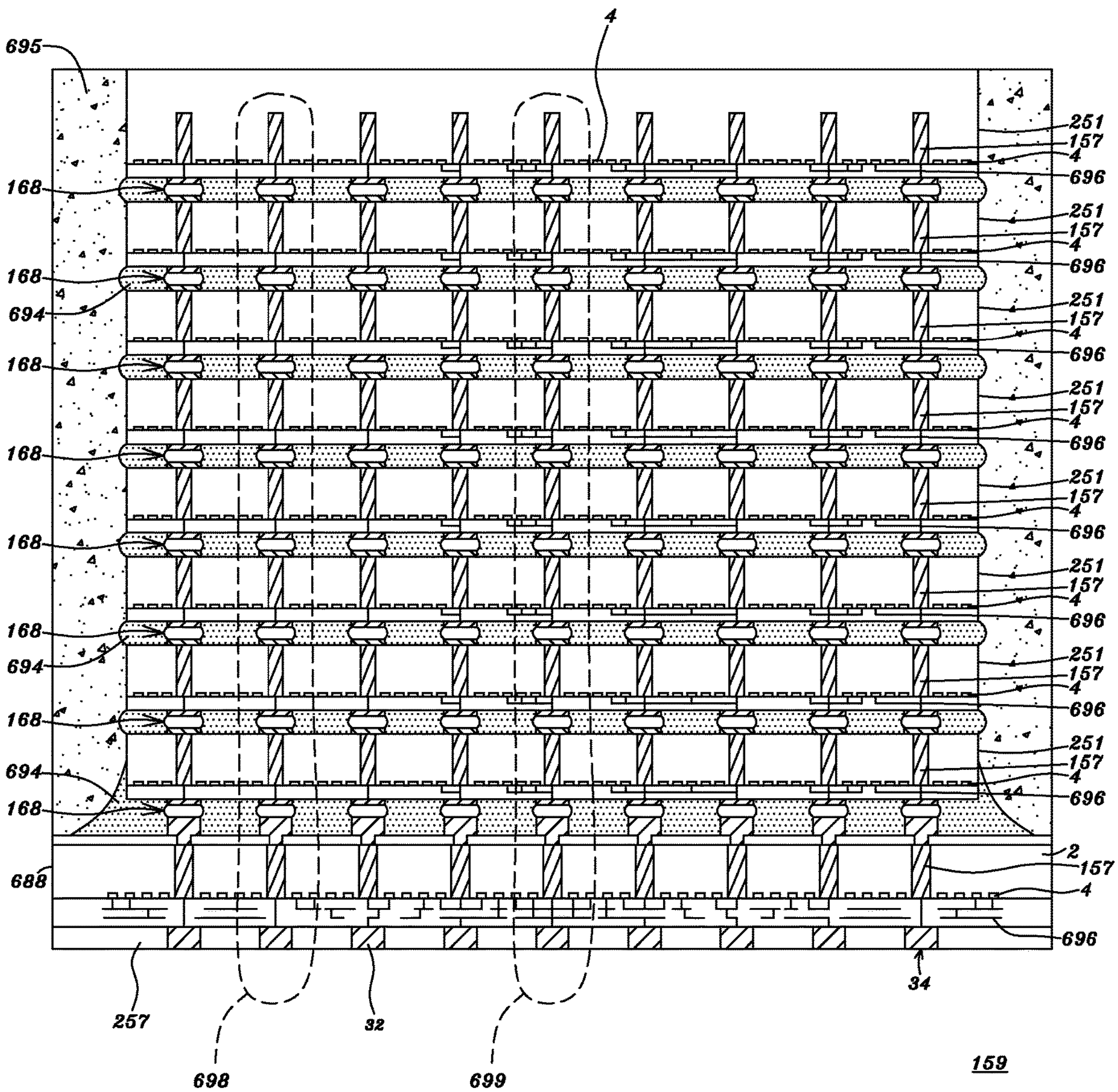

FIG. 11B is a schematically cross-sectional view showing a second type of memory module in accordance with an embodiment of the present application. Referring to FIG. 11B, a second type of memory module 159 may have a similar structure to the first type of memory module 159 as illustrated in FIG. 11A. For an element indicated by the same reference number shown in FIGS. 11A and 11B, the specification of the element as seen in FIG. 11B may be referred to that of the element as illustrated in FIG. 11A. The difference between the first and second types of memory modules 159 is mentioned as below: for the second type of memory module 159, its control chip may further include an insulating dielectric layer 257, such as polymer layer, on the bottommost one of the polymer layers 42 of the second interconnection scheme 588 of its control chip 688 or, in the case that the second interconnection scheme 588 of its control chip 688 is not formed, on and under the passivation layer 14 of its control chip 688. The micro-bumps or micro-pads 34 of its control chip 688 may be of the first type as illustrated in FIG. 3A, and the insulating dielectric layer 257 of its control chip 688 may cover a sidewall of the copper layer 32 of each of the micro bumps or micro-pads 34 of its control chip 688, wherein the insulating dielectric layer 257 of its control chip 688 may have a bottom surface coplanar with a bottom surface of the copper layer 32 of each of the micro-bumps or micro-pads 34 of its control chip 688. The insulating dielectric layer 257 of its control chip 688 may have the same specification as the insulating dielectric layer 257 of the second type of semiconductor integrated-circuit (IC) chip 100 illustrated in FIG. 3B.

3. Third Type of Memory Module or Unit

Figure 11C:
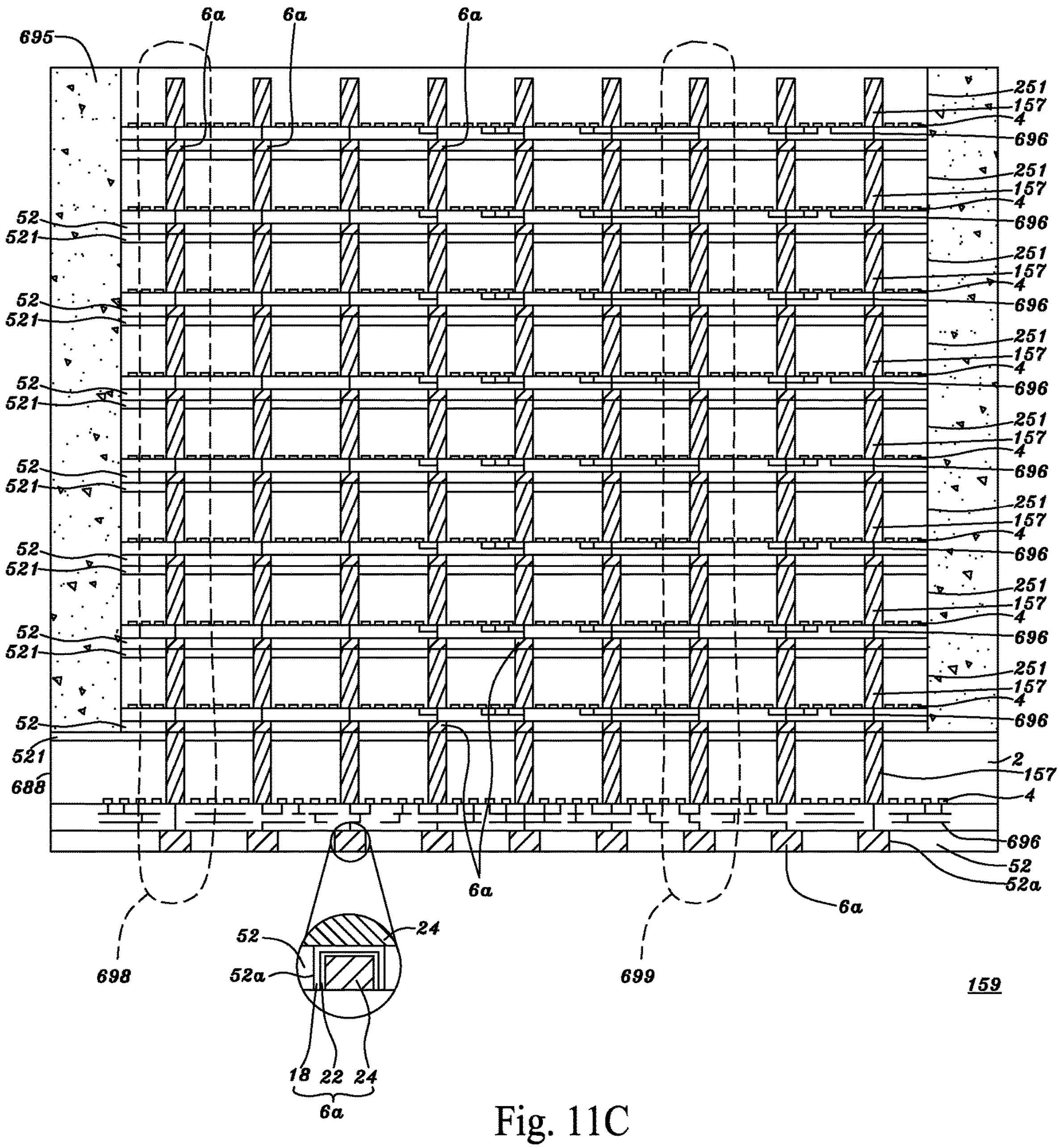
Figure 12D:
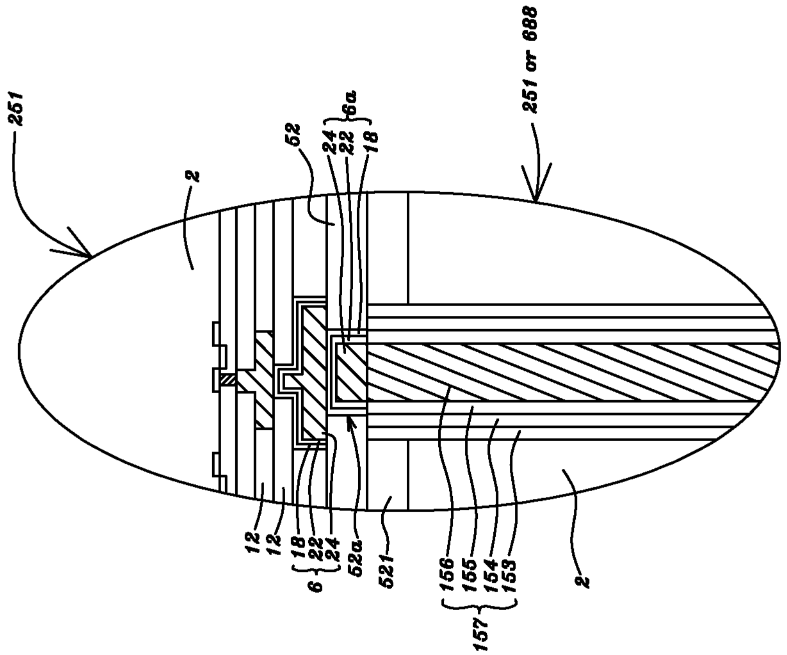
FIGS. 12C and 12D are schematically cross-sectional views showing a direct bonding process in accordance with an embodiment of the present application.
Figure 12C:
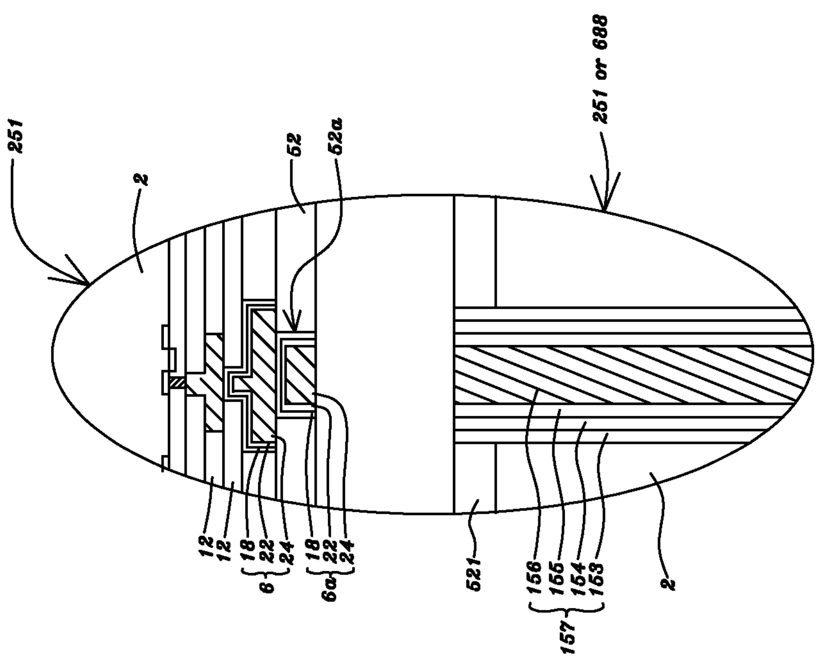

FIG. 11C is a schematically cross-sectional view showing a third type of memory module in accordance with an embodiment of the present application. Referring to FIG. 11C, a third type of memory module 159 may have a similar structure to the first type of memory module 159 illustrated in FIG. 11A. For an element indicated by the same reference number shown in FIGS. 11A and 11C, the specification of the element as seen in FIG. 11C may be referred to that of the element as illustrated in FIG. 11A. The difference between the first and third types of memory modules 159 is that a direct bonding process may be performed for the third type of memory module 159 as seen in FIG. 11C. FIGS. 12C and 12D are schematically cross-sectional views showing a direct bonding process in accordance with an embodiment of the present application. Referring to FIG. 11C, each of the memory chips 251 and control chip 688 may have the same specification as the third type of semiconductor integrated-circuit (IC) chip 100 illustrated in FIG. 3C and turned upside down. For an element indicated by the same reference number shown in FIGS. 3C and 11C, the specification of the element as seen in FIG. 11C may be referred to that of the element as illustrated in FIG. 3C. Referring to FIGS. 3C and 11C, for each of the memory chips 251 and control chip 688 of the third type of memory module 159, its semiconductor substrate 2 may be ground or polished from a top surface thereof at its backside, other than the topmost one of the memory chips 251, to have a top surface of the copper layer 156 of each of its through silicon vias (TSVs) 157 exposed at its backside, wherein the top surface of the copper layer 156 of each of its through silicon vias (TSVs) 157 may be coplanar with the top surface of its semiconductor substrate 2, and each of its through silicon vias (TSVs) 157 may be aligned with one of its metal pads 6*a*.

Referring to FIGS. 3C, 11C, 12C and 12D, each of upper ones of the memory chips 251 may be bonded to a lower one of the memory chips 251 or to the control chip 688. Each of the lower ones of the memory chips 251 and the control chip 688 may be formed with an insulating bonding layer 521 on the top surface of its semiconductor substrate 2 at its backside as seen in FIGS. 12C and 12D, wherein its insulating bonding layer 521 may include a silicon-oxide layer having a thickness between 0.1 and 2 μm, wherein its insulating bonding layer 521 may have a top surface coplanar with the top surface of the copper layer 156 of each of its through silicon vias (TSVs) 157.

Referring to FIGS. 11C, 12C and 12D, an upper one of the memory chips 251 may join a lower one of the memory chips 251 or the control chip 688 by (1) activating a joining surface, i.e., silicon oxide, of the insulating bonding layer 52 at the active side of the upper one of the memory chips 251 and a joining surface, i.e., silicon dioxide, of the insulating bonding layer 521 at the backside of the lower one of the memory chips 251 or the control chip 688 with nitrogen plasma for increasing hydrophilic property thereof, (2) next rinsing the joining surface of the insulating bonding layer 52 at the active side of the upper one of the memory chips 251 and the joining surface of the insulating bonding layer 521 at the backside of the lower one of the memory chips 251 or the control chip 688 with deionized water for water adsorption and cleaning, (3) next placing the upper one of the memory chips 251 onto the lower one of the memory chips 251 or the control chip 688 with each of the metal pads 6*a* at the active side of the upper one of the memory chips 251 in contact with one of the through silicon vias (TSVs) 157 of the lower one of the memory chips 251 and control chip 688 and with the joining surface of the insulating bonding layer 52 at the active side of the upper one of the memory chips 251 in contact with the joining surface of the insulating bonding layer 521 at the backside of the lower one of the memory chips 251 or the control chip 688, and (4) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the upper one of the memory chips 251 to the joining surface of the insulating bonding layer 521 at the backside of the lower one of the memory chips 251 or the control chip 688 and (b) copper-to-copper bonding at a temperature between 300 and 350 degrees Celsius and for a time period between 10 and 60 minutes to bond the copper layer 24 of each of the metal pads 6*a* at the active side of the upper one of the memory chips 251 to the copper layer 156 of one of the through silicon vias (TSVs) 157 of the lower one of the memory chips 251 or the control chip 688, wherein the oxide-to-oxide bonding may be caused by water desorption from reaction between the joining surface of the insulating bonding layer 52 at the active side of the upper one of the memory chips 251 and the joining surface of the insulating bonding layer 521 at the backside of the lower one of the memory chips 251 or the control chip 688, and the copper-to-copper bonding may be caused by metal inter-diffusion between the copper layer 24 of the metal pads 6*a* at the active side of the upper one of the memory chips 251 and the copper layer 156 of the through silicon vias (TSVs) 157 of the lower one of the memory chips 251 or the control chip 688.

4. Fourth Type of Memory Module or Unit

Figure 11D:
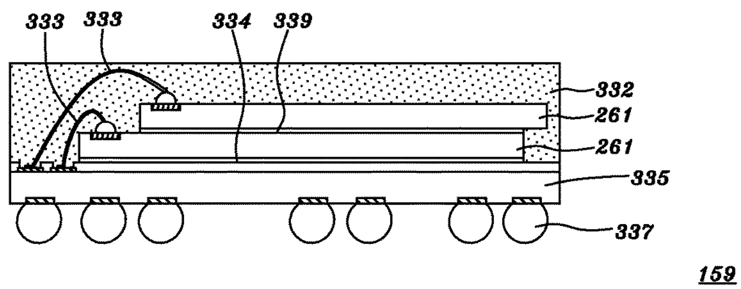

FIG. 11D is a schematically cross-sectional view showing a fourth type of memory module in accordance with an embodiment of the present application. Referring to FIG. 11D, a fourth type of memory module 159 may include (1) multiple memory integrated-circuit (IC) chips 261 stacked with each other and mounted to each other via an adhesive layer 339 such as silver paste or an heat conductive paste, wherein an upper one of its memory integrated-circuit (IC) chips 261 may overhang from an edge of a lower one of its memory integrated-circuit (IC) chips 261, wherein each of its memory integrated-circuit (IC) chips 261 may be a non-volatile memory (NVM) integrated-circuit (IC) chip, such as NAND flash chip, NOR flash chip, magnetoresistive random-access-memory (MRAM) integrated-circuit (IC) chip, resistive random access memory (RRAM) integrated-circuit (IC) chip, phase-change random-access-memory (PCM) integrated-circuit (IC) chip or ferroelectric-random-access-memory (FRAM) integrated-circuit (IC) chip, or a volatile memory (VM) integrated-circuit (IC) chip, such as high bandwidth dynamic random-access-memory (DRAM) or high bandwidth static random-access-memory (SRAM) chip, wherein for a case each of its memory integrated-circuit (IC) chips 261 may be a high bandwidth dynamic random-access-memory (DRAM) chip, or for another case the lower one of its memory integrated-circuit (IC) chips 261 may be a high bandwidth dynamic random-access-memory (DRAM) chip and the upper one of its memory integrated-circuit (IC) chips 261 may be a NAND flash chip or NOR flash chip, (2) a circuit board or ball-grid-array (BGA) substrate 335 having multiple patterned metal layers and multiple polymer layers, i.e., insulating dielectric layers, (not shown) each between neighboring two of the patterned metal layers of its circuit board or ball-grid-array (BGA) substrate 335, wherein its circuit board or ball-grid-array (BGA) substrate 335 is arranged under its memory integrated-circuit (IC) chips 261 to have the lower one of its memory integrated-circuit (IC) chips 261 to be attached to a top surface thereof via an adhesive layer 334 such as silver paste or an heat conductive paste, (3) multiple wirebonded wires 333 each coupling one of its memory integrated-circuit (IC) chips 261 to the topmost one of the patterned metal layers of its circuit board or ball-grid-array (BGA) substrate 335, (4) a molded polymer 332 over a top surface of its circuit board or ball-grid-array (BGA) substrate 335, encapsulating its memory integrated-circuit (IC) chips 261 and wirebonded wires 333 and (5) a plurality of solder balls 337 each attached to the bottommost one of the patterned metal layers of its circuit board or ball-grid-array (BGA) substrate 335.

Specification for Optical Input/Output (I/O) Module or Unit

First Type of Optical Input/Output (PO) Module

Figure 11E:
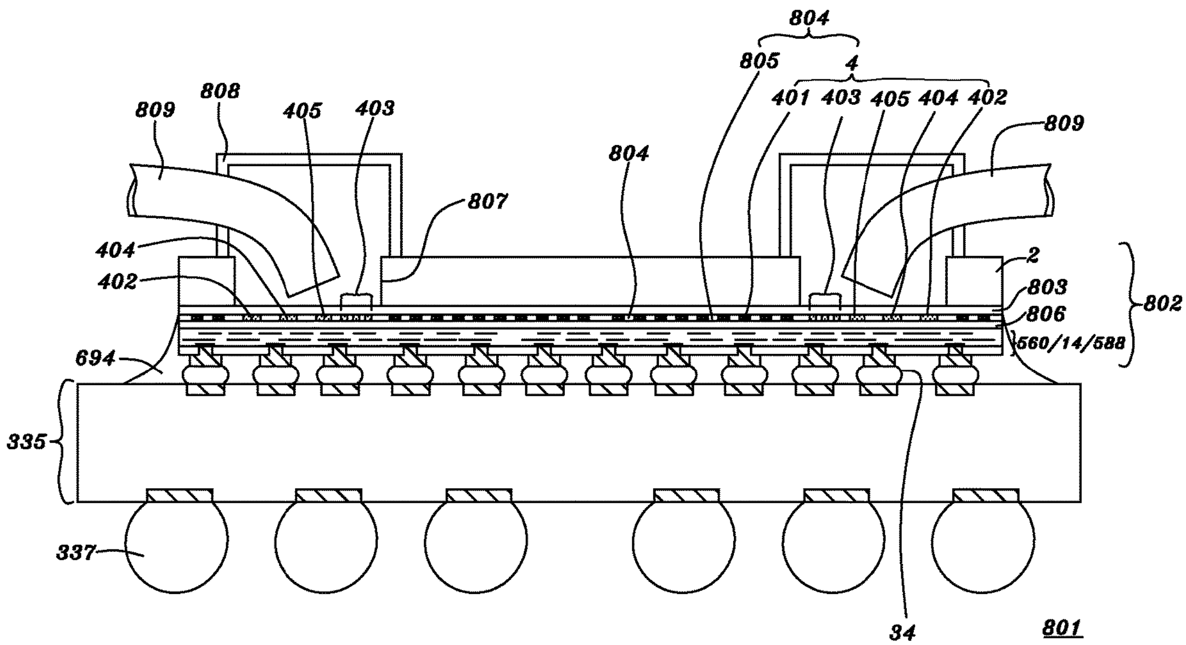
FIG. 11E is a schematically cross-sectional view showing a first type of optical input/output (I/O) module in accordance with an embodiment of the present application.

FIG. 11E is a schematically cross-sectional view showing a first type of optical input/output (PO) module in accordance with an embodiment of the present application. Referring to FIG. 11E, a first type of optical input/output (I/O) module 801 may include an optical input/output (I/O) chip 802 having the same specification as the first type of semiconductor integrated-circuit (IC) chip 100 illustrated in FIG. 3A to be turned upside down, wherein its optical input/output (PO) chip 802 may further include (1) an insulating layer 803, such as a layer of silicon dioxide, on a bottom surface of the semiconductor substrate 2 thereof, such as silicon substrate, (2) a device layer 804 on a bottom surface of the insulating layer 803 thereof, wherein the device layer 804 may include a semiconductor layer 805, such as silicon layer, on the bottom surface of the insulating layer 803 thereof, and the semiconductor devices 4 of its optical input/output (I/O) chip 802 may include a plurality of transistors 401, optical waveguides 402, optical grating couplers 403, optical transmitters or modulators 404 and photodetectors 405 each having a portion formed in the semiconductor layer 805 of the device layer 804 thereof, wherein the device layer 804 may be provided with an insulating isolator in the semiconductor layer 805 thereof and between each neighboring two of the transistors 401, optical waveguides 402, optical grating couplers 403, optical transmitters or modulators 404 and photodetectors 405 thereof, and (4) an insulating layer 806, such as a layer of silicon dioxide, on a bottom surface of the semiconductor layer 805 thereof. For the first type of optical input/output (PO) module 801, the first interconnection scheme 560 of its optical input/output (I/O) chip 802 may be formed on a bottom surface of the insulating layer 806 of its optical input/output (I/O) chip 802, the passivation layer 14 of its optical input/output (I/O) chip 802 may be formed on the bottom surface of the first interconnection scheme 560 of its optical input/output (PO) chip 802, and optionally the second interconnection scheme 588 of its optical input/output (PO) chip 802 may be formed on the bottom surface of the passivation layer 14 of its optical input/output (I/O) chip 802, as illustrated in FIG. 3A. Further, for the first type of optical input/output (PO) module 801, each of the first, second, third or fourth type of micro-bumps or micro-pads 34 of its optical input/output (I/O) chip 802 may be formed on the bottommost one of the interconnection metal layers 27 of the second interconnection scheme 588 of its optical input/output (I/O) chip 802 or, in the case that the second interconnection scheme 588 of its optical input/output (I/O) chip 802 is not formed, on a bottom surface of one of the metal pads 8 of the first interconnection scheme 560 of its optical input/output (I/O) chip 802, as illustrated in FIG. 3A. For the first type of optical input/output (I/O) module 801, a plurality of through holes 807 may be further formed extending vertically through the semiconductor substrate 2 of its optical input/output (I/O) chip 802, exposing the oxide layer 803 of its optical input/output (I/O) chip 802, wherein each of the through holes 807 in the semiconductor substrate 2 of its optical input/output (I/O) chip 802 may be aligned with and arranged vertically over one or a plurality of the optical waveguides 402 of its optical input/output (I/O) chip 802, one or a plurality of the optical grating couplers 403 of its optical input/output (I/O) chip 802, one or a plurality of the optical transmitters or modulators 404 of its optical input/output (I/O) chip 802 and one or a plurality of the photodetectors 405 of its optical input/output (I/O) chip 802.

Referring to FIG. 11E, the first type of optical input/output (I/O) module 801 may further include (1) a circuit board or ball-grid-array (BGA) substrate 335 having multiple patterned metal layers and multiple polymer layers, i.e., insulating dielectric layers, (not shown) each between neighboring two of the patterned metal layers of its circuit board or ball-grid-array (BGA) substrate 335, wherein its circuit board or ball-grid-array (BGA) substrate 335 is arranged under its optical input/output (I/O) chip 802 to have each of the first, second, third or fourth type of micro-bumps or micro-pads 34 of its optical input/output (I/O) chip 802 to be bonded to a top surface of the topmost one of the patterned metal layers of its circuit board or ball-grid-array (BGA) substrate 335, (2) an underfill 694, e.g., polymer layer, between its optical input/output (I/O) chip 802 and circuit board or ball-grid-array (BGA) substrate 335 to enclose each of the first, second, third or fourth type of micro-bumps or micro-pads 34 of its optical input/output (I/O) chip 802, (3) multiple solder balls 337 each attached to the bottommost one of the patterned metal layers of its circuit board or ball-grid-array (BGA) substrate 335, (4) an optical fiber 809 in each of the through holes 807 in the semiconductor substrate 2 of its optical input/output (I/O) chip 802, whereby input optical signals transmitted or received from the optical fiber 809 may optically couple to the optical waveguides 402, optical grating couplers 403 and photodetectors 405 of its optical input/output (I/O) chip 802, which are aligned with and vertically under said each of the through holes 807 in the semiconductor substrate 2 of its optical input/output (I/O) chip 802, and the optical transmitters or modulators 404 aligned with and vertically under said each of the through holes 807 in the semiconductor substrate 2 of its optical input/output (I/O) chip 802 may generate output optical signals optically coupling to the optical fiber 809, and (5) a cover 808 covering a top of each of the through holes 807 in the semiconductor substrate 2 of its optical input/output (I/O) chip 802 and fixing each of the optical fibers 809 to its optical input/output (I/O) chip 802.

Second Type of Optical Input/Output (I/O) Module

Figure 11F:
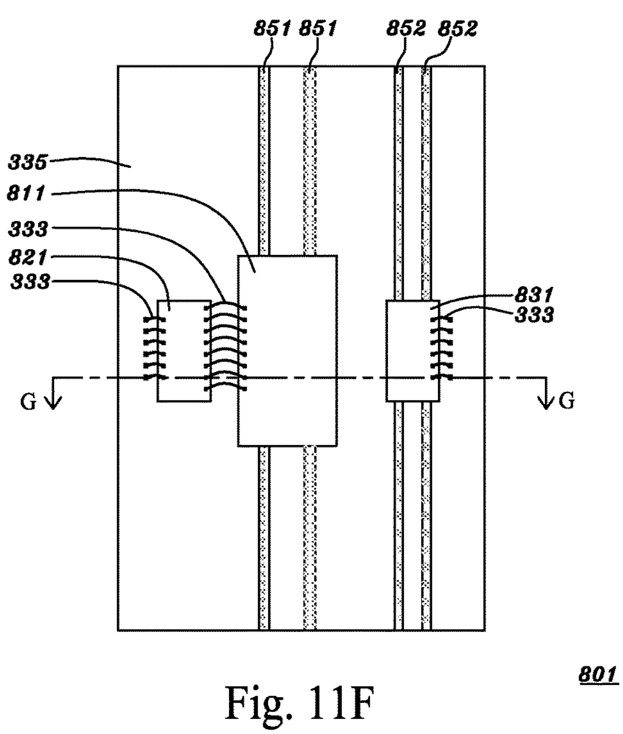
FIG. 11F is a schematically top view showing a second type of optical input/output (I/O) module in accordance with an embodiment of the present application.
Figure 11G:
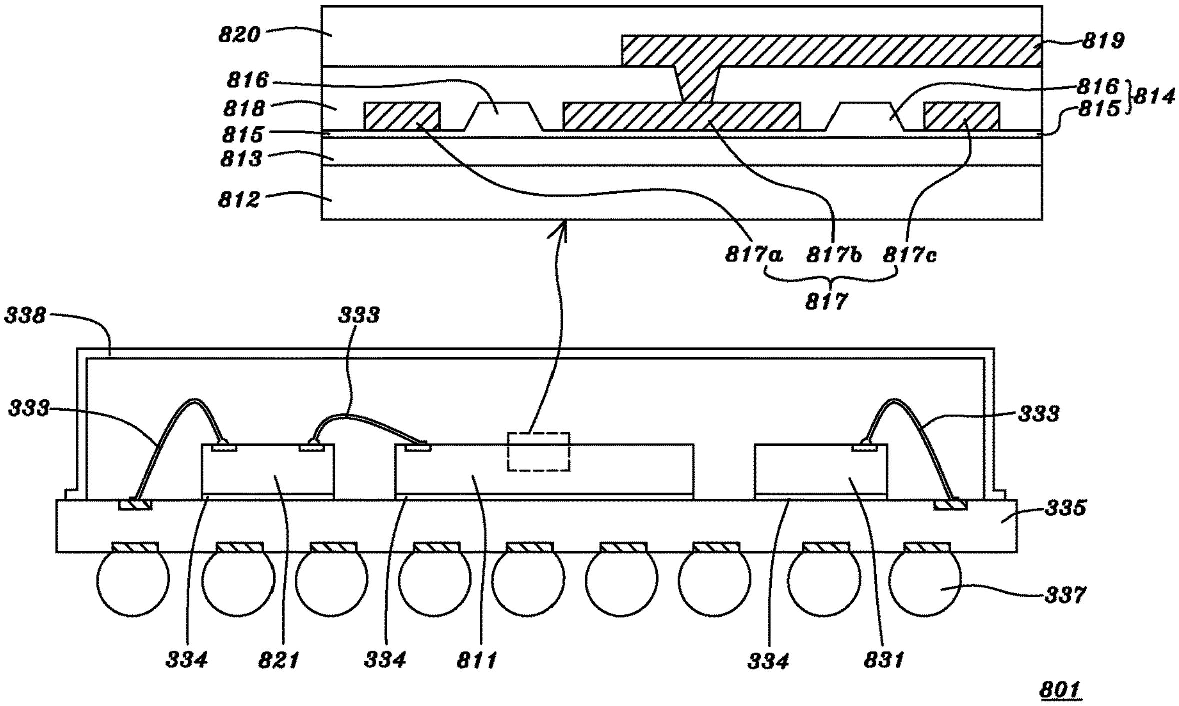
FIG. 11G is a schematically cross-sectional view cut along a cross-sectional line G-G shown in FIG. 11F.

FIG. 11F is a schematically top view showing a second type of optical input/output (I/O) module in accordance with an embodiment of the present application. FIG. 11G is a schematically cross-sectional view cut along a cross-sectional line G-G shown in FIG. 11F. Referring to FIGS. 11F and 11G, a second type of optical input/output (I/O) module 801 may include (1) a circuit board or ball-grid-array (BGA) substrate 335 having multiple patterned metal layers and multiple polymer layers, i.e., insulating dielectric layers, (not shown) each between neighboring two of the patterned metal layers of its circuit board or ball-grid-array (BGA) substrate 335, (2) three semiconductor integrated-circuit (IC) chips 811, 821 and 831 each having a bottom surface attached to a top surface of its circuit board or ball-grid-array (BGA) substrate 335 via an adhesive layer 334 such as silver paste or an heat conductive paste, (3) multiple wirebonded wires 333 each coupling one of its semiconductor integrated-circuit (IC) chips 821 and 831 to the topmost one of the patterned metal layers of its circuit board or ball-grid-array (BGA) substrate 335 or coupling its semiconductor integrated-circuit (IC) chip 811 to its semiconductor integrated-circuit (IC) chip 821, (4) a cover 338 attached to the top surface of its circuit board or ball-grid-array (BGA) substrate 335, wherein a cavity in its cover 338 may accommodate each of its semiconductor integrated-circuit (IC) chips 811, 821 and 831 and each of its wirebonded wires 333 and (5) a plurality of solder balls 337 each attached to the bottommost one of the patterned metal layers of its circuit board or ball-grid-array (BGA) substrate 335.

Referring to FIGS. 11F and 11G, for the second type of optical input/output (I/O) module 801, its semiconductor integrated-circuit (IC) chip 811 may include (1) a semiconductor substrate 812, such as silicon substrate, (2) an insulating layer 813, such as a layer of silicon dioxide, on a top surface of the semiconductor substrate 812, (3) a film 814 of lithium niobate ($LiNbO_3$) on a top surface of the insulating layer 813, wherein the film 814 of lithium niobate ($LiNbO_3$) may include a planar bottom portion 815 on the top surface of the insulating layer 813 and two fins 816 substantially extending in parallel in a direction into the paper and protruding from a top surface of the planar bottom portion 815, (4) a patterned metal layer 817, such as gold layer, on the top surface of the planar bottom portion 815, wherein the patterned metal layer 817 may include three discrete metal sheets 817*a*, 817*b* and 817*c* with a gap between each neighboring two thereof accommodating one of the two fins 816 of the film 814 of lithium niobate ($LiNbO_3$), (5) an insulating dielectric layer 818, such as silicon dioxide, on the patterned metal layer 817 and the two fins 816 of the film 814 of lithium niobate ($LiNbO_3$), wherein the insulating dielectric layer 818 may have a portion in a gap between each of the two fins 816 of the film 814 of lithium niobate ($LiNbO_3$) of its semiconductor integrated-circuit (IC) chip 811 and each neighboring one of the three discrete metal sheets 817*a*, 817*b* and 817*c* of the patterned metal layer 817, and wherein three openings (only one shown) in the insulating dielectric layer 818 may be formed over the three discrete metal sheets 817*a*, 817*b* and 817*c* of the patterned metal layer 817, (6) a patterned metal layer 819, such as gold layer, on a top surface of the insulating dielectric layer 818, wherein the patterned metal layer 819 may include a first metal piece coupling to a middle one of the three discrete metal sheets of the patterned metal layer 816 through one of the three openings in the insulating dielectric layer 818 and a second metal piece (not shown) coupling to left and right ones of the three discrete metal sheets of the patterned metal layer 817 through two of the three openings in the insulating dielectric layer 818 respectively and (7) an insulating dielectric layer 820, such as silicon dioxide, on the patterned metal layer 819 and insulating dielectric layer 818, wherein two openings (not shown) in the insulating dielectric layer 820 may be formed over the first and second metal pieces of the patterned metal layer 819 respectively, and thereby two of its wirebonded wires 333 may be bonded onto the first and second metal pieces of the patterned metal layer 819 respectively to couple the first and second metal pieces of the patterned metal layer 819 to its semiconductor integrated-circuit (IC) chip 821. Thereby, for the second type of optical input/output (I/O) module 801, its semiconductor integrated-circuit (IC) chip 811 may be configured for modulating output optical signals into an optical carrier transmitted in the two fins 816 of the film 814 of lithium niobate ($LiNbO_3$) of its semiconductor integrated-circuit (IC) chip 811 by applying two electrical voltages V1 and V2, such as voltages of power supply and ground reference, to the first and second metal pieces of the patterned metal layer 819 of its semiconductor integrated-circuit (IC) chip 811 to horizontally deform the two fins 816 of the film 814 of lithium niobate ($LiNbO_3$) of its semiconductor integrated-circuit (IC) chip 811. The two fins 816 of the film 814 of lithium niobate ($LiNbO_3$) of its semiconductor integrated-circuit (IC) chip 811 may optically couple with one or a plurality of optical fibers 851.

Referring to FIGS. 11F and 11G, for the second type of optical input/output (I/O) module 801, its semiconductor integrated-circuit (IC) chip 821 is an optical driver configured for generating, in accordance with output electrical signals transmitted from the patterned metal layers of its circuit board or ball-grid-array (BGA) substrate 335 through one or more of its wirebonded wires 333, the two electrical voltages V1 and V2 to be applied to the first and second metal pieces of the patterned metal layer 818 of its semiconductor integrated-circuit (IC) chip 811 through said two of its wirebonded wires 333 respectively.

Referring to FIGS. 11F and 11G, for the second type of optical input/output (I/O) module 801, its semiconductor integrated-circuit (IC) chip 831 is a gallium-arsenide (GaAs) integrated-circuit (IC) chip used as an optical receiver configured for detecting or receiving input optical signals transmitted from one or a plurality of optical fibers 852 and transforming the input optical signals into input electrical signals to be transmitted to the patterned metal layers of its circuit board or ball-grid-array (BGA) substrate 335 through one or more of its wirebonded wires 333.

Specification for Sub-System Module or Unit

1. First Type of Sub-system Module or Unit

Figure 13A:
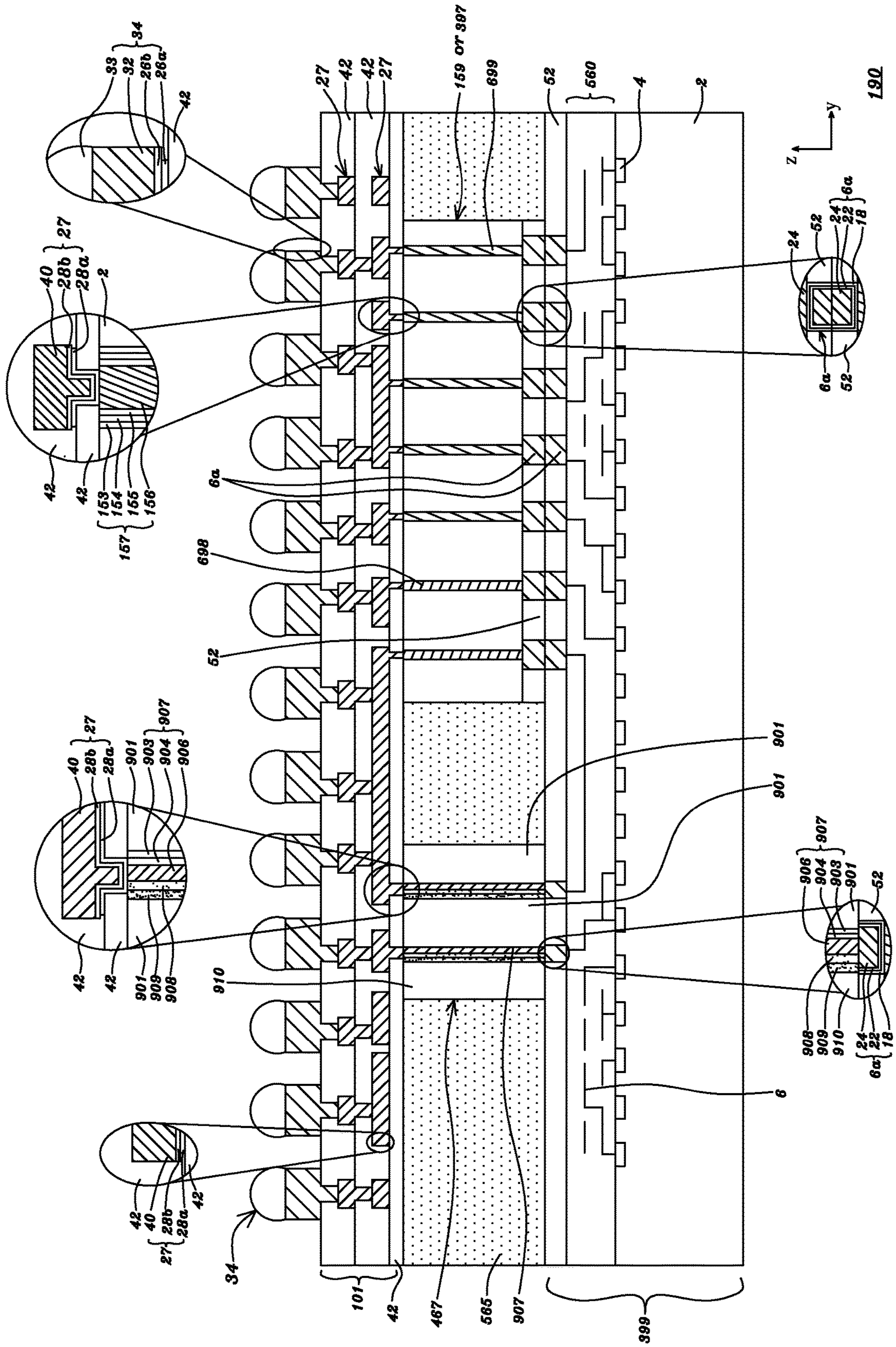
FIGS. 13A and 13B are schematically cross-sectional views showing a first type of sub-system module for two alternatives in accordance with an embodiment of the present application.
Figure 13B:
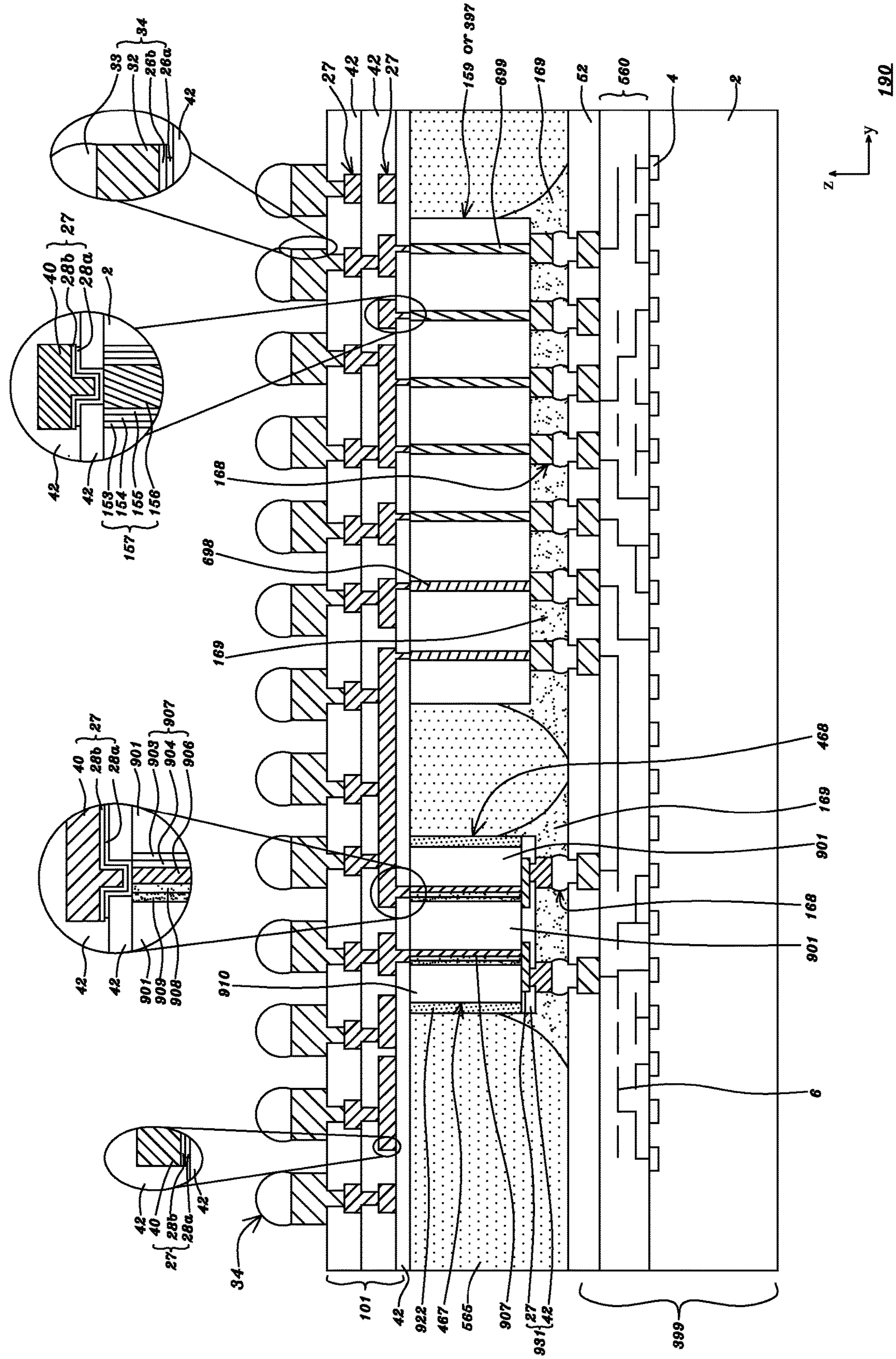

FIGS. 13A and 13B are schematically cross-sectional views showing a first type of sub-system module for two alternatives in accordance with an embodiment of the present application. Referring to FIG. 13A, a first type of sub-system module 190 may include an application specific integrated-circuit (ASIC) chip 399 having the same specification as the third type of semiconductor integrated-circuit (IC) chip 100 illustrated in FIG. 3C, wherein the application specific integrated-circuit (ASIC) chip 399 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example.

Referring to FIG. 13A, the first type of sub-system module 190 may include a memory module 159 having the same specification as the third type of memory module 159 illustrated in FIG. 11C to be bonded to its application specific integrated-circuit (ASIC) chip 399 using an oxide-to-oxide and metal-to-metal direct bonding method. The oxide-to-oxide and metal-to-metal direct bonding method may include (1) oxide-to-oxide bonding the insulating bonding layer 52 of its memory module 159 to the insulating bonding layer 52 of its application specific integrated-circuit (ASIC) chip 399, and (2) metal-to-metal bonding, e.g., copper-to-copper bonding, the metal pads 6*a*, such as copper pads, of its memory module 159 to the metal pads 6*a*, such as copper pads, of its application specific integrated-circuit (ASIC) chip 399. The control chip 688 of its memory module 159 may have the semiconductor devices 4 such as transistors at the active surface of the semiconductor substrate 2 thereof as illustrated in FIG. 11C, and the active surface of the semiconductor substrate 2 of the control chip 688 of its memory module 159 may face an active surface of the semiconductor substrate 2 of its application specific integrated-circuit (ASIC) logic chip 399, wherein its application specific integrated-circuit (ASIC) logic chip 399 may have the semiconductor devices 4 such as transistors at the active surface of the semiconductor substrate 2 thereof as illustrated in FIG. 3C. Alternatively, its memory module 159 may be replaced with a known-good memory or application-specific-integrated-circuit (ASIC) chip 397, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated PO chip, dedicated control and PO chip, intellectual-property (IP) chip, interface chip, networking chip, universal-serial-bus (USB) chip, Serdes chip, power-management integrated-circuit (IC) chip or analog integrated-circuit (IC) chip. For the first type of sub-system module 190, its known-good memory or application-specific-integrated-circuit (ASIC) chip 397 in case of replacing its memory module 159 may have the same specification as the third type of semiconductor integrated-circuit (IC) chip 100 illustrated in FIG. 3C, and may be turned upside down to be bonded to its application specific integrated-circuit (ASIC) chip 399 using an oxide-to-oxide and metal-to-metal direct bonding method. The oxide-to-oxide and metal-to-metal direct bonding method may include (1) oxide-to-oxide bonding the insulating bonding layer 52 at the active side of its known-good memory or application-specific-integrated-circuit (ASIC) chip 397 to the insulating bonding layer 52 of its application specific integrated-circuit (ASIC) chip 399, and (2) metal-to-metal bonding, e.g., copper-to-copper bonding, the metal pads 6*a*, such as copper pads, at the active side of its known-good memory or application-specific-integrated-circuit (ASIC) chip 397 to the metal pads 6*a*, such as copper pads, of its application specific integrated-circuit (ASIC) chip 399.

Referring to FIG. 13A, the first type of sub-system module 190 may include a vertical-through-via (VTV) connector 467 having the same specification as one of the first through tenth types of vertical-through-via (VTV) connector 467 illustrated in FIGS. 4A-4I, 5A-5C, 6A-6F, 7A-7I, 8A-8F and 9A-9D to be turned upside down, which may be alternatively replaced with one of the first through second types of pad-enlarged vertical-through-via (VTV) connector 469 illustrated in FIGS. 4J-4P, 5D-5E and 8G-8I to be turned upside down, provided with (1) the supporting substrate(s) 901 and covering substrate 910 having the top surface turned to be at the bottom thereof as a bottom surface thereof to be bonded to the insulating bonding layer 52 of its application specific integrated-circuit (ASIC) chip 399 by oxide-to-oxide bonding and (2) the top metal pads or contacts 907*e*, 907*n*, 907*u*, 917*d*, 918*d*, 919*a* and/or 919*c* or top metal pads or contacts 927*e* turned to be at the bottom thereof as bottom metal pads or contacts thereof having copper at the bottom surface thereof bonded to copper of the metal pads 6*a* of its application specific integrated-circuit (ASIC) chip 399 at the top surface thereof by metal-to-metal bonding, e.g., copper-to-copper bonding. In particular, FIG. 13A shows the first type of sub-system module 190 is provided with the ninth type of vertical-through-via (VTV) connector 467 formed with two of the first type of metal-trance-on-substrate (MTOSub) units 900 stacked with each other as illustrated in FIGS. 8A-8F. The vertical-through-via (VTV) connector 467 or pad-enlarged vertical-through-via (VTV) connector 469 may be provided with the supporting substrate(s) 901 and covering substrate 910 each having the bottom surface turned to be at the top thereof as a top surface thereof facing upwards and the bottom metal pads or contacts 907*f*, 907*v*, 917*e*, 918*e*, 919*b* and/or 919*d* or bottom metal pads or contacts 927*f* turned to be at the top thereof as top metal pads or contacts thereof facing upwards. For more elaboration, in the case that each of the supporting substrate(s) 901 and covering substrate 910 is a glass substrate, which may include silicon dioxide at the top surface thereof turned to be at the bottom surface thereof to be bonded to silicon dioxide of the insulating bonding layer 52 of its application specific integrated-circuit (ASIC) chip 399 at the top surface thereof by oxide-to-oxide bonding. Alternatively, in the case that each of the supporting substrate(s) 901 and covering substrate 910 is a silicon substrate, at the top surface of which a layer of silicon dioxide may be formed by a thermal oxidation process, the top surface thereof may be turned to be at the bottom surface thereof to be bonded to silicon dioxide of the insulating bonding layer 52 of its application specific integrated-circuit (ASIC) chip 399 at the top surface thereof by oxide-to-oxide bonding.

Alternatively, referring to FIG. 13B, for the first type of sub-system module 190, its memory module 159 may have the same specification as the first type of memory module 159 illustrated in FIG. 11A, its known-good memory or ASIC chip 397 in case of replacing its memory module 159 may have the same specification as the first type of semiconductor integrated-circuit chip 100 illustrated in FIG. 3A, its application specific integrated-circuit (ASIC) chip 399 may have the same specification as the first type of semiconductor integrated-circuit (IC) chip as illustrated in FIG. 3A, and its vertical-through-via (VTV) connector 467 as seen in FIG. 13A may be replaced with a rerouted vertical-through-via (VTV) connector 468 having the same specification as the second type of rerouted vertical-through-via (VTV) connector 468 illustrated in FIGS. 10H-10J to be turned upside down with the first, second, third or fourth type of micro-bumps or micro-pads 34 thereof turned to be at the bottom thereof, the bottom surface thereof turned to be at the top thereof as a top surface thereof, and the bottom metal pads or contacts 907*f*, 907*v*, 917*e*, 918*e*, 919*b* and/or 919*d* thereof turned to be at the top thereof as top metal pads or contacts thereof, wherein each of its rerouted vertical-through-via (VTV) connector 468 and memory module 159, or known-good memory or ASIC chip 397 in case of replacing its memory module 159, may be provided with the first, second, third or fourth type of micro-bumps or micro-pads 34 each bonded to one of the first, second, third or fourth type of micro-bumps or micro-pads 34 of its application specific integrated-circuit (ASIC) chip 399 to form a bonded metal bump or contact 168 therebetween by a step for one of the first through fourth cases as illustrated in FIGS. 11A, 12A and 12B in which the first, second, third or fourth type of micro-bumps or micro-pads 34 of said each of its rerouted vertical-through-via (VTV) connector 468 and memory module 159, or known-good memory or ASIC chip 397 in case of replacing its memory module 159, may be considered as the first, second, third or fourth type of micro-bumps or micro-pads 34 of the upper one of the memory chips 251 of the memory module 159 illustrated in FIGS. 11A, 12A and 12B, and the first, second, third or fourth type of micro-bumps or micro-pads 34 of its application specific integrated-circuit (ASIC) chip 399 may be considered as the first, second, third or fourth type of micro-bumps or micro-pads 570 of the lower one of the memory chips 251 or the control chip 688 of the memory module 159 illustrated in FIGS. 11A, 12A and 12B. In this case, the first type of sub-system module 190 may further include an underfill 169, e.g., polymer layer, between its memory module 159, or known-good memory or ASIC chip 397 in case of replacing its memory module 159, and application specific integrated-circuit (ASIC) chip 399 and between its rerouted vertical-through-via (VTV) connector 468 and application specific integrated-circuit (ASIC) chip 399, covering a sidewall of each of its bonded metal bumps or contacts 168 therebetween.

Referring to FIGS. 13A and 13B, for the first type of sub-system module 190, its known-good memory or ASIC chip 397 in case of replacing its memory module 159 may have the semiconductor devices 4 such as transistors at the active surface of the semiconductor substrate 2 thereof as illustrated in FIGS. 3A and 3C, and the active surface of the semiconductor substrate 2 of its known-good memory or ASIC chip 397 may face an active surface of the semiconductor substrate 2 of its application specific integrated-circuit (ASIC) logic chip 399, wherein its application specific integrated-circuit (ASIC) logic chip 399 may have the semiconductor devices 4 such as transistors at the active surface of the semiconductor substrate 2 thereof as illustrated in FIGS. 3A and 3C. For the first type of sub-system module 190, its known-good memory or ASIC chip 397 may be used as the auxiliary and cooperating (AC) integrated-circuit (IC) chip for supporting and co-working with its application specific integrated-circuit (ASIC) logic chip 399.

Referring to FIG. 13A, the first type of sub-system module 190 may include a polymer layer 565, e.g., resin or compound, on the insulating bonding layer 52 of its application specific integrated-circuit (ASIC) chip 399, wherein its polymer layer 565 has a portion between its memory module 159, or its known-good memory or ASIC chip 397 in case of replacing its memory module 159, and its vertical-through-via (VTV) connector 467, or pad-enlarged vertical-through-via (VTV) connector 469 in case of replacing its vertical-through-via (VTV) connector 467, and its polymer layer 565 has a top surface coplanar with a top surface of its memory module 159, or a top surface of its known-good memory or ASIC chip 397 in case of replacing its memory module 159, and the top surface of its vertical-through-via (VTV) connector 467 or pad-enlarged vertical-through-via (VTV) connector 469. Its polymer layer 565 may be, for example, polyimide, BenzoCycloButene (BCB), parylene, polybenzoxazole (PBO), epoxy-based material or compound, photo epoxy SU-8, elastomer, or silicone. For more elaboration, its polymer layer 565 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Alternatively, referring to FIG. 13B, for the first type of sub-system module 190, its polymer layer 565 having the same specification as one illustrated in FIG. 13A may be formed on the topmost one of the polymer layer 42 of its application specific integrated-circuit (ASIC) chip 399, wherein its polymer layer 565 may have a portion between its memory module 159, or its known-good memory or ASIC chip 397 in case of replacing its memory module 159, and its rerouted vertical-through-via (VTV) connector 468, and its polymer layer 565 may have a top surface coplanar with a top surface of its memory module 159, or a top surface of its known-good memory or ASIC chip 397 in case of replacing its memory module 159, and the top surface of its rerouted vertical-through-via (VTV) connector 468.

Referring to FIGS. 13A and 13B, for the first type of sub-system module 190, its memory module 159, or its known-good memory or ASIC chip 397 in case of replacing its memory module 159, may be ground or polished from the backside thereof such that the insulating lining layer 153, adhesion layer 154 and seed layer 155 of each of the through silicon vias (TSVs) 157 of the topmost one of the memory chips 251 of its memory module 159 at the backside thereof, or the insulating lining layer 153, adhesion layer 154 and seed layer 155 of each of the through silicon vias (TSVs) 157 of its known-good memory or ASIC chip 397 in case of replacing its memory module 159, may be removed. Thus, the top surface of the top metal pads or contacts 907*f*, 907*v*, 917*e*, 918*e*, 919*b* and/or 919*d* of its vertical-through-via (VTV) connector 467 or rerouted vertical-through-via (VTV) connector 468, or the top surface of the top metal pads or contacts 927*f* of its pad-enlarged vertical-through-via (VTV) connector 469, and, optionally, a backside of the copper layer 156 of each of the through silicon vias (TSVs) 157 of the topmost one of the memory chips 251 of its memory module 159, or a backside of the copper layer 156 of each of the through silicon vias (TSVs) 157 of its known-good memory or ASIC chip 397 in case of replacing its memory module 159, may be coplanar with the top surface of each of its vertical-through-via (VTV) connector 467, rerouted vertical-through-via (VTV) connector 468 or pad-enlarged vertical-through-via (VTV) connector 469, a top surface of the semiconductor substrate 2 of the topmost one of the memory chips 251 of its memory module 159, or a top surface of the semiconductor substrate 2 of its known-good memory or ASIC chip 397 in case of replacing its memory module 159, and the top surface of its polymer layer 565. The insulating lining layer 153, adhesion layer 154 and seed layer 155 of each of the through silicon vias (TSVs) 157 of the topmost one of the memory chips 251 of its memory module 159, or the insulating lining layer 153, adhesion layer 154 and seed layer 155 of each of the through silicon vias (TSVs) 157 of its known-good memory or ASIC chip 397 in case of replacing its memory module 159, may be left at a sidewall of the copper layer 156 of each of the through silicon vias (TSVs) 157 of the topmost one of the memory chips 251 of its memory module 159, or a sidewall of the copper layer 156 of each of the through silicon vias (TSVs) 157 of its known-good memory or ASIC chip 397 in case of replacing its memory module 159.

Referring to FIGS. 13A and 13B, the first type of sub-system module 190 may include a frontside interconnection scheme for a device (FISD) 101 on its memory module 159, or its known-good memory or ASIC chip 397 in case of replacing its memory module 159, its vertical-through-via (VTV) connector 467, rerouted vertical-through-via (VTV) connector 468 or pad-enlarged vertical-through-via (VTV) connector 469 and its polymer layer 565. For the first type of sub-system module 190, its frontside interconnection scheme for a device (FISD) 101 may include (1) one or more interconnection metal layers 27 coupling to the top metal pads or contacts 907*f*, 907*v*, 917*e*, 918*e*, 919*b* and/or 919*d* of its vertical-through-via (VTV) connector 467 or rerouted vertical-through-via (VTV) connector 468, or the top metal pads or contacts 927*f* of its pad-enlarged vertical-through-via (VTV) connector 469, and the through silicon vias (TSVs) 157 of the memory chips 251 and control chip 688 of its memory module 159, or the through silicon vias (TSVs) 157 of its known-good memory or ASIC chip 397 in case of replacing its memory module 159, and (2) one or more polymer layers 42, i.e., insulating dielectric layers, each between neighboring two of the interconnection metal layers 27 of its frontside interconnection scheme for a device (FISD) 101, between a bottommost one of the interconnection metal layers 27 of its frontside interconnection scheme for a device (FISD) 101 and a planar surface composed of the top surface of its vertical-through-via (VTV) connector 467, rerouted vertical-through-via (VTV) connector 468 or pad-enlarged vertical-through-via (VTV) connector 469, the top surface of the semiconductor substrate 2 of the topmost one of the memory chips 251 of its memory module 159, or the top surface of the semiconductor substrate 2 of its known-good memory or ASIC chip 397 in case of replacing its memory module 159, and the top surface of its polymer layer 565, or on and above a topmost one of the interconnection metal layers 27 of its frontside interconnection scheme for a device (FISD) 101, wherein the topmost one of the interconnection metal layers 27 of its frontside interconnection scheme for a device (FISD) 101 may have multiple metal pads at bottoms of multiple openings in the topmost one of the polymer layers 42 of its frontside interconnection scheme for a device (FISD) 101. Each of the interconnection metal layers 27 of its frontside interconnection scheme for a device (FISD) 101 may have the same specification as that of the second interconnection scheme 588 of the first type of semiconductor integrated-circuit (IC) chip 100 as illustrated in FIG. 3A, and each of the polymer layers 42 of its frontside interconnection scheme for a device (FISD) 101 may have the same specification as that of the second interconnection scheme 588 of the first type of semiconductor integrated-circuit (IC) chip 100 as illustrated in FIG. 3A. Each of the interconnection metal layers 27 of its frontside interconnection scheme for a device (FISD) 101 may extend horizontally across an edge of its memory module 159, or its known-good memory or ASIC chip 397 in case of replacing its memory module 159, and an edge of its vertical-through-via (VTV) connector 467, rerouted vertical-through-via (VTV) connector 468 or pad-enlarged vertical-through-via (VTV) connector 469.

Referring to FIGS. 13A and 13B, the first type of sub-system module 190 may include multiple micro-bumps or micro-pads 34, which may be of one of the first through fourth types having the same specification as the first through fourth types of micro-bumps or micro-pillars 34 as illustrated in FIG. 3A respectively, each having the adhesion layer 26*a* formed on one of the metal pads of the topmost one of the interconnection metal layers 27 of its frontside interconnection scheme for a device (FISD) 101 at the bottoms of the openings in the topmost one of the polymer layers 42 of its frontside interconnection scheme for a device (FISD) 101. For an element indicated by the same reference number shown in FIGS. 13A and 13B, the specification of the element as seen in FIG. 13B may be referred to that of the element as illustrated in FIG. 13A.

For the first type of sub-system module 190, each of the memory chips 251 and control chip 688 of its memory module 159, or its known-good memory or ASIC chip 397 in case of replacing its memory module 159, may have multiple small I/O circuits each coupling to one of multiple small I/O circuits of its application specific integrated-circuit (ASIC) chip 399 through, in sequence as seen in FIG. 13A, one of the bonded metal pads 6*a* of its memory module 159, or its known-good memory or ASIC chip 397 in case of replacing its memory module 159, and one of the bonded metal pads 6*a* of its application specific integrated-circuit (ASIC) chip 399, or through, as seen in FIG. 13B, one of its bonded metal bump or contact 168 between its memory module 159, or its known-good memory or ASIC chip 397 in case of replacing its memory module 159, and its application specific integrated-circuit (ASIC) chip 399, for data transmission therebetween with a data bit width of equal to or greater than 64, 128, 256, 512, 1024, 2048, 4096, 8K, or 16K, wherein each of the small PO circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 399 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small PO circuits of each of the memory chips 251 and control chip 688 of its memory module 159, or its known-good memory or ASIC chip 397 in case of replacing its memory module 159, and each of the small I/O circuits of its application specific integrated-circuit (ASIC)

chip 399 may have an I/O power efficiency smaller than 0.5 pico-Joules per bit, per switch or per voltage swing, or between 0.01 and 0.5 pico-Joules per bit, per switch or per voltage swing. Further, its application specific integrated-circuit (ASIC) chip 399 may include multiple programmable logic cells (LC) 2014 therein each as seen in FIG. 1 and multiple programmable switches 379 therein each as seen in FIG. 2, employed for a hardware accelerator or machine-learning operator. Further, its memory module 159, or its known-good memory or ASIC chip 397 in case of replacing its memory module 159, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key and a cryptography block or circuit configured (1) to encrypt, in accordance with the password or key, configuration data transmitted from or stored in the memory cells 490 for the look-up tables (LUT) 210 of the programmable logic cells (LC) 2014 of its application specific integrated-circuit (ASIC) logic chip 399 or the memory cells 362 of the programmable switch cells 379 of its application specific integrated-circuit (ASIC) logic chip 399 as encrypted configuration data to be passed to its micro-bumps or micro-pads 34 and (2) to decrypt, in accordance with the password or key, encrypted configuration data from its micro-bumps or micro-pads 34 as decrypted configuration data to be passed to and stored in the memory cells 490 for the look-up tables (LUT) 210 of the programmable logic cells (LC) 2014 of its application specific integrated-circuit (ASIC) logic chip 399 or the memory cells 362 of the programmable switch cells 379 of its application specific integrated-circuit (ASIC) logic chip 399. Further, its memory module 159, or its known-good memory or ASIC chip 397 in case of replacing its memory module 159, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of its application specific integrated-circuit (ASIC) logic chip 399 to be stored therein for programming or configuring the programmable logic cells (LC) 2014 of its application specific integrated-circuit (ASIC) logic chip 399 or to the memory cells 362 of the programmable switch cells 379 of its application specific integrated-circuit (ASIC) logic chip 399 to be stored therein for programming or configuring the programmable switch cells 379 of its application specific integrated-circuit (ASIC) logic chip 399. Further, its memory module 159, or its known-good memory or ASIC chip 397 in case of replacing its memory module 159, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 399.

Referring to FIGS. 13A and 13B, for the first type of sub-system module 190, each of the memory chips 251 and control chip 688 of its memory module 159, or its known-good memory or ASIC chip 397 in case of replacing its memory module 159, may have multiple large input/output (PO) circuits each coupling to one of its micro-bumps or micro-pads 34 for signal transmission or power or ground delivery through the interconnection metal layers 27 of its frontside interconnection scheme for a device (FISD) 101, wherein each of the large input/output (I/O) circuits of each of the memory chips 251 and control chip 688 of its memory module 159, or its known-good memory or ASIC chip 397 in case of replacing its memory module 159, may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (PO) circuits of each of the memory chips 251 and control chip 688 of its memory module 159, or its known-good memory or ASIC chip 397 in case of replacing its memory module 159, may have an I/O power efficiency greater than 3, 5 or 10 pico-Joules per bit, per switch or per voltage swing. Further, its application specific integrated-circuit (ASIC) logic chip 399 may have multiple large input/output (PO) circuits each coupling to one of its micro-bumps or micro-pads 34 for signal transmission through, in sequence, one of the transmission metal lines 907*b*, 917*b* and 918*b*, signal metal lines 907*d* and planar antennas 907*q* of its vertical-through-via (VTV) connector 467, rerouted vertical-through-via (VTV) connector 468 or pad-enlarged vertical-through-via (VTV) connector 469, or one of the dedicated vertical bypasses 698 of its memory module 159 as illustrated in FIG. 11C, or one of the through silicon vias (TSVs) 157 of its known-good memory or ASIC chip 397 in case of replacing its memory module 159, and the interconnection metal layers 27 of its frontside interconnection scheme for a device (FISD) 101, wherein said one of the dedicated vertical bypasses 698 is not connected to any transistor of each of the memory chips 251 and control chip 688 of its memory module 159, or said one of the through silicon vias (TSVs) 157 is not connected to any transistor of its known-good memory or ASIC chip 397 in case of replacing its memory module 159, wherein each of the large input/output (PO) circuits of its application specific integrated-circuit (ASIC) logic chip 399 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its application specific integrated-circuit (ASIC) logic chip 399 may have an I/O power efficiency greater than 3, 5 or 10 pico-Joules per bit, per switch or per voltage swing. Further, its application specific integrated-circuit (ASIC) logic chip 399 may couple to one of its micro-bumps or micro-pads 34 for ground delivery through, in sequence, one of the ground metal lines 907*a*, 907*c*, 907*m*, 907*y*, 917*a* and 918*a* of its vertical-through-via (VTV) connector 467, rerouted vertical-through-via (VTV) connector 468 or pad-enlarged vertical-through-via (VTV) connector 469, or one of the dedicated vertical bypasses 698 of its memory module 159 as illustrated in FIG. 11C, or one of the through silicon vias (TSVs) 157 of its known-good memory or ASIC chip 397 in case of replacing its memory module 159, and the interconnection metal layers 27 of its frontside interconnection scheme for a device (FISD) 101, wherein said one of the dedicated vertical bypasses 698 is not connected to any transistor of each of the memory chips 251 and control chip 688 of its memory module 159, or said one of the through silicon vias (TSVs) 157 is not connected to any transistor of its known-good memory or ASIC chip 397 in case of replacing its memory module 159; alternatively said one of the ground metal lines 907*a*, 907*c*, 907*m*, 907*y*, 917*a* and 918*a* of its vertical-through-via (VTV) connector 467, rerouted vertical-through-via (VTV) connector 468 or pad-enlarged vertical-through-via (VTV) connector 469 may be replaced with the power metal line for power delivery. One of the vertical interconnects 699 of its memory module 159 as illustrated in FIG. 11C, or one of the through silicon vias (TSVs) 157 of its known-good memory or ASIC chip 397 in case of replacing its memory module 159, may couple to one of its micro bumps or micro-pads 34 through the interconnection metal layers 27 of its frontside interconnection scheme for a device (FISD) 101 and to its application specific integrated-circuit (ASIC) chip 399 through one of the metal pads 6*a* of the control chip 688 of its memory module 159 as seen in FIG. 11C, or one of the metal pads 6*a* of its known-good memory or ASIC chip 397 in case of replacing its memory module 159.

Referring to FIGS. 13A and 13B, for the first type of sub-system module 190, each of the memory chips 251 and control chip 688 of its memory module 159, or its known-good memory or ASIC chip 397 in case of replacing its memory module 159, may be implemented using a semiconductor node or generation less advanced than or equal to, or above or equal to 20 nm, 30 nm, 40 nm, 50 nm, 90 nm, 130 nm, 250 nm, 350 nm or 500 nm; while its application specific integrated-circuit (ASIC) logic chip 399 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory chips 251 and control chip 688 of its memory module 159, or its known-good memory or ASIC chip 397 in case of replacing its memory module 159, may be 1, 2, 3, 4, 5 or greater than 5 nodes or generations older, more matured or less advanced than that used in its application specific integrated-circuit (ASIC) logic chip 399. Transistors used in each of the memory chips 251 and control chip 688 of its memory module 159, or its known-good memory or ASIC chip 397 in case of replacing its memory module 159, may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory chips 251 and control chip 688 of its memory module 159, or its known-good memory or ASIC chip 397 in case of replacing its memory module 159, may be different from that used in its application specific integrated-circuit (ASIC) logic chip 399; each of the memory chips 251 and control chip 688 of its memory module 159, or its known-good memory or ASIC chip 397 in case of replacing its memory module 159, may use planar MOSFETs, while its application specific integrated-circuit (ASIC) logic chip 399 may use fin field effect transistors (FINFETs) or gate-all-around field effect transistors (GAAFETs). A power supply voltage (Vcc) applied in each of the memory chips 251 and control chip 688 of its memory module 159, or its known-good memory or ASIC chip 397 in case of replacing its memory module 159, may be greater than or equal to 1.5, 2.0, 2.5, 3, 3.3, 4, or 5 voltages, while a power supply voltage (Vcc) applied in its application specific integrated-circuit (ASIC) logic chip 399 may be smaller than or equal to 1.8, 1.5 or 1 voltage. The power supply voltage applied in each of the memory chips 251 and control chip 688 of its memory module 159, or its known-good memory or ASIC chip 397 in case of replacing its memory module 159, may be higher than that applied in its application specific integrated-circuit (ASIC) logic chip 399. A gate oxide of a field effect transistor (FET) of each of the memory chips 251 and control chip 688 of its memory module 159, or its known-good memory or ASIC chip 397 in case of replacing its memory module 159, may have a physical thickness greater than or equal to 5 nm, 6 nm, 7.5 nm, 10 nm, 12.5 nm, or 15 nm, while a gate oxide of a field effect transistor (FET) of its application specific integrated-circuit (ASIC) logic chip 399 may have a physical thickness less than 4.5 nm, 4 nm, 3 nm or 2 nm. The thickness of the gate oxide of the field effect transistor (FET) of each of the memory chips 251 and control chip 688 of its memory module 159, or its known-good memory or ASIC chip 397 in case of replacing its memory module 159, may be greater than that of its application specific integrated-circuit (ASIC) logic chip 399.

For more elaboration, referring to FIGS. 13A and 13B, for the first type of sub-system module 190, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when its application specific integrated-circuit (ASIC) logic chip 399 is redesigned using a new technology node or for new application. Alternatively, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when its application specific integrated-circuit (ASIC) logic chip 399 is redesigned using the new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 399 manufactured using a new technology node. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 399 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. Alternatively, a technology process for forming its known-good memory or ASIC chip 397 in case of replacing its memory module 159 may not be compatible to that for forming its application specific integrated-circuit (ASIC) logic chip 399, wherein its known-good memory or ASIC chip 397 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

2. Second Type of Sub-system Module or Unit

Figure 13C:
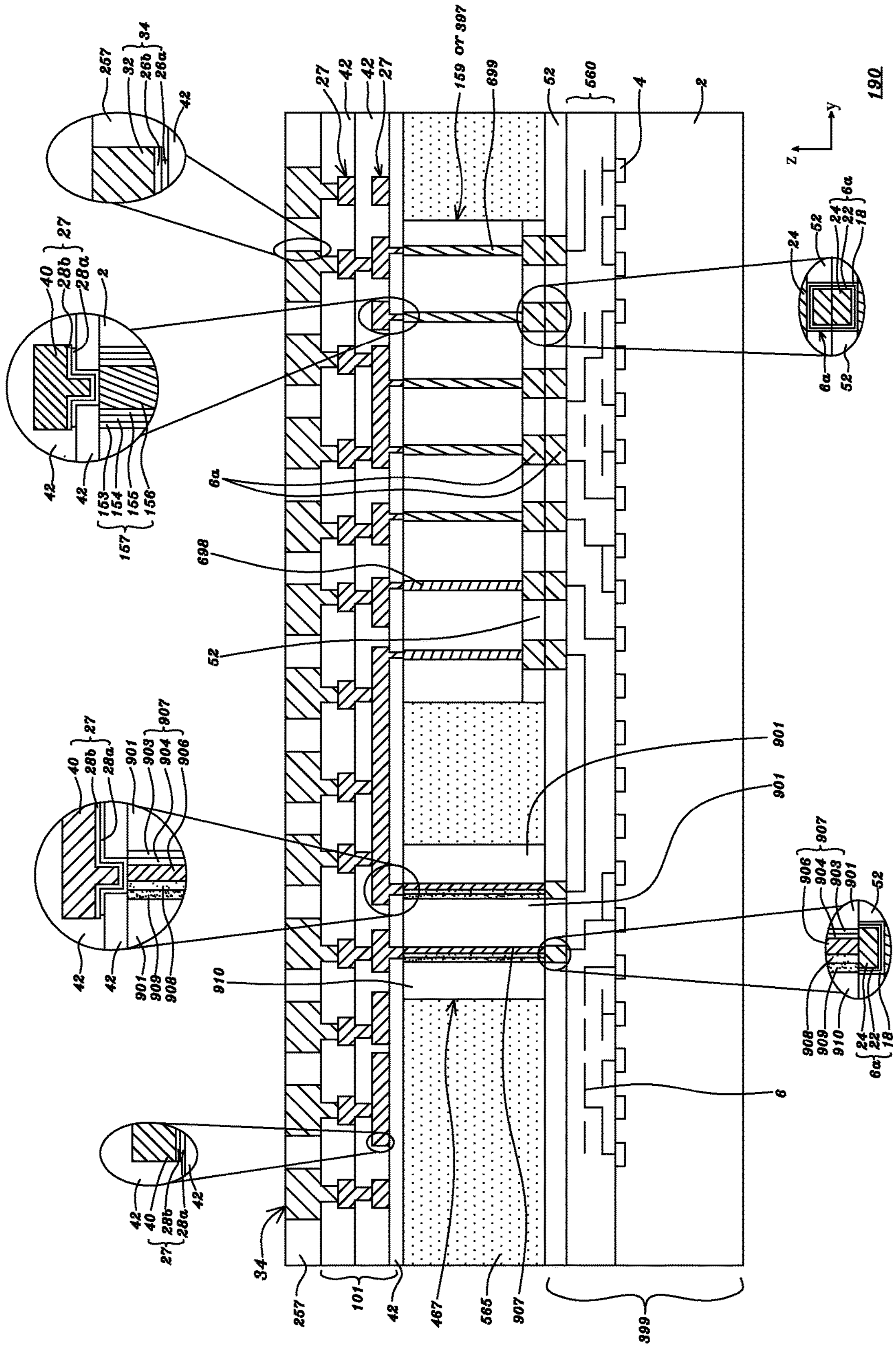
FIGS. 13C and 13D are schematically cross-sectional views showing a second type of sub-system module for two alternatives in accordance with an embodiment of the present application.
Figure 13D:
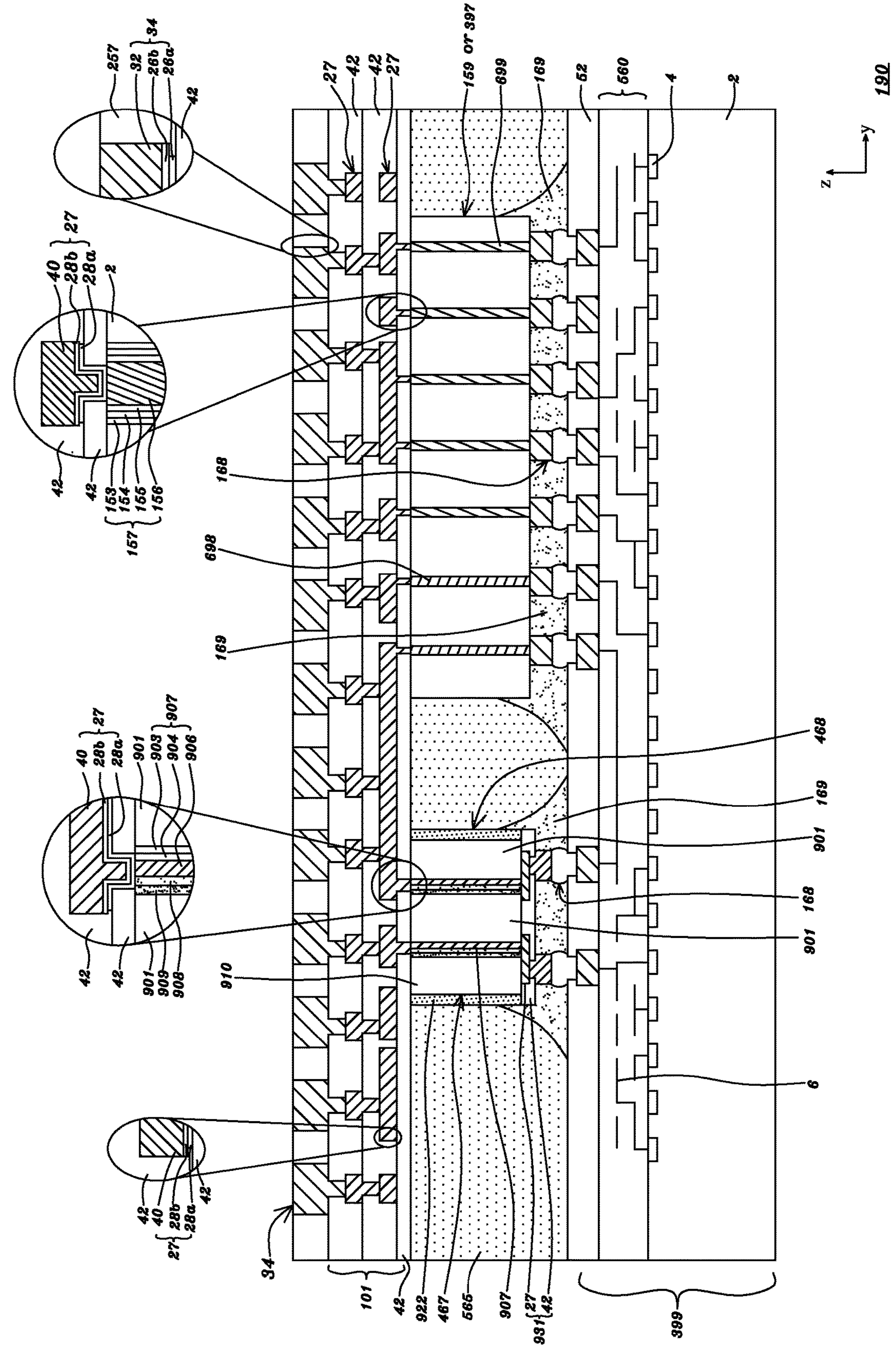

FIGS. 13C and 13D are schematically cross-sectional views showing a second type of sub-system module for two alternatives in accordance with an embodiment of the present application. A second type of sub-system module 190 as seen in FIG. 13C or 13D may have a similar structure to the first type of sub-system module 190 illustrated in FIG. 13A or 13B respectively. For an element indicated by the same reference number shown in FIGS. 13A-13D, the specification of the element as seen in FIG. 13C or 13D may be referred to that of the element as illustrated in FIG. 13A or 13B respectively. The difference between the first and second types of sub-system modules 190 is that the second type of sub-system module 190 may further include an insulating dielectric layer 257, such as polymer layer, on the topmost one of the polymer layers 42 of its frontside interconnection scheme for a device (FISD) 101. For the second type of sub-system module 190, its micro-bumps or micro-pads 34 may be of the first type as illustrated in FIGS. 3A, 13A and 13B, and its insulating dielectric layer 257 may cover a sidewall of the copper layer 32 of each of its first type of micro-bumps or micro-pads 34, wherein its insulating dielectric layer 257 may have a top surface coplanar with a top surface of the copper layer 32 of each of its first type of micro-bumps or micro-pads 34, wherein its insulating dielectric layer 257 may be, for example, polyimide, BenzoCycloButene (BCB), parylene, polybenzoxazole (PBO), epoxy-based material or compound, photo epoxy SU-8, elastomer, or silicone; its insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan.

3-1. Third Type of Sub-System Module or Unit for First Alternative

Figure 13E:
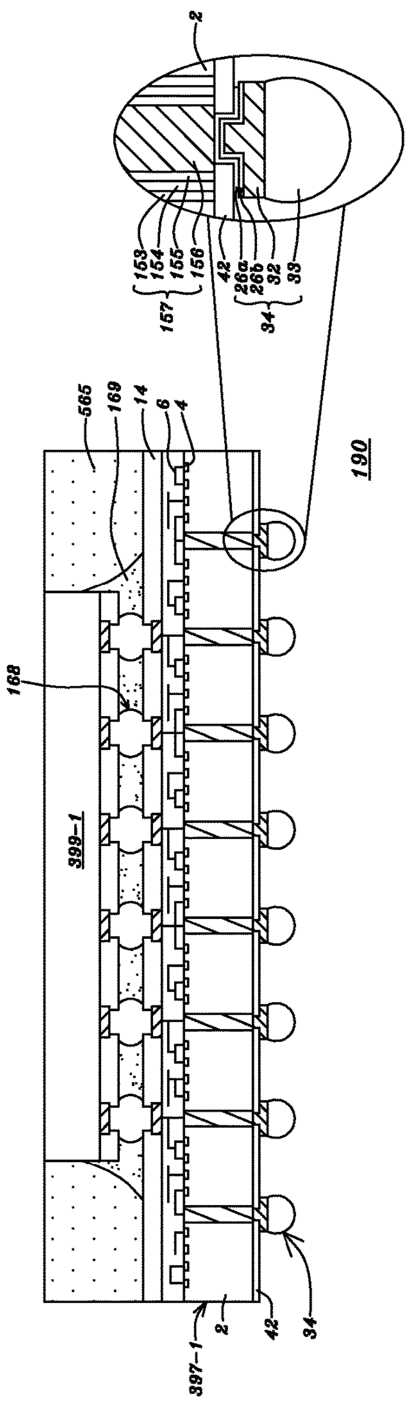
FIGS. 13E-13G are schematically cross-sectional views showing a third type of sub-system modules for three alternatives in accordance with an embodiment of the present application.

FIG. 13E is a schematically cross-sectional view showing a third type of sub-system module for a first alternative in accordance with an embodiment of the present application. Referring to FIG. 13E, a third type of sub-system module 190 for a first alternative may include an application specific integrated-circuit (ASIC) chip 399-1 having the same specification as the first type of semiconductor integrated-circuit (IC) chip 100 illustrated in FIG. 3A, wherein its application specific integrated-circuit (ASIC) chip 399-1 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example.

Referring to FIG. 13E, the third type of sub-system module 190 for the first alternative may include a known-good memory or application-specific-integrated-circuit (ASIC) chip 397-1, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, power-management integrated-circuit (IC) chip or analog integrated-circuit (IC) chip. For the third type of sub-system module 190 for the first alternative, its known-good memory or application-specific-integrated-circuit (ASIC) chip 397-1 may have the same specification as the first type of semiconductor integrated-circuit (IC) chip 100 illustrated in FIG. 3A.

In a first aspect, referring to FIG. 13E, its application specific integrated-circuit (ASIC) chip 399-1 may be turned upside down with the first, second, third or fourth type of micro-bumps or micro-pads 34 thereof turned to be at the bottom thereof each to be bonded to one of the first, second, third or fourth type of micro-bumps or micro-pads 34 of its known-good memory or application-specific-integrated-circuit (ASIC) chip 397-1 to form a bonded metal bump or contact 168 therebetween by a step for one of the first through fourth cases as illustrated in FIGS. 11A, 12A and 12B in which the first, second, third or fourth type of micro-bumps or micro-pads 34 of its application specific integrated-circuit (ASIC) chip 399-1 may be considered as the first, second, third or fourth type of micro-bumps or micro-pads 34 of the upper one of the memory chips 251 of the memory module 159 illustrated in FIGS. 11A, 12A and 12B, and the first, second, third or fourth type of micro-bumps or micro-pads 34 of its known-good memory or application-specific-integrated-circuit (ASIC) chip 397-1 may be considered as the first, second, third or fourth type of micro-bumps or micro-pads 570 of the lower one of the memory chips 251 or the control chip 688 of the memory module 159 illustrated in FIGS. 11A, 12A and 12B. In this case, the third type of sub-system module 190 for the first alternative may further include an underfill 169, e.g., polymer layer, between its application specific integrated-circuit (ASIC) chip 399-1 and its known-good memory or application-specific-integrated-circuit (ASIC) chip 397-1, covering a sidewall of each of its bonded metal bumps or contacts 168 therebetween.

In a second aspect, for the third type of sub-system module 190 for the first alternative, its known-good memory or application-specific-integrated-circuit (ASIC) chip 397-1 may have the same specification as the third type of semiconductor integrated-circuit chip 100 illustrated in FIG. 3C, and its application specific integrated-circuit (ASIC) chip 399-1 may have the same specification as the first type of semiconductor integrated-circuit (IC) chip as illustrated in FIG. 3C. Its application specific integrated-circuit (ASIC) chip 399-1 may be bonded to its known-good memory or application-specific-integrated-circuit (ASIC) chip 397-1 using an oxide-to-oxide and metal-to-metal direct bonding method. The oxide-to-oxide and metal-to-metal direct bonding method may include (1) oxide-to-oxide bonding the insulating bonding layer 52, i.e., a layer of silicon dioxide, at the active side of its application specific integrated-circuit (ASIC) chip 399-1 to the insulating bonding layer 52, i.e., a layer of silicon dioxide, of its known-good memory or application-specific-integrated-circuit (ASIC) chip 397-1, and (2) metal-to-metal bonding, e.g., copper-to-copper bonding, the metal pads 6*a*, such as copper pads, at the active side of its application specific integrated-circuit (ASIC) chip 399-1 to the metal pads 6*a*, such as copper pads, of its a known-good memory or application-specific-integrated-circuit (ASIC) chip 397-1.

Referring to FIG. 13E, for the third type of sub-system module 190 for the first alternative, its known-good memory or ASIC chip 397-1 may have the semiconductor devices 4 such as transistors at the active surface of the semiconductor substrate 2 thereof as illustrated in FIGS. 3A and 3C, and the active surface of the semiconductor substrate 2 of its known-good memory or ASIC chip 397-1 may face an active surface of the semiconductor substrate 2 of its application specific integrated-circuit (ASIC) logic chip 399-1, wherein its application specific integrated-circuit (ASIC) logic chip 399-1 may have the semiconductor devices 4 such as transistors at the active surface of the semiconductor substrate 2 thereof as illustrated in FIGS. 3A and 3C. For the third type of sub-system module 190 for the first alternative, its known-good memory or ASIC chip 397-1 may be used as the auxiliary and cooperating (AC) integrated-circuit (IC) chip for supporting and co-working with its application specific integrated-circuit (ASIC) logic chip 399-1.

Referring to FIG. 13E, the third type of sub-system module 190 for the first alternative may include a polymer layer 565, e.g., resin or compound, on its known-good memory or ASIC chip 397-1 and at the same horizontal level of its application specific integrated-circuit (ASIC) logic chip 399-1, wherein its application specific integrated-circuit (ASIC) logic chip 399-1 is horizontally between two portions of its polymer layer 565. For the third type of sub-system module 190 for the first alternative, its polymer layer 565 may have a top surface coplanar with a top surface of its application specific integrated-circuit (ASIC) logic chip 399-1, i.e., a backside of the semiconductor substrate 2 of its application specific integrated-circuit (ASIC) logic chip 399-1, and its polymer layer 565 may have the same specification as that of the polymer layer 565 of the first type of sub-system module 190 as illustrated in FIGS. 13A and 13B.

Referring to FIG. 13E, for the third type of sub-system module 190 for the first alternative, the semiconductor substrate 2 of its known-good memory or ASIC chip 397-1 may be ground or polished from the backside thereof, i.e., from the bottom side thereof, such that a bottom portion of the semiconductor substrate 2 of its known-good memory or ASIC chip 397-1 may be removed and the insulating lining layer 153, adhesion layer 154 and seed layer 155 of each of the through silicon vias (TSVs) 157 of its known-good memory or ASIC chip 397-1 at a bottom of each of the through silicon vias (TSVs) 157 of its known-good memory or ASIC chip 397-1 may be removed, wherein the insulating lining layer 153, adhesion layer 154 and seed layer 155 of each of the through silicon vias (TSVs) 157 of its known-good memory or ASIC chip 397-1 may be left at a sidewall of the copper layer 156 of each of the through silicon vias (TSVs) 157 of its known-good memory or ASIC chip 397-1. Thereby, the copper layer 156 of each of the through silicon vias (TSVs) 157 of its known-good memory or ASIC chip 397-1 may have a bottom surface coplanar with a bottom surface of the semiconductor substrate 2 of its known-good memory or ASIC chip 397-1.

Referring to FIG. 13E, the third type of sub-system module 190 for the first alternative may further include (1) a polymer layer 42, i.e., insulating dielectric layer, on the bottom surface of the semiconductor substrate 2 of its known-good memory or ASIC chip 397-1, wherein each opening in its polymer layer 42 is under the bottom surface of the copper layer 156 of one of the through silicon vias (TSVs) 157 of its known-good memory or ASIC chip 397-1, wherein its polymer layers 42 may have the same specification as the polymer layer 42 of the second interconnection scheme 588 of the first type of semiconductor integrated-circuit (IC) chip 100 as illustrated in FIG. 3A, and (2) multiple micro-bumps or micro-pads 34 each on the bottom surface of the copper layer 156 of one of the through silicon vias (TSVs) 157 of its known-good memory or ASIC chip 397-1 at a top of one of the openings in its polymer layer 42. Each of the micro-bumps or micro-pads 34 may have various types, i.e., first, second, third and fourth types, which may have the same specification as the first, second, third and fourth types of micro-bumps or micro-pads 34 respectively as illustrated in FIG. 3A, having the adhesion layer 26*a* formed on the bottom surface of the copper layer 156 of one of the through silicon vias (TSVs) 157 of its known-good memory or ASIC chip 397-1.

Referring to FIG. 13E, for the third type of sub-system module 190 for the first alternative, its known-good memory or ASIC chip 397-1 may have multiple small I/O circuits each coupling to one of multiple small I/O circuits of its application specific integrated-circuit (ASIC) chip 399-1 through one of its bonded metal bump or contact 168 therebetween for the first aspect, or through one of the metal pads 6*a* of its known-good memory or ASIC chip 397-1 and one of the metal pads 6*a* of its application specific integrated-circuit (ASIC) chip 399-1 for the second aspect, for data transmission therebetween with a data bit width of equal to or greater than 64, 128, 256, 512, 1024, 2048, 4096, 8K, or 16K, wherein each of the small PO circuits of its known-good memory or ASIC chip 397-1 and each of the small I/O circuits of its application specific integrated-circuit (ASIC) chip 399-1 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small I/O circuits of its known-good memory or ASIC chip 397-1 and each of the small PO circuits of its application specific integrated-circuit (ASIC) chip 399-1 may have an PO power efficiency smaller than 0.5 pico-Joules per bit, per switch or per voltage swing, or between 0.01 and 0.5 pico-Joules per bit, per switch or per voltage swing. Further, its application specific integrated-circuit (ASIC) chip 399-1 may include multiple programmable logic cells (LC) 2014 therein each as seen in FIG. 1 and multiple programmable switches 379 therein each as seen in FIG. 2, employed for a hardware accelerator or machine-learning operator. Further, its known-good memory or ASIC chip 397-1 may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key and a cryptography block or circuit configured (1) to encrypt, in accordance with the password or key, configuration data transmitted from or stored in the memory cells 490 for the look-up tables (LUT) 210 of the programmable logic cells (LC) 2014 of its application specific integrated-circuit (ASIC) logic chip 399-1 or the memory cells 362 of the programmable switch cells 379 of its application specific integrated-circuit (ASIC) logic chip 399-1 as encrypted configuration data to be passed to its micro-bumps or micro-pads 34 at its bottom and (2) to decrypt, in accordance with the password or key, encrypted configuration data from its micro-bumps or micro-pads 34 at its bottom as decrypted configuration data to be passed to and stored in the memory cells 490 for the look-up tables (LUT) 210 of the programmable logic cells (LC) 2014 of its application specific integrated-circuit (ASIC) logic chip 399-1 or the memory cells 362 of the programmable switch cells 379 of its application specific integrated-circuit (ASIC) logic chip 399-1. Further, its known-good memory or ASIC chip 397-1 may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of its application specific integrated-circuit (ASIC) logic chip 399-1 to be stored therein for programming or configuring the programmable logic cells (LC) 2014 of its application specific integrated-circuit (ASIC) logic chip 399-1 or to the memory cells 362 of the programmable switch cells 379 of its application specific integrated-circuit (ASIC) logic chip 399-1 to be stored therein for programming or configuring the programmable switch cells 379 of its application specific integrated-circuit (ASIC) logic chip 399-1. Further, its known-good memory or ASIC chip 397-1 may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 399-1.

Referring to FIG. 13E, for the third type of sub-system module 190 for the first alternative, its known-good memory or ASIC chip 397-1 may have multiple large input/output (PO) circuits each coupling to one of its micro-bumps or micro-pads 34 at its bottom for signal transmission or power or ground delivery through one of the through silicon vias (TSVs) 157 of its known-good memory or ASIC chip 397-1, wherein each of the large input/output (I/O) circuits of its known-good memory or ASIC chip 397-1 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its known-good memory or ASIC chip 397-1 may have an I/O power efficiency greater than 3, 5 or 10 pico-Joules per bit, per switch or per voltage swing. Further, its application specific integrated-circuit (ASIC) logic chip 399-1 may have multiple large input/output (I/O) circuits each coupling to one of its micro-bumps or micro-pads 34 at its bottom for signal transmission or power or ground delivery (1) through, in sequence for the first aspect, one of its bonded metal bump or contact 168 therebetween and one of the through silicon vias (TSVs) 157 of its known-good memory or ASIC chip 397-1, or (2) through, in sequence for the second aspect, one of the metal pads 6*a* of its known-good memory or ASIC chip 397-1, one of the metal pads 6*a* of its application specific integrated-circuit (ASIC) chip 399-1 and one of the through silicon vias (TSVs) 157 of its known-good memory or ASIC chip 397-1, wherein each of the large input/output (I/O) circuits of its application specific integrated-circuit (ASIC) logic chip 399-1 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (PO) circuits of its application specific integrated-circuit (ASIC) logic chip 399-1 may have an I/O power efficiency greater than 3, 5 or 10 pico-Joules per bit, per switch or per voltage swing.

Referring to FIG. 13E, for the third type of sub-system module 190 for the first alternative, its known-good memory or ASIC chip 397-1 may be implemented using a semiconductor node or generation less advanced than or equal to, or above or equal to 20 nm, 30 nm, 40 nm, 50 nm, 90 nm, 130 nm, 250 nm, 350 nm or 500 nm; while its application specific integrated-circuit (ASIC) logic chip 399-1 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in its known-good memory or ASIC chip 397-1 may be 1, 2, 3, 4, 5 or greater than 5 nodes or generations older, more matured or less advanced than that used in its application specific integrated-circuit (ASIC) logic chip 399-1. Transistors used in its known-good memory or ASIC chip 397-1 may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in its known-good memory or ASIC chip 397-1 may be different from that used in its application specific integrated-circuit (ASIC) logic chip 399-1; its known-good memory or ASIC chip 397-1 may use planar MOSFETs, while its application specific integrated-circuit (ASIC) logic chip 399-1 may use fin field effect transistors (FINFETs) or gate-all-around field effect transistors (GAAFETs). A power supply voltage (Vcc) applied in its known-good memory or ASIC chip 397-1 may be greater than or equal to 1.5, 2.0, 2.5, 3, 3.3, 4, or 5 voltages, while a power supply voltage (Vcc) applied in its application specific integrated-circuit (ASIC) logic chip 399-1 may be smaller than or equal to 1.8, 1.5 or 1 voltage. The power supply voltage applied in its known-good memory or ASIC chip 397-1 may be higher than that applied in its application specific integrated-circuit (ASIC) logic chip 399-1. A gate oxide of a field effect transistor (FET) of its known-good memory or ASIC chip 397-1 may have a physical thickness greater than or equal to 5 nm, 6 nm, 7.5 nm, 10 nm, 12.5 nm, or 15 nm, while a gate oxide of a field effect transistor (FET) of its application specific integrated-circuit (ASIC) logic chip 399-1 may have a physical thickness less than 4.5 nm, 4 nm, 3 nm or 2 nm. The thickness of the gate oxide of the field effect transistor (FET) of its known-good memory or ASIC chip 397-1 may be greater than that of its application specific integrated-circuit (ASIC) logic chip 399-1.

For more elaboration, referring to FIG. 13E, for the third type of sub-system module 190 for the first alternative, its known-good memory or ASIC chip 397-1 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when its application specific integrated-circuit (ASIC) logic chip 399-1 is redesigned using a new technology node or for new application. Alternatively, its known-good memory or ASIC chip 397-1 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when its application specific integrated-circuit (ASIC) logic chip 399-1 is redesigned using the new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. Alternatively, its known-good memory or ASIC chip 397-1 may use an old technology node to cooperate with its application specific integrated-circuit (ASIC) logic chip 399-1 manufactured using a new technology node. Alternatively, its known-good memory or ASIC chip 397-1 may use an old technology node to cooperate with its application specific integrated-circuit (ASIC) logic chip 399-1 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. Alternatively, a technology process for forming its known-good memory or ASIC chip 397-1 may not be compatible to that for forming its application specific integrated-circuit (ASIC) logic chip 399-1, wherein its known-good memory or ASIC chip 397-1 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

3-2. Third Type of Sub-System Module or Unit for Second Alternative

Figure 13F:
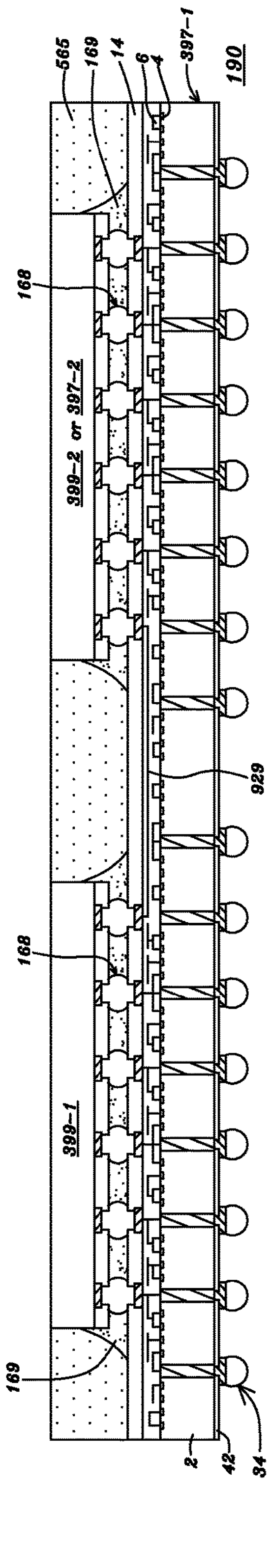

Alternatively, FIG. 13F is a schematically cross-sectional view showing a third type of sub-system module for a second alternative in accordance with an embodiment of the present application. Referring to FIG. 13F, a third type of sub-system module 190 for a second alternative is similar to the third type of sub-system module 190 for the first alternative as illustrated in FIG. 13E, but the difference between the third type of sub-system modules 190 for the first and second alternatives is that the third type of sub-system module 190 for the second alternative may further include an application specific integrated-circuit (ASIC) logic chip 399-2 having the same specification as the first type of semiconductor integrated-circuit (IC) chip 100 illustrated in FIG. 3A, wherein the application specific integrated-circuit (ASIC) chip 399-2 having the same specification as the first type of semiconductor integrated-circuit (IC) chip 100 illustrated in FIG. 3A, wherein the application specific integrated-circuit (ASIC) chip 399-2 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. For an element indicated by the same reference number shown in FIGS. 13E and 13F, the specification of the element as seen in FIG. 13F may be referred to that of the element as illustrated in FIG. 13E. For the third type of sub-system modules 190 for the second alternative, its application specific integrated-circuit (ASIC) logic chip 399-2 may be replaced with a known-good memory or application-specific-integrated-circuit (ASIC) chip 397-2, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, power-management integrated-circuit (IC) chip or analog integrated-circuit (IC) chip. Its known-good memory or application-specific-integrated-circuit (ASIC) chip 397-2 may have the same specification as the first type of semiconductor integrated-circuit (IC) chip 100 illustrated in FIG. 3A.

For the first aspect, referring to FIG. 13F, its application specific integrated-circuit (ASIC) chip 399-2, or known-good memory or application-specific-integrated-circuit (ASIC) chip 397-2 in case or replacing its application specific integrated-circuit (ASIC) chip 399-2, may be turned upside down with the first, second, third or fourth type of micro-bumps or micro-pads 34 thereof turned to be at the bottom thereof each to be bonded to one of the first, second, third or fourth type of micro-bumps or micro-pads 34 of its known-good memory or application-specific-integrated-circuit (ASIC) chip 397-1 to form a bonded metal bump or contact 168 therebetween by a step for one of the first through fourth cases as illustrated in FIGS. 11A, 12A and 12B in which the first, second, third or fourth type of micro-bumps or micro-pads 34 of its application specific integrated-circuit (ASIC) chip 399-2, or known-good memory or application-specific-integrated-circuit (ASIC) chip 397-2 in case or replacing its application specific integrated-circuit (ASIC) chip 399-2, may be considered as the first, second, third or fourth type of micro-bumps or micro-pads 34 of the upper one of the memory chips 251 of the memory module 159 illustrated in FIGS. 11A, 12A and 12B, and the first, second, third or fourth type of micro-bumps or micro-pads 34 of its known-good memory or application-specific-integrated-circuit (ASIC) chip 397-1 may be considered as the first, second, third or fourth type of micro-bumps or micro-pads 570 of the lower one of the memory chips 251 or the control chip 688 of the memory module 159 illustrated in FIGS. 11A, 12A and 12B. In this case, the third type of sub-system module 190 for the second alternative may further include an underfill 169, e.g., polymer layer, between its application specific integrated-circuit (ASIC) chip 399-2, or known-good memory or application-specific-integrated-circuit (ASIC) chip 397-2 in case or replacing its application specific integrated-circuit (ASIC) chip 399-2, and its known-good memory or application-specific-integrated-circuit (ASIC) chip 397-1, covering a sidewall of each of its bonded metal bumps or contacts 168 therebetween.

For the second aspect, for the third type of sub-system module 190 for the second alternative, its known-good memory or application-specific-integrated-circuit (ASIC) chip 397-1 may have the same specification as the third type of semiconductor integrated-circuit chip 100 as illustrated in FIG. 3C, and its application specific integrated-circuit (ASIC) chip 399-2, or known-good memory or application-specific-integrated-circuit (ASIC) chip 397-2 in case or replacing its application specific integrated-circuit (ASIC) chip 399-2, may have the same specification as the first type of semiconductor integrated-circuit (IC) chip as illustrated in FIG. 3C. Its application specific integrated-circuit (ASIC) chip 399-2, or known-good memory or application-specific-integrated-circuit (ASIC) chip 397-2 in case or replacing its application specific integrated-circuit (ASIC) chip 399-2, may be bonded to its known-good memory or application-specific-integrated-circuit (ASIC) chip 397-1 using an oxide-to-oxide and metal-to-metal direct bonding method. The oxide-to-oxide and metal-to-metal direct bonding method may include (1) oxide-to-oxide bonding the insulating bonding layer 52, i.e., a layer of silicon dioxide, at the active side of its application specific integrated-circuit (ASIC) chip 399-2, or known-good memory or application-specific-integrated-circuit (ASIC) chip 397-2 in case or replacing its application specific integrated-circuit (ASIC) chip 399-2, to the insulating bonding layer 52, i.e., a layer of silicon dioxide, of its known-good memory or application-specific-integrated-circuit (ASIC) chip 397-1, and (2) metal-to-metal bonding, e.g., copper-to-copper bonding, the metal pads 6*a*, such as copper pads, at the active side of its application specific integrated-circuit (ASIC) chip 399-2, or known-good memory or application-specific-integrated-circuit (ASIC) chip 397-2 in case or replacing its application specific integrated-circuit (ASIC) chip 399-2, to the metal pads 6*a*, such as copper pads, of its a known-good memory or application-specific-integrated-circuit (ASIC) chip 397-1.

Referring to FIG. 13F, for the third type of sub-system module 190 for the second alternative, its known-good memory or ASIC chip 397-1 may have the semiconductor devices 4 such as transistors at the active surface of the semiconductor substrate 2 thereof as illustrated in FIGS. 3A and 3C, and the active surface of the semiconductor substrate 2 of its known-good memory or ASIC chip 397-1 may face an active surface of the semiconductor substrate 2 of its application specific integrated-circuit (ASIC) logic chip 399-1 and an active surface of the semiconductor substrate 2 of its application specific integrated-circuit (ASIC) chip 399-2, or known-good memory or application-specific-integrated-circuit (ASIC) chip 397-2 in case of replacing its application specific integrated-circuit (ASIC) chip 399-2, wherein each of its application specific integrated-circuit (ASIC) logic chip 399-1 and its application specific integrated-circuit (ASIC) chip 399-2, or known-good memory or application-specific-integrated-circuit (ASIC) chip 397-2 in case of replacing its application specific integrated-circuit (ASIC) chip 399-2, may have the semiconductor devices 4 such as transistors at the active surface of the semiconductor substrate 2 thereof as illustrated in FIGS. 3A and 3C. For the third type of sub-system module 190 for the second alternative, its known-good memory or ASIC chip 397-1 may be used as the auxiliary and cooperating (AC) integrated-circuit (IC) chip for supporting and co-working with each of its application specific integrated-circuit (ASIC) logic chip 399-1 and its application specific integrated-circuit (ASIC) chip 399-2, or known-good memory or application-specific-integrated-circuit (ASIC) chip 397-2 in case of replacing its application specific integrated-circuit (ASIC) chip 399-2.

Referring to FIG. 13F, for the third type of sub-system module 190 for the second alternative, its known-good memory or application-specific-integrated-circuit (ASIC) chip 397-1 may include a metal interconnect 929, provided by the interconnection metal layers 6 and/or 27 of the first and/or second interconnection schemes 560 and/or 588 thereof, coupling its application specific integrated-circuit (ASIC) chip 399-1 to its application specific integrated-circuit (ASIC) chip 399-2, or known-good memory or application-specific-integrated-circuit (ASIC) chip 397-2 in case of replacing its application specific integrated-circuit (ASIC) chip 399-2, for ground or power delivery or signal transmission.

Referring to FIG. 13F, for the third type of sub-system module 190 for the second alternative, its polymer layer 565, e.g., resin or compound, may be formed on its known-good memory or ASIC chip 397-1 and at the same horizontal level of its application specific integrated-circuit (ASIC) logic chip 399-1 and its application specific integrated-circuit (ASIC) chip 399-2, or known-good memory or application-specific-integrated-circuit (ASIC) chip 397-2 in case of replacing its application specific integrated-circuit (ASIC) chip 399-2, wherein each of its application specific integrated-circuit (ASIC) logic chip 399-1 and its application specific integrated-circuit (ASIC) chip 399-2, or known-good memory or application-specific-integrated-circuit (ASIC) chip 397-2 in case of replacing its application specific integrated-circuit (ASIC) chip 399-2, is horizontally between two portions of its polymer layer 565. For the third type of sub-system module 190 for the second alternative, its polymer layer 565 may have a top surface coplanar with a top surface of its application specific integrated-circuit (ASIC) logic chip 399-1, i.e., a backside of the semiconductor substrate 2 of its application specific integrated-circuit (ASIC) logic chip 399-1, and a top surface of its application specific integrated-circuit (ASIC) logic chip 399-2, i.e., a backside of the semiconductor substrate 2 of its application specific integrated-circuit (ASIC) logic chip 399-2, or known-good memory or application-specific-integrated-circuit (ASIC) chip 397-2, i.e., a backside of the semiconductor substrate 2 of its known-good memory or application-specific-integrated-circuit (ASIC) chip 397-2, in case of replacing its application specific integrated-circuit (ASIC) chip 399-2, and its polymer layer 565 may have the same specification as that of the polymer layer 565 of the first type of sub-system module 190 as illustrated in FIGS. 13A and 13B.

3-3. Third Type of Sub-System Module or Unit for Third Alternative

Figure 13G:
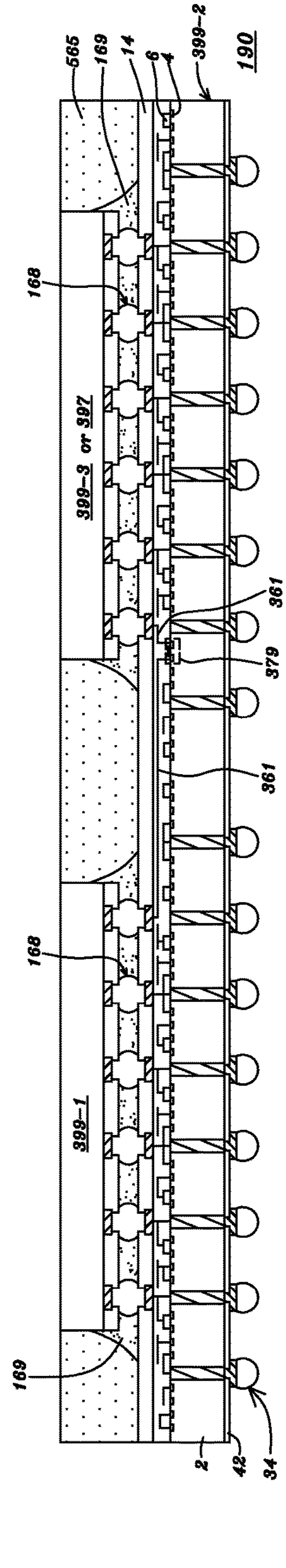

Alternatively, FIG. 13G is a schematically cross-sectional view showing a third type of sub-system module for a third alternative in accordance with an embodiment of the present application. Referring to FIG. 13G, a third type of sub-system module 190 for a third alternative is similar to the third type of sub-system module 190 for the first alternative as illustrated in FIG. 13E, but the difference between the third type of sub-system modules 190 for the first and third alternatives is that the third type of sub-system module 190 for the third alternative may include an application specific integrated-circuit (ASIC) logic chip 399-2 having the same specification as the first type of semiconductor integrated-circuit (IC) chip 100 illustrated in FIG. 3A to replace the known-good memory or application-specific-integrated-circuit (ASIC) chip 397-1 of the third type of sub-system module 190 for the first alternative as seen in FIG. 13E, and the third type of sub-system module 190 for the third alternative may include a known-good memory or application-specific-integrated-circuit (ASIC) chip 397 having the same specification as the first type of semiconductor integrated-circuit (IC) chip 100 illustrated in FIG. 3A, wherein its known-good memory or application-specific-integrated-circuit (ASIC) chip 397 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, power-management integrated-circuit (IC) chip or analog integrated-circuit (IC) chip, and its application specific integrated-circuit (ASIC) chip 399-2 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. For an element indicated by the same reference number shown in FIGS. 13E and 13G, the specification of the element as seen in FIG. 13G may be referred to that of the element as illustrated in FIG. 13E.

Alternatively, for the third type of sub-system module 190 for the third alternative, its known-good memory or application-specific-integrated-circuit (ASIC) chip 397 may be replaced by an application specific integrated-circuit (ASIC) logic chip 399-3 having the same specification as the first type of semiconductor integrated-circuit (IC) chip 100 illustrated in FIG. 3A, wherein its application specific integrated-circuit (ASIC) logic chip 399-3 in case of replacing its known-good memory or application-specific-integrated-circuit (ASIC) chip 397 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example.

For the first aspect, referring to FIG. 13G, each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, may be turned upside down with the first, second, third or fourth type of micro-bumps or micro-pads 34 thereof turned to be at the bottom thereof each to be bonded to one of the first, second, third or fourth type of micro-bumps or micro-pads 34 of its application specific integrated-circuit (ASIC) chip 399-2 to form a bonded metal bump or contact 168 therebetween by a step for one of the first through fourth cases as illustrated in FIGS. 11A, 12A and 12B in which the first, second, third or fourth type of micro-bumps or micro-pads 34 of each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, may be considered as the first, second, third or fourth type of micro-bumps or micro-pads 34 of the upper one of the memory chips 251 of the memory module 159 illustrated in FIGS. 11A, 12A and 12B, and the first, second, third or fourth type of micro-bumps or micro-pads 34 of its application specific integrated-circuit (ASIC) chip 399-2 may be considered as the first, second, third or fourth type of micro-bumps or micro-pads 570 of the lower one of the memory chips 251 or the control chip 688 of the memory module 159 illustrated in FIGS. 11A, 12A and 12B. In this case, the third type of sub-system module 190 for the third alternative may further include an underfill 169, e.g., polymer layer, between its application specific integrated-circuit (ASIC) chip 399-2 and each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, covering a sidewall of each of its bonded metal bumps or contacts 168 therebetween.

For the second aspect, referring to FIG. 13G, for the third type of sub-system module 190 for the third alternative, each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, may have the same specification as the third type of semiconductor integrated-circuit chip 100 as illustrated in FIG. 3C, and its application specific integrated-circuit (ASIC) chip 399-2 may have the same specification as the first type of semiconductor integrated-circuit (IC) chip as illustrated in FIG. 3C. Each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, may be bonded to its application specific integrated-circuit (ASIC) chip 399-2 using an oxide-to-oxide and metal-to-metal direct bonding method. The oxide-to-oxide and metal-to-metal direct bonding method may include (1) oxide-to-oxide bonding the insulating bonding layer 52, i.e., a layer of silicon dioxide, at the active side of each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, to the insulating bonding layer 52, i.e., a layer of silicon dioxide, of its application specific integrated-circuit (ASIC) chip 399-2, and (2) metal-to-metal bonding, e.g., copper-to-copper bonding, the metal pads 6*a*, such as copper pads, at the active side of each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, to the metal pads 6*a*, such as copper pads, of its application specific integrated-circuit (ASIC) chip 399-2.

Referring to FIG. 13G, for the third type of sub-system module 190 for the third alternative, its application specific integrated-circuit (ASIC) chip 399-2 may have the semiconductor devices 4 such as transistors at the active surface of the semiconductor substrate 2 thereof as illustrated in FIGS. 3A and 3C, and the active surface of the semiconductor substrate 2 of its application specific integrated-circuit (ASIC) chip 399-2 may face an active surface of the semiconductor substrate 2 of each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, wherein each of its application specific integrated-circuit (ASIC) chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, may have the semiconductor devices 4 such as transistors at the active surface of the semiconductor substrate 2 thereof as illustrated in FIGS. 3A and 3C. For the third type of sub-system module 190 for the third alternative, its known-good memory or ASIC chip 397 may be used as the auxiliary and cooperating (AC) integrated-circuit (IC) chip for supporting and co-working with each of its application specific integrated-circuit (ASIC) logic chips 399-1 and 399-2.

Referring to FIG. 13G, for the third type of sub-system module 190 for the third alternative, its polymer layer 565, e.g., resin or compound, may be formed on its application specific integrated-circuit (ASIC) chip 399-2 and at the same horizontal level of its application specific integrated-circuit (ASIC) logic chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, wherein each of its application specific integrated-circuit (ASIC) logic chip 399-1 and known-good memory or application-specific-integrated-circuit (ASIC) chip 397 is horizontally between two portions of its polymer layer 565. For the third type of sub-system module 190 for the third alternative, its polymer layer 565 may have a top surface coplanar with a top surface of its application specific integrated-circuit (ASIC) logic chip 399-1, i.e., a backside of the semiconductor substrate 2 of its application specific integrated-circuit (ASIC) logic chip 399-1, and a top surface of its known-good memory or application-specific-integrated-circuit (ASIC) chip 397, or a top surface of its application specific integrated-circuit (ASIC) logic chip 399-3 in case of replacing its known-good memory or application-specific-integrated-circuit (ASIC) chip 397, i.e., a backside of the semiconductor substrate 2 of its known-good memory or application-specific-integrated-circuit (ASIC) chip 397 or a backside of the semiconductor substrate 2 of its application specific integrated-circuit (ASIC) logic chip 399-3 in case of replacing its known-good memory or application-specific-integrated-circuit (ASIC) chip 397, and its polymer layer 565 may have the same specification as that of the polymer layer 565 of the first type of sub-system module 190 as illustrated in FIGS. 13A and 13B.

Referring to FIG. 13G, for the third type of sub-system module 190 for the third alternative, the semiconductor substrate 2 of its application specific integrated-circuit (ASIC) chip 399-2 may be ground or polished from the backside thereof, i.e., from the bottom side thereof, such that a bottom portion of the semiconductor substrate 2 of its application specific integrated-circuit (ASIC) chip 399-2 may be removed and the insulating lining layer 153, adhesion layer 154 and seed layer 155 of each of the through silicon vias (TSVs) 157 of its application specific integrated-circuit (ASIC) chip 399-2 at a bottom of each of the through silicon vias (TSVs) 157 of its application specific integrated-circuit (ASIC) chip 399-2 may be removed, wherein the insulating lining layer 153, adhesion layer 154 and seed layer 155 of each of the through silicon vias (TSVs) 157 of its application specific integrated-circuit (ASIC) chip 399-2 may be left at a sidewall of the copper layer 156 of each of the through silicon vias (TSVs) 157 of its application specific integrated-circuit (ASIC) chip 399-2. Thereby, the copper layer 156 of each of the through silicon vias (TSVs) 157 of its application specific integrated-circuit (ASIC) chip 399-2 may have a bottom surface coplanar with a bottom surface of the semiconductor substrate 2 of its application specific integrated-circuit (ASIC) chip 399-2.

Referring to FIG. 13G, the third type of sub-system module 190 for the third alternative may further include (1) a polymer layer 42, i.e., insulating dielectric layer, on the bottom surface of the semiconductor substrate 2 of its application specific integrated-circuit (ASIC) chip 399-2, wherein each opening in its polymer layer 42 is under the bottom surface of the copper layer 156 of one of the through silicon vias (TSVs) 157 of its application specific integrated-circuit (ASIC) chip 399-2, wherein its polymer layers 42 may have the same specification as the polymer layer 42 of the second interconnection scheme 588 of the first type of semiconductor integrated-circuit (IC) chip 100 as illustrated in FIG. 3A, and (2) multiple micro-bumps or micro-pads 34 each on the bottom surface of the copper layer 156 of one of the through silicon vias (TSVs) 157 of its application specific integrated-circuit (ASIC) chip 399-2 at a top of one of the openings in its polymer layer 42. Each of the micro-bumps or micro-pads 34 may have various types, i.e., first, second, third and fourth types, which may have the same specification as the first, second, third and fourth types of micro-bumps or micro-pads 34 respectively as illustrated in FIG. 3A, having the adhesion layer 26*a* formed on the bottom surface of the copper layer 156 of one of the through silicon vias (TSVs) 157 of its application specific integrated-circuit (ASIC) chip 399-2.

Referring to FIG. 13G, for the third type of sub-system module 190 for the third alternative, some of the transistors 4 of its application specific integrated-circuit (ASIC) logic chip 399-2 may be provided for one of the programmable switch cells 379 thereof having the same specification as one illustrated in FIG. 2 having one of the nodes N23-N26 coupling to its application specific integrated-circuit (ASIC) logic chip 399-1 through one of the programmable interconnects 361 of its application specific integrated-circuit (ASIC) logic chip 399-2, provided by the interconnection metal layers 6 and/or 27 of the first and/or second interconnection schemes 560 and/or 588 of its application specific integrated-circuit (ASIC) logic chip 399-2, and another of the nodes N23-N26 coupling to its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, through another of the programmable interconnects 361 of its application specific integrated-circuit (ASIC) logic chip 399-2, provided by the interconnection metal layers 6 and/or 27 of the first and/or second interconnection schemes 560 and/or 588 of its application specific integrated-circuit (ASIC) logic chip 399-2, to control coupling between its application specific integrated-circuit (ASIC) logic chip 399-1 and its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397. The memory cells 362 of said one of the programmable switch cells 379 may store configuration data passed from one or more of its micro-bumps or micro-pads 34 through one or more of the through silicon vias (TSVs) 157 of its application specific integrated-circuit (ASIC) logic chip 399-2.

Referring to FIG. 13G, for the third type of sub-system module 190 for the third alternative, its application specific integrated-circuit (ASIC) chip 399-2 may include a metal interconnect, provided by the interconnection metal layers 6 and/or 27 of the first and/or second interconnection schemes 560 and/or 588 thereof, coupling its application specific integrated-circuit (ASIC) chip 399-1 to its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, for ground or power delivery or signal transmission. Its application specific integrated-circuit (ASIC) chip 399-2 may have a first group of small I/O circuits each coupling to one of multiple small I/O circuits of its application specific integrated-circuit (ASIC) chip 399-1 through one of its bonded metal bump or contact 168 therebetween for the first aspect, or through one of the metal pads 6*a* of its application specific integrated-circuit (ASIC) chip 399-2 and one of the metal pads 6*a* of its application specific integrated-circuit (ASIC) chip 399-1 for the second aspect, for data transmission therebetween with a data bit width of equal to or greater than 64, 128, 256, 512, 1024, 2048, 4096, 8K, or 16K, and a second group of small I/O circuits each coupling to one of multiple small I/O circuits of its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, through one of its bonded metal bump or contact 168 therebetween for the first aspect, or through one of the metal pads 6*a* of its application specific integrated-circuit (ASIC) chip 399-2 and one of the metal pads 6*a* of its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, for the second aspect, for data transmission therebetween with a data bit width of equal to or greater than 64, 128, 256, 512, 1024, 2048, 4096, 8K, or 16K, wherein each of the first and second groups of small I/O circuits of its application specific integrated-circuit (ASIC) chip 399-2, each of the small I/O circuits of its application specific integrated-circuit (ASIC) chip 399-1 and each of the small I/O circuits of its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the first and second groups of small I/O circuits of its application specific integrated-circuit (ASIC) chip 399-2, each of the small I/O circuits of its application specific integrated-circuit (ASIC) chip 399-1 and each of the small I/O circuits of its known-good memory or application-specific-integrated-circuit (ASIC) chip 397, or application specific integrated-circuit (ASIC) logic chip 399-3 in case of replacing its known-good memory or application-specific-integrated-circuit (ASIC) chip 397, may have an I/O power efficiency smaller than 0.5 pico-Joules per bit, per switch or per voltage swing, or between 0.01 and 0.5 pico-Joules per bit, per switch or per voltage swing. Further, each of its application specific integrated-circuit (ASIC) chips 399-1 and 399-2 may include multiple programmable logic cells (LC) 2014 therein each as seen in FIG. 1 and multiple programmable switches 379 therein each as seen in FIG. 2, employed for a hardware accelerator or machine-learning operator. Further, its known-good memory or ASIC chip 397 may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key and a cryptography block or circuit configured (1) to encrypt, in accordance with the password or key, configuration data transmitted from or stored in the memory cells 490 for the look-up tables (LUT) 210 of the programmable logic cells (LC) 2014 of each of its application specific integrated-circuit (ASIC) logic chips 399-1 and 399-2 or the memory cells 362 of the programmable switch cells 379 of each of its application specific integrated-circuit (ASIC) logic chips 399-1 and 399-2 as encrypted configuration data to be passed to its micro-bumps or micro-pads 34 at its bottom and (2) to decrypt, in accordance with the password or key, encrypted configuration data from its micro-bumps or micro-pads 34 at its bottom as decrypted configuration data to be passed to and stored in the memory cells 490 for the look-up tables (LUT) 210 of the programmable logic cells (LC) 2014 of each of its application specific integrated-circuit (ASIC) logic chips 399-1 and 399-2 or the memory cells 362 of the programmable switch cells 379 of each of its application specific integrated-circuit (ASIC) logic chips 399-1 and 399-2. Further, its known-good memory or ASIC chip 397 may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of each of its application specific integrated-circuit (ASIC) logic chips 399-1 and 399-2 to be stored therein for programming or configuring the programmable logic cells (LC) 2014 of each of its application specific integrated-circuit (ASIC) logic chips 399-1 and 399-2 or to the memory cells 362 of the programmable switch cells 379 of each of its application specific integrated-circuit (ASIC) logic chips 399-1 and 399-2 to be stored therein for programming or configuring the programmable switch cells 379 of each of its application specific integrated-circuit (ASIC) logic chips 399-1 and 399-2. Further, its known-good memory or ASIC chip 397 may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to each of its application specific integrated-circuit (ASIC) logic chips 399-1 and 399-2.

Referring to FIG. 13G, for the third type of sub-system module 190 for the third alternative, its application specific integrated-circuit (ASIC) logic chip 399-2 may have multiple large input/output (I/O) circuits each coupling to one of its micro-bumps or micro-pads 34 at its bottom for signal transmission or power or ground delivery through one of the through silicon vias (TSVs) 157 of its application specific integrated-circuit (ASIC) logic chip 399-2, wherein each of the large input/output (PO) circuits of its application specific integrated-circuit (ASIC) logic chip 399-2 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its application specific integrated-circuit (ASIC) logic chip 399-2 may have an I/O power efficiency greater than 3, 5 or 10 pico-Joules per bit, per switch or per voltage swing. Further, each of its application specific integrated-circuit (ASIC) logic chip 399-1 and its known-good memory or ASIC chip 397, or application specific integrated-circuit (ASIC) logic chip 399-3 in case of replacing its known-good memory or application-specific-integrated-circuit (ASIC) chip 397, may have multiple large input/output (PO) circuits each coupling to one of its micro-bumps or micro-pads 34 at its bottom for signal transmission or power or ground delivery (1) through, in sequence for the first aspect, one of its bonded metal bump or contact 168 therebetween and one of the through silicon vias (TSVs) 157 of its application specific integrated-circuit (ASIC) logic chip 399-2, or (2) through, in sequence for the second aspect, one of the metal pads 6*a* of said each of its application specific integrated-circuit (ASIC) logic chip 399-1 and its known-good memory or ASIC chip 397, or application specific integrated-circuit (ASIC) logic chip 399-3 in case of replacing its known-good memory or application-specific-integrated-circuit (ASIC) chip 397, one of the metal pads 6*a* of its application specific integrated-circuit (ASIC) chip 399-2 and one of the through silicon vias (TSVs) 157 of its application specific integrated-circuit (ASIC) chip 399-2, wherein each of the large input/output (I/O) circuits of said each of its application specific integrated-circuit (ASIC) logic chip 399-1 and its known-good memory or ASIC chip 397, or application specific integrated-circuit (ASIC) logic chip 399-3 in case of replacing its known-good memory or application-specific-integrated-circuit (ASIC) chip 397, may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of said each of its application specific integrated-circuit (ASIC) logic chip 399-1 and its known-good memory or ASIC chip 397, or application specific integrated-circuit (ASIC) logic chip 399-3 in case of replacing its known-good memory or application-specific-integrated-circuit (ASIC) chip 397, may have an I/O power efficiency greater than 3, 5 or 10 pico-Joules per bit, per switch or per voltage swing.

Referring to FIG. 13G, for the third type of sub-system module 190 for the third alternative, its known-good memory or ASIC chip 397 may be implemented using a semiconductor node or generation less advanced than or equal to, or above or equal to 20 nm, 30 nm, 40 nm, 50 nm, 90 nm, 130 nm, 250 nm, 350 nm or 500 nm; while each of its application specific integrated-circuit (ASIC) logic chips 399-1 and 399-2 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in its known-good memory or ASIC chip 397 may be 1, 2, 3, 4, 5 or greater than 5 nodes or generations older, more matured or less advanced than that used in each of its application specific integrated-circuit (ASIC) logic chips 399-1 and 399-2. Transistors used in its known-good memory or ASIC chip 397 may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in its known-good memory or ASIC chip 397 may be different from that used in each of its application specific integrated-circuit (ASIC) logic chips 399-1 and 399-2; its known-good memory or ASIC chip 397 may use planar MOSFETs, while each of its application specific integrated-circuit (ASIC) logic chips 399-1 and 399-2 may use fin field effect transistors (FINFETs) or gate-all-around field effect transistors (GAAFETs). A power supply voltage (Vcc) applied in its known-good memory or ASIC chip 397 may be greater than or equal to 1.5, 2.0, 2.5, 3, 3.3, 4, or 5 voltages, while a power supply voltage (Vcc) applied in each of its application specific integrated-circuit (ASIC) logic chips 399-1 and 399-2 may be smaller than or equal to 1.8, 1.5 or 1 voltage. The power supply voltage applied in its known-good memory or ASIC chip 397 may be higher than that applied in each of its application specific integrated-circuit (ASIC) logic chips 399-1 and 399-2. A gate oxide of a field effect transistor (FET) of its known-good memory or ASIC chip 397 may have a physical thickness greater than or equal to 5 nm, 6 nm, 7.5 nm, 10 nm, 12.5 nm, or 15 nm, while a gate oxide of a field effect transistor (FET) of each of its application specific integrated-circuit (ASIC) logic chips 399-1 and 399-2 may have a physical thickness less than 4.5 nm, 4 nm, 3 nm or 2 nm. The thickness of the gate oxide of the field effect transistor (FET) of its known-good memory or ASIC chip 397 may be greater than that of each of its application specific integrated-circuit (ASIC) logic chips 399-1 and 399-2.

For more elaboration, referring to FIG. 13G, for the third type of sub-system module 190 for the third alternative, its known-good memory or ASIC chip 397 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when each of its application specific integrated-circuit (ASIC) logic chips 399-1 and 399-2 is redesigned using a new technology node or for new application. Alternatively, its known-good memory or ASIC chip 397 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when each of its application specific integrated-circuit (ASIC) logic chips 399-1 and 399-2 is redesigned using the new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. Alternatively, its known-good memory or ASIC chip 397 may use an old technology node to cooperate with each of its application specific integrated-circuit (ASIC) logic chips 399-1 and 399-2 manufactured using a new technology node. Alternatively, its known-good memory or ASIC chip 397 may use an old technology node to cooperate with each of its application specific integrated-circuit (ASIC) logic chips 399-1 and 399-2 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. Alternatively, a technology process for forming its known-good memory or ASIC chip 397 may not be compatible to that for forming each of its application specific integrated-circuit (ASIC) logic chips 399-1 and 399-2, wherein its known-good memory or ASIC chip 397 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

Specification for Stacking Unit

1. Structure for First Type of Stacking Unit and Process for Forming the Same

Figure 14A:
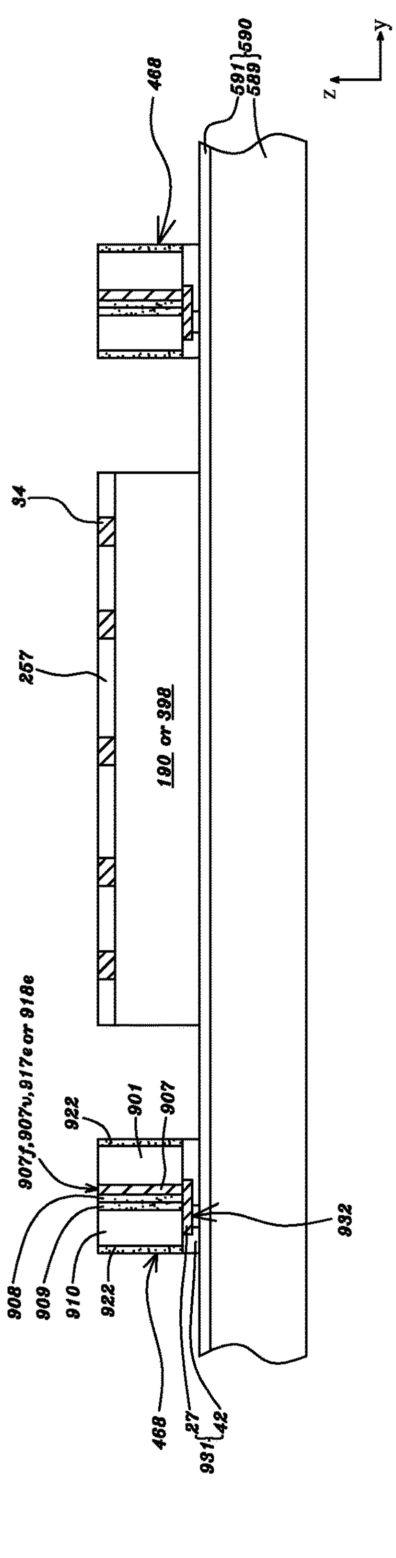
FIGS. 14A-14E are schematically cross-sectional views showing a process for forming a first type of stacking unit in a y-z plane in accordance with an embodiment of the present application.

FIGS. 14A-14E are schematically cross-sectional views showing a process for forming a first type of stacking unit in a y-z plane in accordance with an embodiment of the present application. Referring to FIG. 14A, a temporary substrate 590 may be provided with the same specification as the temporary substrate 590 as illustrated in FIG. 10A. Next, multiple application specific integrated-circuit (ASIC) chips 398 (only one is shown), each having the same specification as the second type of semiconductor integrated-circuit (IC) chip 100 illustrated in FIG. 3B, each may include the semiconductor substrate 2 having a bottom surface at a backside thereof attached to the sacrificial bonding layer 591 of the temporary substrate 590. Each of the application specific integrated-circuit (ASIC) chips 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. Alternatively, each of the application specific integrated-circuit (ASIC) chips 398 may be replaced with a sub-system module 190 having the same specification as the second type of sub-system module 190 as illustrated in each of FIGS. 13C and 13D, which may include the application specific integrated-circuit (ASIC) chip 399 having a bottom surface at a backside thereof attached to the sacrificial bonding layer 591 of the temporary substrate 590. Further, multiple rerouted vertical-through-via (VTV) connectors 468, each having the same specification as the first type of rerouted vertical-through-via (VTV) connector 468 as illustrated in FIGS. 10A-10G, each may be turned upside down with the rerouted metal pads 932 thereof turned to be at the bottom thereof, the polymer layer 42 of the interconnection scheme 931 thereof turned to be at the bottom thereof to be attached to the sacrificial bonding layer 591 of the temporary substrate 590, the bottom surface thereof turned to be at the top thereof as a top surface thereof, and the bottom metal pads or contacts 907*f*, 907*v*, 917*e*, 918*e*, 919*b* and/or 919*d* thereof turned to be at the top thereof as top metal pads or contacts thereof. In particular, FIGS. 14A-14E show each of the rerouted vertical-throughvia (VTV) connectors 468 may be formed with any of the first through seventh types of vertical-through-via (VTV) connectors 467 as seen in FIGS. 4A-4I, 5A-5C and 6A-6F. Each of the rerouted vertical-through-via (VTV) connectors 468 may be alternatively replaced with one type of the first and second types of pad-enlarged vertical-through-via (VTV) connector 469 illustrated in FIGS. 4J-4P, 5D-5E and 8G-8I to be turned upside down with the top metal pads of contacts 927*e* thereof turned to be at the bottom thereof as bottom metal pads or contacts, the top surface thereof turned to be at the bottom thereof as a bottom surface to be attached to the sacrificial bonding layer 591 of the temporary substrate 590, the bottom surface thereof turned to be at the top thereof as a top surface thereof, and the bottom metal pads or contacts 927*f* thereof turned to be at the top thereof as top metal pads or contacts thereof.

Figure 14B:
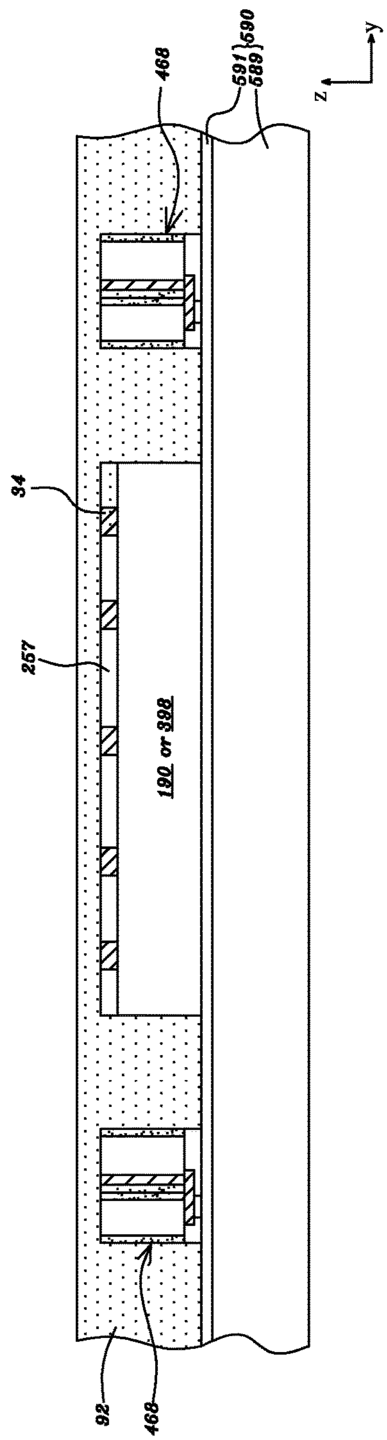

Next, referring to FIG. 14B, a polymer layer 92, or insulating dielectric layer, may be applied to fill a gap between each neighboring two of the application specific integrated-circuit (ASIC) chips 398, or the sub-system modules 190 in case of replacing the application specific integrated-circuit (ASIC) chips 398, and the rerouted vertical-through-via (VTV) connectors 468 or pad-enlarged vertical-through-via (VTV) connectors 469 and to cover the insulating dielectric layer 257 and micro-bumps or micro-pads 34 of each of the application specific integrated-circuit (ASIC) chips 398, or the sub-system modules 190 in case of replacing the application specific integrated-circuit (ASIC) chips 398, and the top surface of each of the rerouted vertical-through-via (VTV) connectors 468 or pad-enlarged vertical-through-via (VTV) connectors 469 by methods, for example, spin-on coating, screen-printing, dispensing or molding. The polymer layer 92 may be, for example, polyimide, BenzoCycloButene (BCB), parylene, polybenzoxazole (PBO), epoxy-based resin or compound, photo epoxy SU-8, elastomer, or silicone. The polymer layer 92 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Figure 14C:
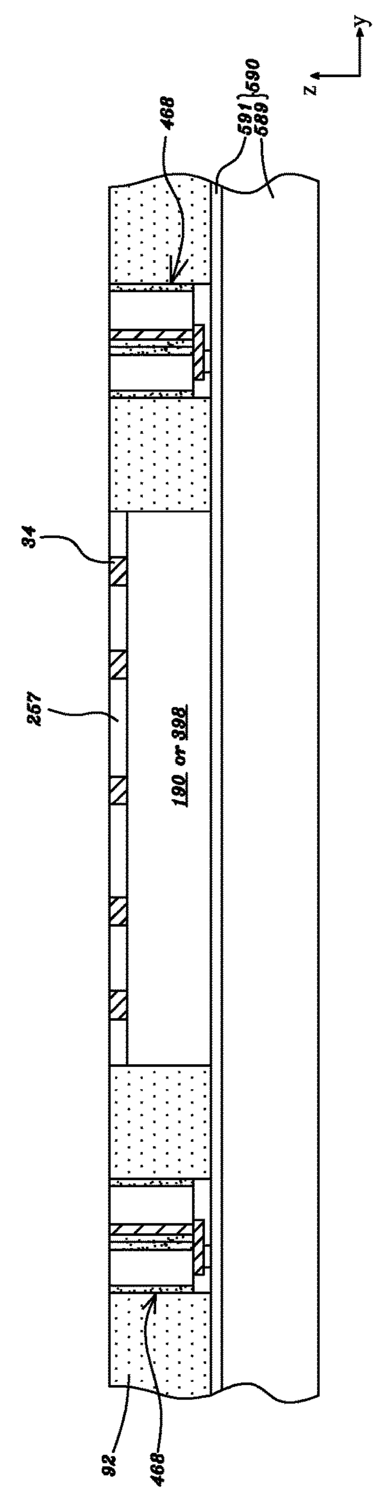

Next, referring to FIG. 14C, a chemical mechanical polishing (CMP), polishing or grinding process may be applied to remove a top portion of the polymer layer 92 such that a top surface of the copper layer 32 of each of the micro-bumps or micro-pads 34 of each of the application specific integrated-circuit (ASIC) chips 398, or the sub-system modules 190 in case of replacing the application specific integrated-circuit (ASIC) chips 398, a top surface of the insulating dielectric layer 257 of each of the application specific integrated-circuit (ASIC) chips 398, or the sub-system modules 190 in case of replacing the application specific integrated-circuit (ASIC) chips 398, the top surface of each of the top metal pads or contacts 907*f*, 907*v*, 917*e*, 918*e*, 919*b* and/or 919*d* of each of the rerouted vertical-through-via (VTV) connectors 468, or the top surface of each of the top metal pads or contacts 927*f* of each of the pad-enlarged vertical-through-via (VTV) connectors 469, and the top surface of each of the rerouted vertical-through-via (VTV) connectors 468 or pad-enlarged vertical-through-via (VTV) connectors 469 may be exposed to be coplanar with a top surface of the polymer layer 92.

Figure 14D:
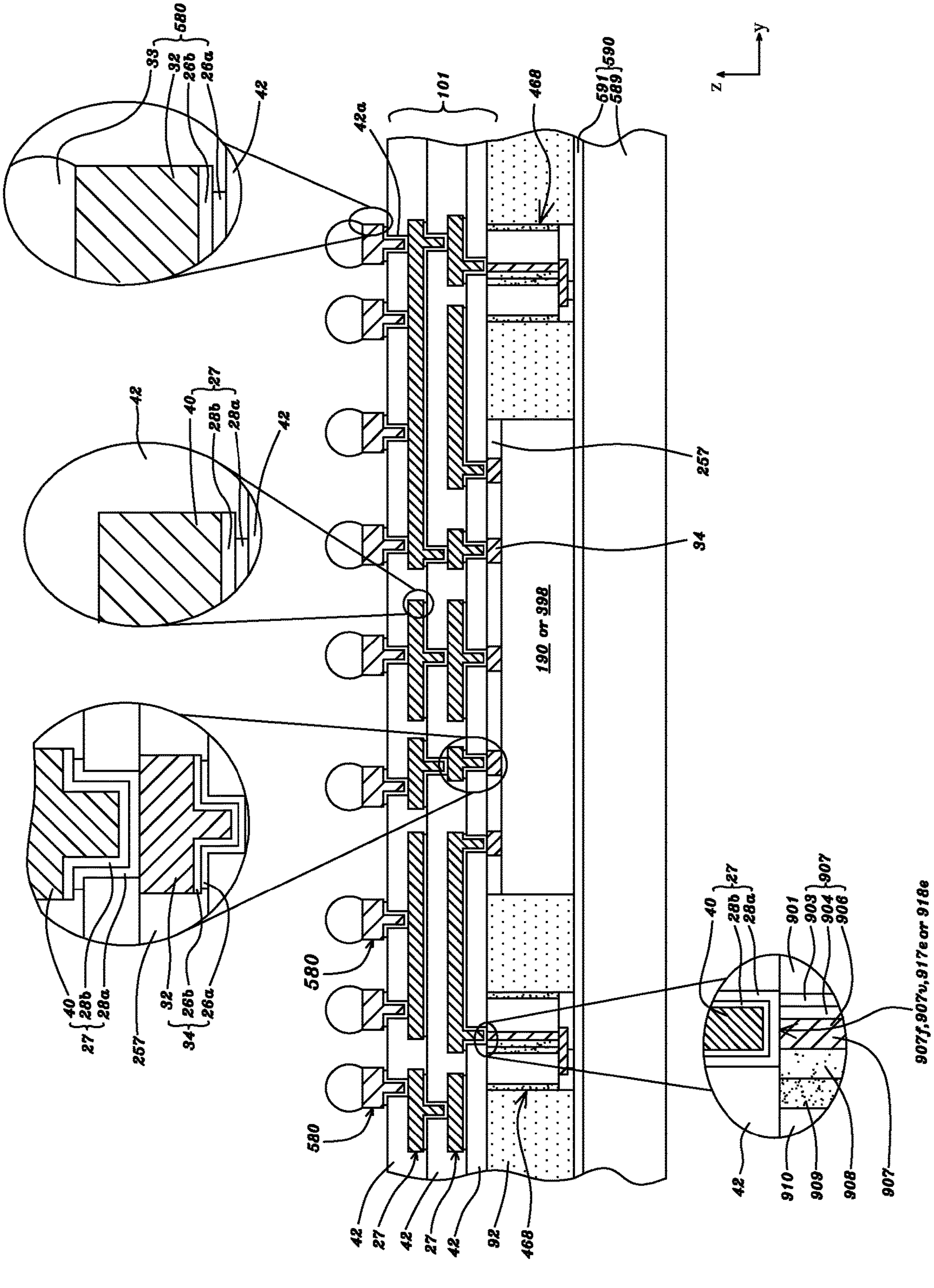

Referring to FIG. 14D, a frontside interconnection scheme for a device (FISD) 101 may be formed on the top surface of the polymer layer 92, the application specific integrated-circuit (ASIC) chips 398, or the sub-system modules 190 in case of replacing the application specific integrated-circuit (ASIC) chips 398, and the rerouted vertical-through-via (VTV) connectors 468 or pad-enlarged vertical-through-via (VTV) connectors 469. The frontside interconnection scheme for a device (FISD) 101 may include (1) one or more interconnection metal layers 27 over the top surface of the polymer layer 92, the application specific integrated-circuit (ASIC) chips 398, or the sub-system modules 190 in case of replacing the application specific integrated-circuit (ASIC) chips 398, and the rerouted vertical-through-via (VTV) connectors 468 or pad-enlarged vertical-through-via (VTV) connectors 469, wherein the one or more interconnection metal layers 27 may couple to the micro-bumps or micro-pads 34 of each of the application specific integrated-circuit (ASIC) chips 398, or the sub-system modules 190 in case of replacing the application specific integrated-circuit (ASIC) chips 398, and the top metal pads or contacts 907*f*, 907*v*, 917*e*, 918*e*, 919*b* and/or 919*d* of each of the rerouted vertical-through-via (VTV) connectors 468, or top metal pads or contacts 927*f* of each of the pad-enlarged vertical-through-via (VTV) connectors 469, and (2) one or more polymer layers 42, i.e., insulating dielectric layers, each between neighboring two of its interconnection metal layers 27, between a bottommost one of its interconnection metal layers 27 and a planar surface composed of the top surface of the polymer layer 92, the top surface of the insulating dielectric layer 257 of each of the application specific integrated-circuit (ASIC) chips 398, or the sub-system modules 190 in case of replacing the application specific integrated-circuit (ASIC) chips 398, and the top surface of each of the rerouted vertical-through-via (VTV) connectors 468 or pad-enlarged vertical-through-via (VTV) connectors 469, or on and above a topmost one of its interconnection metal layers 27, wherein the topmost one of its interconnection metal layers 27 may be patterned with multiple metal pads at bottoms of multiple openings in the topmost one of its polymer layers 42. Each of the interconnection metal layers 27 may include (1) a copper layer 40 having lower portions in openings in one of the polymer layers 42 having a thickness of between 0.3 μm and 20 μm and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of the interconnection metal layers 27 of its frontside interconnection scheme for a device (FISD) 101 may have the same specification as that of the second interconnection scheme 588 of the first type of semiconductor integrated-circuit (IC) chip 100 as illustrated in FIG. 3A, and each of the polymer layers 42 of its frontside interconnection scheme for a device (FISD) 101 may have the same specification as that of the second interconnection scheme 588 of the first type of semiconductor integrated-circuit (IC) chip 100 as illustrated in FIG. 3A. Each of the interconnection metal layers 27 of the frontside interconnection scheme for a device (FISD) 101 may extend horizontally across an edge of each of the application specific integrated-circuit (ASIC) chips 398, or the sub-system modules 190 in case of replacing the application specific integrated-circuit (ASIC) chips 398, and an edge of each of the rerouted vertical-through-via (VTV) connectors 468 or pad-enlarged vertical-through-via (VTV) connectors 469.

Next, referring to FIG. 14D, multiple metal bumps or pads 580, i.e., metal contacts, in an array, which may be of one of the first through fourth types having the same specification as the first through fourth types of micro-bumps or micro-pillars 34 as illustrated in FIG. 3A respectively, may have the adhesion layer 26*a* formed on the metal pads of the topmost one of the interconnection metal layers 27 of the frontside interconnection scheme for a device (FISD) 101 at the bottoms of the respective openings in the topmost one of the polymer layers 42 of the frontside interconnection scheme for a device (FISD) 101.

Figure 14E:
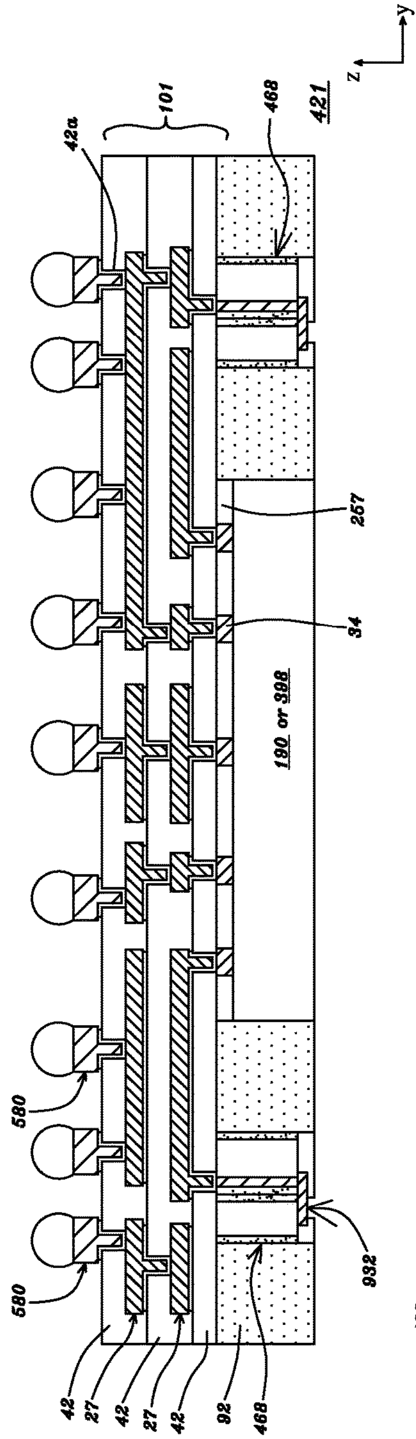

Next, the glass or silicon substrate 589 as seen in FIG. 14D may be released from the sacrificial bonding layer 591, which may be referred to the step as illustrated in FIG. 10E. Next, the remainder of the sacrificial bonding layer 591 may be pulled off, which may be referred to the step as illustrated in FIG. 10E, such that the bottom surface of the semiconductor substrate 2 of each of the application specific integrated-circuit (ASIC) chips 398, or the bottom surface of the application specific integrated-circuit (ASIC) chip 399 of each of the operation units 190 in case of replacing the application specific integrated-circuit (ASIC) chips 398, a bottom surface of the polymer layer 42 of the interconnection scheme 931 of each of the rerouted vertical-through-via (VTV) connectors 468, or the bottom surface of each of the pad-enlarged vertical-through-via (VTV) connectors 469, and a bottom surface of the polymer layer 92 may be exposed and coplanar. Further, the rerouted metal pads 932 of each of the rerouted vertical-through-via (VTV) connectors 468, or the bottom metal pads or contacts 927*e* of each of the pad-enlarged vertical-through-via (VTV) connectors 469, may be exposed at a bottom thereof. Next, the polymer layers 42 of the frontside interconnection scheme for a device (FISD) 101 and the polymer layer 92 may be cut or diced to separate multiple individual units (only one is shown) each for a first type of stacking unit 421 as shown in FIG. 14E by a laser cutting process or mechanical cutting process.

2. Structure for Second Type of Stacking Unit and Process for Forming the Same

Figure 15A:
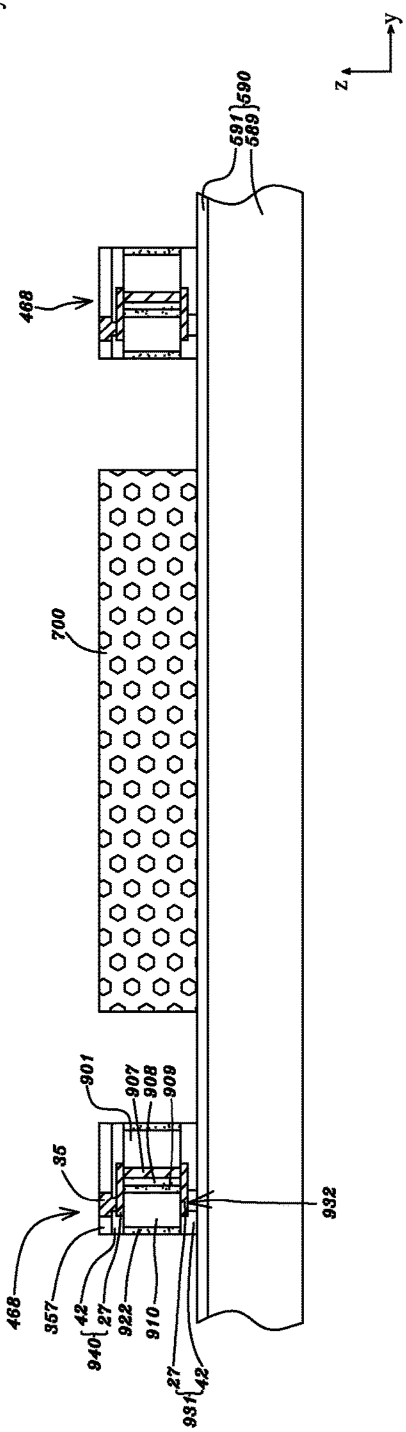
FIGS. 15A-15D are schematically cross-sectional views showing a process for forming a second type of stacking unit in an y-z plane in accordance with an embodiment of the present application.

FIGS. 15A-15D are schematically cross-sectional views showing a process for forming a second type of stacking unit in an y-z plane in accordance with an embodiment of the present application. Referring to FIG. 15A, a temporary substrate 590 may be provided with the same specification as the temporary substrate 590 as illustrated in FIG. 10A. Next, multiple micro heat pipes 700 (only one is shown) may be provided each with a bottom surface attached to the sacrificial bonding layer 591 of the temporary substrate 590, wherein each of the micro heat pipes 700 may have a thickness between 100 and 400 micrometers. Further, multiple rerouted vertical-through-via (VTV) connectors 468, each having the same specification as the fourth type of rerouted vertical-through-via (VTV) connector 468 as illustrated in FIG. 10N, each may be turned upside down with the rerouted metal pads 932 thereof turned to be at the bottom thereof, the polymer layer 42 of the interconnection scheme 931 thereof turned to be at the bottom thereof to be attached to the sacrificial bonding layer 591 of the temporary substrate 590, the bottom surface thereof turned to be at the top thereof as a top surface thereof, and the micro-bumps or micro-pads 35 and insulating dielectric layer 357 thereof turned to be at the top thereof. In particular, FIGS. 15A-15D show each of the rerouted vertical-through-via (VTV) connectors 468 may be formed with any of the first through seventh types of vertical-through-via (VTV) connectors 467 as seen in FIGS. 4A-4I, 5A-5C and 6A-6F. Each of the rerouted vertical-through-via (VTV) connectors 468 may be alternatively replaced with one type of the first and second types of pad-enlarged vertical-through-via (VTV) connector 469 illustrated in FIGS. 4J-4P, 5D-5E and 8G-8I to be turned upside down with the top metal pads of contacts 927*e* thereof turned to be at the bottom thereof as bottom metal pads or contacts, the top surface thereof turned to be at the bottom thereof as a bottom surface to be attached to the sacrificial bonding layer 591 of the temporary substrate 590, the bottom surface thereof turned to be at the top thereof as a top surface thereof, and the bottom metal pads or contacts 927*f* thereof turned to be at the top thereof as top metal pads or contacts thereof.

Figure 15B:
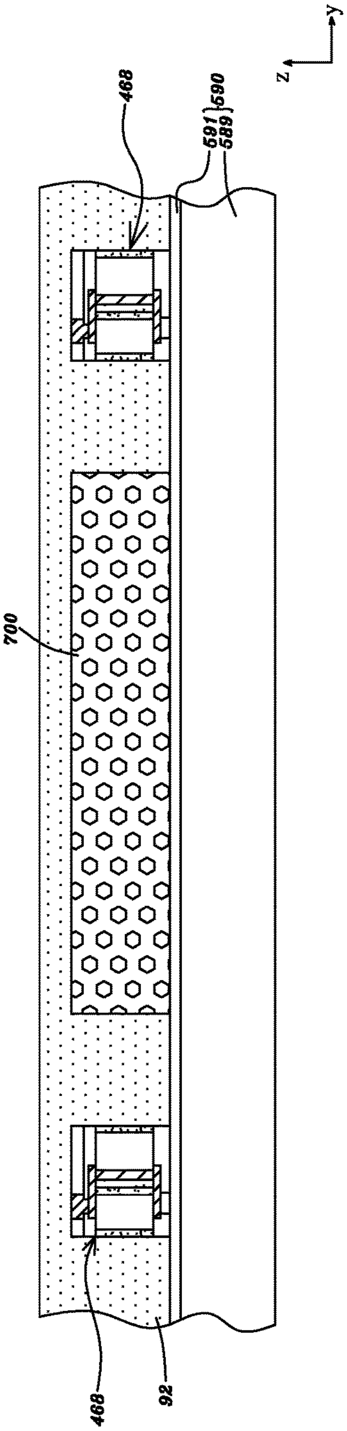

Next, referring to FIG. 15B, a polymer layer 92, or insulating dielectric layer, may be applied to fill a gap between each neighboring two of the micro heat pipes 700 and the rerouted vertical-through-via (VTV) connectors 468, or pad-enlarged vertical-through-via (VTV) connectors 469, and to cover the micro heat pipes 700 and the micro-bumps or micro-pads 35 and insulating dielectric layer 357 of each of the rerouted vertical-through-via (VTV) connectors 468, or the top surface and top metal pads of contacts 927*f* of each of the pad-enlarged vertical-through-via (VTV) connectors 469, by methods, for example, spin-on coating, screen-printing, dispensing or molding. The polymer layer 92 may have the same specification as that of the first type of stacking unit 421 illustrated in FIGS. 14A-14E.

Figure 15C:
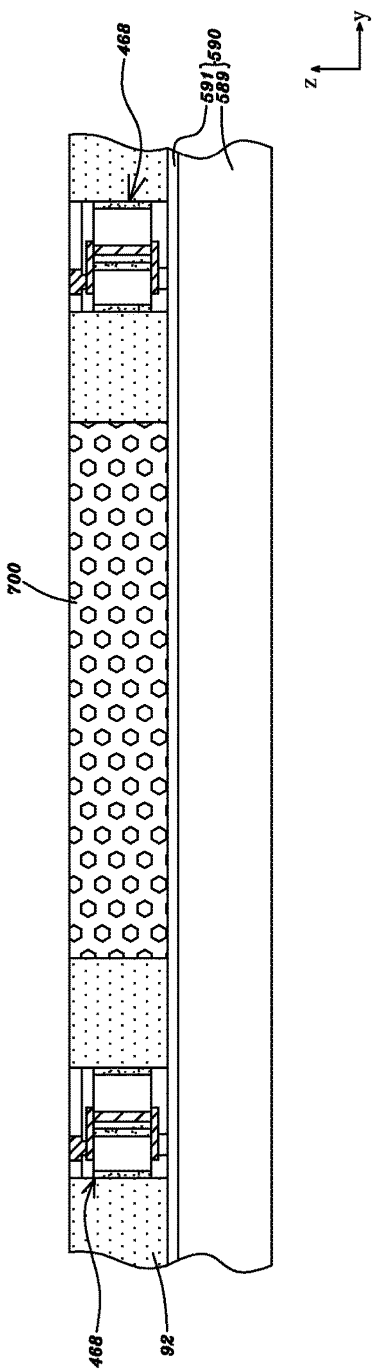

Next, referring to FIG. 15C, a chemical mechanical polishing (CMP), polishing or grinding process may be applied to remove a top portion of the polymer layer 92 such that a top surface of each of the micro heat pipes 700, a top surface of the copper layer 32 of each of the micro-bumps or micro-pads 35 of each of the rerouted vertical-through-via (VTV) connectors 468 and a top surface of the insulating dielectric layer 357 of each of the rerouted vertical-through-via (VTV) connectors 468 may be exposed to be coplanar with a top surface of the polymer layer 92. In case that each of the rerouted vertical-through-via (VTV) connectors 468 is replaced with the pad-enlarged vertical-through-via (VTV) connector 469, the top surface of each of the micro heat pipes 700, a top surface of each of the top metal pads of contacts 927*f* of each of the pad-enlarged vertical-through-via (VTV) connectors 469 and the top surface of each of the pad-enlarged vertical-through-via (VTV) connectors 469 may be exposed to be coplanar with the top surface of the polymer layer 92.

Figure 15D:
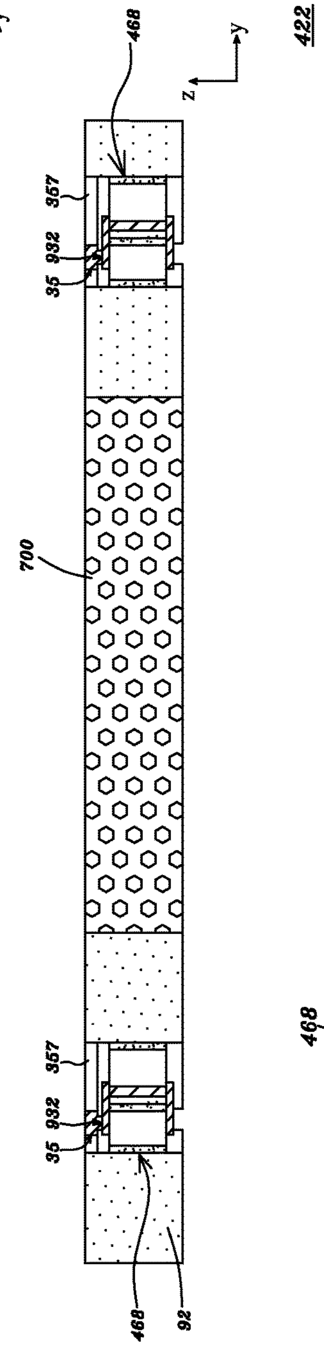

Next, the glass or silicon substrate 589 as seen in FIG. 15C may be released from the sacrificial bonding layer 591, which may be referred to the step as illustrated in FIG. 10E. Next, the remainder of the sacrificial bonding layer 591 may be pulled off, which may be referred to the step as illustrated in FIG. 10E, such that the bottom surface of each of the micro heat pipes 700, a bottom surface of the polymer layer 42 of the interconnection scheme 931 of each of the rerouted vertical-through-via (VTV) connectors 468, or the bottom surface of each of the pad-enlarged vertical-through-via (VTV) connectors 469, and a bottom surface of the polymer layer 92 may be exposed and coplanar. Further, the rerouted metal pads 932 of each of the rerouted vertical-through-via (VTV) connectors 468, or the bottom metal pads or contacts 927*e* of each of the pad-enlarged vertical-through-via (VTV) connectors 469, may be exposed at a bottom thereof. Next, the polymer layer 92 may be cut or diced to separate multiple individual units (only one is shown) each for a second type of stacking unit 422 as shown in FIG. 15D by a laser cutting process or mechanical cutting process.

3. Structure for Third Type of Stacking Unit

Figure 16:
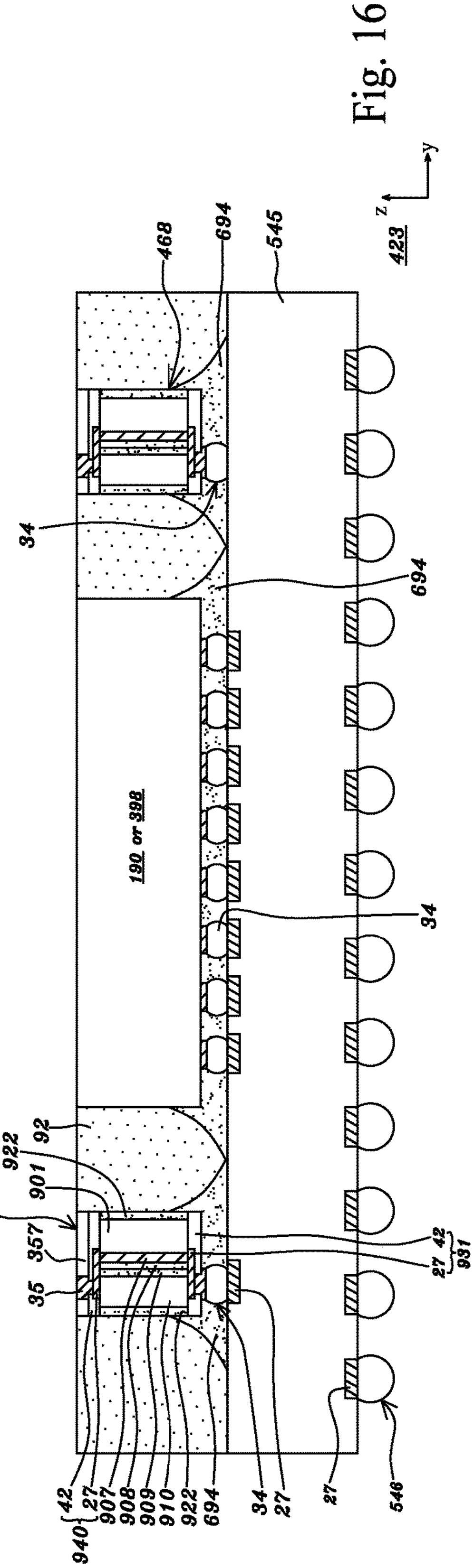
FIG. 16 is a schematically cross-sectional view showing a third type of stacking unit in accordance with an embodiment of the present application.
Figure 22:
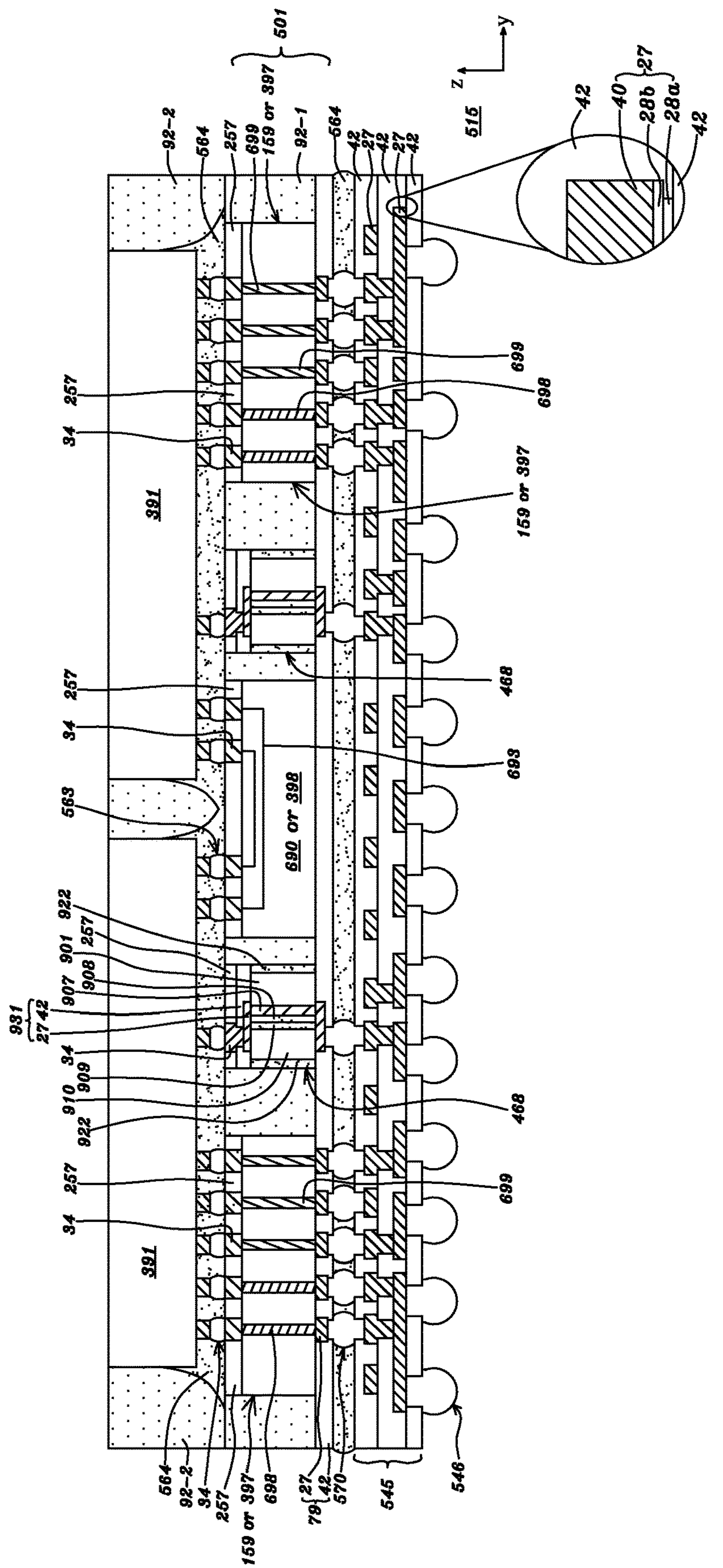

FIG. 16 is a schematically cross-sectional view showing a third type of stacking unit in accordance with an embodiment of the present application. Referring to FIG. 16, a third type of stacking unit 423 may include (1) a circuit board 545 as seen in FIG. 22 having multiple interconnection metal layers 27 and multiple polymer layers 42, i.e., insulating dielectric layers, each between neighboring two of the interconnection metal layers 27 of its circuit board 545, on a topmost one of the interconnection metal layers 27 of its circuit board 545 or under and on a bottommost one of the interconnection metal layers 27 of its circuit board 545, wherein each of the interconnection metal layers 27 of its circuit board 545 may have the same specification as that of the second interconnection scheme 588 of the first type of semiconductor integrated-circuit (IC) chip 100 as illustrated in FIG. 3A, and each of the polymer layers 42 of its circuit board 545 may have the same specification as that of the second interconnection scheme 588 of the first type of semiconductor integrated-circuit (IC) chip 100 as illustrated in FIG. 3A, (2) multiple solder balls 546, such as a tin-containing alloy, each attached to a metal pad of the bottommost one of the interconnection metal layers 27 of its circuit board 545 at a top of an opening in the bottommost one of the polymer layers 42 of its circuit board 545, (3) a sub-system module 190, which may have the same specification as the third type of sub-system module 190 for the first, second or third alternative as seen in FIGS. 13E-13G, having the micro-bumps or micro-pads 34 at the bottom thereof to be bonded to a metal pad of the topmost one of the interconnection metal layers 27 of its circuit board 545 at a bottom of an opening in the topmost one of the polymer layers 42 of its circuit board 545, wherein its sub-system module 190 may be alternatively replaced with an application specific integrated-circuit (ASIC) chip 398 having the same specification as the first type of semiconductor integrated-circuit (IC) chip 100 illustrated in FIG. 3A to be turned upside down with the micro-bumps or micro-pads 34 thereof turned to be at the bottom thereof to be bonded to a metal pad of the topmost one of the interconnection metal layers 27 of its circuit board 545 at a bottom of an opening in the topmost one of the polymer layers 42 of its circuit board 545, wherein its application specific integrated-circuit (ASIC) chip 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip, radio-frequency (RF) integrated-circuit (IC) chip, for example, (4) multiple rerouted vertical-through-via (VTV) connectors 468 each having the same specification as the third type of rerouted vertical-through-via (VTV) connector 468 illustrated in FIGS. 10K-10M to be turned upside down with the first, second, third or fourth type of micro-bumps or micro-pads 34 thereof turned to be at the bottom thereof to be bonded to a metal pad of the topmost one of the patterned metal layers of its circuit board 545 and the bottom surface thereof turned to be at the top thereof as a top surface thereof, and the micro-bumps or micro-pads 35 and insulating dielectric layer 357 thereof turned to be at the top thereof, (5) an underfill 694 between its sub-system module 190, or its semiconductor integrated-circuit chip 398 in case of replacing its sub-system module 190, and its circuit board 545 and between each of its rerouted vertical-through-via (VTV) connectors 468 and its circuit board 545, covering a sidewall of each of the micro-bumps or micro-pads 34 between its sub-system module 190, or its semiconductor integrated-circuit chip 398 in case of replacing its sub-system module 190, and its circuit board 545 and a sidewall of each of the micro-bumps or micro-pads 34 between each of its rerouted vertical-through-via (VTV) connectors 468 and its circuit board 545, and (6) a polymer layer 92, or insulating dielectric layer, on a top surface of its circuit board 545, wherein its polymer layer 92 may have a portion between its sub-system module 190, or its semiconductor integrated-circuit chip 398 in case of replacing its sub-system module 190, and each of its rerouted vertical-through-via (VTV) connectors 468, wherein its polymer layer 92 may have the same specification as the polymer layer 92 of the first type of stacking unit 421 illustrated in FIGS. 14A-14E, wherein a top surface of the semiconductor substrate 2 of the application specific integrated-circuit (ASIC) chip 399 of its sub-system module 190, or a top surface of the semiconductor substrate 2 of its semiconductor integrated-circuit chip 398 in case of replacing its sub-system module 190, a top surface of the copper layer 32 of each of the micro-bumps or micro-pads 35 of each of its rerouted vertical-through-via (VTV) connectors 468, a top surface of the insulating dielectric layer 357 of each of its rerouted vertical-through-via (VTV) connectors 468 and a top surface of its polymer layer 92 may be coplanar. In particular, FIG. 16 shows each of the rerouted vertical-through-via (VTV) connectors 468 of the third type of stacking unit 423 may be formed with any of the first through seventh types of vertical-through-via (VTV) connectors 467 as seen in FIGS. 4A-4I, 5A-5C and 6A-6F.

4. Structure for Fourth Type of Stacking Unit

Figure 17:
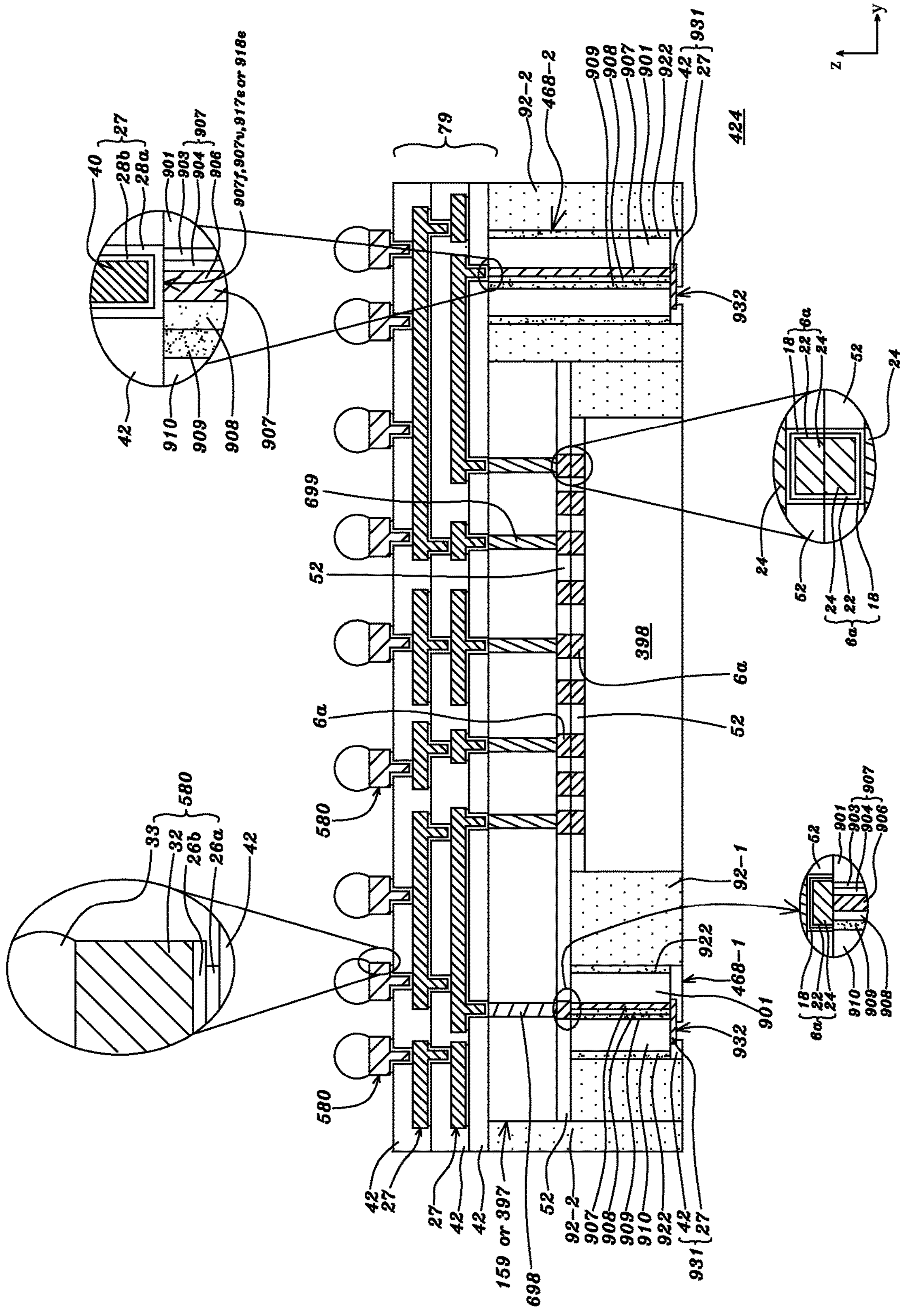
FIG. 17 is a schematically cross-sectional view showing a fourth type of stacking unit in accordance with an embodiment of the present application.

FIG. 17 is a schematically cross-sectional view showing a fourth type of stacking unit in accordance with an embodiment of the present application. Referring to FIG. 17, a fourth type of stacking unit 424 may include (1) a memory module 159 having the same specification as the third type of memory module 159 illustrated in FIG. 11C, (2) an application specific integrated-circuit (ASIC) chip 398 having the same specification as the third type of semiconductor integrated-circuit (IC) chip 100 illustrated in FIG. 3C, wherein the application specific integrated-circuit (ASIC) chip 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip, radio-frequency (RF) integrated-circuit (IC) chip, for example, and (3) a first rerouted vertical-through-via (VTV) connector 468-1 having the same specification as the first type of rerouted vertical-through-via (VTV) connector 468 as illustrated in FIG. 10A-10G but shown upside down in FIG. 17 with the rerouted metal pads 932 thereof shown in FIG. 17 at the bottom thereof, the polymer layer 42 of the interconnection scheme 931 thereof shown in FIG. 17 at the bottom thereof, the bottom surface thereof shown in FIG. 17 at the top thereof as a top surface thereof and the bottom metal pads or contacts 907*f*, 907*v*, 917*e*, 918*e*, 919*b* and/or 919*d* thereof shown in FIG. 17 at the top thereof as top metal pads or contacts thereof. In particular, FIG. 17 shows the first rerouted vertical-through-via (VTV) connector 468-1 of the fourth type of stacking unit 424 may be formed with any of the first through seventh types of vertical-through-via (VTV) connectors 467 as seen in FIGS. 4A-4I, 5A-5C and 6A-6F. The first rerouted vertical-through-via (VTV) connector 468-1 may be alternatively replaced with one type of the first and second types of pad-enlarged vertical-through-via (VTV) connector 469 illustrated in FIGS. 4J-4P, 5D-5E and 8G-8I, i.e., first pad-enlarged vertical-through-via (VTV) connector (not shown), to be turned upside down with the top metal pads of contacts 927*e* thereof turned to be at the bottom thereof as bottom metal pads or contacts, the top surface thereof turned to be at the bottom thereof as a bottom surface, the bottom surface thereof turned to be at the top thereof as a top surface thereof, and the bottom metal pads or contacts 927*f* thereof turned to be at the top thereof as top metal pads or contacts thereof.

Referring to FIG. 17, for the fourth type of stacking unit 424, the control chip 688 of its memory module 159 may be bonded to its application specific integrated-circuit (ASIC) chip 398 using an oxide-to-oxide and metal-to-metal direct bonding method. The oxide-to-oxide and metal-to-metal direct bonding method may include (1) oxide-to-oxide bonding the insulating bonding layer 52, such as a layer of silicon dioxide, of the control chip 688 of its memory module 159 to the insulating bonding layer 52, such as a layer of silicon dioxide, of its application specific integrated-circuit (ASIC) chip 398, and (2) metal-to-metal bonding, e.g., copper-to-copper bonding, the metal pads 6*a*, such as copper pads, of the control chip 688 of its memory module 159 to the metal pads 6*a*, such as copper pads, of its application specific integrated-circuit (ASIC) chip 398. The control chip 688 of its memory module 159 may have the semiconductor devices 4 such as transistors at the active surface of the semiconductor substrate 2 thereof as illustrated in FIG. 11C, and the active surface of the semiconductor substrate 2 of the control chip 688 of its memory module 159 may face an active surface of the semiconductor substrate 2 of its application specific integrated-circuit (ASIC) logic chip 398, wherein its application specific integrated-circuit (ASIC) logic chip 398 may have the semiconductor devices 4 such as transistors at the active surface of the semiconductor substrate 2 thereof as illustrated in FIG. 3C.

Referring to FIG. 17, the control chip 688 of its memory module 159 may be provided with the insulating bonding layer 52, i.e., the layer of silicon dioxide, bonded to its first rerouted vertical-through-via (VTV) connector 468-1 or first pad-enlarged vertical-through-via (VTV) connector 469 by oxide-to-oxide bonding and the metal pads 6*a*, such as copper pads, bonded to the top metal pads or contacts 907*f*, 907*v*, 917*e*, 918*e*, 919*b* and/or 919*d*, such as copper pads, of its first rerouted vertical-through-via (VTV) connector 468-1 or the top metal pads or contacts 927*f*, such as copper pads, of its first pad-enlarged vertical-through-via (VTV) connector 469 by metal-to-metal bonding, e.g., copper-to-copper bonding. For more elaboration, in the case that each of the supporting substrate(s) 901 and covering substrate 910 of its first rerouted vertical-through-via (VTV) connector 468-1 or first pad-enlarged vertical-through-via (VTV) connector 469 is a glass substrate, which may include silicon dioxide at the top surface thereof to be bonded to the insulating bonding layer 52, i.e., the layer of silicon dioxide, of the control chip 688 of its memory module 159 by oxide-to-oxide bonding. Alternatively, in the case that each of the supporting substrate(s) 901 and covering substrate 910 is a silicon substrate, at the top surface of which a layer of silicon dioxide may be formed by a thermal oxidation process to be bonded to the insulating bonding layer 52, i.e., the layer of silicon dioxide, of the control chip 688 of its memory module 159 by oxide-to-oxide bonding.

Alternatively, referring to FIG. 17, for the fourth type of stacking unit 424, its memory module 159 may be replaced with a known-good memory or application-specific-integrated-circuit (ASIC) chip 397, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip. Its known-good memory or application-specific-integrated-circuit (ASIC) chip 397 in case of replacing its memory module 159 may have the same specification as the third type of semiconductor integrated-circuit (IC) chip 100 as illustrated in FIG. 3C but shown upside down in FIG. 17, and may be bonded to its application specific integrated-circuit (ASIC) chip 398 using an oxide-to-oxide and metal-to-metal direct bonding method. The oxide-to-oxide and metal-to-metal direct bonding method may include (1) oxide-to-oxide bonding the insulating bonding layer 52, such as a layer of silicon dioxide, of its known-good memory or application-specific-integrated-circuit (ASIC) chip 397 to the insulating bonding layer 52, such as a layer of silicon dioxide, of its application specific integrated-circuit (ASIC) chip 398, and (2) metal-to-metal bonding, e.g., copper-to-copper bonding, the metal pads 6*a*, such as copper pads, of its known-good memory or application-specific-integrated-circuit (ASIC) chip 397 to the metal pads 6*a*, such as copper pads, of its application specific integrated-circuit (ASIC) chip 398. For the fourth type of stacking unit 424, its known-good memory or application-specific-integrated-circuit (ASIC) chip 397 in case of replacing its memory module 159 may include analog circuits, mixed-mode signal circuits, radio-frequency (RF) circuits, and/or transmitter, receiver or transceiver circuits therein. Its known-good memory or ASIC chip 397 in case of replacing its memory module 159 may have the semiconductor devices 4 such as transistors at the active surface of the semiconductor substrate 2 thereof as illustrated in FIG. 3C, and the active surface of the semiconductor substrate 2 of its known-good memory or ASIC chip 397 may face an active surface of the semiconductor substrate 2 of its application specific integrated-circuit (ASIC) logic chip 398, wherein its application specific integrated-circuit (ASIC) logic chip 398 may have the semiconductor devices 4 such as transistors at the active surface of the semiconductor substrate 2 thereof as illustrated in FIG. 3C. Its known-good memory or ASIC chip 397 in case of replacing its memory module 159 may be provided with the insulating bonding layer 52, i.e., the layer of silicon dioxide, bonded to its first rerouted vertical-through-via (VTV) connector 468-1 or first pad-enlarged vertical-through-via (VTV) connector 469 by oxide-to-oxide bonding and the metal pads 6*a*, such as copper pads, bonded to the top metal pads or contacts 907*f*, 907*v*, 917*e*, 918*e*, 919*b* and/or 919*d*, such as copper pads, of its first rerouted vertical-through-via (VTV) connector 468-1 or the top metal pads or contacts 927*f*, such as copper pads, of its first pad-enlarged vertical-through-via (VTV) connector 469 by metal-to-metal bonding, e.g., copper-to-copper bonding. For more elaboration, in the case that each of the supporting substrate(s) 901 and covering substrate 910 of its first rerouted vertical-through-via (VTV) connector 468-1 or first pad-enlarged vertical-through-via (VTV) connector 469 is a glass substrate, which may include silicon dioxide at the top surface thereof to be bonded to the insulating bonding layer 52, i.e., the layer of silicon dioxide, of its known-good memory or ASIC chip 397 in case of replacing its memory module 159 by oxide-to-oxide bonding. Alternatively, in the case that each of the supporting substrate(s) 901 and covering substrate 910 is a silicon substrate, at the top surface of which a layer of silicon dioxide may be formed by a thermal oxidation process to be bonded to the insulating bonding layer 52, i.e., the layer of silicon dioxide, of its known-good memory or ASIC chip 397 in case of replacing its memory module 159 by oxide-to-oxide bonding.

Alternatively, for the fourth type of stacking unit 424, its memory module 159 may have the same specification as the first type of memory module 159 illustrated in FIG. 11A, its known-good memory or ASIC chip 397 in case of replacing its memory module 159 may have the same specification as the first type of semiconductor integrated-circuit chip 100 illustrated in FIG. 3A, its first rerouted vertical-through-via (VTV) connector 468-1 may have the same specification as the third type of rerouted vertical-through-via (VTV) connector 468 illustrated in FIGS. 10K-10M and its application specific integrated-circuit (ASIC) chip 398 may have the same specification as the first type of semiconductor integrated-circuit (IC) chip as illustrated in FIG. 3A, wherein each of its application specific integrated-circuit (ASIC) chip 398 and first rerouted vertical-through-via (VTV) connector 468-1 may be provided with the first, second, third or fourth type of micro-bumps or micro-pads 34 each bonded to one of the first, second, third or fourth type of micro-bumps or micro-pads 34 of its memory module 159, or its known-good memory or ASIC chip 397 in case of replacing its memory module 159, to form a bonded metal bump or contact (not shown) therebetween by a step for one of the first through fourth cases as illustrated in FIGS. 11A, 12A and 12B in which the first, second, third or fourth type of micro-bumps or micro-pads 34 of said each of its application specific integrated-circuit (ASIC) chip 398 and first rerouted vertical-through-via (VTV) connector 468-1 may be considered as the first, second, third or fourth type of micro-bumps or micro-pads 34 of the upper one of the memory chips 251 of the memory module 159 illustrated in FIGS. 11A, 12A and 12B, and the first, second, third or fourth type of micro-bumps or micro-pads 34 of its memory module 159, or known-good memory or ASIC chip 397 in case of replacing its memory module 159, may be considered as the first, second, third or fourth type of micro-bumps or micro-pads 570 of the lower one of the memory chips 251 or the control chip 688 of the memory module 159 illustrated in FIGS. 11A, 12A and 12B. In this case, the fourth type of stacking unit 424 may further include an underfill, e.g., polymer layer, between its memory module 159, or known-good memory or ASIC chip 397 in case of replacing its memory module 159, and its application specific integrated-circuit (ASIC) chip 398 and between its first rerouted vertical-through-via (VTV) connector 468-1 and its application specific integrated-circuit (ASIC) chip 398, covering a sidewall of each of its bonded metal bumps or contacts 168 between its memory module 159, or known-good memory or ASIC chip 397 in case of replacing its memory module 159, and its application specific integrated-circuit (ASIC) chip 398 and covering a sidewall of each of its bonded metal bumps or contacts 168 between its first rerouted vertical-through-via (VTV) connector 468-1 and its application specific integrated-circuit (ASIC) chip 398.

Referring to FIG. 17, the fourth type of stacking unit 424 may include a first polymer layer 92-1, e.g., resin or compound, on a bottom surface of its memory module 159 or on a bottom surface of its known-good memory or ASIC chip 397 in case of replacing its memory module 159, wherein its first polymer layer 92-1 may have the same specification as the polymer layer 92 of the first type of stacking unit 421 illustrated in FIGS. 14A-14E. For the fourth type of stacking unit 424, its first polymer layer 92-1 may have a portion between its application specific integrated-circuit (ASIC) logic chip 398 and its first rerouted vertical-through-via (VTV) connector 468-1 or first pad-enlarged vertical-through-via (VTV) connector 469, and its first polymer layer 92-1 may have a bottom surface coplanar with a bottom surface of its application specific integrated-circuit (ASIC) logic chip 398 and a bottom surface of its first rerouted vertical-through-via (VTV) connector 468-1, or the bottom surface of its first pad-enlarged vertical-through-via (VTV) connector 469.

Referring to FIG. 17, the fourth type of stacking unit 424 may include (1) a second rerouted vertical-through-via (VTV) connector 468-2 having the same specification as the first type of rerouted vertical-through-via (VTV) connector 468 as illustrated in FIGS. 10A-10G but shown upside down in FIG. 17 with the rerouted metal pads 932 thereof shown at the bottom thereof, the polymer layer 42 of the interconnection scheme 931 thereof shown at the bottom thereof, the bottom surface thereof shown at the top thereof as a top surface thereof, and the bottom metal pads or contacts 907*f*, 907*v*, 917*e*, 918*e*, 919*b* and/or 919*d* thereof shown at the top thereof as top metal pads or contacts thereof, wherein the second rerouted vertical-through-via (VTV) connector 468-2 may be alternatively replaced with one type of the first and second types of pad-enlarged vertical-through-via (VTV) connector 469 illustrated in FIGS. 4J-4P, 5D-5E and 8G-8I, i.e., second pad-enlarged vertical-through-via (VTV) connector (not shown), shown upside down with the top metal pads of contacts 927*e* thereof turned to be at the bottom thereof as bottom metal pads or contacts, the top surface thereof turned to be at the bottom thereof as a bottom surface, the bottom surface thereof turned to be at the top thereof as a top surface thereof, and the bottom metal pads or contacts 927*f* thereof turned to be at the top thereof as top metal pads or contacts thereof, and (2) a second polymer layer 92-2, e.g., resin or compound, bonded to a sidewall of its first polymer layer 92-1, a sidewall of its second rerouted vertical-through-via (VTV) connector 468-2, or second pad-enlarged vertical-through-via (VTV) connector 469, and a sidewall of the molding compound 695 and control chip of its memory module 159, or a sidewall of its known-good memory or ASIC chip 397 in case of replacing its memory module 159, wherein its second polymer layer 92-2 may have the same specification as the polymer layer 92 of the first type of stacking unit 421 illustrated in FIGS. 14A-14E. For the fourth type of stacking unit 424, its second polymer layer 92-2 may have a portion between its second rerouted vertical-through-via (VTV) connector 468-2, or second pad-enlarged vertical-through-via (VTV) connector 469, and its first polymer layer 92-1 and between its second rerouted vertical-through-via (VTV) connector 468-2, or second pad-enlarged vertical-through-via (VTV) connector 469, and its memory module 159, or its known-good memory or ASIC chip 397 in case of replacing its memory module 159. Its second polymer layer 92-2 may have a bottom surface coplanar with the bottom surface of its first polymer layer 92-1. For more elaboration, if its first rerouted vertical-through-via (VTV) connector 468-1 has the same specification as the first type of rerouted vertical-through-via (VTV) connector 468 as illustrated in FIG. 10A-10G, the bottom surface of each of its first and second polymer layers 92-1 and 92-2 may be coplanar with a bottom surface of the polymer layer 42 of the interconnection scheme 931 of its first rerouted vertical-through-via (VTV) connector 468-1 and a bottom surface of the polymer layer 42 of the interconnection scheme 931 of its second rerouted vertical-through-via (VTV) connector 468-2, or the bottom surface of its second pad-enlarged vertical-through-via (VTV) connector 469; if its first rerouted vertical-through-via (VTV) connector 468-1 has the same specification as the third type of rerouted vertical-through-via (VTV) connector 468 as illustrated in FIGS. 10K-10M, the bottom surface of each of its first and second polymer layers 92-1 and 92-2 may be coplanar with a bottom surface of the insulating dielectric layer 357 of its first rerouted vertical-through-via (VTV) connector 468-1, a bottom surface of the copper layer 32 of each of the micro-bumps or micro-pads 35 of its first rerouted vertical-through-via (VTV) connector 468-1 and a bottom surface of the polymer layer 42 of the interconnection scheme 931 of its second rerouted vertical-through-via (VTV) connector 468-2, or the bottom surface of its second pad-enlarged vertical-through-via (VTV) connector 469. In particular, FIG. 17 shows the second rerouted vertical-through-via (VTV) connector 468-2 of the fourth type of stacking unit 424 may be formed with any of the first through seventh types of vertical-through-via (VTV) connectors 467 as seen in FIGS. 4A-4I, 5A-5C and 6A-6F.

Alternatively, for the fourth type of stacking unit 424, its second rerouted vertical-through-via (VTV) connector 468-2 may have the same specification as the fifth type of rerouted vertical-through-via (VTV) connector 468 as illustrated in FIG. 10O but turned upside down with the micro-bumps or micro-pads 34 thereof turned to be at the bottom thereof (not shown), the insulating dielectric layer 257 thereof turned to be at the bottom thereof (not shown), the bottom surface thereof turned to be at the top thereof as a top surface thereof (not shown), and the bottom metal pads or contacts 907*f*, 907*v*, 917*e*, 918*e*, 919*b* and/or 919*d* thereof turned to be at the top thereof as top metal pads or contacts thereof (not shown). If its first rerouted vertical-through-via (VTV) connector 468-1 has the same specification as the first type of rerouted vertical-through-via (VTV) connector 468 as illustrated in FIG. 10A-10G, the bottom surface of each of its first and second polymer layers 92-1 and 92-2 may be coplanar with a bottom surface of the polymer layer 42 of the interconnection scheme 931 of its first rerouted vertical-through-via (VTV) connector 468-1, a bottom surface of the insulating dielectric layer 257 of its second rerouted vertical-through-via (VTV) connector 468-2 and a bottom surface of the copper layer 32 of each of the micro-bumps or micro-pads 34 of its second rerouted vertical-through-via (VTV) connector 468-2; if its first rerouted vertical-through-via (VTV) connector 468-1 has the same specification as the third type of rerouted vertical-through-via (VTV) connector 468 as illustrated in FIGS. 10K-10M, the bottom surface of each of its first and second polymer layers 92-1 and 92-2 may be coplanar with a bottom surface of the insulating dielectric layer 357 of its first rerouted vertical-through-via (VTV) connector 468-1, a bottom surface of the copper layer 32 of each of the micro-bumps or micro-pads 35 of its first rerouted vertical-through-via (VTV) connector 468-1, a bottom surface of the insulating dielectric layer 257 of its second rerouted vertical-through-via (VTV) connector 468-2 and a bottom surface of the copper layer 32 of each of the micro-bumps or micro-pads 34 of its second rerouted vertical-through-via (VTV) connector 468-2.

Referring to FIG. 17, for the fourth type of stacking unit 424, its memory module 159, or its known-good memory or ASIC chip 397 in case of replacing its memory module 159, may be ground or polished from the backside thereof, i.e., from the top side thereof, such that the insulating lining layer 153, adhesion layer 154 and seed layer 155 of each of the through silicon vias (TSVs) 157 of the topmost one of the memory chips 251 of its memory module 159 at the backside thereof, or the insulating lining layer 153, adhesion layer 154 and seed layer 155 of each of the through silicon vias (TSVs) 157 of its known-good memory or ASIC chip 397 in case of replacing its memory module 159, may be removed. Thus, a backside of the copper layer 156 of each of the through silicon vias (TSVs) 157 of the topmost one of the memory chips 251 of its memory module 159, or a backside of the copper layer 156 of each of the through silicon vias (TSVs) 157 of its known-good memory or ASIC chip 397 in case of replacing its memory module 159, may be coplanar with the top surface of the topmost one of the memory chips 251 of its memory module 159, or the top surface of its known-good memory or ASIC chip 397 in case of replacing its memory module 159, and a top surface of its second polymer layer 92-2. The insulating lining layer 153, adhesion layer 154 and seed layer 155 of each of the through silicon vias (TSVs) 157 of the topmost one of the memory chips 251 of its memory module 159, or the insulating lining layer 153, adhesion layer 154 and seed layer 155 of each of the through silicon vias (TSVs) 157 of its known-good memory or ASIC chip 397 in case of replacing its memory module 159, may be left at a sidewall of the copper layer 156 of each of the through silicon vias (TSVs) 157 of the topmost one of the memory chips 251 of its memory module 159, or a sidewall of the copper layer 156 of each of the through silicon vias (TSVs) 157 of its known-good memory or ASIC chip 397 in case of replacing its memory module 159. The top metal pads or contacts 907*f*, 907*v*, 917*e*, 918*e*, 919*b* and/or 919*d*, i.e., copper pads or contacts, of its second rerouted vertical-through-via (VTV) connector 468-2, or the top metal pads or contacts 927*f*, i.e., copper pads or contacts, of its second pad-enlarged vertical-through-via (VTV) connector 469, may have a top surface coplanar with the top surface of its second rerouted vertical-through-via (VTV) connector 468-2, or second pad-enlarged vertical-through-via (VTV) connector 469, the top surface of its second polymer layer 92-2 and the top surface of the topmost one of the memory chips 251 of its memory module 159, or the top surface of its known-good memory or ASIC chip 397 in case of replacing its memory module 159. For more elaboration, the top surface of each of the top metal pads or contacts 907*f*, 907*v*, 917*e*, 918*e*, 919*b* and/or 919*d* of its second rerouted vertical-through-via (VTV) connector 468-2, or the top surface of each of the top metal pads or contacts 927*f*, i.e., copper pads or contacts, of its second pad-enlarged vertical-through-via (VTV) connector 469, may be coplanar with the backside of the copper layer 156 of each of the through silicon vias (TSVs) 157 of the topmost one of the memory chips 251 of its memory module 159, or the backside of the copper layer 156 of each of the through silicon vias (TSVs) 157 of its known-good memory or ASIC chip 397 in case of replacing its memory module 159.

Referring to FIG. 17, the fourth type of stacking unit 424 may further include a backside interconnection scheme for a device (BISD) 79 on its memory module 159, or its known-good memory or ASIC chip 397 in case of replacing its memory module 159, its second vertical-through-via (VTV) connector 468-2, or second pad-enlarged vertical-through-via (VTV) connector 469, and its second polymer layer 92-2. For the fourth type of stacking unit 424, its backside interconnection scheme for a device (BISD) 79 may include (1) one or more interconnection metal layers 27 coupling to the top metal pads or contacts 907*f*, 907*v*, 917*e*, 918*e*, 919*b* and/or 919*d* of its second rerouted vertical-through-via (VTV) connector 468-2, or the top metal pads or contacts 927*f* of its second pad-enlarged vertical-through-via (VTV) connector 469, and the through silicon vias (TSVs) 157 of the memory chips 251 and control chip 688 of its memory module 159, or the through silicon vias (TSVs) 157 of its known-good memory or ASIC chip 397 in case of replacing its memory module 159, and (2) one or more polymer layers 42, i.e., insulating dielectric layers, each between neighboring two of the interconnection metal layers 27 of its backside interconnection scheme for a device (BISD) 79, between a bottommost one of the interconnection metal layers 27 of its backside interconnection scheme for a device (BISD) 79 and a planar surface composed of the top surface of the semiconductor substrate 2 of the topmost one of the memory chips 251 of its memory module 159, or the top surface of the semiconductor substrate 2 of its known-good memory or ASIC chip 397 in case of replacing its memory module 159, the top surface of its second rerouted vertical-through-via (VTV) connector 468-2, or second pad-enlarged vertical-through-via (VTV) connector 469, and the top surface of its second polymer layer 92-2, or on and above a topmost one of the interconnection metal layers 27 of its backside interconnection scheme for a device (BISD) 79, wherein the topmost one of the interconnection metal layers 27 of its backside interconnection scheme for a device (BISD) 79 may have multiple metal pads at bottoms of multiple openings in the topmost one of the polymer layers 42 of its backside interconnection scheme for a device (BISD) 79. Each of the interconnection metal layers 27 of its backside interconnection scheme for a device (BISD) 79 may have the same specification as that of the second interconnection scheme 588 of the first type of semiconductor integrated-circuit (IC) chip 100 as illustrated in FIG. 3A, and each of the polymer layers 42 of its backside interconnection scheme for a device (BISD) 79 may have the same specification as that of the second interconnection scheme 588 of the first type of semiconductor integrated-circuit (IC) chip 100 as illustrated in FIG. 3A. Each of the interconnection metal layers 27 of its backside interconnection scheme for a device (BISD) 79 may extend horizontally across an edge of its memory module 159, or its known-good memory or ASIC chip 397 in case of replacing its memory module 159, and an edge of its second rerouted vertical-through-via (VTV) connector 468-2 or second pad-enlarged vertical-through-via (VTV) connector 469.

Referring to FIG. 17, the fourth type of stacking unit 424 may include multiple metal bumps or pads 580, i.e., metal contacts, in an array which may be of one of the first through fourth types having the same specification as the first through fourth types of micro-bumps or micro-pillars 34 as illustrated in FIG. 3A respectively, each having the adhesion layer 26*a* formed on one of the metal pads of the topmost one of the interconnection metal layers 27 of its backside interconnection scheme for a device (BISD) 79 at the bottoms of the openings in the topmost one of the polymer layers 42 of its backside interconnection scheme for a device (BISD) 79. For the fourth type of stacking unit 424, the total thickness of its first rerouted vertical-through-via (VTV) connector 468-1 or first pad-enlarged vertical-through-via (VTV) connector 469 may be less than that of its second rerouted vertical-through-via (VTV) connector 468-2 or second pad-enlarged vertical-through-via (VTV) connector 469. Further, the total thickness of its second rerouted vertical-through-via (VTV) connector 468-2 or second pad-enlarged vertical-through-via (VTV) connector 469 may be greater than the total thickness of its memory module 159, or the total thickness of its known-good memory or ASIC chip 397 in case of replacing its memory module 159, in the z direction and the total thickness of its application specific integrated-circuit (ASIC) chip 398.

Referring to FIG. 17, for the fourth type of stacking unit 429, each of the memory chips 251 and control chip 688 of its memory module 159, or its known-good memory or ASIC chip 397 in case of replacing its memory module 159, may have multiple small I/O circuits each coupling to one of multiple small I/O circuits of its application specific integrated-circuit (ASIC) chip 398 through, in sequence, one of the bonded metal pads 6*a* of its memory module 159, or its known-good memory or ASIC chip 397 in case of replacing its memory module 159, and one of the bonded metal pads 6*a* of its application specific integrated-circuit (ASIC) chip 398, or, alternatively, through one of its bonded metal bump or contact (not shown) between its memory module 159, or its known-good memory or ASIC chip 397 in case of replacing its memory module 159, and its application specific integrated-circuit (ASIC) chip 398, for data transmission therebetween with a data bit width of equal to or greater than 64, 128, 256, 512, 1024, 2048, 4096, 8K, or 16K, wherein each of the small PO circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 398 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small PO circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 398 may have an I/O power efficiency smaller than 0.5 pico-Joules per bit, per switch or per voltage swing, or between 0.01 and 0.5 pico-Joules per bit, per switch or per voltage swing. Further, its application specific integrated-circuit (ASIC) chip 398 may include multiple programmable logic cells (LC) 2014 therein each as seen in FIG. 1 and multiple programmable switches 379 therein each as seen in FIG. 2, employed for a hardware accelerator or machine-learning operator. Further, its memory module 159, or known-good memory or logic chip or known-good ASIC chip, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key and a cryptography block or circuit configured (1) to encrypt, in accordance with the password or key, configuration data transmitted from or stored in the memory cells 490 for the look-up tables (LUT) 210 of the programmable logic cells (LC) 2014 of its application specific integrated-circuit (ASIC) logic chip 398 or the memory cells 362 of the programmable switch cells 379 of its application specific integrated-circuit (ASIC) logic chip 398 as encrypted configuration data to be passed to its metal bumps or pads 580 and (2) to decrypt, in accordance with the password or key, encrypted configuration data from its metal bumps or pads 580 as decrypted configuration data to be passed to and stored in the memory cells 490 for the look-up tables (LUT) 210 of the programmable logic cells (LC) 2014 of its application specific integrated-circuit (ASIC) logic chip 398 or the memory cells 362 of the programmable switch cells 379 of its application specific integrated-circuit (ASIC) logic chip 398. Further, its memory module 159, or known-good memory or logic chip or known-good ASIC chip, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of its application specific integrated-circuit (ASIC) logic chip 398 to be stored therein for programming or configuring the programmable logic cells (LC) 2014 of its application specific integrated-circuit (ASIC) logic chip 398 or to the memory cells 362 of the programmable switch cells 379 of its application specific integrated-circuit (ASIC) logic chip 398 to be stored therein for programming or configuring the programmable switch cells 379 of its application specific integrated-circuit (ASIC) logic chip 398. Further, its memory module 159, or known-good memory or logic chip or known-good ASIC chip, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 398.

Referring to FIG. 17, for the fourth type of stacking unit 424, each of the memory chips 251 and control chip 688 of its memory module 159, or its known-good memory or ASIC chip 397 in case of replacing its memory module 159, may have multiple large input/output (I/O) circuits each coupling to one of its metal bumps or pads 580 for signal transmission or power or ground delivery through one of the through silicon vias (TSVs) 157 of one or more of the memory chips 251 of its memory module 159, or its known-good memory or ASIC chip 397 in case of replacing its memory module 159, and each of the interconnection metal layers 27 of its backside interconnection scheme for a device (BISD) 79, wherein each of the large input/output (I/O) circuits of each of the memory chips 251 and control chip 688 of its memory module 159, or its known-good memory or ASIC chip 397 in case of replacing its memory module 159, may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of each of the memory chips 251 and control chip 688 of its memory module 159, or its known-good memory or ASIC chip 397 in case of replacing its memory module 159, may have an I/O power efficiency greater than 3, 5 or 10 pico-Joules per bit, per switch or per voltage swing. Further, its application specific integrated-circuit (ASIC) logic chip 398 may have multiple large input/output (I/O) circuits each coupling to one of its metal bumps or pads 580 for signal transmission or power or ground delivery through, in sequence, one of the dedicated vertical bypasses 698 of its memory module 159 as illustrated in FIGS. 11A and 11C, or one of the through silicon vias (TSVs) 157 of its known-good memory or ASIC chip 397 in case of replacing its memory module 159, and each of the interconnection metal layers 27 of its backside interconnection scheme for a device (BISD) 79, wherein said one of the dedicated vertical bypasses 698 is not connected to any transistor of each of the memory chips 251 and control chip 688 of its memory module 159, or said one of the through silicon vias (TSVs) 157 is not connected to any transistor of its known-good memory or ASIC chip 397 in case of replacing its memory module 159, wherein each of the large input/output (I/O) circuits of its application specific integrated-circuit (ASIC) logic chip 398 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its application specific integrated-circuit (ASIC) logic chip 398 may have an I/O power efficiency greater than 3, 5 or 10 pico-Joules per bit, per switch or per voltage swing. One of the vertical interconnects 699 of its memory module 159 as illustrated in FIGS. 11A and 11C, or one of the through silicon vias (TSVs) 157 of its known-good memory or ASIC chip 397 in case of replacing its memory module 159, may couple to one of its metal bumps or pads 580 through each of the interconnection metal layers 27 of its backside interconnection scheme for a device (BISD) 79 and to its application specific integrated-circuit (ASIC) chip 398 through one of the metal pads 6*a* of the control chip 688 of its memory module 159 as seen in FIG. 11C, or one of the metal pads 6*a* of its known-good memory or ASIC chip 397 in case of replacing its memory module 159, or, alternatively, through one of its bonded metal bump or contact (not shown) between its memory module 159, or its known-good memory or ASIC chip 397 in case of replacing its memory module 159, and its application specific integrated-circuit (ASIC) chip 398.

Referring to FIG. 17, for the fourth type of stacking unit 424, each of the memory chips 251 and control chip 688 of its memory module 159, or its known-good memory or ASIC chip 397 in case of replacing its memory module 159, may be implemented using a semiconductor node or generation less advanced than or equal to, or above or equal to 20 nm, 30 nm, 40 nm, 50 nm, 90 nm, 130 nm, 250 nm, 350 nm or 500 nm; while its application specific integrated-circuit (ASIC) logic chip 398 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory chips 251 and control chip 688 of its memory module 159, or its known-good memory or ASIC chip 397 in case of replacing its memory module 159, may be 1, 2, 3, 4, 5 or greater than 5 nodes or generations older, more matured or less advanced than that used in its application specific integrated-circuit (ASIC) logic chip 398. Transistors used in each of the memory chips 251 and control chip 688 of its memory module 159, or its known-good memory or ASIC chip 397 in case of replacing its memory module 159, may be provided with fully depleted silicon-on-insulator (FDSOI) metal-oxide-semiconductor field effect transistors (MOSFETs), partially depleted silicon-on-insulator (PD-SOI) MOSFETs or a planar MOSFETs. Transistors used in each of the memory chips 251 and control chip 688 of its memory module 159, or its known-good memory or ASIC chip 397 in case of replacing its memory module 159, may be different from that used in its application specific integrated-circuit (ASIC) logic chip 398; each of the memory chips 251 and control chip 688 of its memory module 159, or its known-good memory or ASIC chip 397 in case of replacing its memory module 159, may use planar MOSFETs, while its application specific integrated-circuit (ASIC) logic chip 398 may use fin field effect transistors (FINFETs) or gate-all-around field effect transistors (GAAFETs). A power supply voltage (Vcc) applied in each of the memory chips 251 and control chip 688 of its memory module 159, or its known-good memory or ASIC chip 397 in case of replacing its memory module 159, may be greater than or equal to 1.5, 2.0, 2.5, 3, 3.3, 4, or 5 voltages, while a power supply voltage (Vcc) applied in its application specific integrated-circuit (ASIC) logic chip 398 may be smaller than or equal to 1.8, 1.5 or 1 voltage. The power supply voltage applied in each of the memory chips 251 and control chip 688 of its memory module 159, or its known-good memory or ASIC chip 397 in case of replacing its memory module 159, may be higher than that applied in its application specific integrated-circuit (ASIC) logic chip 398. A gate oxide of a field effect transistor (FET) of each of the memory chips 251 and control chip 688 of its memory module 159, or its known-good memory or ASIC chip 397 in case of replacing its memory module 159, may have a physical thickness greater than or equal to 5 run, 6 nm, 7.5 nm, 10 nm, 12.5 nm, or 15 nm, while a gate oxide of a field effect transistor (FET) of its application specific integrated-circuit (ASIC) logic chip 398 may have a physical thickness less than 4.5 nm, 4 nm, 3 nm or 2 nm. The thickness of the gate oxide of the field effect transistor (FET) of each of the memory chips 251 and control chip 688 of its memory module 159, or its known-good memory or ASIC chip 397 in case of replacing its memory module 159, may be greater than that of its application specific integrated-circuit (ASIC) logic chip 398.

For more elaboration, referring to FIG. 17, for the fourth type of stacking unit 424, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when its application specific integrated-circuit (ASIC) logic chip 398 is redesigned using a new technology node or for new application. Alternatively, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when its application specific integrated-circuit (ASIC) logic chip 398 is redesigned using a new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip, radio-frequency (RF) integrated-circuit (IC) chip, for example. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 398 manufactured using a new technology node. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 398 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. Alternatively, a technology process for forming its known-good memory or ASIC chip 397 in case of replacing its memory module 159 may not be compatible to that for forming its application specific integrated-circuit (ASIC) logic chip 398, wherein its known-good memory or ASIC chip 397 in case of replacing its memory module 159 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

Specification for Chip Package

1. Structure for First Type of Chip Package

Figure 18:
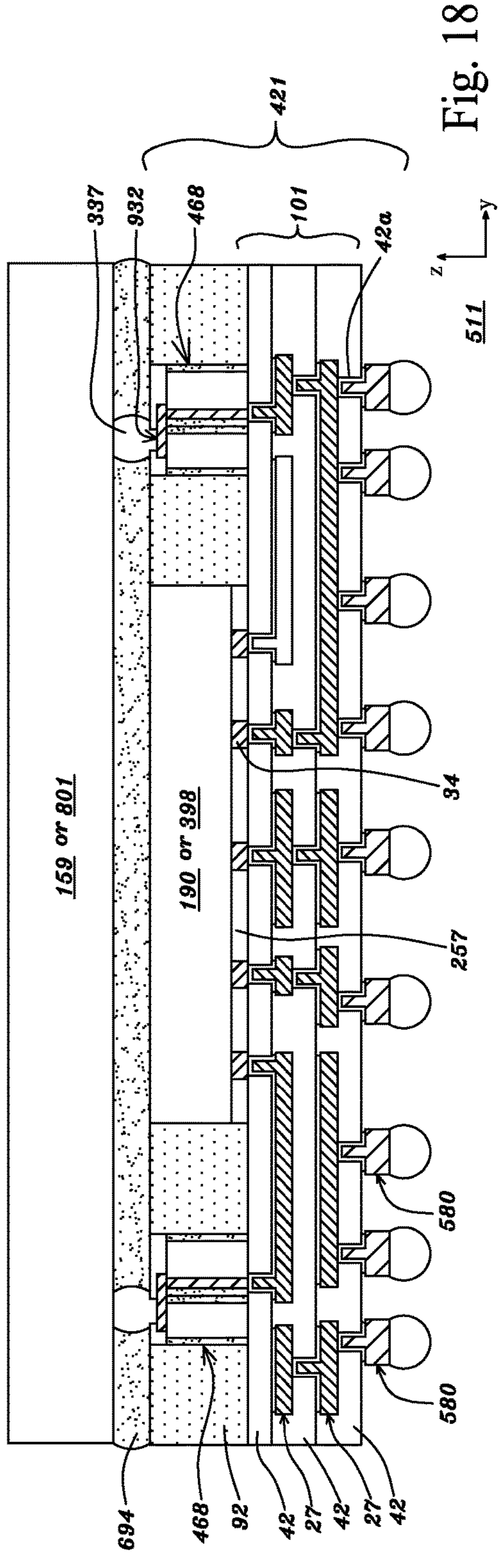
FIGS. 18-22 are schematically perspective views showing first through fifth types of chip packages in accordance with an embodiment of the present application.

FIG. 18 is a schematically perspective view showing a first type of chip package in accordance with an embodiment of the present application. Referring to FIG. 18, a first type of chip package 511 may include (1) the first type of stacking unit 421 as illustrated in FIGS. 14A-14E, with the metal bumps or pads 580 thereof turned to be at the bottom thereof and the rerouted metal pads 932 of each of the rerouted vertical-through-via (VTV) connectors 468 thereof turned to be at the top thereof, or the bottom metal pads or contacts 927*e* of each of the pad-enlarged vertical-through-via (VTV) connectors 469 thereof turned to be at the top thereof as top metal pads or contacts 927*e* of said each of the pad-enlarged vertical-through-via (VTV) connectors 469 thereof, and (2) the fourth type of memory module 159 as illustrated in FIG.

11D over its first type of stacking unit 421, wherein its fourth type of memory module 159 may be replaced with (i) the first or second type of optical input/output (PO) module 801 as illustrated in FIG. 11E or in FIGS. 11F and 11G or (ii) an analog module, i.e., analog chip package, having the same specification as the first type of optical input/output (I/O) module 801 as illustrated in FIG. 11E, but wherein the difference between its analog module and first type of optical input/output (PO) module 801 is that its analog module may include an analog integrated-circuit (IC) chip to replace the optical input/output (PO) chip 802 of its first type of optical input/output (I/O) module 801, wherein the analog integrated-circuit (IC) chip of its analog module may have analog circuits, mixed-mode signal circuits, radio-frequency (RF) circuits, and/or transmitter, receiver or transceiver circuits therein, wherein its fourth type of memory module 159, or its first or second type of optical input/output (I/O) module 801 or analog module in case of replacing its fourth type of memory module 159, may have the solder balls 337 each bonded to the top surface of one of the rerouted metal pads 932 of one of the rerouted vertical-through-via (VTV) connectors 468 of its first type of stacking unit 421, or the top surface of one of the top metal pads or contacts 927*e* of one of the pad-enlarged vertical-through-via (VTV) connectors 469 of its first type of stacking unit 421, wherein an underfill 694, e.g., polymer layer, may be provided between its first type of stacking unit 421 and its fourth type of memory module 159, or between its first type of stacking unit 421 and its first or second type of optical input/output (I/O) module 801 or analog module in case of replacing its fourth type of memory module 159, covering a sidewall of each of the solder balls 337 of its fourth type of memory module 159, or a sidewall of each of the solder balls 337 of its first or second type of optical input/output (I/O) module 801 or analog module in case of replacing its fourth type of memory module 159.

2. Structure for Second Type of Chip Package

Figure 19:
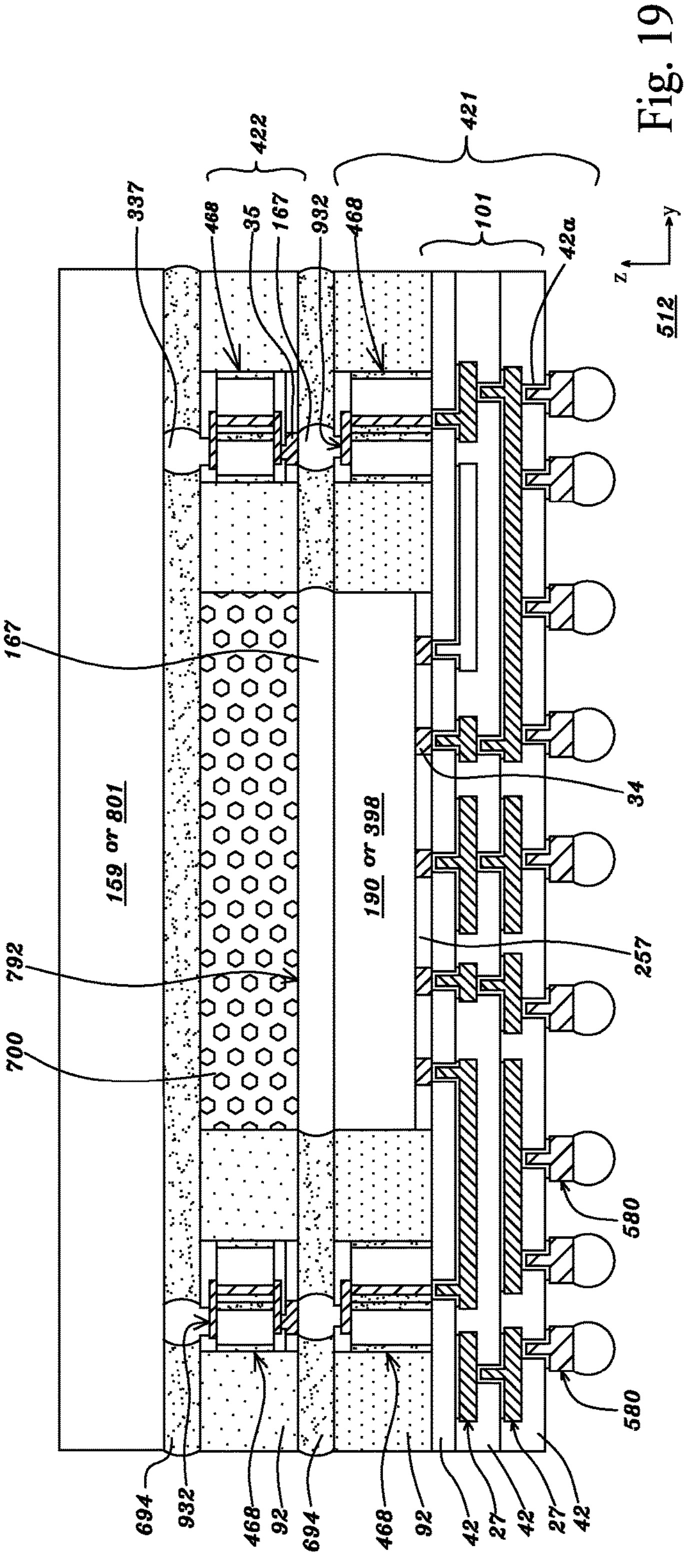

FIG. 19 is a schematically perspective view showing a second type of chip package in accordance with an embodiment of the present application. Referring to FIG. 19, a second type of chip package 512 may include (1) the first type of stacking unit 421 as illustrated in FIGS. 14A-14E, with the metal bumps or pads 580 thereof turned to be at the bottom thereof and the rerouted metal pads 932 of each of the rerouted vertical-through-via (VTV) connectors 468 thereof turned to be at the top thereof, or the bottom metal pads or contacts 927*e* of each of the pad-enlarged vertical-through-via (VTV) connectors 469 thereof turned to be at the top thereof as top metal pads or contacts 927*e* of said each of the pad-enlarged vertical-through-via (VTV) connectors 469 thereof, (2) the second type of stacking unit 422 as illustrated in FIGS. 15A-15D to be turned upside down and over its first type of stacking unit 421, with the micro-bumps or micro-pads 35 of each of the rerouted vertical-through-via (VTV) connector 468 thereof turned to be at the bottom thereof and the rerouted metal pads 932 of each of the rerouted vertical-through-via (VTV) connectors 468 thereof turned to be at the top thereof or with the top metal pads or contacts 927*f* of each of the pad-enlarged vertical-through-via (VTV) connector 469 thereof turned to be at the bottom thereof as bottom metal pads or contacts and the bottom metal pads or contacts 927*e* of each of the pad-enlarged vertical-through-via (VTV) connector 469 thereof turned to be at the top thereof as top metal pads or contacts, wherein a tin-containing bump 167 may be provided with a bottom end joining each of the rerouted metal pads 932 of each of the rerouted vertical-through-via (VTV) connectors 468 of its first type of stacking unit 421, or each of the top metal pads or contacts 927*e* of each of the pad-enlarged vertical-through-via (VTV) connectors 469 of its first type of stacking unit 421, and a top end joining each of the micro-bumps or micro-pads 35 of each of the rerouted vertical-through-via (VTV) connectors 468 of its second type of stacking unit 422, or each of the bottom metal pads or contacts 927*f* of each of the pad-enlarged vertical-through-via (VTV) connectors 469 of its second type of stacking unit 422, and a tin-containing bump 167 may be provided with a bottom end joining the semiconductor substrate 2 of the application specific integrated-circuit (ASIC) chip 398 of its first type of stacking unit 421, or the semiconductor substrate 2 of the application specific integrated-circuit (ASIC) chip 399 of the sub-system module 190 of its first type of stacking unit 421 in case of replacing the application specific integrated-circuit (ASIC) chip 398 of its first type of stacking unit 421, and a top end joining the micro heat pipe 700 of its second type of stacking unit 422, wherein an underfill 694, e.g., polymer layer, may be provided between its first and second types of stacking units 421 and 422, covering a sidewall of each of its tin-containing bumps 167 between its first and second types of stacking units 421 and 422, and (3) the fourth type of memory module 159 as illustrated in FIG. 11D over its second type of stacking unit 422, wherein its fourth type of memory module 159 may be replaced with (i) the first or second type of optical input/output (I/O) module 801 as illustrated in FIG. 11E or in FIGS. 11F and 11G or (ii) an analog module, i.e., analog chip package, having the same specification as the first type of optical input/output (I/O) module 801 as illustrated in FIG. 11E, but wherein the difference between its analog module and first type of optical input/output (I/O) module 801 is that its analog module may include an analog integrated-circuit (IC) chip to replace the optical input/output (I/O) chip 802 of its first type of optical input/output (I/O) module 801, wherein the analog integrated-circuit (IC) chip of its analog module may have analog circuits, mixed-mode signal circuits, radio-frequency (RF) circuits, and/or transmitter, receiver or transceiver circuits therein, wherein its fourth type of memory module 159, or its first or second type of optical input/output (I/O) module 801 or analog module in case of replacing its fourth type of memory module 159, may have the solder balls 337 each bonded to the top surface of one of the rerouted metal pads 932 of one of the rerouted vertical-through-via (VTV) connectors 468 of its second type of stacking unit 422, or the top surface of one of the top metal pads or contacts 927*e* of one of the pad-enlarged vertical-through-via (VTV) connectors 469 of its second type of stacking unit 422, wherein an underfill 694, e.g., polymer layer, may be provided between its second type of stacking unit 422 and its fourth type of memory module 159, or between its second type of stacking unit 422 and its first or second type of optical input/output (I/O) module 801 or analog module in case of replacing its fourth type of memory module 159, covering a sidewall of each of the solder balls 337 of its fourth type of memory module 159, or a sidewall of each of the solder balls 337 of its first or second type of optical input/output (I/O) module 801 or analog module in case of replacing its fourth type of memory module 159.

3. Structure for Third Type of Chip Package

Figure 20:
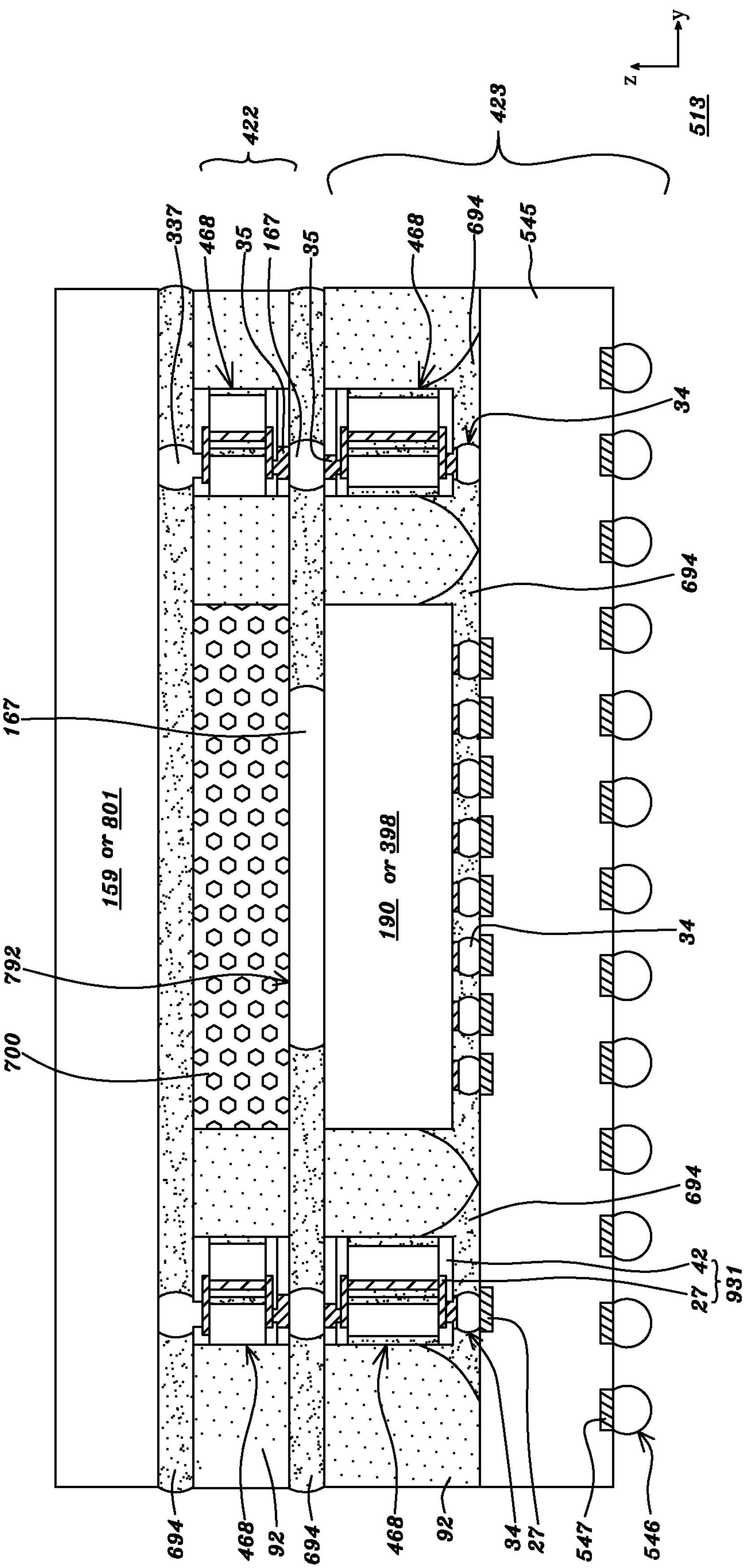

FIG. 20 is a schematically perspective view showing a third type of chip package in accordance with an embodiment of the present application. Referring to FIG. 20, a third type of chip package 513 is similar to the second type of chip package 512 as illustrated in FIG. 19, but the difference between the second and third types of chip packages 512 and 513 is that the first type of stacking unit 421 of the second type of chip package 512 is replaced with the third type of stacking unit 423 as illustrated in FIG. 16 for the third type of chip package 513. For an element indicated by the same reference number shown in FIGS. 19 and 20, the specification of the element as seen in FIG. 20 may be referred to that of the element as illustrated in FIG. 19. For the third type of chip package 513, its second type of stacking unit 422 may be arranged over its third type of stacking unit 423, wherein a tin-containing bump 167 may be provided with a bottom end joining each of the micro-bumps or micro-pads 35 of each of the rerouted vertical-through-via (VTV) connectors 468 of its third type of stacking unit 423 and a top end joining each of the micro-bumps or micro-pads 35 of each of the rerouted vertical-through-via (VTV) connectors 468 of its second type of stacking unit 422, or each of the bottom metal pads or contacts **927*f* of each of the pad-enlarged vertical-through-via (VTV) connectors 469 of its second type of stacking unit 422, and a tin-containing bump 167 may be provided with a bottom end joining the semiconductor substrate 2 of the application specific integrated-circuit (ASIC) chip 399-1 of the sub-system module 190 of its third type of stacking unit 423 for the first alternative as seen in FIG. 16E, the semiconductor substrate 2 of each of the application specific integrated-circuit (ASIC) chips 399-1 and 399-2, or known-good memory or application-specific-integrated-circuit (ASIC) chip 397-2 in case of replacing the application specific integrated-circuit (ASIC) chip 399-2, of the sub-system module 190 of its third type of stacking unit 423 for the second alternative as seen in FIG. 16F, the semiconductor substrate 2 of each of the application specific integrated-circuit (ASIC) chips 399-1 and known-good memory or application-specific-integrated-circuit (ASIC) chip 397, or application specific integrated-circuit (ASIC) chip 399-3 in case of replacing the known-good memory or application-specific-integrated-circuit (ASIC) chip 397, of the sub-system module 190 of its third type of stacking unit 423 for the third alternative as seen in FIG. 16G, or the semiconductor substrate 2 of the semiconductor integrated-circuit chip 398 of its third type of stacking unit 423 in case of replacing the sub-system module 190 of its third type of stacking unit 423 and a top end joining the micro heat pipe 700 of its second type of stacking unit 422, wherein an underfill 694, e.g., polymer layer, may be provided between its second and third types of stacking units 422 and 423, covering a sidewall of each of its tin-containing bumps 167 between its second and third types of stacking units 422 and 423**.

4. Structure for Fourth Type of Chip Package

Figure 21:
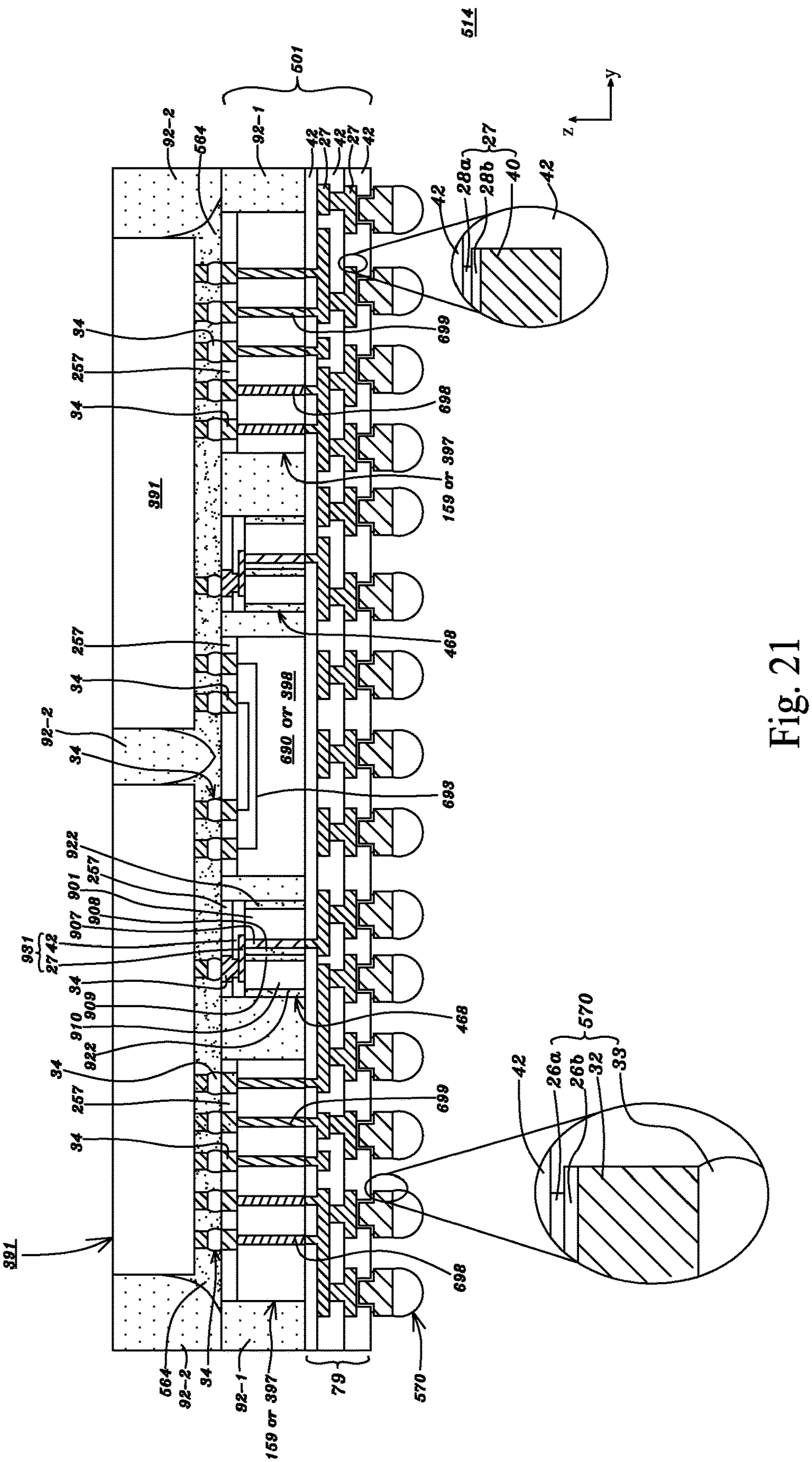

FIG. 21 is a schematically perspective view showing a fourth type of chip package in accordance with an embodiment of the present application. Referring to FIG. 21, a fourth type of chip package 514 may include (1) a circuit substrate 501, and (2) one or more functional units 391 over its circuit substrate 501, wherein each of its functional units 391 may be any of (1) a semiconductor integrated-circuit (IC) chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and 110 chip, intellectual-property (IP) chip, interface chip, networking chip, universal-serial-bus (USB) chip, Serdes chip, analog integrated-circuit (IC) chip or power-management integrated-circuit (IC) chip, having the same specification as the first type of semiconductor integrated-circuit (IC) chip 100 as illustrated in FIG. 3A but shown upside down in FIG. 21 with the micro-bumps or micro-pads 34 thereof shown at the bottom thereof bonded to the circuit substrate 501, (2) a sub-system module having the same specification as the first type of sub-system module 190 as illustrated in FIGS. 13A and 13B but shown upside down in FIG. 21 with the micro-bumps or micro-pads 34 thereof shown at the bottom thereof bonded to the circuit substrate 501, and (3) a memory module having the same specification as the first type of memory module 159 illustrated in FIG. 11A with the micro-bumps or micro-pads 34 thereof shown at the bottom thereof bonded to the circuit substrate 501.

Referring to FIG. 21, the circuit substrate 501 may include (1) one or more fine-line interconnection bridges (FIBs) 690 each having the same specification as the first or second type of fine-line interconnection bridge (FIBs) 690 as illustrated in FIG. 3D or 3E respectively, (2) multiple rerouted vertical-through-via (VTV) connectors 468 each having the same specification as the fifth type of rerouted vertical-through-via (VTV) connectors 468 as illustrated in FIG. 10O, wherein each of the rerouted vertical-through-via (VTV) connectors 468 may be alternatively replaced with one type of the first and second types of pad-enlarged vertical-through-via (VTV) connector 469 illustrated in FIGS. 4J-4P, 5D-5E and 8G-8I, and (3) multiple memory modules 159 each having the same specification as the second type of memory modules 159 as illustrated in FIG. 11B but shown upside down in FIG. 21. In particular, FIG. 21 shows each of the rerouted vertical-through-via (VTV) connectors 468 of the fourth type of chip package 514 may be formed with any of the first through seventh types of vertical-through-via (VTV) connectors 467 as seen in FIGS. 4A-4I, 5A-5C and 6A-6F. Alternatively, each of its memory modules 159 may be replaced with a known-good memory or application-specific-integrated-circuit (ASIC) chip 397, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated 110 chip, dedicated control and I/O chip, intellectual-property (IP) chip, interface chip, networking chip, universal-serial-bus (USB) chip, Serdes chip, power-management integrated-circuit (IC) chip or analog integrated-circuit (IC) chip. For the fourth type of chip package 514, each of its known-good memory or application-specific-integrated-circuit (ASIC) chips 397 in case of replacing its memory modules 159 may have the same specification as the second type of semiconductor integrated-circuit (IC) chip 100 illustrated in FIG. 3B. Alternatively, each of the fine-line interconnection bridges (FIBs) 690 of the circuit substrate 501 may be replaced with an application specific integrated-circuit (ASIC) chip 398 having the same specification as the second type of semiconductor integrated-circuit (IC) chip 100 illustrated in FIG. 3B, wherein the application specific integrated-circuit (ASIC) chip 398 of the circuit substrate 501 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip, radio-frequency (RF) integrated-circuit (IC) chip.

Referring to FIG. 21, the circuit substrate 501 may further include a polymer layer 92-1 around sidewalls of each of its fine-line interconnection bridges (FIBs) 690, or sidewalls of each of its application specific integrated-circuit (ASIC) chips 398 in case of replacing its fine-line interconnection bridges (FIBs) 690, sidewalls of each of its rerouted vertical-through-via (VTV) connectors 468, or pad-enlarged vertical-through-via (VTV) connector 469, and sidewalls of each of its memory modules 159, or sidewalls of each of its known-good memory or application-specific-integrated-circuit (ASIC) chips 397 in case of replacing its memory modules 159. For the circuit substrate 501, its polymer layer 92-1 may have a top surface coplanar with the top surface of the copper layer 32 of each of the micro-bumps or micro-pads 34 of each of its fine-line interconnection bridges (FIBs) 690, or the top surface of the copper layer 32 of each of the micro-bumps or micro-pads 34 of each of its application specific integrated-circuit (ASIC) chip 398 in case of replacing its fine-line interconnection bridges (FIBs) 690, the top surface of the copper layer 32 of each of the micro bumps or micro-pads 34 of each of its rerouted vertical-through-via (VTV) connectors 468, or the top surface of each of the top metal pads of contacts 927*e* of each of its pad-enlarged vertical-through-via (VTV) connectors 469, and the top surface of the copper layer 32 of each of the micro-bumps or micro-pads 34 of each of its memory modules 159, or the top surface of the copper layer 32 of each of the micro-bumps or micro-pads 34 of each of its known-good memory or application-specific-integrated-circuit (ASIC) chips 397 in case of replacing its memory modules 159, and the top surface of the insulating dielectric layer 257 of each of its fine-line interconnection bridges (FIBs) 690, or the top surface of the insulating dielectric layer 257 of each of its application specific integrated-circuit (ASIC) chips 398 in case of replacing its fine-line interconnection bridges (FIBs) 690, the top surface of the insulating dielectric layer 257 of each of its rerouted vertical-through-via (VTV) connectors 468, or the top surface of each of its pad-enlarged vertical-through-via (VTV) connectors 469, and the top surface of the insulating dielectric layer 257 of each of its memory modules 159, or known-good memory or application-specific-integrated-circuit (ASIC) chips 397 in case of replacing its memory modules 159. Its polymer layer 92-1 may have a bottom surface coplanar with a bottom surface of the semiconductor substrate 2 of each of its fine-line interconnection bridges (FIBs) 690, or a bottom surface of the semiconductor substrate 2 of each of its application specific integrated-circuit (ASIC) chips 398 in case of replacing its fine-line interconnection bridges (FIBs) 690, the bottom surface of each of its rerouted vertical-through-via (VTV) connectors 468 or pad-enlarged vertical-through-via (VTV) connectors 469 and the bottom surface of the bottommost one of the memory chips 251 of each of its memory modules 159, or a bottom surface of the semiconductor substrate 2 of each of its known-good memory or application-specific-integrated-circuit (ASIC) chips 397 in case of replacing its memory modules 159. In particular, the bottom surface of its polymer layer 92-1 may be coplanar with the bottom surface of each of the bottom metal pads or contacts 907*f*, 907*v*, 917*e*, 918*e*, 919*b* and/or 919*d* of each of its rerouted vertical-through-via (VTV) connectors 468, or the bottom surface of each of the bottom metal pads of contacts 927*f* of each of its pad-enlarged vertical-through-via (VTV) connectors 469, and a backside of the copper layer 156 of each of the through silicon vias 157 of the bottommost one of the memory chips 251 of each of its memory modules 159, or a backside of the copper layer 156 of each of the through silicon vias 157 of each of its known-good memory or application-specific-integrated-circuit (ASIC) chips 397 in case of replacing its memory modules 159.

Referring to FIG. 21, the circuit substrate 501 may further include a backside interconnection scheme for a device (BISD) 79 on and under its planar bottom surface composed of the bottom surface of its polymer layer 92-1, the bottom surface of the semiconductor substrate 2 of each of its fine-line interconnection bridges (FIBs) 690, or the bottom surface of the semiconductor substrate 2 of each of its application specific integrated-circuit (ASIC) chips 398 in case of replacing its fine-line interconnection bridges (FIBs) 690, the bottom surface of each of its rerouted vertical-through-via (VTV) connectors 468 or pad-enlarged vertical-through-via (VTV) connectors 469, and the bottom surface of the bottommost one of the memory chips 251 of each of its memory modules 159, or the bottom surface of the semiconductor substrate 2 of each of its known-good memory or application-specific-integrated-circuit (ASIC) chips 397 in case of replacing its memory modules 159. The backside interconnection scheme for a device (BISD) 79 of the circuit substrate 501 may include (1) one or more interconnection metal layers 27 coupling to each of the bottom metal pads or contacts 907*f*, 907*v*, 917*e*, 918*e*, 919*b* and/or 919*d* of each of the rerouted vertical-through-via (VTV) connectors 468 of the circuit substrate 501, or each of the bottom metal pads or contacts 927*f* of each of the pad-enlarged vertical-through-via (VTV) connectors 469 of the circuit substrate 501, and the backside of the copper layer 156 of each of the through silicon vias 157 of the bottommost one of the memory chips 251 of each of the memory modules 159 of the circuit substrate 501, or the backside of the copper layer 156 of each of the through silicon vias 157 of each of the known-good memory or application-specific-integrated-circuit (ASIC) chips 397 of the circuit substrate 501 in case of replacing the memory modules 159 of the circuit substrate 501, and (2) one or more polymer layers 42, i.e., insulating dielectric layers, each between neighboring two of its interconnection metal layers 27, between its planar bottom surface and the topmost one of its interconnection metal layers 27 or under the bottommost one of its interconnection metal layers 27, wherein a lower one of its interconnection metal layers 27 may couple to an upper one of its interconnection metal layers 27 through an opening in one of its polymer layers 42 between the lower and upper ones of its interconnection metal layers 27, wherein each opening in the topmost one of its polymer layers 42 may be vertically under one of the bottom metal pads or contacts 907*f*, 907*v*, 917*e*, 918*e*, 919*b* and/or 919*d* of one of the rerouted vertical-through-via (VTV) connectors 468 of the circuit substrate 501, or one of the bottom metal pads or contacts 927*f* of one of the pad-enlarged vertical-through-via (VTV) connectors 469 of the circuit substrate 501, or one of the through silicon vias 157 of the bottommost one of the memory chips 251 of one of the memory modules 159 of the circuit substrate 501, or one of the through silicon vias 157 of one of the known-good memory or application-specific-integrated-circuit (ASIC) chips 397 of the circuit substrate 501 in case of replacing the memory modules 159 of the circuit substrate 501, wherein the bottommost one of its interconnection metal layers 27 may be patterned with multiple metal pads at tops of multiple openings in the bottommost one of its polymer layers 42. For the backside interconnection scheme for a device (BISD) 79, each of its interconnection metal layers 27 may extend horizontally across under an edge of each of the fine-line interconnection bridges (FIBs) 690 of the circuit substrate 501, or an edge of each of the application specific integrated-circuit (ASIC) chips 398 of the circuit substrate 501 in case of replacing the fine-line interconnection bridges (FIBs) 690 of the circuit substrate 501, an edge of each of the rerouted vertical-through-via (VTV) connectors 468 of the circuit substrate 501, or an edge of each of the pad-enlarged vertical-through-via (VTV) connectors 469 of the circuit substrate 501, and an edge of each of the memory modules 159 of the circuit substrate 501, or an edge of each of the known-good memory or application-specific-integrated-circuit (ASIC) chips 397 of the circuit substrate 501 in case of replacing the memory modules 159 of the circuit substrate 501. Each of the interconnection metal layers 27 of the backside interconnection scheme for a device (BISD) 79 may have the same specification as that of the second interconnection scheme 588 of the first type of semiconductor integrated-circuit (IC) chip 100 as illustrated in FIG. 3A but shown upside down in FIG. 21, and each of the polymer layers 42 of the backside interconnection scheme for a device (BISD) 79 may have the same specification as that of the second interconnection scheme 588 of the first type of semiconductor integrated-circuit (IC) chip 100 as illustrated in FIG. 3A but shown upside down in FIG. 21.

Referring to FIG. 21, for the fourth type of chip package 514, each of its functional units 391 may be provided with the micro-bumps or micro-pads 34, each of which may have the same specification as the second type of micro-bumps or micro-pads 34 as illustrated in FIG. 3A, each having the solder cap 33 to be bonded to (1) the top surface of the copper layer 32 of one of the micro-bumps or micro-pads 34 of one of the fine-line interconnection bridges (FIBs) 690 of its circuit substrate 501, or the top surface of the copper layer 32 of one of the micro-bumps or micro-pads 34 of one of the application specific integrated-circuit (ASIC) chips 398 of its circuit substrate 501 in case of replacing the fine-line interconnection bridges (FIBs) 690 of its circuit substrate 501, (2) the top surface of the copper layer 32 of one of the micro-bumps or micro-pads 34 of one of the rerouted vertical-through-via (VTV) connectors 468 of its circuit substrate 501, or the top surface of one of the top metal pads of contacts 927*e* of one of the pad-enlarged vertical-through-via (VTV) connectors 469 of its circuit substrate 501, or (3) the top surface of the copper layer 32 of one of the micro bumps or micro-pads 34 of one of the memory modules 159 of its circuit substrate 501, or the top surface of the copper layer 32 of one of the micro-bumps or micro-pads 34 of one of the known-good memory or application-specific-integrated-circuit (ASIC) chips 397 of its circuit substrate 501 in case of replacing the memory modules 159 of its circuit substrate 501. Each of its functional units 391 may be provided with the micro-bumps or micro-pads 34, each of which may have the same specification as the third type of micro-bumps or micro-pads 34 as illustrated in FIGS. 3A, 12A and 12B, each having the solder cap 38 to be bonded to (1) the top surface of the copper layer 32 of one of the micro-bumps or micro-pads 34 of one of the fine-line interconnection bridges (FIBs) 690 of its circuit substrate 501, or the top surface of the copper layer 32 of one of the micro-bumps or micro-pads 34 of one of the application specific integrated-circuit (ASIC) chips 398 of its circuit substrate 501 in case of replacing the fine-line interconnection bridges (FIBs) 690 of its circuit substrate 501, (2) the top surface of the copper layer 32 of one of the micro-bumps or micro-pads 34 of one of the rerouted vertical-through-via (VTV) connectors 468 of its circuit substrate 501, or the top surface of one of the top metal pads of contacts 927*e* of one of the pad-enlarged vertical-through-via (VTV) connectors 469 of its circuit substrate 501, or (3) the top surface of the copper layer 32 of one of the micro-bumps or micro-pads 34 of one of the memory modules 159 of its circuit substrate 501, or the top surface of the copper layer 32 of one of the micro-bumps or micro-pads 34 of one of the known-good memory or application-specific-integrated-circuit (ASIC) chips 397 of its circuit substrate 501 in case of replacing the memory modules 159 of its circuit substrate 501. The fourth type of chip package 514 may further include an underfill 564, such as a layer of polymer or epoxy resins or compounds, between each of its functional units 391 and its circuit substrate 501, covering a sidewall of each of the micro-bumps or micro-pads 34 of each of its functional units 391.

Referring to FIG. 21, the fourth type of chip package 514 may further include a polymer layer 92-2 on a top surface of its circuit substrate 501 and horizontally around each of its functional units 391. For the fourth type of chip package 514, its polymer layer 92-2 may have a top surface coplanar with a top surface of each of its functional units 391, i.e., a top surface of the semiconductor substrate 2 of each of its semiconductor integrated-circuit (IC) chips when provided for its functional units 391, a top surface of the semiconductor substrate 2 of the application specific integrated-circuit (ASIC) chip 399 of each of its sub-system modules 190 when provided for its functional units 391 or a top surface of the topmost one of the memory chips 251 of each of its memory modules 159 when provided for its functional units 391.

Referring to FIG. 21, the fourth type of chip package 514 may further include multiple metal bumps, pillars or pads 570 in an array on the bottommost one of the interconnection metal layers 27 of the backside interconnection scheme for a device (BISD) 79 of its circuit substrate 501 at tops of the respective openings in the bottommost one of the polymer layers 42 of the backside interconnection scheme for a device (BISD) 79 of its circuit substrate 501. For the fourth type of chip package 514, each of its metal bumps, pillars or pads 570 may be of various types. A first type of metal bump, pillar or pad 570 may include (1) an adhesion layer 26*a*, such as titanium (Ti) or titanium nitride (TiN) layer having a thickness between 1 nm and 50 nm, under and on one of the metal pads of the bottommost one of the interconnection metal layers 27 of the backside interconnection scheme for a device (BISD) 79 of its circuit substrate 501 at the top of one of the openings in the bottommost one of the polymer layers 42 of the backside interconnection scheme for a device (BISD) 79 of its circuit substrate 501, (2) a seed layer 26*b*, such as copper, on its adhesion layer 26*a* and (3) a copper layer 32, i.e., copper pad, having a thickness between 1 μm and 60 μm on its seed layer 26*b*. Alternatively, a second type of metal bump, pillar or pad 570 may include the adhesion layer 26*a*, seed layer 26*b* and copper layer 32 as mentioned above for the first type of metal bump, pillar or pad 570, and may further include a tin-containing solder cap 33, i.e., solder bump, made of tin or a tin-silver alloy having a thickness between 1 μm and 50 μm on its copper layer 32. Alternatively, a third type of metal bump, pillar or pad 570 may include a gold layer, i.e., gold bump, having a thickness between 3 and 15 micrometers under one of the metal pads of the bottommost one of the interconnection metal layers 27 of the backside interconnection scheme for a device (BISD) 79 of its circuit substrate 501 at the top of one of the openings in the bottommost one of the polymer layers 42 of the backside interconnection scheme for a device (BISD) 79 of its circuit substrate 501.

Referring to FIG. 21, for the fourth type of chip package 514, each of its functional units 391 may couple to one of the other(s) of its functional units 391 through a metal line or trace 693 of one of the fine-line interconnection bridges (FIBs) 690 of its circuit substrate 501, or a metal line or trace of one of the application specific integrated-circuit (ASIC) chips 398 of its circuit substrate 501 provided by the interconnection metal layers 6 and/or 27 of the first and/or second interconnection schemes 560 and/or 588 of said one of the application specific integrated-circuit (ASIC) chips 398 of its circuit substrate 501 in case of replacing the fine-line interconnection bridges (FIBs) 690 of its circuit substrate 501, for delivery of a voltage of power supply (Vcc), a voltage of ground reference (Vss), clock signals (CLK) or other signals therebetween. Alternatively, for the fourth type of chip package 514, some of the transistors 4 of each of the application specific integrated-circuit (ASIC) logic chips 398 of its circuit substrate 501 in case of replacing the fine-line interconnection bridges (FIBs) 690 of its circuit substrate 501 may be provided for one of the programmable switch cells 379 thereof having the same specification as one illustrated in FIG. 2 having one of the nodes N23-N26 coupling to one of its functional units 391 through one of the programmable interconnects 361, provided by the interconnection metal layers 6 and/or 27 of the first and/or second interconnection schemes 560 and/or 588 thereof, and another of the nodes N23-N26 coupling to another of its functional units 391 through another of the programmable interconnects 361, provided by the interconnection metal layers 6 and/or 27 of the first and/or second interconnection schemes 560 and/or 588 thereof, to control coupling between its functional units 391. The memory cells 362 of said one of the programmable switch cells 379 may store configuration data passed from one or more of its micro bumps or micro-pads 570 (1) through, in sequence, each of the interconnection metal layers 27 of the backside interconnection scheme for a device (BISD) 79 of its circuit substrate 501, one of the interconnection metal layers 907 of one of the rerouted vertical-through-via (VTV) connectors 468 of its circuit substrate 501, or one of the interconnection metal layers 907 of one of the pad-enlarged vertical-through-via (VTV) connectors 469 of its circuit substrate 501, and one of its functional units 391, or (2) through, in sequence, each of the interconnection metal layers 27 of the backside interconnection scheme for a device (BISD) 79 of its circuit substrate 501, one of the dedicated vertical bypasses 698 or vertical interconnects 699 of one of the memory modules 159 of its circuit substrate 501 as illustrated in FIG. 11B, or one of the through silicon vias (TSVs) 157 of one of the known-good memory or ASIC chips 397 of its circuit substrate 501 in case of replacing said of the memory modules 159 of its circuit substrate 501, and one of its functional units 391. Each of its functional units 391 may couple to one of its metal bumps, pillars or pads 570 (1) through, in sequence, one of the interconnection metal layers 907 of one of the rerouted vertical-through-via (VTV) connectors 468 of its circuit substrate 501, or one of the interconnection metal layers 907 of one of the pad-enlarged vertical-through-via (VTV) connectors 469 of its circuit substrate 501, and each of the interconnection metal layers 27 of the backside interconnection scheme for a device (BISD) 79 of its circuit substrate 501, or (2) through, in sequence, one of the dedicated vertical bypasses 698 or vertical interconnects 699 of one of the memory modules 159 of its circuit substrate 501, or one of the through silicon vias (TSVs) 157 of one of the known-good memory or ASIC chips 397 of its circuit substrate 501 in case of replacing said of the memory modules 159 of its circuit substrate 501, and each of the interconnection metal layers 27 of the backside interconnection scheme for a device (BISD) 79 of its circuit substrate 501, for delivery of a voltage of power supply (Vcc), a voltage of ground reference (Vss), clock signals (CLK) or other signals therebetween.

5. Structure for Fifth Type of Chip Package

FIG. 22 is a schematically perspective view showing a fifth type of chip package in accordance with an embodiment of the present application. Referring to FIG. 22, a fifth type of chip package 515 is similar to the fourth type of chip package 514 as illustrated in FIG. 21, but the difference between the fourth and fifth types of chip packages 514 and 515 is that the fifth type of chip package 515 is further provided with (1) a circuit board 545 having multiple interconnection metal layers 27 and multiple polymer layers 42, i.e., insulating dielectric layers, each between neighboring two of the interconnection metal layers 27 of its circuit board 545, on a topmost one of the interconnection metal layers 27 of its circuit board 545 or under and on a bottommost one of the interconnection metal layers 27 of its circuit board 545, wherein each of the interconnection metal layers 27 of its circuit board 545 may have the same specification as that of the second interconnection scheme 588 of the first type of semiconductor integrated-circuit (IC) chip 100 as illustrated in FIG. 3A, and each of the polymer layers 42 of its circuit board 545 may have the same specification as that of the second interconnection scheme 588 of the first type of semiconductor integrated-circuit (IC) chip 100 as illustrated in FIG. 3A, and (2) multiple solder balls 546, such as a tin-containing alloy, each attached to a metal pad of the bottommost one of the interconnection metal layers 27 of its circuit board 545 at a top of an opening in the bottommost one of the polymer layers 42 of its circuit board 545.

Referring to FIG. 22, for the fifth type of chip package 515, the backside interconnection scheme for a device (BISD) 79 of its circuit substrate 501 may include one or more interconnection metal layers 27 as seen in FIG. 21 but only one is shown in FIG. 22 under and on its planar bottom surface composed of the bottom surface of the polymer layer 92-1 of its circuit substrate 501, the bottom surface of the semiconductor substrate 2 of each of the fine-line interconnection bridges (FIBs) 690 of its circuit substrate 501, or the bottom surface of the semiconductor substrate 2 of each of the application specific integrated-circuit (ASIC) chips 398 of its circuit substrate 501 in case of replacing the fine-line interconnection bridges (FIBs) 690 of its circuit substrate 501, the bottom surface of each of the rerouted vertical-through-via (VTV) connectors 468 of its circuit substrate 501, or the bottom surface of each of the pad-enlarged vertical-through-via (VTV) connectors 469 of its circuit substrate 501, and the bottom surface of the bottommost one of the memory chips 251 of each of the memory modules 159 of its circuit substrate 501, or a bottom surface of the semiconductor substrate 2 of each of the known-good memory or application-specific-integrated-circuit (ASIC) chips 397 of its circuit substrate 501 in case of replacing the memory modules 159 of its circuit substrate 501. The backside interconnection scheme for a device (BISD) 79 of its circuit substrate 501 may include one or more polymer layers 42 as seen in FIG. 21 but only one is shown in FIG. 22 under and on its planar bottom surface and the only one interconnection metal layer 27 of the backside interconnection scheme for a device (BISD) 79 of its circuit substrate 501.

Referring to FIG. 22, for the fifth type of chip package 515, each of its metal bumps, pillars or pads 570 formed in an array on the bottommost one of the interconnection metal layers 27 of the backside interconnection scheme for a device (BISD) 79 of its circuit substrate 501 at tops of the respective openings in the bottommost one of the polymer layers 42 of the backside interconnection scheme for a device (BISD) 79 of its circuit substrate 501 may be bonded to a metal pad of the topmost one of the interconnection metal layers 27 of its circuit board 545 at a bottom of an opening in the topmost one of the polymer layers 42 of its circuit board 545.

Referring to FIG. 22, the fifth type of chip package 515 may further include an underfill 564, such as a layer of polymer or epoxy resins or compounds, between its circuit substrate 501 and its circuit board 545, covering a sidewall of each of its metal bumps, pillars or pads 570.

6. Structure for Sixth Type of Chip Package and Process for Forming the Same

Figures 23A, 23B, 23C:
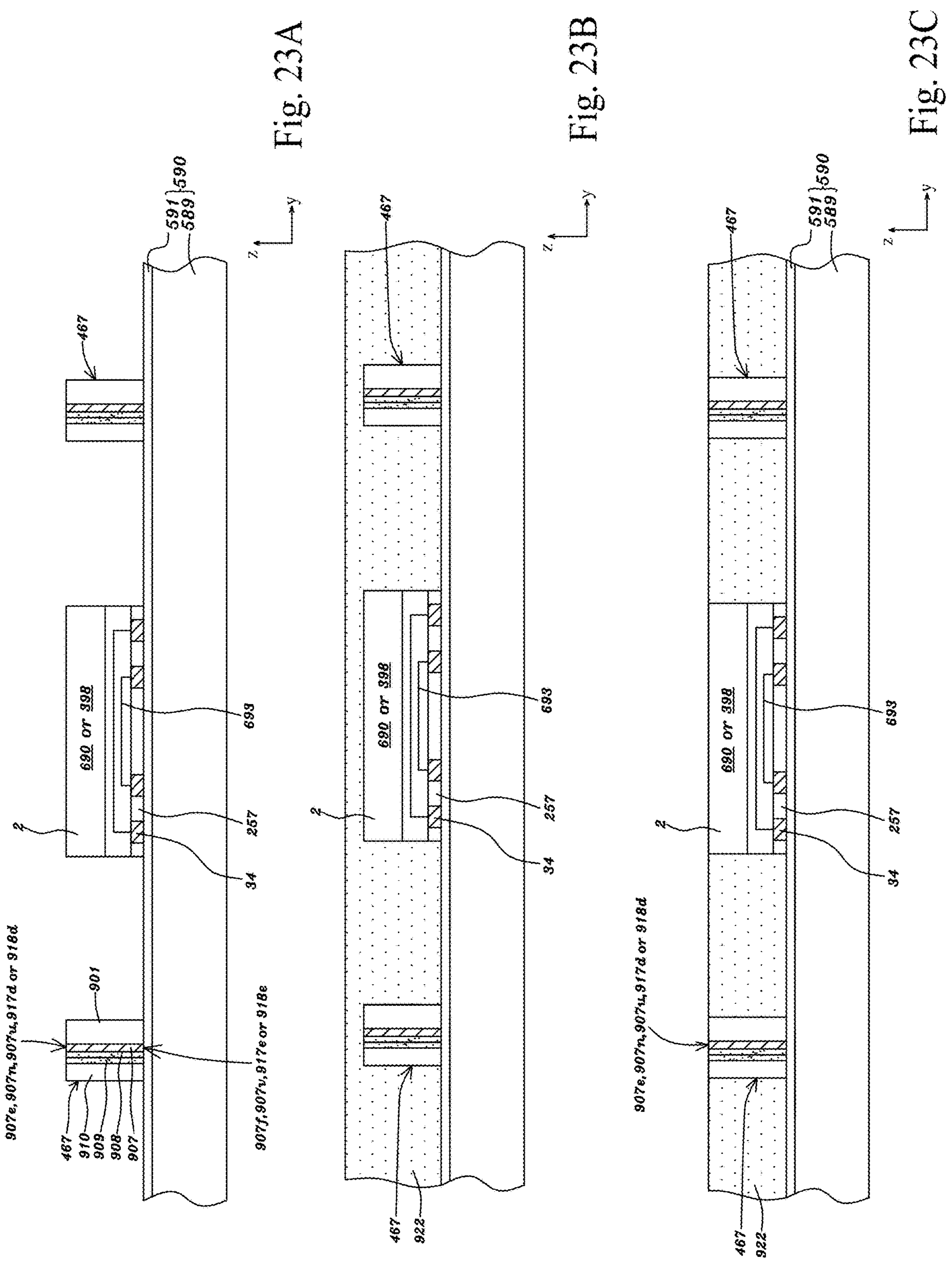
FIGS. 23A-23H are schematically cross-sectional views in a y-z plane showing a process for fabricating a sixth type of chip package in accordance with an embodiment of the present application.

FIGS. 23A-23H are schematically cross-sectional views in a y-z plane showing a process for fabricating a sixth type of chip package in accordance with an embodiment of the present application. Referring to FIG. 23A, a temporary substrate 590 may be provided with the same specification as the temporary substrate 590 as illustrated in FIG. 10A. Next, multiple fine-line interconnection bridges (FIBs) 690, each of which may have the same specification as either of the first or second type of vertical-through-via (VTV) connector 690 as illustrated in FIGS. 3D and 3E, may be provided to be turned upside down each with the insulating dielectric layer 257 thereof turned to be at the bottom thereof having a bottom surface to be attached to a top surface of the sacrificial bonding layer 591 of the temporary substrate 590, the micro-bumps or micro-pads 34 thereof turned to be at the bottom thereof having a bottom surface to be attached to the top surface of the sacrificial bonding layer 591 of the temporary substrate 590, and the bottom thereof turned to be at the top thereof. Alternatively, each of the fine-line interconnection bridges (FIBs) 690 may be replaced with an application specific integrated-circuit (ASIC) chip 398 having the same specification as the second type of semiconductor integrated-circuit (IC) chip 100 illustrated in FIG. 3B, provided to be turned upside down each with the insulating dielectric layer 257 thereof turned to be at the bottom thereof having a bottom surface to be attached to the top surface of the sacrificial bonding layer 591 of the temporary substrate 590, the micro-bumps or micro-pads 34 thereof turned to be at the bottom thereof having a bottom surface to be attached to the top surface of the sacrificial bonding layer 591 of the temporary substrate 590, and the bottom thereof turned to be at the top thereof, wherein the application specific integrated-circuit (ASIC) chip 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip, radio-frequency (RF) integrated-circuit (IC) chip. Multiple vertical-through-via (VTV) connectors 467, each of which may have the same specification as any type of the first through tenth types of vertical-through-via (VTV) connectors 467 as illustrated in FIGS. 4A-4I, 5A-5C, 6A-6F, 7A-7I, 8A-8F and 9A-9D, may be provided each with the bottom surface attached to the top surface of the sacrificial bonding layer 591 of the temporary substrate 590. In particular, FIGS. 23A-23H show each of the vertical-through-via (VTV) connectors 467 may be formed of any of the first through seventh types as seen in FIGS. 4A-4I, 5A-5C and 6A-6F. Each of the vertical-through-via (VTV) connectors 467 may be alternatively replaced with one type of the first and second types of pad-enlarged vertical-through-via (VTV) connector 469 illustrated in FIGS. 4J-4P, 5D-5E and 8G-8I with the bottom surface attached to the top surface of the sacrificial bonding layer 591 of the temporary substrate 590.

Next, referring to FIG. 23B, a polymer layer 922, or insulating dielectric layer, may be applied to fill a gap between each neighboring two of the fine-line interconnection bridges (FIBs) 690, or application specific integrated-circuit (ASIC) chips 398 in case of replacing the fine-line interconnection bridges (FIBs) 690, and the vertical-through-via (VTV) connectors 467 or pad-enlarged vertical-through-via (VTV) connectors 469, and to cover the top surface of each of the fine-line interconnection bridges (FIBs) 690, or application specific integrated-circuit (ASIC) chips 398 in case of replacing the fine-line interconnection bridges (FIBs) 690, the vertical-through-via (VTV) connectors 467 or pad-enlarged vertical-through-via (VTV) connectors 469 and the top surface of the sacrificial bonding layer 591 by methods, for example, spin-on coating, screen-printing, dispensing or molding. The polymer layer 922 may have the same specification as that of the polymer layer 922 of the first type of rerouted vertical-through-via (VTV) connector 468 as illustrated in FIG. 10B.

Next, referring to FIG. 23C, a chemical mechanical polishing (CMP), polishing or grinding process may be applied to remove a top portion of the polymer layer 922 and to planarize a top surface of the polymer layer 922, the top surface of each of the vertical-through-via (VTV) connectors 467 or pad-enlarged vertical-through-via (VTV) connectors 469 and the top surface of each of the fine-line interconnection bridges (FIBs) 690, or application specific integrated-circuit (ASIC) chips 398 in case of replacing the fine-line interconnection bridges (FIBs) 690. Thereby, for each of the vertical-through-via (VTV) connectors 467 or pad-enlarged vertical-through-via (VTV) connectors 469, the top surface of each of its top metal pads or contacts 907*e*, 907*n*, 907*u*, 917*d*, 918*d*, 919*a* and/or 919*c* or the top surface of each of its top metal pads or contacts 927*e*, the top surface of its supporting substrate 901, i.e., the top surface of the glass substrate for its supporting substrate 901 or the top surface of the silicon substrate for its supporting substrate 901, and the top surface of its covering substrate 910, i.e., the top surface of the glass substrate for its covering substrate 910 or the top surface of the silicon substrate for its covering substrate 910, may be exposed to be coplanar with a top surface of the polymer layer 922. For each of the fine-line interconnection bridges (FIBs) 690, or application specific integrated-circuit (ASIC) chips 398 in case of replacing the fine-line interconnection bridges (FIBs) 690, a top surface of its semiconductor substrate 2, i.e., a backside thereof, may be exposed to be coplanar with the top surface of the polymer layer 922.

Figure 23D:
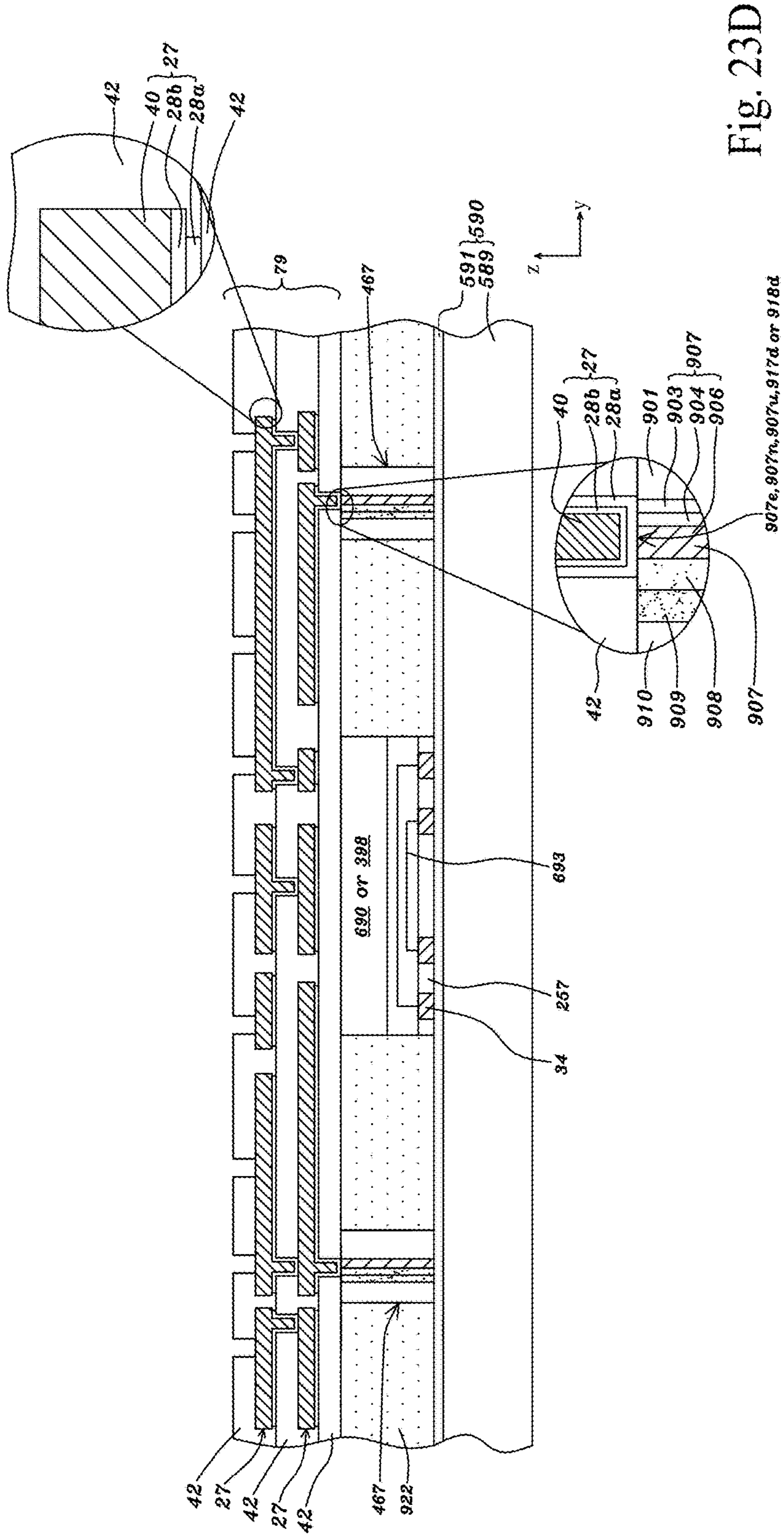

Next, referring to FIG. 23D, a backside interconnection scheme for a device (BISD) 79 may be formed on the top surface of the polymer layer 922, on the top surface of each of the fine-line interconnection bridges (FIBs) 690, or application specific integrated-circuit (ASIC) chips 398 in case of replacing the fine-line interconnection bridges (FIBs) 690, and on the top surface of each of the vertical-through-via (VTV) connectors 467 or pad-enlarged vertical-through-via (VTV) connectors 469, that is, on the top surface of each of the top metal pads or contacts 907*e*, 907*n*, 907*u*, 917*d*, 918*d*, 919*a* and/or 919*c* thereof or the top surface of each of the top metal pads or contacts 927*e* thereof, the top surface of each of the supporting substrate(s) 901 thereof and the top surface of the covering substrate 910 thereof, and on the top surface of the polymer layer 922. The backside interconnection scheme for a device (BISD) 79 may include (1) one or more interconnection metal layers 27 coupling to the top metal pads or contacts 907*e*, 907*n*, 907*u*, 917*d*, 918*d*, 919*a* and/or 919*c* of each of the vertical-through-via (VTV) connectors, and (2) one or more polymer layers 42, i.e., insulating dielectric layers, each between neighboring two of the interconnection metal layers 27 of the backside interconnection scheme for a device (BISD) 79, between a bottommost one of the interconnection metal layers 27 of the backside interconnection scheme for a device (BISD) 79 and a planar surface composed of the top surface of the semiconductor substrate 2 of each of the fine-line interconnection bridges (FIBs) 690, or application specific integrated-circuit (ASIC) chips 398 in case of replacing the fine-line interconnection bridges (FIBs) 690, the top surface of each of the vertical-through-via (VTV) connectors 467 or pad-enlarged vertical-through-via (VTV) connectors 469 and the top surface of the polymer layer 922, or on and above a topmost one of the interconnection metal layers 27 of the backside interconnection scheme for a device (BISD) 79, wherein the topmost one of the interconnection metal layers 27 of the backside interconnection scheme for a device (BISD) 79 may have multiple metal pads at bottoms of multiple respective openings in the topmost one of the polymer layers 42 of the backside interconnection scheme for a device (BISD) 79. Each of the interconnection metal layers 27 of the backside interconnection scheme for a device (BISD) 79 may have the same specification as that of the second interconnection scheme 588 of the first type of semiconductor integrated-circuit (IC) chip 100 as illustrated in FIG. 3A, and each of the polymer layers 42 of the backside interconnection scheme for a device (BISD) 79 may have the same specification as that of the second interconnection scheme 588 of the first type of semiconductor integrated-circuit (IC) chip 100 as illustrated in FIG. 3A. Each of the interconnection metal layers 27 of the backside interconnection scheme for a device (BISD) 79 may extend horizontally across over an edge of each of the vertical-through-via (VTV) connectors 467 or pad-enlarged vertical-through-via (VTV) connectors 469 and an edge of each of the fine-line interconnection bridges (FIBs) 690, or application specific integrated-circuit (ASIC) chips 398 in case of replacing the fine-line interconnection bridges (FIBs) 690.

Figure 23E:
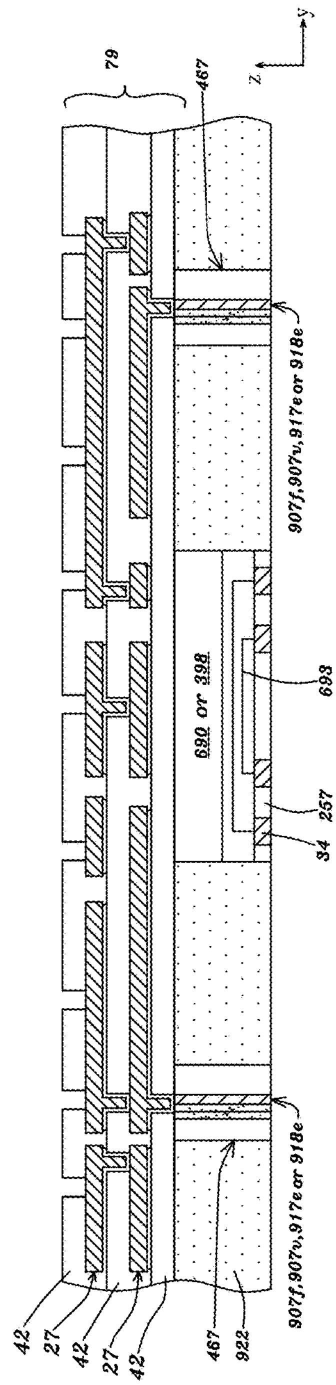
Figure 23F:
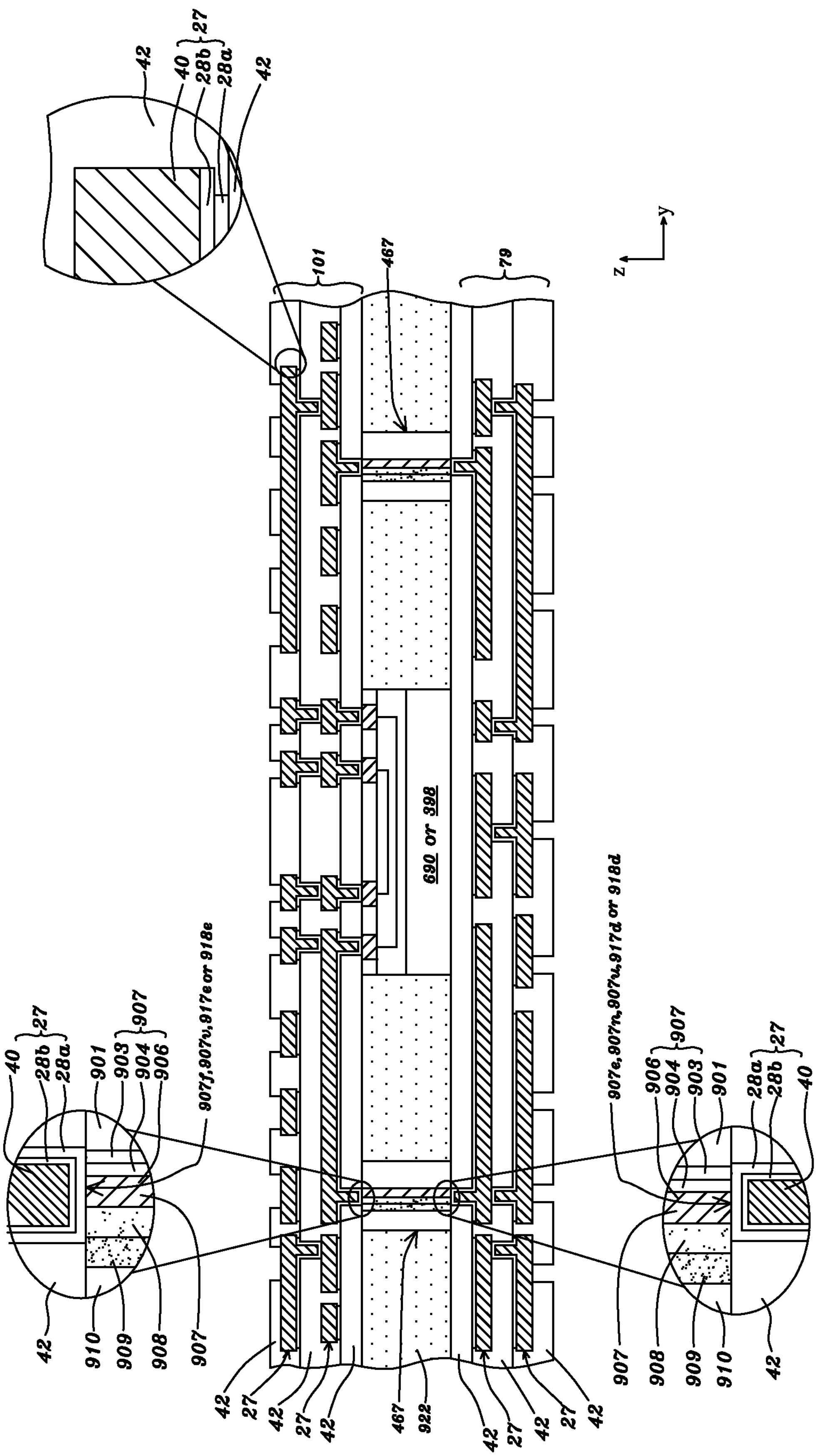

Next, referring to FIG. 23E, the glass or silicon substrate 589 as seen in FIG. 23D may be released from the sacrificial bonding layer 591, which may be referred to the step as illustrated in FIG. 10E. Next, the remainder of the sacrificial bonding layer 591 may be pulled off, which may be referred to the step as illustrated in FIG. 10E such that the bottom surface of each of the vertical-through-via (VTV) connectors 467 or pad-enlarged vertical-through-via (VTV) connectors 469, the bottom surface of the insulating dielectric layer 257 of each of the fine-line interconnection bridges (FIBs) 690, or application specific integrated-circuit (ASIC) chips 398 in case of replacing the fine-line interconnection bridges (FIBs) 690, the bottom surface of each of the micro-bumps or micro-pads 34 of each of the fine-line interconnection bridges (FIBs) 690, or application specific integrated-circuit (ASIC) chips 398 in case of replacing the fine-line interconnection bridges (FIBs) 690, and a bottom surface of the polymer layer 922 may be exposed as seen in FIG. 10E; for each of the vertical-through-via (VTV) connectors 467 or pad-enlarged vertical-through-via (VTV) connectors 469, the bottom surface of each of its bottom metal pads or contacts 907*f*, 907*v*, 917*e*, 918*e*, 919*b* and/or 919*d* or the bottom surface of each of its top metal pads or contacts 927*f*, the bottom surface of each of its supporting substrate(s) 901, i.e., the bottom surface of the glass substrate for each of its supporting substrate(s) 901 or the bottom surface of the silicon substrate for each of its supporting substrate(s) 901, and the bottom surface of its covering substrate 910, i.e., the bottom surface of the glass substrate for its covering substrate 910 or the bottom surface of the silicon substrate for its covering substrate 910, may be exposed and coplanar with the bottom surface of the polymer layer 922, the bottom surface of the insulating dielectric layer 257 of each of the fine-line interconnection bridges (FIBs) 690, or application specific integrated-circuit (ASIC) chips 398 in case of replacing the fine-line interconnection bridges (FIBs) 690, and the bottom surface of each of the micro-bumps or micro-pads 34 of each of the fine-line interconnection bridges (FIBs) 690, or application specific integrated-circuit (ASIC) chips 398 in case of replacing the fine-line interconnection bridges (FIBs) 690.

Next, the structure as seen in FIG. 23E may be turned upside down with the backside interconnection scheme for a device (BISD) 79 thereof turned to be at the bottom thereof, the bottom surface of each of the vertical-through-via (VTV) connectors 467 or pad-enlarged vertical-through-via (VTV) connectors 469 thereof turned to be at the top thereof, i.e., each of the bottom metal pads or contacts 907*f*, 907*v*, 917*e*, 918*e*, 919*b* and/or 919*d* of each of the vertical-through-via (VTV) connectors 467 thereof or each of the bottom metal pads or contacts 927*f* of each of the pad-enlarged vertical-through-via (VTV) connectors 469 thereof turned to be at the top thereof as top metal pads or contacts, the insulating dielectric layer 257 of each of the fine-line interconnection bridges (FIBs) 690 thereof, or application specific integrated-circuit (ASIC) chips 398 in case of replacing the fine-line interconnection bridges (FIBs) 690, turned to be at the top thereof, each of the micro-bumps or micro-pads 34 of each of the fine-line interconnection bridges (FIBs) 690 thereof, or application specific integrated-circuit (ASIC) chips 398 in case of replacing the fine-line interconnection bridges (FIBs) 690, turned to be at the top thereof. Next, a frontside interconnection scheme for a device (FISD) 101 may be formed on the top surface of the polymer layer 922, the top surface of each of the fine-line interconnection bridges (FIBs) 690, or application specific integrated-circuit (ASIC) chips 398 in case of replacing the fine-line interconnection bridges (FIBs) 690, and the top surface of each of the vertical-through-via (VTV) connectors 467 or pad-enlarged vertical-through-via (VTV) connectors 469. The frontside interconnection scheme for a device (FISD) 101 may include (1) one or more interconnection metal layers 27 coupling to the top metal pads or contacts 907*f*, 907*v*, 917*e*, 918*e*, 919*b* and/or 919*d* of each of the vertical-through-via (VTV) connectors and the micro-bumps or micro-pads 34 of each of the fine-line interconnection bridges (FIBs) 690, or application specific integrated-circuit (ASIC) chips 398 in case of replacing the fine-line interconnection bridges (FIBs) 690, and (2) one or more polymer layers 42, i.e., insulating dielectric layers, each between neighboring two of the interconnection metal layers 27 of the frontside interconnection scheme for a device (FISD) 101, between a bottommost one of the interconnection metal layers 27 of the frontside interconnection scheme for a device (FISD) 101 and a planar surface composed of the top surface of the polymer layer 922, the top surface of each of the fine-line interconnection bridges (FIBs) 690, or application specific integrated-circuit (ASIC) chips 398 in case of replacing the fine-line interconnection bridges (FIBs) 690, and the top surface of each of the vertical-through-via (VTV) connectors 467 or pad-enlarged vertical-through-via (VTV) connectors 469, or on and above a topmost one of the interconnection metal layers 27 of the frontside interconnection scheme for a device (FISD) 101, wherein the topmost one of the interconnection metal layers 27 of the frontside interconnection scheme for a device (FISD) 101 may have multiple metal pads at bottoms of multiple respective openings in the topmost one of the polymer layers 42 of the frontside interconnection scheme for a device (FISD) 101. Each of the interconnection metal layers 27 of the frontside interconnection scheme for a device (FISD) 101 may have the same specification as that of the second interconnection scheme 588 of the first type of semiconductor integrated-circuit (IC) chip 100 as illustrated in FIG. 3A, and each of the polymer layers 42 of the frontside interconnection scheme for a device (FISD) 101 may have the same specification as that of the second interconnection scheme 588 of the first type of semiconductor integrated-circuit (IC) chip 100 as illustrated in FIG. 3A. Each of the interconnection metal layers 27 of the frontside interconnection scheme for a device (FISD) 101 may extend horizontally across over an edge of each of the vertical-through-via (VTV) connectors 467 or pad-enlarged vertical-through-via (VTV) connectors 469 and an edge of each of the fine-line interconnection bridges (FIBs) 690, or application specific integrated-circuit (ASIC) chips 398 in case of replacing the fine-line interconnection bridges (FIBs) 690.

Figure 23G:
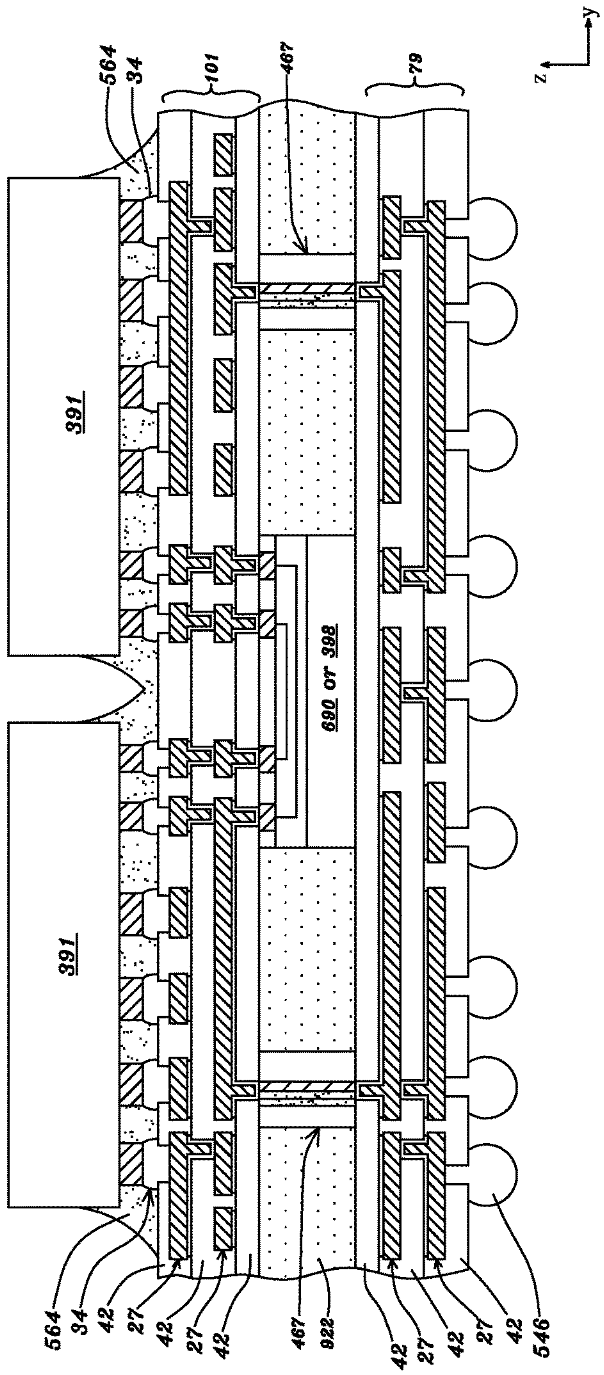

Next, referring to FIG. 23G, multiple functional units 391 may be bonded to and over the frontside interconnection scheme for a device (FISD) 101. For example, each of the functional units 391 may be any of (1) a semiconductor integrated-circuit (IC) chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip, having the same specification as the first type of semiconductor integrated-circuit (IC) chip 100 as illustrated in FIG. 3A but shown upside down in FIG. 23G with the micro-bumps or micro-pads 34 thereof shown at the bottom thereof each bonded to one of the metal pads of the topmost one of the interconnection metal layers 27 of the frontside interconnection scheme for a device (FISD) 101, (2) a sub-system module having the same specification as the first type of sub-system module 190 as illustrated in FIGS. 13A and 13B but shown upside down in FIG. 23G with the micro-bumps or micro-pads 34 thereof shown at the bottom thereof each bonded to one of the metal pads of the topmost one of the interconnection metal layers 27 of the frontside interconnection scheme for a device (FISD) 101, and (3) a memory module having the same specification as the first type of memory module 159 illustrated in FIG. 11A with the micro-bumps or micro-pads 34 thereof shown at the bottom thereof each bonded to one of the metal pads of the topmost one of the interconnection metal layers 27 of the frontside interconnection scheme for a device (FISD) 101.

For more elaboration, referring to FIG. 23G, each of the functional units 391 may be provided with the micro-bumps or micro-pads 34, each of which may have the same specification as the second type of micro-bumps or micro-pads 34 as illustrated in FIG. 3A, each having the solder cap 33 to be bonded to a top surface of one of the metal pads of the topmost one of the interconnection metal layers 27 of the frontside interconnection scheme for a device (FISD) 101. Alternatively, each of the functional units 391 may be provided with the micro bumps or micro-pads 34, each of which may have the same specification as the third type of micro-bumps or micro-pads 34 as illustrated in FIGS. 3A, 12A and 12B, each having the solder cap 38 to be bonded to a top surface of one of the metal pads of the topmost one of the interconnection metal layers 27 of the frontside interconnection scheme for a device (FISD) 101.

Next, referring to FIG. 23G, an underfill 564, such as a layer of polymer or epoxy resins or compounds, may be formed between each of the functional units 391 and the frontside interconnection scheme for a device (FISD) 101, covering a sidewall of each of the micro-bumps or micro-pads 34 of each of the functional units 391.

Next, referring to FIG. 23G, multiple solder balls 546, such as a tin-containing alloy, each may be planted to or formed on one of the metal pads of the backside interconnection scheme for a device (BISD) 79 at a top of one of the openings in the bottommost one of the polymer layers 42 of the backside interconnection scheme for a device (BISD) 79.

Figure 23H:
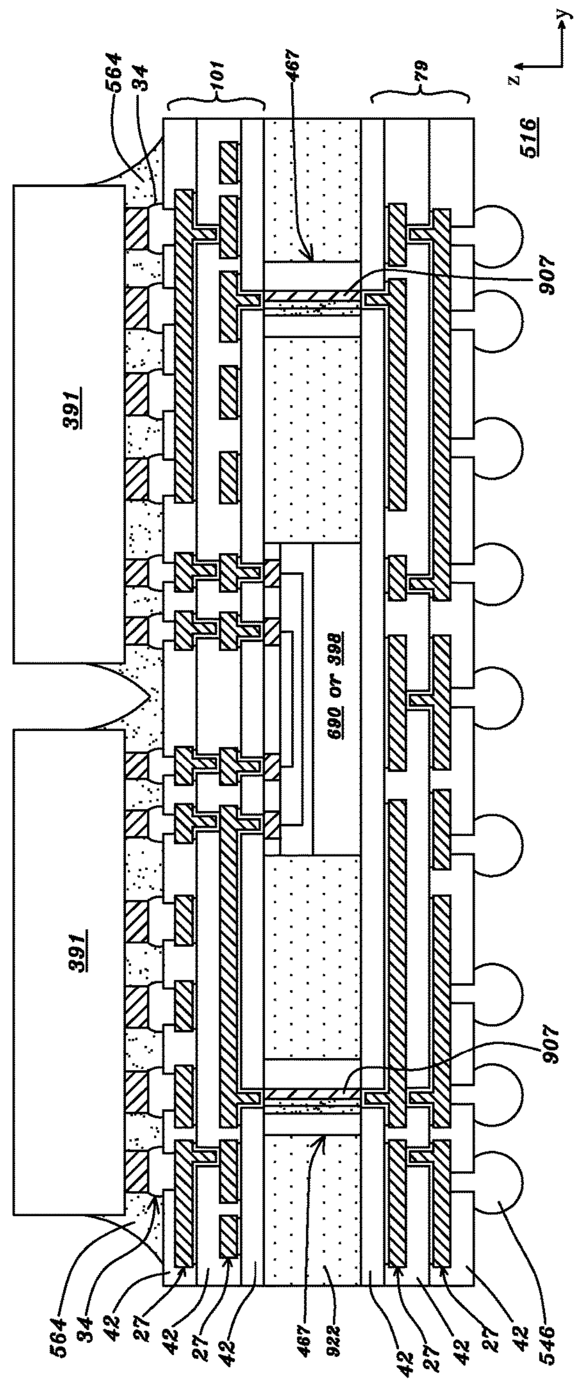

Next, the polymer layers 42 of the frontside and backside interconnection schemes for a device (FISD and BISD) 101 and 79 and the polymer layer 922 may be cut or diced to separate multiple individual units each for a sixth type of chip package 516 as shown in FIG. 23H by a laser cutting process or mechanical cutting process.

Referring to FIG. 23H, for the sixth type of chip package 516, each of its functional units 391 may couple to one of the other(s) of its functional units 391 through, in sequence, each of the interconnection metal layers 27 of its frontside interconnection scheme for a device (FISD) 101, a metal line or trace 693 of one of its fine-line interconnection bridges (FIBs) 690, or the interconnection metal layers 6 and/or 27 of the first and/or second interconnection schemes 560 and/or 588 of one of its application specific integrated-circuit (ASIC) chips 398 in case of replacing its fine-line interconnection bridges (FIBs) 690, and each of the interconnection metal layers 27 of its frontside interconnection scheme for a device (FISD) 101 for delivery of a voltage of power supply (Vcc), a voltage of ground reference (Vss), clock signals (CLK) or other signals therebetween. Alternatively, some of the transistors 4 of each of its application specific integrated-circuit (ASIC) logic chips 398 in case of replacing its fine-line interconnection bridges (FIBs) 690 may be provided for one of the programmable switch cells 379 thereof having the same specification as one illustrated in FIG. 2 having one of the nodes N23-N26 coupling to one of its functional units 391 through one of the programmable interconnects 361, provided by the interconnection metal layers 6 and/or 27 of the first and/or second interconnection schemes 560 and/or 588 thereof, and another of the nodes N23-N26 coupling to another of its functional units 391 through another of the programmable interconnects 361, provided by the interconnection metal layers 6 and/or 27 of the first and/or second interconnection schemes 560 and/or 588 thereof, to control coupling between its functional units 391. Each of its functional units 391 may couple to one of its solder balls 546 (1) through, in sequence, each of the interconnection metal layers 27 of its frontside interconnection scheme for a device (FISD) 101, one of the interconnection metal layers 907 of one of its vertical-through-via (VTV) connectors 467 or pad-enlarged vertical-through-via (VTV) connectors 469 and each of the interconnection metal layers 27 of its backside interconnection scheme for a device (BISD) 79 for delivery of a voltage of power supply (Vcc), a voltage of ground reference (Vss), clock signals (CLK) or other signals therebetween.

7. Structure for Seventh Type of Chip Package and Process for Forming the Same

Figure 24A:
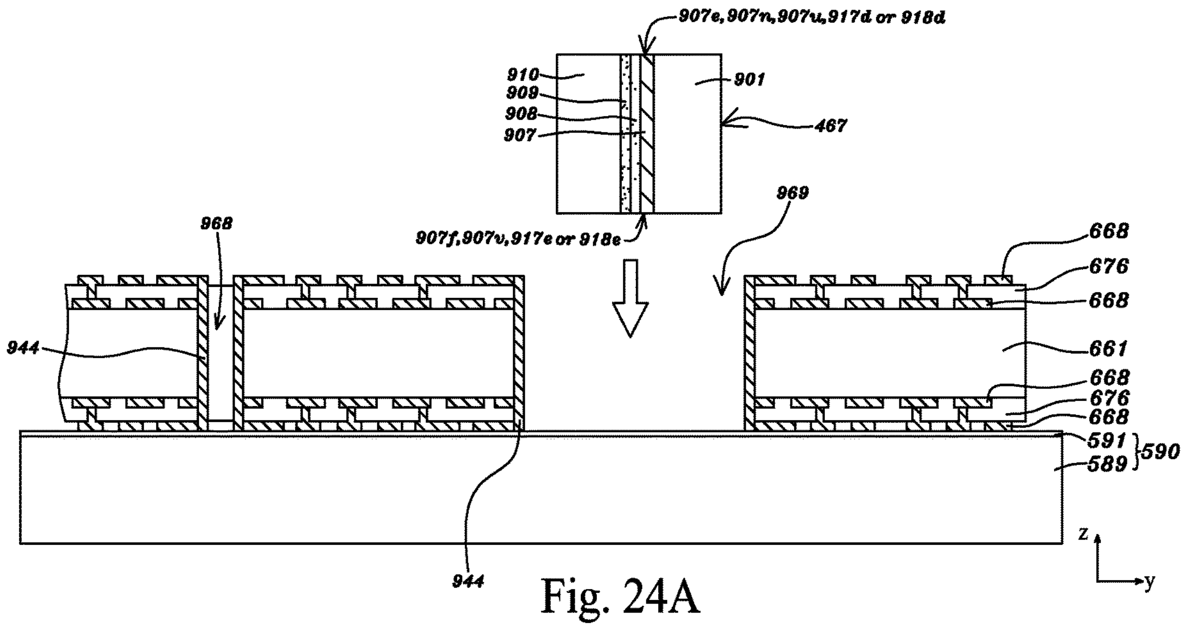
FIGS. 24A-24D are schematically cross-sectional views in a y-z plane showing a process for fabricating a circuit substrate in accordance with an embodiment of the present application.

FIGS. 24A-24D are schematically cross-sectional views in a y-z plane showing a process for fabricating a circuit substrate in accordance with an embodiment of the present application. Referring to FIG. 24A, a temporary substrate 590 may be provided with the same specification as the temporary substrate 590 as illustrated in FIG. 10A. Next, a semifinished substrate 941 of printed circuit board (PCB) is provided with a bottom surface to be attached to a top surface of the sacrificial bonding layer 591 of the temporary substrate 590. The semifinished substrate 941 for a printed circuit board (PCB) may include (1) a core layer 661, such as FR4, containing epoxy or bismaleimide-triazine (BT) resin, wherein FR4 may be a composite material composed of woven fiberglass cloth and an epoxy resin binder, wherein the core layer 661 may have a thickness between 0.03 and 2.5 millimeters or between 0.1 and 2 millimeters, (2) multiple interconnection metal layers 668, made of copper, over and under the core layer 661, wherein each of the interconnection metal layers 668 may have a thickness between 1 and 80 micrometers or between 3 and 50 micrometers, and (3) multiple polymer layers 676, i.e., prepreg, over and under the core layer 661, wherein each of the polymer layers 676 is between neighboring two of the interconnection metal layers 668, wherein each of the polymer layers 676 may be made of epoxy, glass fiber, bismaleimide triazine (BT), Ajinomoto build-up film (ABF) or a combination of two or more of the above materials and have a thickness between 0.01 and 0.4 millimeters or between 0.05 and 0.3 millimeters. Multiple first through holes 968 may be formed each with a transverse dimension, e.g., width or diameter, between 0.05 and 1 millimeters by a mechanical drilling process or laser drilling process to vertically extend through the core layer 661, each of the interconnection metal layers 668 and each of the polymer layers 676, and multiple second through holes 969 may be formed by a mechanical drilling process or laser drilling process to vertically extend through the core layer 661, each of the interconnection metal layers 668 and each of the polymer layers 676. Each of the second through holes 969 may extend in the x direction to have a longitudinal or rectangular shape with a length between 1 and 100 millimeters, between 5 and 20 millimeters, between 8 and 50 millimeters or greater than 10, 30, 50, 80 or 100 millimeters and a width between 0.2 and 3 millimeters, between 0.4 and 1 millimeters or between 0.8 and 2 millimeters. Alternatively, each of the second through holes 969 may have a circular or square shape with a diameter or width between 1 and 5 millimeters, between 5 and 10 millimeters, between 8 and 20 millimeters, or greater than 10, 30, 50, 80 or 100 millimeters. A metal layer 944, such as copper layer, may be formed by an electroless plating process and/or electroplating process on a sidewall of each of the first and second through holes 968 and 969 to couple to a metal contact of each of the interconnection metal layers 668 at the sidewall thereof. The bottommost one of the interconnection metal layers 668 of the semifinished substrate 941 may have a bottom surface to be attached to the top surface of the sacrificial bonding layer 591 of the temporary substrate 590.

Figure 24B:
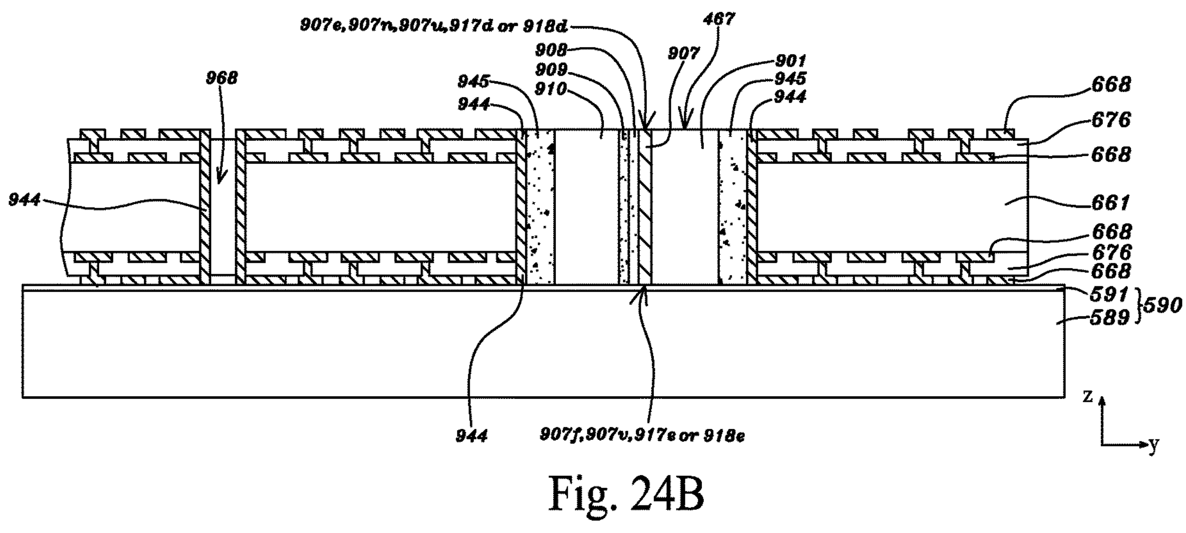

Next, referring to FIGS. 24A and 24B, multiple vertical-through-via (VTV) connectors 467, each of which may have the same specification as any type of the first through tenth types of vertical-through-via (VTV) connectors 467 as illustrated in FIGS. 4A-4I, 5A-5C, 6A-6F, 7A-7I, 8A-8F and 9A-9D, each may be placed in one of the second through holes 969 in the semifinished substrate 941 and provided with the bottom surface to be attached to the top surface of the sacrificial bonding layer 591 of the temporary substrate 590. In particular, FIGS. 24A-24C and 24E show each of the vertical-through-via (VTV) connectors 467 may be formed of any of the first through seventh types as seen in FIGS. 4A-4I, 5A-5C and 6A-6F. Each of the vertical-through-via (VTV) connectors 467 may be alternatively replaced with one of the first through second types of pad-enlarged vertical-through-via (VTV) connector 469 illustrated in FIGS. 4J-4P, 5D-5E and 8G-8I. In particular, FIG. 24D show a circuit substrate is fabricated with the first type of pad-enlarged vertical-through-via (VTV) connector 469 illustrated in FIGS. 4J-4P and 5D-5E. Next, an adhesive polymer material 945 may be filled into a gap between a sidewall of said each of the vertical-through-via (VTV) connectors 467 or pad-enlarged vertical-through-via (VTV) connectors 469 and the metal layer 944 on the sidewall of said one of the second through holes 969. Next, when each of the vertical-through-via (VTV) connectors 467 or pad-enlarged vertical-through-via (VTV) connectors 469 has the top surface higher than a level of a top surface of the topmost one of the interconnection metal layers 668 of the semifinished substrate 941, a polishing or grinding process may be performed to remove a top portion of each of the vertical-through-via (VTV) connectors 467 or pad-enlarged vertical-through-via (VTV) connectors 469 such that the top surface of the topmost one of the interconnection metal layers 668 of the semifinished substrate 941 may be coplanar with the top surface of each of the vertical-through-via (VTV) connectors 467 or pad-enlarged vertical-through-via (VTV) connectors 469, that is, the top metal pads or contacts 907*e*, 907*n*, 907*u*, 917*d*, 918*d*, 919*a* and/or 919*c* of each of the vertical-through-via (VTV) connectors 467, or the top metal pads or contacts 927*e* of each of the pad-enlarged vertical-through-via (VTV) connectors 469, the top surface of each of the supporting substrates 901 of each of the vertical-through-via (VTV) connectors 467 or pad-enlarged vertical-through-via (VTV) connectors 469, i.e., the top surface of the glass substrate for said each of the supporting substrates 901 or the top surface of the silicon substrate for said each of the supporting substrates 901, and the top surface of the covering substrate 910 of each of the vertical-through-via (VTV) connectors 467 or pad-enlarged vertical-through-via (VTV) connectors 469, i.e., the top surface of the glass substrate for the covering substrate 910 of said each of the vertical-through-via (VTV) connectors 467 or pad-enlarged vertical-through-via (VTV) connectors 469 or the top surface of the silicon substrate for the covering substrate 910 of said each of the vertical-through-via (VTV) connectors 467 or pad-enlarged vertical-through-via (VTV) connectors 469.

Next, the glass or silicon substrate 589 as seen in FIG. 24B may be released from the sacrificial bonding layer 591, which may be referred to the step as illustrated in FIG. 10E. Next, the remainder of the sacrificial bonding layer 591 may be pulled off, which may be referred to the step as illustrated in FIG. 10E such that the bottom surface of each of the vertical-through-via (VTV) connectors 467 or pad-enlarged vertical-through-via (VTV) connectors 469 and the bottom surface of the bottommost one of the interconnection metal layers 668 of the semifinished substrate 941 may be exposed; for each of the vertical-through-via (VTV) connectors 467 or pad-enlarged vertical-through-via (VTV) connectors 469, the bottom surface of each of its bottom metal pads or contacts 907*f*, 907*v*, 917*e*, 918*e*, 919*b* and/or 919*d*, or the bottom surface of each of its bottom metal pads or contacts 927*f*, the bottom surface of each of its supporting substrate(s) 901, i.e., the bottom surface of the glass substrate for each of its supporting substrate(s) 901 or the bottom surface of the silicon substrate for each of its supporting substrate(s) 901, and the bottom surface of its covering substrate 910, i.e., the bottom surface of the glass substrate for its covering substrate 910 or the bottom surface of the silicon substrate for its covering substrate 910, may be exposed and coplanar with the bottom surface of the bottommost one of the interconnection metal layers 668 of the semifinished substrate 941.

Figure 24C:
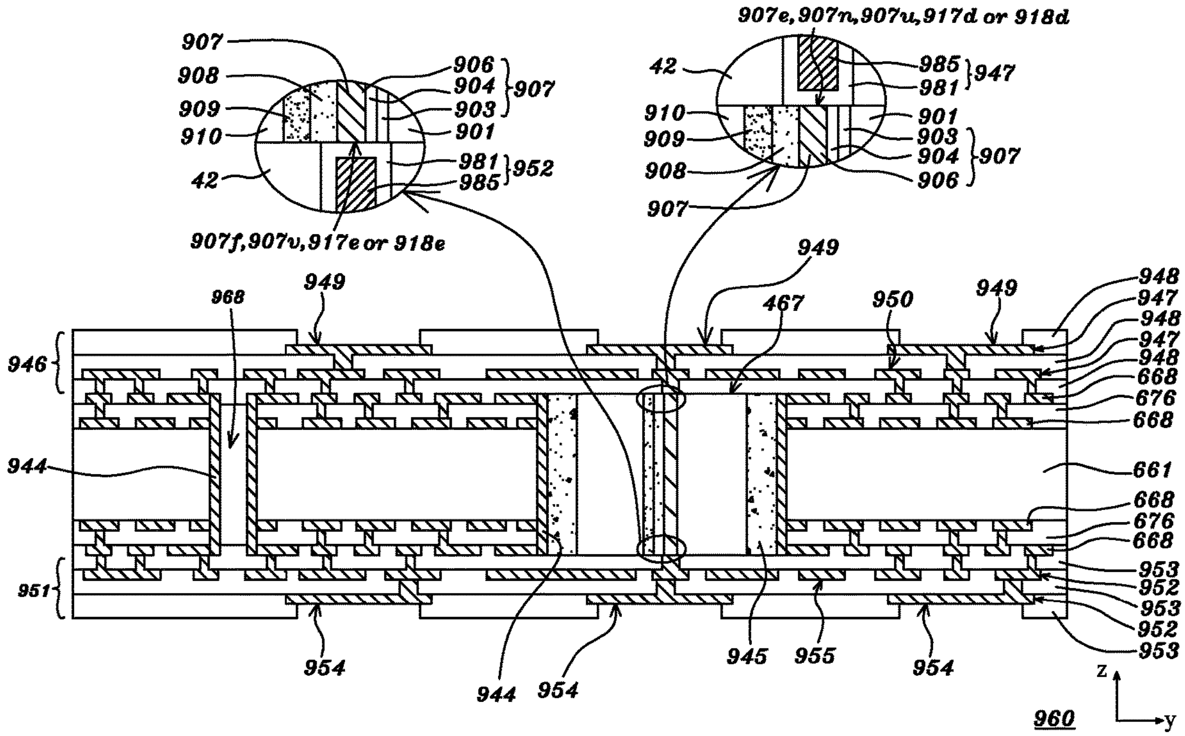
Figure 24D:
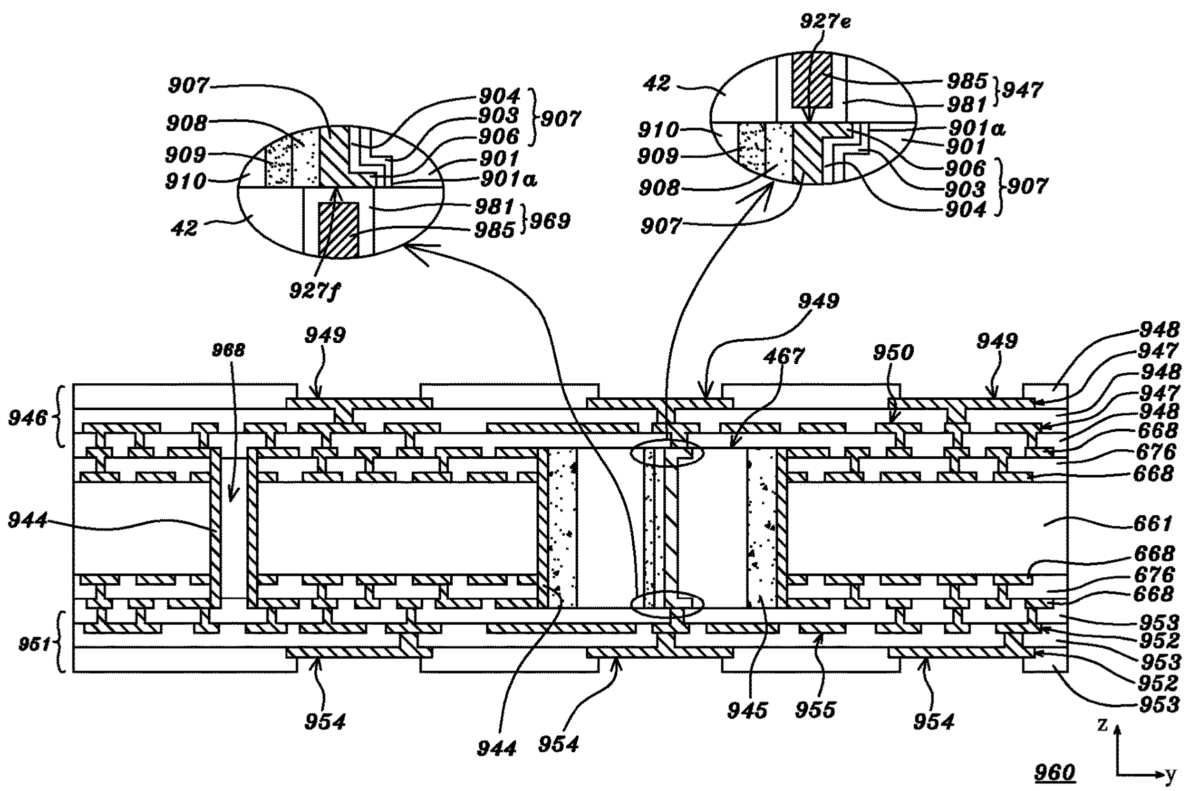

Next, referring to FIGS. 24C and 24D, a top interconnection scheme 946 may be formed on a top side of the semifinished substrate 941 and a top side of each of the vertical-through-via (VTV) connectors 467 or pad-enlarged vertical-through-via (VTV) connectors 469, i.e., on the top surface of the topmost one of the interconnection metal layers 668 of the semifinished substrate 941, the top surface of the topmost one of the polymer layers 676 of the semifinished substrate 941 and the top surface of each of the vertical-through-via (VTV) connectors 467 or pad-enlarged vertical-through-via (VTV) connectors 469. The top interconnection scheme 946 may include (1) one or more interconnection metal layers 947 coupling to the top metal pads or contacts 907*e*, 907*n*, 907*u*, 917*d*, 918*d*, 919*a* and/or 919*c* of each of the vertical-through-via (VTV) connectors 467, or the top metal pads or contacts 927*e* of each of the pad-enlarged vertical-through-via (VTV) connectors 469, and the topmost one of the interconnection metal layers 668 of the semifinished substrate 941, and (2) one or more polymer layers 948, i.e., insulating dielectric layers, each between neighboring two of the interconnection metal layers 947 of the top interconnection scheme 946, between a bottommost one of the interconnection metal layers 947 of the top interconnection scheme 946 and the top side of the semifinished substrate 941 and between the bottommost one of the interconnection metal layers 947 and the top side of each of the vertical-through-via (VTV) connectors 467 or pad-enlarged vertical-through-via (VTV) connectors 469, or on and above a topmost one of the interconnection metal layers 947 of the top interconnection scheme 946, wherein the topmost one of the interconnection metal layers 947 of the top interconnection scheme 946 may have multiple metal pads at bottoms of multiple openings in the topmost one of the polymer layers 948 of the top interconnection scheme 946. Each of the interconnection metal layers 947 of the top interconnection scheme 946 may include a seed layer 981 at its bottom, such as copper layer formed by a sputtering process with a thickness between 0.2 and 15 micrometers, between 0.5 and 12 micrometers or between 1 and 8 micrometers, and a metal layer 985, such as copper layer formed by an electroplating process with a thickness with a thickness between 2 and 70 micrometers, between 5 and 50 micrometers or between 10 and 30 micrometers, on a top surface of its seed layer 981, and each of the polymer layers 948 of the top interconnection scheme 946 may be made of epoxy, glass fiber, bismaleimide triazine (BT), Ajinomoto build-up film (ABF) or a combination of two or more of the above materials and have a thickness, between 0.01 and 0.4 millimeters or between 0.05 and 0.3 millimeters. Each of the interconnection metal layers 947 of the top interconnection scheme 946 may extend horizontally across over an edge of each of the vertical-through-via (VTV) connectors 467 or pad-enlarged vertical-through-via (VTV) connectors 469.

Further, referring to FIGS. 24C and 24D, a bottom interconnection scheme 951 may be formed on a bottom side of the semifinished substrate 941 and a bottom side of each of the vertical-through-via (VTV) connectors 467 or pad-enlarged vertical-through-via (VTV) connectors 469, i.e., on the bottom surface of the bottommost one of the interconnection metal layers 668 of the semifinished substrate 941, the bottom surface of the bottommost one of the polymer layers 676 of the semifinished substrate 941 and the bottom surface of each of the vertical-through-via (VTV) connectors 467 or pad-enlarged vertical-through-via (VTV) connectors 469. The bottom interconnection scheme 951 may include (1) one or more interconnection metal layers 952 coupling to the bottom metal pads or contacts 907*f*, 907*v*, 917*e*, 918*e*, 919*b* and/or 919*d* of each of the vertical-through-via (VTV) connectors 467, or the bottom metal pads or contacts 927*f* of each of the pad-enlarged vertical-through-via (VTV) connectors 469, and the bottommost one of the interconnection metal layers 668 of the semifinished substrate 941, and (2) one or more polymer layers 953, i.e., insulating dielectric layers, each between neighboring two of the interconnection metal layers 952 of the bottom interconnection scheme 951, between a topmost one of the interconnection metal layers 952 of the bottom interconnection scheme 951 and the bottom side of the semifinished substrate 941 and between the topmost one of the interconnection metal layers 952 of the bottom interconnection scheme 951 and the bottom side of each of the vertical-through-via (VTV) connectors 467 or pad-enlarged vertical-through-via (VTV) connectors 469, or on and under a bottommost one of the interconnection metal layers 952 of the bottom interconnection scheme 951, wherein the bottommost one of the interconnection metal layers 952 of the bottom interconnection scheme 951 may have multiple metal pads at tops of multiple openings in the bottommost one of the polymer layers 953 of the bottom interconnection scheme 951. Each of the interconnection metal layers 952 of the bottom interconnection scheme 951 may include a seed layer 982 at its top, such as copper layer formed by a sputtering process with a thickness between 0.2 and 15 micrometers, between 0.5 and 12 micrometers or between 1 and 8 micrometers, and a metal layer 986, such as copper layer formed by an electroplating process with a thickness with a thickness between 2 and 70 micrometers, between 5 and 50 micrometers or between 10 and 30 micrometers, on a bottom surface of its seed layer 982, and each of the polymer layers 953 of the bottom interconnection scheme 951 may be made of epoxy, glass fiber, bismaleimide triazine (BT), Ajinomoto build-up film (ABF) or a combination of two or more of the above materials and have a thickness, between 0.01 and 0.4 millimeters or between 0.05 and 0.3 millimeters. Each of the interconnection metal layers 952 of the bottom interconnection scheme 951 may extend horizontally across under an edge of each of the vertical-through-via (VTV) connectors 467 or pad-enlarged vertical-through-via (VTV) connectors 469.

Figure 24E:
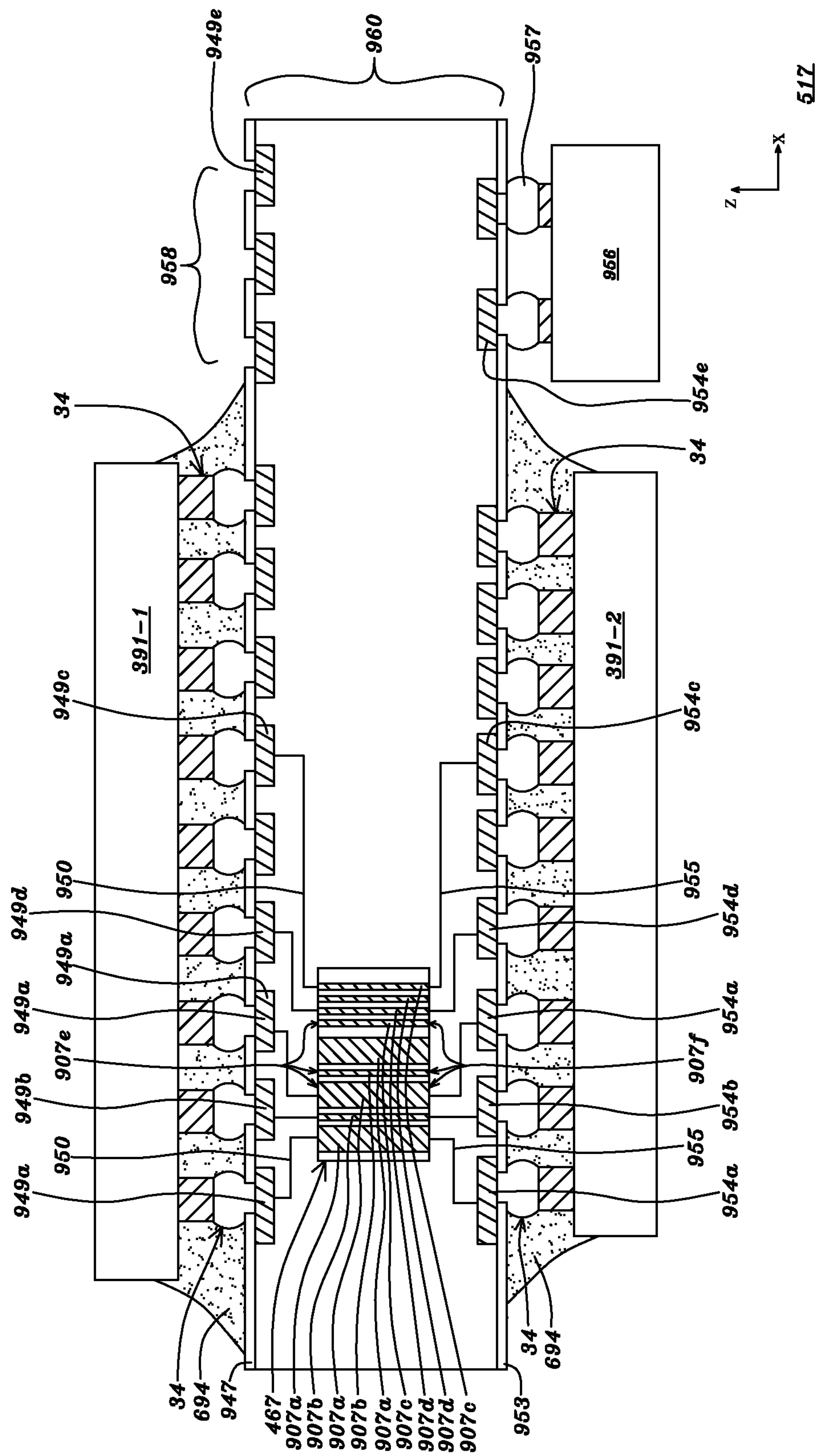
FIG. 24E is a circuit diagram in an x-z plane showing a seventh type of chip package in accordance with an embodiment of the present application.
Figure 25:
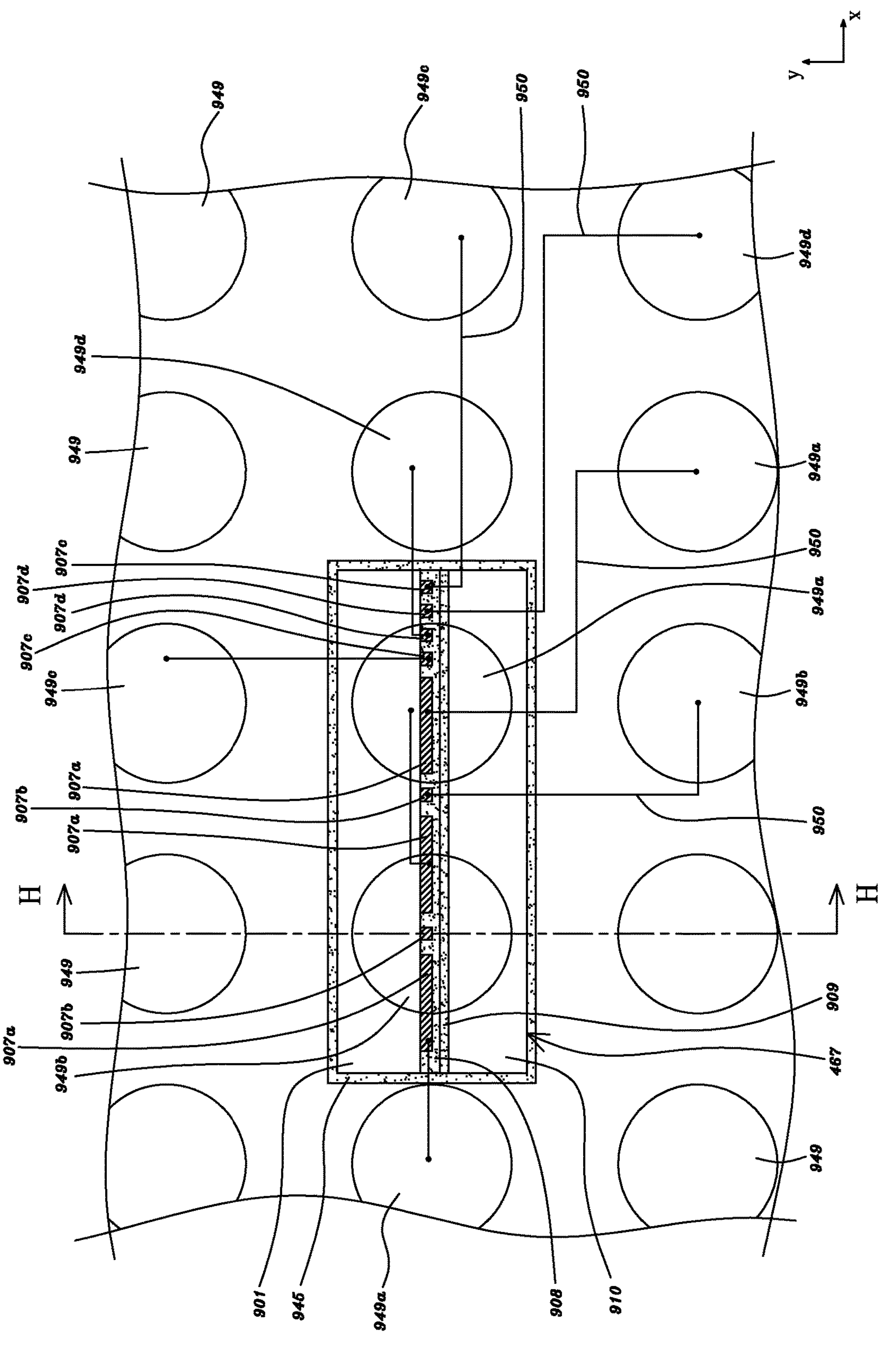
FIG. 25 is a schematically top view showing a region of a circuit substrate in an x-y plane in accordance with an embodiment of the present application.

Next, the polymer layers 948, 676 and 953 and the core layer 661 may be cut or diced to separate multiple individual units each for a circuit substrate 960 as shown in FIGS. 24C and 24D by a laser cutting process or mechanical cutting process. FIG. 25 is a schematically top view showing a region of a circuit substrate in an x-y plane in accordance with an embodiment of the present application, wherein FIG. 24C is a cross-sectional view along a cross-sectional line H-H of FIG. 25. FIG. 24E is a circuit diagram in an x-z plane showing a seventh type of chip package in accordance with an embodiment of the present application. Referring to FIGS. 24C-24E and 25, for each of the circuit substrates 960, the topmost one of the interconnection metal layers 947 of its top interconnection scheme 946 may be patterned with multiple rerouted metal pads 949 on a top surface of one of the polymer layers 948 of its top interconnection scheme 946, and the interconnection metal layers 947 of its top interconnection scheme 946 may be patterned with multiple rerouted metal traces 950 each coupling one of its rerouted metal pads 949 to one of the top metal pads or contacts 907*e*, 907*n*, 907*u*, 917*d*, 918*d*, 919*a* and/or 919*c* of one of its vertical-through-via (VTV) connectors 467 or one of the top metal pads or contacts 927*e* of one of its pad-enlarged vertical-through-via (VTV) connectors 469. The bottommost one of the interconnection metal layers 952 of its bottom interconnection scheme 951 may be patterned with multiple rerouted metal pads 954 on a bottom surface of one of the polymer layers 953 of its bottom interconnection scheme 951, and the interconnection metal layers 952 of its bottom interconnection scheme 951 may be patterned with multiple rerouted metal traces 955 each coupling one of its rerouted metal pads 954 to one of the bottom metal pads or contacts 907*f*, 907*v*, 917*e*, 918*e*, 919*b* and/or 919*d* of one of its vertical-through-via (VTV) connectors 467 or one of the bottom metal pads or contacts 927*f* of one of its pad-enlarged vertical-through-via (VTV) connectors 469.

In particular, FIGS. 24E and 25 show the first type of vertical-through-via (VTV) connector 467 as illustrated in FIGS. 4A-4I and 5A-5C is embedded in the circuit substrate 960. For example, referring to FIGS. 24E and 25, for the circuit substrate 960, the rerouted metal pads 949 of its top interconnection scheme 946 may include (1) a first group of rerouted metal pads 949*a* each coupling to the top metal pad or contact 907*e* of one of the ground metal lines 907*a* of its first type of vertical-through-via (VTV) connector 467 through one of the rerouted metal traces 950 of its top interconnection scheme 946, (2) a second group of rerouted metal pads 949*b* each coupling to the top metal pad or contact 907*e* of one of the transmission metal lines 907*b* of its first type of vertical-through-via (VTV) connector 467 through one of the rerouted metal traces 950 of its top interconnection scheme 946, (3) a third group of rerouted metal pads 949*c* each coupling to the top metal pad or contact 907*e* of one of the ground metal lines 907*c* of its first type of vertical-through-via (VTV) connector 467 through one of the rerouted metal traces 950 of its top interconnection scheme 946, and (4) a fourth group of rerouted metal pads 949*d* each coupling to the top metal pad or contact 907*e* of one of the signal metal lines 907*d* of its first type of vertical-through-via (VTV) connector 467 through one of the rerouted metal traces 950 of its top interconnection scheme 946. The rerouted metal pads 954 of its bottom interconnection scheme 951 may include (1) a first group of rerouted metal pads 954*a* each coupling to the bottom metal pad or contact 907*f* of one of the ground metal lines 907*a* of its first type of vertical-through-via (VTV) connector 467 through one of the rerouted metal traces 955 of its bottom interconnection scheme 951, (2) a second group of rerouted metal pads 954*b* each coupling to the top bottom pad or contact 907*f* of one of the transmission metal lines 907*b* of its first type of vertical-through-via (VTV) connector 467 through one of the rerouted metal traces 955 of its bottom interconnection scheme 951, (3) a third group of rerouted metal pads 954*c* each coupling to the bottom metal pad or contact 907*f* of one of the ground metal lines 907*c* of its first type of vertical-through-via (VTV) connector 467 through one of the rerouted metal traces 955 of its bottom interconnection scheme 951, and (4) a fourth group of rerouted metal pads 954*d* each coupling to the bottom metal pad or contact 907*f* of one of the signal metal lines 907*d* of its first type of vertical-through-via (VTV) connector 467 through one of the rerouted metal traces 950 of its bottom interconnection scheme 951.

FIG. 24E shows a circuit diagram of a seventh type of chip package in an x-z plane in accordance with an embodiment of the present application. For forming a seventh type of chip package 517, multiple function units 391-1 and 391-2 may be provided to be bonded to the circuit substrate 960. Each of the functional units 391-1 and 391-2 may be any of (1) a semiconductor integrated-circuit (IC) chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, high-bit-width memory chip, volatile memory integrated-circuit (IC) chip, dynamic-random-access-memory (DRAM) integrated-circuit (IC) chip, static-random-access-memory (SRAM) integrated-circuit (IC)

chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip, having the same specification as the first type of semiconductor integrated-circuit (IC) chip 100 as illustrated in FIG. 3A, with the semiconductor integrated-circuit (IC) chip 391-1 being shown upside down in FIG. 24E with the micro-bumps or micro-pads 34 thereof shown at the bottom thereof each bonded to one of the rerouted metal pads 949 of the circuit substrate 960, or with the semiconductor integrated-circuit (IC) chip 391-2 being shown in FIG. 24E with the micro-bumps or micro-pads 34 shown at the top thereof each bonded to one of the rerouted metal pads 954 of the circuit substrate 960, (2) a sub-system module having the same specification as the first type of sub-system module 190 as illustrated in FIGS. 13A and 13B, with the sub-system module 391-1 being shown upside down in FIG. 24E with the micro-bumps or micro-pads 34 thereof shown at the bottom thereof each bonded to one of the rerouted metal pads 949 of the circuit substrate 960, or with the sub-system module 391-2 being shown in FIG. 24E with the micro-bumps or micro-pads 34 shown at the top thereof each bonded to one of the rerouted metal pads 954 of the circuit substrate 960, and (3) a memory module having the same specification as the first type of memory module 159 illustrated in FIG. 11A, with the memory module 391-1 being shown in FIG. 24E with the micro-bumps or micro-pads 34 shown at the bottom thereof each bonded to one of the rerouted metal pads 949 of the circuit substrate 960, or with the memory module 391-2 being shown upside down in FIG. 24E with the micro-bumps or micro-pads 34 thereof shown at the top thereof each bonded to one of the rerouted metal pads 954 of the circuit substrate 960.

For more elaboration, referring to FIG. 24E, the functional unit 391-1 may be provided with the micro-bumps or micro-pads 34, each of which may have the same specification as the second type of micro bumps or micro-pads 34 as illustrated in FIG. 3A, each having the solder cap 33 to be bonded to a top surface of one of the rerouted metal pads 949 of the circuit substrate 960, and the functional unit 391-2 may be provided with the micro-bumps or micro-pads 34, each of which may have the same specification as the second type of micro-bumps or micro-pads 34 as illustrated in FIG. 3A, each having the solder cap 33 to be bonded to a bottom surface of one of the rerouted metal pads 954 of the circuit substrate 960. Alternatively, the functional unit 391-1 may be provided with the micro-bumps or micro-pads 34, each of which may have the same specification as the third type of micro-bumps or micro-pads 34 as illustrated in FIGS. 3A, 12A and 12B, each having the solder cap 38 to be bonded to a top surface of one of the rerouted metal pads 949 of the circuit substrate 960, and the functional units 391-2 may be provided with the micro-bumps or micro-pads 34, each of which may have the same specification as the third type of micro-bumps or micro-pads 34 as illustrated in FIGS. 3A, 12A and 12B, each having the solder cap 38 to be bonded to a bottom surface of one of the rerouted metal pads 954 of the circuit substrate 960.

Referring to FIG. 24E, an underfill 694, e.g., polymer layer, may be filled into a gap between the circuit substrate 960 and the functional unit 391-1, covering a sidewall of each the micro-bumps or micro-pads 34 of the functional unit 391-1, and may be filled into a gap between the circuit substrate 960 and the functional unit 391-2, covering a sidewall of each the micro-bumps or micro-pads 34 of the functional unit 391-2.

Furthermore, referring to FIG. 24E, the rerouted metal pads 954 of the bottom interconnection scheme 951 of the circuit substrate 960 may include a fifth group of rerouted metal pads 954*e* having one or more passive devices 956, each of which may be a resister, capacitor or inductor, bonded thereto by a tin-containing solder 957 therebetween. The rerouted metal pads 949 of the top interconnection scheme 946 of the circuit substrate 960 may include a fifth group of rerouted metal pads 949*e* used as an input/output port 958 arranged for connection with an external circuit.

Referring to FIGS. 24C-24E and 25, for the seventh type of chip package 517, its functional unit 391-1 may couple to its functional unit 391-2 through, in sequence, (1) one of the micro-bump or micro-pad 34 of its functional unit 391-1, (2) one of the rerouted metal traces 950 of its circuit substrate 960, (3) one of the interconnection metal layers 907 of one of the vertical-through-via (VTV) connectors 467 or pad-enlarged vertical-through-via (VTV) connectors 469 of its circuit substrate 960, i.e., one of the ground metal lines 907*a*, transmission metal lines 907*b*, ground metal lines 907*c* and signal metal lines 907*d* of one of the vertical-through-via (VTV) connectors 467 of its circuit substrate 960 in case of said one of the vertical-through-via (VTV) connectors 467 having the same specification as the first type of vertical-through-via (VTV) connector 467 as illustrated in FIGS. 4A-4I and 5A-5C, (4) one of the rerouted metal traces 955 of its circuit substrate 960, and (5) one of the micro-bump or micro-pad 34 of its functional unit 391-2. Further, its functional unit 391-1 may couple to its passive device 956 through, in sequence, (1) one of the micro-bump or micro-pad 34 of its functional unit 391-1, (2) one of the rerouted metal traces 950 of its circuit substrate 960, (3) one of the interconnection metal layers 907 of one of the vertical-through-via (VTV) connectors 467 or pad-enlarged vertical-through-via (VTV) connectors 469 of its circuit substrate 960, i.e., one of the ground metal lines 907*a*, transmission metal lines 907*b*, ground metal lines 907*c* and signal metal lines 907*d* of one of the vertical-through-via (VTV) connectors 467 of its circuit substrate 960 in case of said one of the vertical-through-via (VTV) connectors 467 having the same specification as the first type of vertical-through-via (VTV) connector 467 as illustrated in FIGS. 4A-4I and 5A-5C, (4) one of the rerouted metal traces 955 of its circuit substrate 960, and (5) the tin-containing solder 957. Further, its input/output port 958 may couple to its functional unit 391-2 through, in sequence, (1) one of the micro-bump or micro-pad 34 of its functional unit 391-1, (2) one of the rerouted metal traces 950 of its circuit substrate 960, (3) one of the interconnection metal layers 907 of one of the vertical-through-via (VTV) connectors 467 or pad-enlarged vertical-through-via (VTV) connectors 469 of its circuit substrate 960, i.e., one of the ground metal lines 907*a*, transmission metal lines 907*b*, ground metal lines 907*c* and signal metal lines 907*d* of one of the vertical-through-via (VTV) connectors 467 of its circuit substrate 960 in case of said one of the vertical-through-via (VTV)

connectors 467 having the same specification as the first type of vertical-through-via (VTV) connector 467 as illustrated in FIGS. 4A-4I and 5A-5C, (4) one of the rerouted metal traces 955 of its circuit substrate 960, and (5) one of the micro-bump or micro-pad 34 of its functional unit 391-2. For example, referring to FIGS. 24C, 24E and 25, for the seventh type of chip package 517, its functional unit 391-1 may be a radio-frequency (RF) integrated-circuit (IC) chip coupling to its functional unit 391-2, such as digital-signal-processing (DSP) integrated-circuit (IC) chip, through, in sequence, (1) one of the micro-bump or micro-pad 34 of its functional unit 391-2, (2) one of the rerouted metal pads 949*b* of its circuit substrate 960, (3) one of the rerouted metal traces 950 of its circuit substrate 960, (4) one of the transmission metal lines 907*b* of one of the vertical-through-via (VTV) connectors 467 of its circuit substrate 960 in case of said one of the vertical-through-via (VTV) connectors 467 having the same specification as the first type of vertical-through-via (VTV) connector 467 as illustrated in FIGS. 4A-4I and 5A-5C, (5) one of the rerouted metal traces 955 of its circuit substrate 960, (6) one of the rerouted metal pads 954*b* of its circuit substrate 960, and (7) one of the micro bump or micro-pad 34 of its functional unit 391-2, for signal transmission in a high frequency greater than 10, 20, 30, or 50 GHz therebetween, wherein said one of the micro-bump or micro-pad 34 of its functional unit 391-2, said one of the rerouted metal pads 949*b* of its circuit substrate 960, said one of the rerouted metal pads 954*b* of its circuit substrate 960, and said one of the micro-bump or micro-pad 34 of its functional unit 391-2 may be vertically aligned in a line.

8. Structure for Eighth Type of Chip Package and Process for Forming the Same

Figure 26A:
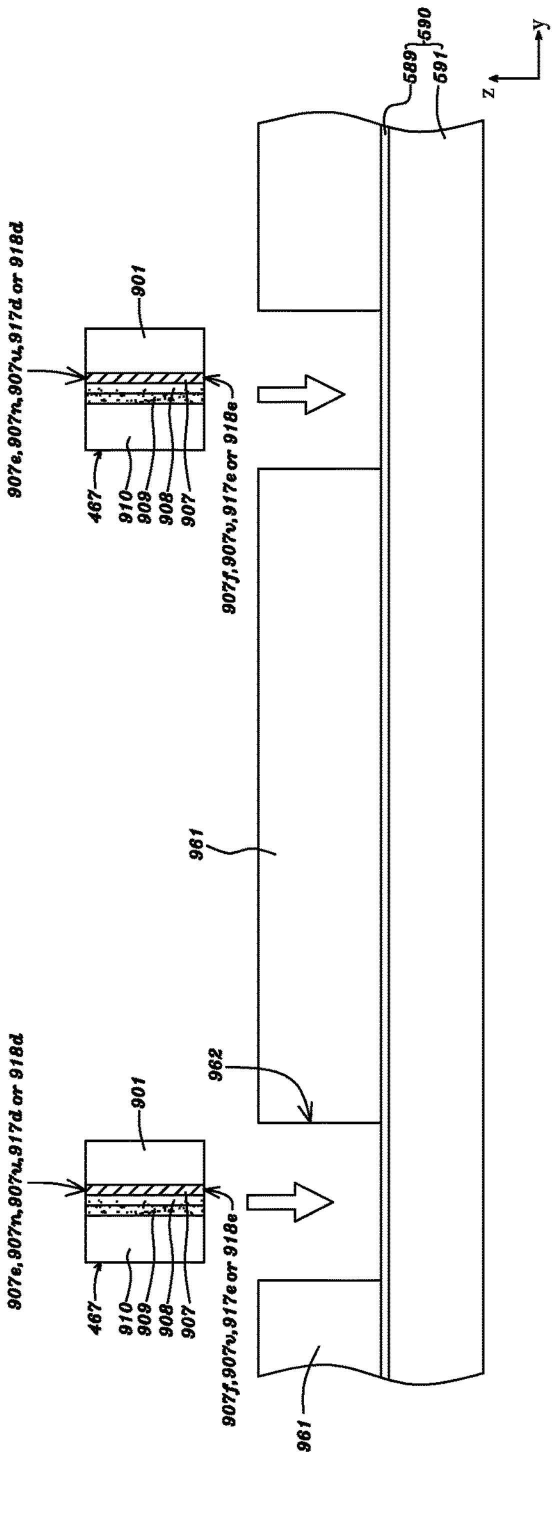
FIGS. 26A-26G are schematically cross-sectional views in a y-z plane showing a process for fabricating an eighth type of chip package for a first alternative in accordance with an embodiment of the present application.

FIGS. 26A-26G are schematically cross-sectional views in a y-z plane showing a process for fabricating an eighth type of chip package for a first alternative in accordance with an embodiment of the present application. FIG. 26H is a schematically cross-sectional view in a y-z plane showing an eighth type of chip package for a second alternative in accordance with an embodiment of the present application. Referring to FIG. 26A, a temporary substrate 590 may be provided with the same specification as the temporary substrate 590 as illustrated in FIG. 10A. Further, a glass substrate 961 is provided with multiple openings 962 therein each extending in the x direction to have a longitudinal or rectangular shape with a length between 1 and 100 millimeters, between 5 and 20 millimeters, between 8 and 50 millimeters or greater than 10, 30, 50, 80 or 100 millimeters and a width between 0.2 and 3 millimeters, between 0.4 and 1 millimeters or between 0.8 and 2 millimeters. Alternatively, each of the openings 962 in the glass substrate 961 may have a circular or square shape with a diameter or width between 1 and 5 millimeters, between 5 and 10 millimeters, between 8 and 20 millimeters, or greater than 10, 30, 50, 80 or 100 millimeters. For example, the openings 962 may be formed in the glass substrate 961 by powder blasting, sand blasting, laser machining, ultrasonic machining, wet etching or water jet cutting. The glass substrate 961 may have a bottom surface to be attached to a top surface of the sacrificial bonding layer 591 of the temporary substrate 590, wherein the glass substrate 961 may have a thickness between 80 and 1,000 micrometers, between 120 and 200 micrometers, between 200 and 400 micrometers or between 400 and 1000 micrometers.

Figure 26B:
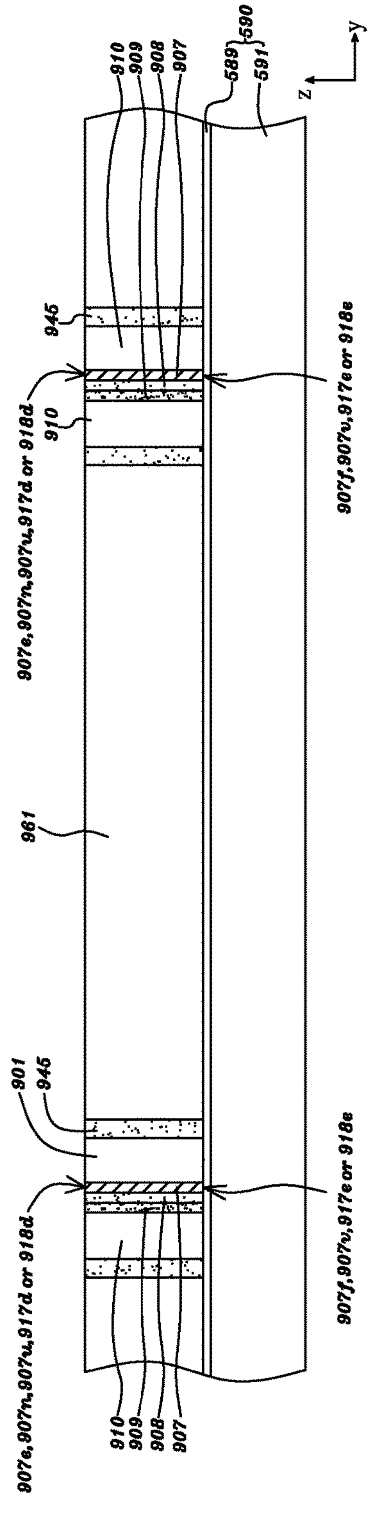

Next, referring to FIGS. 26A and 26B, multiple vertical-through-via (VTV) connectors 467, each of which may have the same specification as any type of the first through tenth types of vertical-through-via (VTV) connectors 467 as illustrated in FIGS. 4A-4I, 5A-5C, 6A-6F, 7A-7I, 8A-8F and 9A-9D, each may be placed in one of the openings 962 in the glass substrate 961 and provided with the bottom surface attached to the top surface of the sacrificial bonding layer 591 of the temporary substrate 590. In particular, FIGS. 26A-26H show each of the vertical-through-via (VTV) connectors 467 may be formed of any of the first through seventh types as seen in FIGS. 4A-4I, 5A-5C and 6A-6F. Each of the vertical-through-via (VTV) connectors 467 may be alternatively replaced with one of the first through second types of pad-enlarged vertical-through-via (VTV) connector 469 illustrated in FIGS. 4J-4P, 5D-5E and 8G-8I, each may be placed in one of the openings 962 in the glass substrate 961 and provided with the bottom surface attached to the top surface of the sacrificial bonding layer 591 of the temporary substrate 590. Next, an adhesive polymer material 945, such as epoxy-based polymer, may be filled into a gap between a sidewall of said each of the vertical-through-via (VTV) connectors 467 or pad-enlarged vertical-through-via (VTV) connectors 469 and a sidewall of said one of the openings 962 in the glass substrate 961. Next, when each of the vertical-through-via (VTV) connectors 467 or pad-enlarged vertical-through-via (VTV) connectors 469 has the top surface higher than a level of a top surface of the glass substrate 961, a polishing or grinding process may be performed to remove a top portion of each of the vertical-through-via (VTV) connectors 467 or pad-enlarged vertical-through-via (VTV) connectors 469 such that the top surface of the glass substrate 961 may be coplanar with the top surface of each of the vertical-through-via (VTV) connectors 467 or pad-enlarged vertical-through-via (VTV) connectors 469, that is, the top metal pads or contacts 907*e*, 907*n*, 907*u*, 917*d*, 918*d*, 919*a* and/or 919*c* of each of the vertical-through-via (VTV) connectors 467, or the top metal pads or contacts 927*e* of each of the pad-enlarged vertical-through-via (VTV) connectors 469, the top surface of each of the supporting substrates 901 of each of the vertical-through-via (VTV) connectors 467 or pad-enlarged vertical-through-via (VTV) connectors 469, i.e., the top surface of the glass substrate for said each of the supporting substrates 901 or the top surface of the silicon substrate for said each of the supporting substrates 901, and the top surface of the covering substrate 910 of each of the vertical-through-via (VTV) connectors 467 or pad-enlarged vertical-through-via (VTV) connectors 469, i.e., the top surface of the glass substrate for the covering substrate 910 of said each of the vertical-through-via (VTV) connectors 467 or pad-enlarged vertical-through-via (VTV) connectors 469 or the top surface of the silicon substrate for the covering substrate 910 of said each of the vertical-through-via (VTV) connectors 467 or pad-enlarged vertical-through-via (VTV) connectors 469.

Figures 26C, 26D:
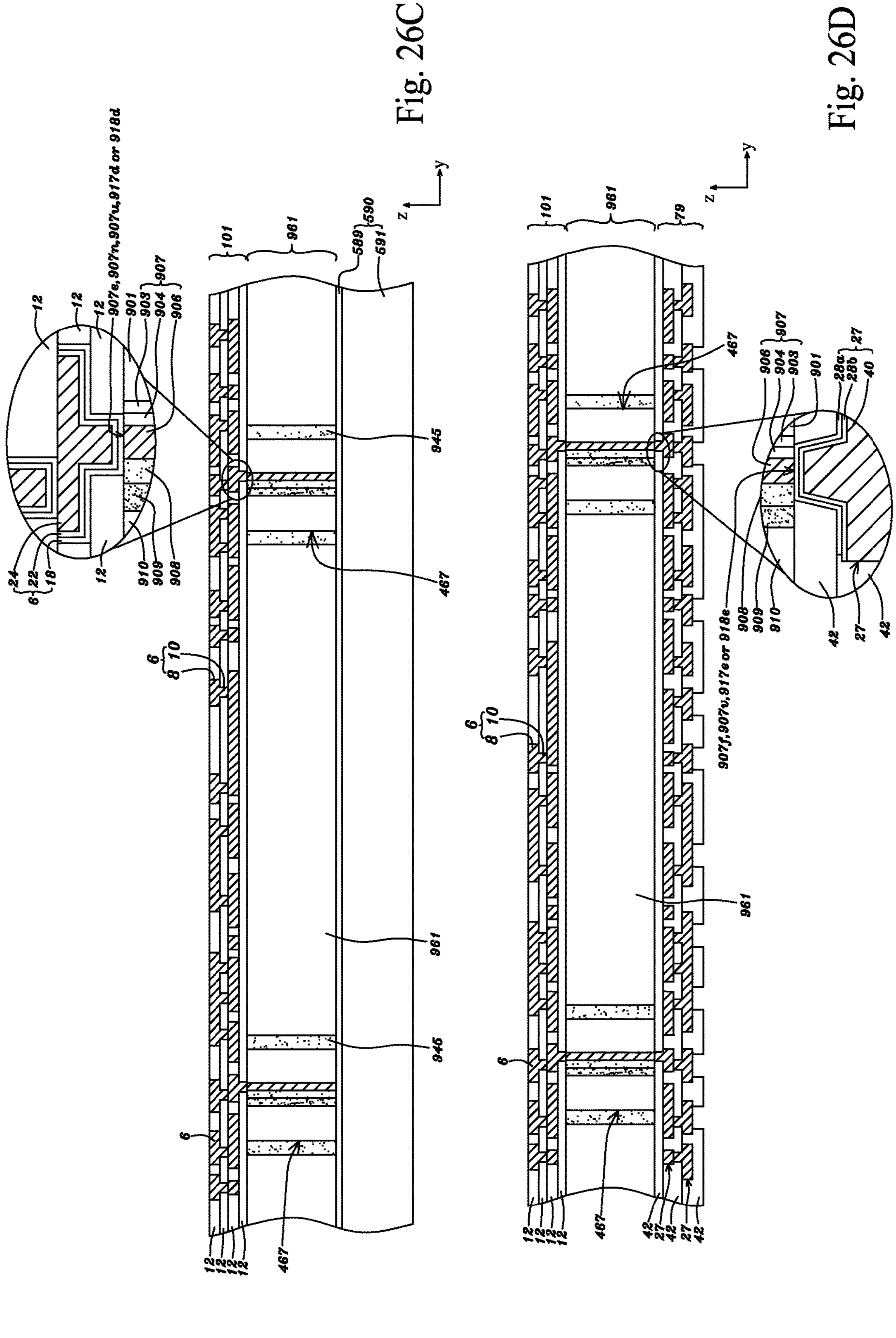

Next, referring to FIG. 26C, a frontside interconnection scheme for a device (FISD) 101 may be formed on the top surface of the glass substrate 961 and the top side of each of the vertical-through-via (VTV) connectors 467 or pad-enlarged vertical-through-via (VTV) connectors 469. The frontside interconnection scheme for a device (FISD) 101 may include multiple insulating dielectric layers 12 and multiple interconnection metal layers 6 each in neighboring two of its insulating dielectric layers 12, wherein each of its interconnection metal layers 6 may couple to the top metal pads or contacts 907*e*, 907*n*, 907*u*, 917*d*, 918*d*, 919*a* and/or 919*c* of each of the vertical-through-via (VTV) connectors 467, or the top metal pads or contacts 927*e* of each of the pad-enlarged vertical-through-via (VTV) connectors 469, wherein each of its interconnection metal layers 6 may be patterned with multiple metal pads, lines or traces 8 in an upper one of the neighboring two of its insulating dielectric layers 12 and multiple metal vias 10 in a lower one of the neighboring two of its insulating dielectric layers 12, wherein between each neighboring two of its interconnection metal layers 6 is provided one of its insulating dielectric layers 12, wherein an upper one of its interconnection metal layers 6 may couple to a lower one of its interconnection metal layers 6 through an opening in one of its insulating dielectric layers 12 between the upper and lower ones of its interconnection metal layers 6. Each of the interconnection metal layers 6 of the frontside interconnection scheme for a device (FISD) 101 may have the same specification as that of the first interconnection scheme 560 of the first type of semiconductor integrated-circuit (IC) chip 100 as illustrated in FIG. 3A, and each of the insulating dielectric layers 12 of the frontside interconnection scheme for a device (FISD) 101 may have the same specification as that of the first interconnection scheme 560 of the first type of semiconductor integrated-circuit (IC) chip 100 as illustrated in FIG. 3A. Each of the interconnection metal layers 6 of the frontside interconnection scheme for a device (FISD) 101 may extend horizontally across over an edge of each of the vertical-through-via (VTV) connectors 467 or pad-enlarged vertical-through-via (VTV) connectors 469.

Next, the glass or silicon substrate 589 as seen in FIG. 26C may be released from the sacrificial bonding layer 591, which may be referred to the step as illustrated in FIG. 10E. Next, the remainder of the sacrificial bonding layer 591 may be pulled off, which may be referred to the step as illustrated in FIG. 10E such that the bottom surface of each of the vertical-through-via (VTV) connectors 467 or pad-enlarged vertical-through-via (VTV) connectors 469 and the bottom surface of the glass substrate 961 may be exposed; for each of the vertical-through-via (VTV) connectors 467 or pad-enlarged vertical-through-via (VTV) connectors 469, the bottom surface of each of its bottom metal pads or contacts 907*f*, 907*v*, 917*e*, 918*e*, 919*b* and/or 919*d*, or the bottom surface of each of its bottom metal pads or contacts 927*f*, the bottom surface of each of its supporting substrate(s) 901, i.e., the bottom surface of the glass substrate for each of its supporting substrate(s) 901 or the bottom surface of the silicon substrate for each of its supporting substrate(s) 901, and the bottom surface of its covering substrate 910, i.e., the bottom surface of the glass substrate for its covering substrate 910 or the bottom surface of the silicon substrate for its covering substrate 910, may be exposed and coplanar with the bottom surface of the glass substrate 961.

Next, referring to FIG. 26D, a backside interconnection scheme for a device (BISD) 79 may be formed on the bottom surface of the glass substrate 961 and the bottom side of each of the vertical-through-via (VTV) connectors 467 or pad-enlarged vertical-through-via (VTV) connectors 469. The backside interconnection scheme for a device (BISD) 79 may include (1) one or more interconnection metal layers 27 coupling to each of the bottom metal pads or contacts 907*f*, 907*v*, 917*e*, 918*e*, 919*b* and/or 919*d* of each of the vertical-through-via (VTV) connectors 467, or each of the bottom metal pads or contacts 927*f* of each of the pad-enlarged vertical-through-via (VTV) connectors 469, and (2) one or more polymer layers 42, i.e., insulating dielectric layers, each between neighboring two of its interconnection metal layers 27, between the topmost one of its interconnection metal layers 27 and a planar bottom surface composed of the bottom surface of the glass substrate 961 and the bottom surface of each of the vertical-through-via (VTV) connectors 467 or pad-enlarged vertical-through-via (VTV) connectors 469, or under the bottommost one of its interconnection metal layers 27, wherein a lower one of its interconnection metal layers 27 may couple to an upper one of its interconnection metal layers 27 through an opening in one of its polymer layers 42 between the lower and upper ones of its interconnection metal layers 27, wherein each opening in the topmost one of its polymer layers 42 may be vertically under one of the bottom metal pads or contacts 907*f*, 907*v*, 917*e*, 918*e*, 919*b* and/or 919*d* of one of the vertical-through-via (VTV) connectors 467, or one of the bottom metal pads or contacts 927*f* of one of the pad-enlarged vertical-through-via (VTV) connectors 469, wherein the bottommost one of its interconnection metal layers 27 may be patterned with multiple metal pads at tops of multiple openings in the bottommost one of its polymer layers 42. Each of the interconnection metal layers 27 of the backside interconnection scheme for a device (BISD) 79 may extend horizontally across under an edge of each of the vertical-through-via (VTV) connector 467 or pad-enlarged vertical-through-via (VTV) connectors 469. Each of the interconnection metal layers 27 of the backside interconnection scheme for a device (BISD) 79 may have the same specification as that of the second interconnection scheme 588 of the first type of semiconductor integrated-circuit (IC) chip 100 as illustrated in FIG. 3A but shown upside down in FIG. 26D, and each of the polymer layers 42 of the backside interconnection scheme for a device (BISD) 79 may have the same specification as that of the second interconnection scheme 588 of the first type of semiconductor integrated-circuit (IC) chip 100 as illustrated in FIG. 3A but shown upside down in FIG. 26D.

Figure 26E:
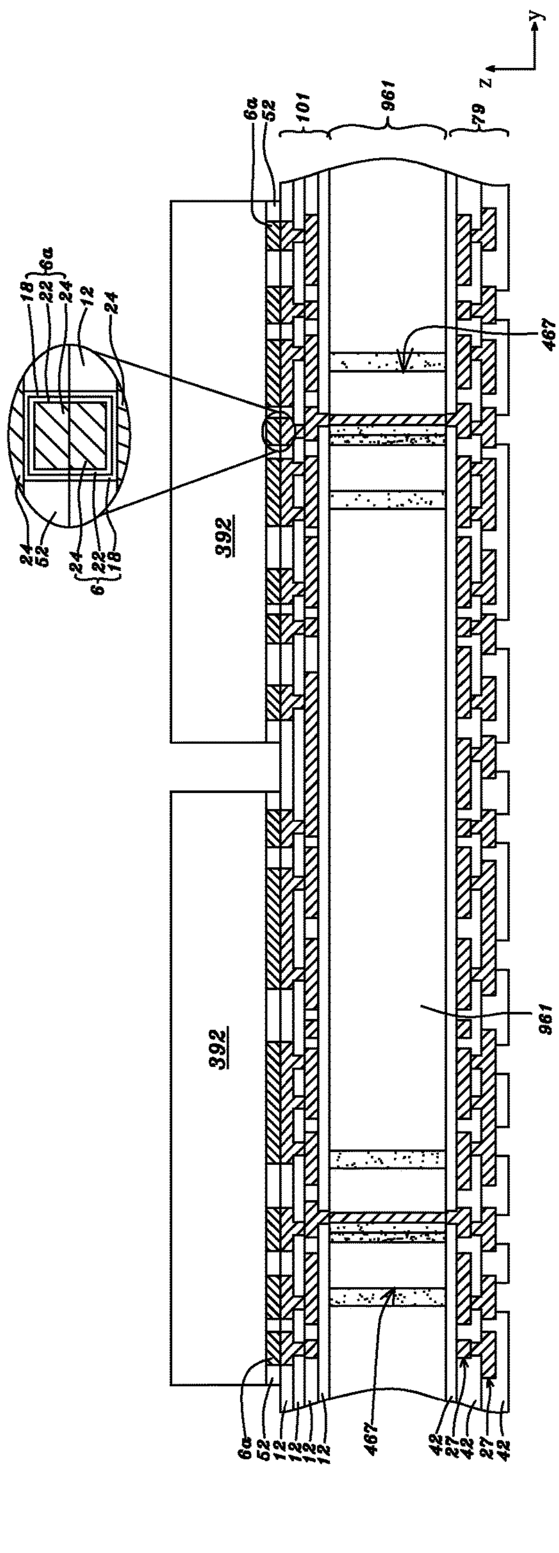

Next, referring to FIG. 26E, multiple semiconductor integrated-circuit (IC) chips 392, each of which may have the same specification as the third type of semiconductor integrated-circuit (IC) chip 100 illustrated in FIG. 3C, each may be turned upside down with the insulating bonding layer 52 and metal pads 6*a* at the bottom thereof to be bonded to the frontside interconnection scheme for a device (FISD) 101 using an oxide-to-oxide and metal-to-metal direct bonding method. The oxide-to-oxide and metal-to-metal direct bonding method may include (1) oxide-to-oxide bonding the insulating bonding layer 52, e.g., a layer of silicon dioxide, of each of the semiconductor integrated-circuit (IC) chips 392 to the topmost one of the insulating dielectric layers 12, e.g., a layer of silicon dioxide, of the frontside interconnection scheme for a device (FISD) 101, and (2) metal-to-metal bonding, e.g., copper-to-copper bonding, the metal pads 6*a*, such as copper pads, of each of the semiconductor integrated-circuit (IC) chips 392 to the topmost one of the interconnection metal layers 6, i.e., the copper layer 24 thereof, of the frontside interconnection scheme for a device (FISD) 101. Each of the semiconductor integrated-circuit (IC) chips 392 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip.

Figure 26F:
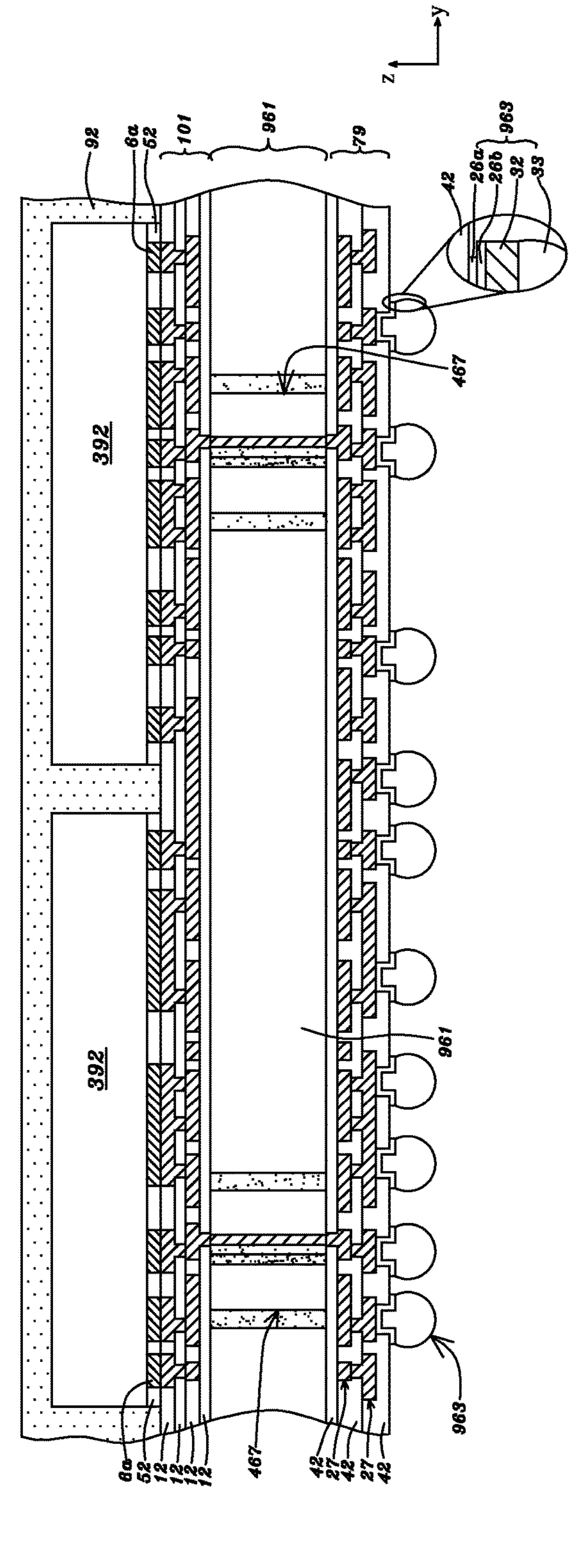

Next, referring to FIG. 26F, a polymer layer 92, or insulating dielectric layer, may be applied to cover the frontside interconnection scheme for a device (FISD) 101 and each of the semiconductor integrated-circuit (IC) chips 392 and to fill a gap between each neighboring two of the semiconductor integrated-circuit (IC) chips 392 by methods, for example, spin-on coating, screen-printing, dispensing or molding. The polymer layer 92 may have the same specification as the polymer layer 92 of the first type of stacking unit 421 illustrated in FIGS. 14A-14E.

Next, referring to FIG. 26F, multiple micro-bumps or micro-pads 963 may be formed on a bottom surface of the bottommost one of the interconnection metal layers 27 of the backside interconnection scheme for a device (BISD) 79 at a top of one of the openings in the bottommost one of the polymer layers 42 of the backside interconnection scheme for a device (BISD) 79. Each of the micro-bumps or micro-pads 963 may be of one of the first through fourth types having the same specifications as the first through fourth types of micro-bumps or micro-pads 34 as illustrated in FIG. 3A respectively, having the adhesion layer 26*a* formed on a bottom surface of the copper layer 40 of the bottommost one of the interconnection metal layers 27 of the backside interconnection scheme for a device (BISD) 79.

Figure 26G:
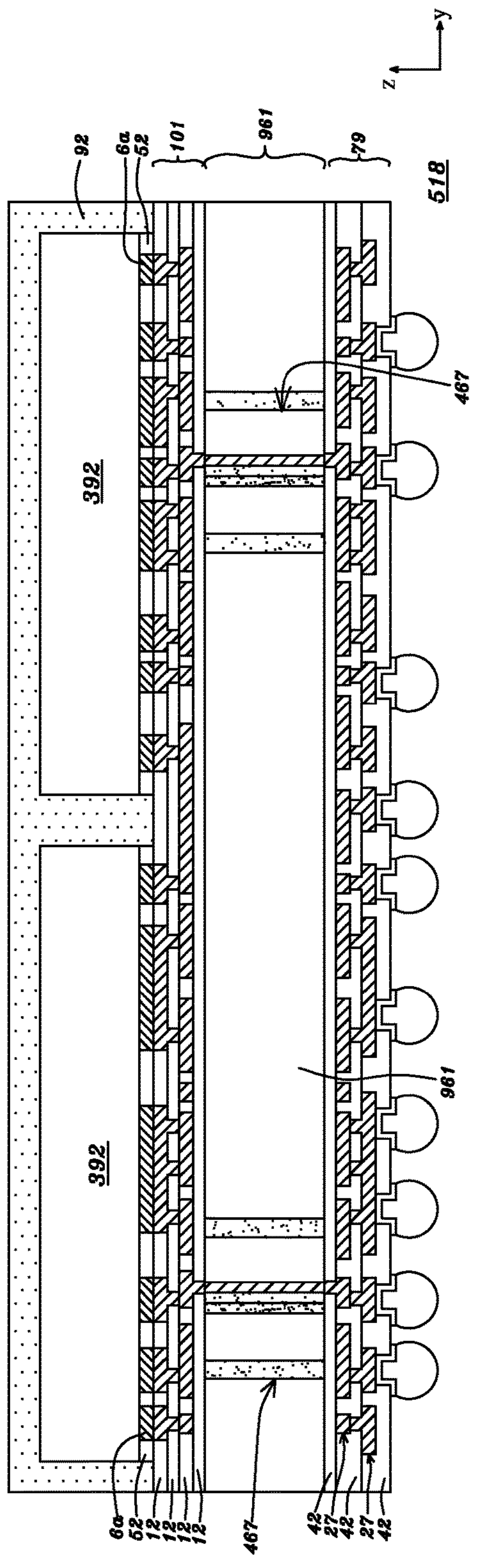
Figure 26H:
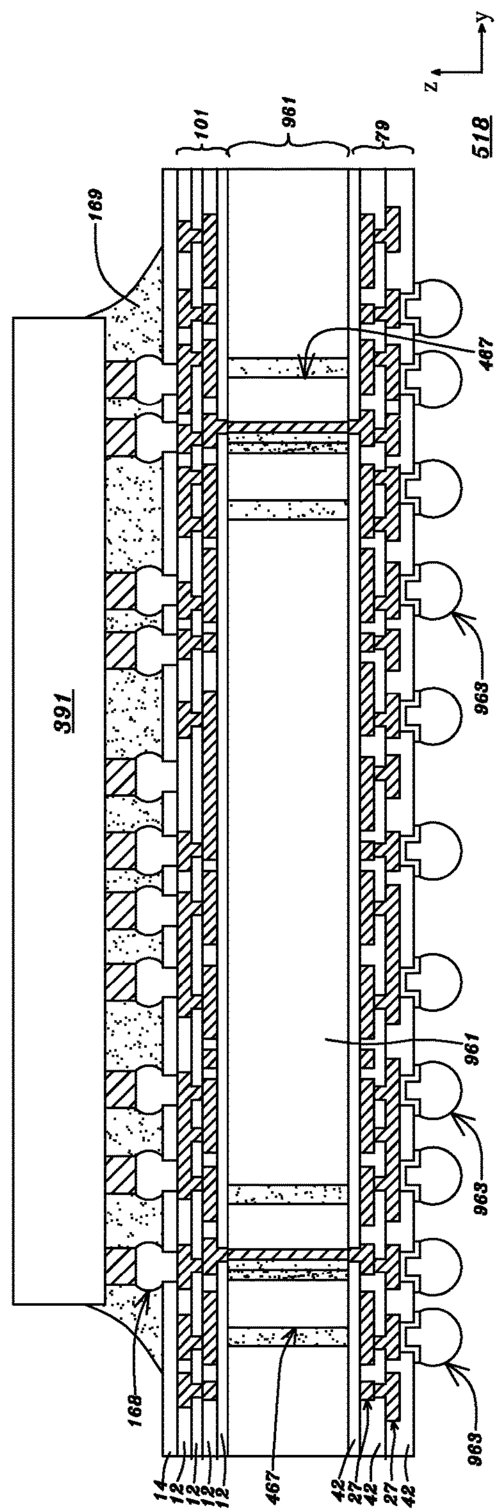
FIG. 26H is a schematically cross-sectional view in a y-z plane showing an eighth type of chip package for a second alternative in accordance with an embodiment of the present application.

Next, the polymer layer 92, each of the insulating dielectric layers 12 of the frontside interconnection scheme for a device (FISD) 101, the glass substrate 961 and each of the polymer layers 42 of the backside interconnection scheme for a device (BISD) 79 may be cut or diced to separate multiple individual units (only one is shown) each for an eighth type of chip package 518 for a first alternative as shown in FIG. 26G by a laser cutting process or mechanical cutting process.

Alternatively, referring to FIG. 26H, an eighth type of chip package 518 for a second alternative may have a similar structure to the eighth type of chip package 518 for the first alternative illustrated in FIGS. 26A-26G. For an element indicated by the same reference number shown in FIGS. 26A-26H, the specification of the element as seen in FIG. 26H may be referred to that of the element as illustrated in FIG. 26A-26G. Referring to FIG. 26H, after forming the frontside interconnection scheme for a device (FISD) 101 on the top surface of the glass substrate 961 and on the top surface of each of the vertical-through-via (VTV) connectors 467 or pad-enlarged vertical-through-via (VTV) connectors 469 as seen in FIG. 26C, a passivation layer 14 may be further formed on the topmost one of the interconnection metal layers 6 and the topmost one of the insulating dielectric layers 12, wherein each opening in the passivation layer 14 may be formed over a contact point of the topmost one of the interconnection metal layers 6, wherein the passivation layer 14 may have the same specification as that of the passivation layer 14 of the first type of semiconductor integrated-circuit (IC) chip 100 as illustrated in FIG. 3A. Next, multiple micro-bumps or micro-pads, each of which may be of one of the first through fourth types having the same specification as the first through fourth types of micro-bumps or micro-pillars 34 as illustrated in FIG. 3A respectively, each may be formed on one of the contact points of the topmost one of the interconnection metal layers 6 of the frontside interconnection scheme for a device (FISD) 101 at a bottom of one of the openings in the passivation layer 14. Next, the backside interconnection scheme for a device (BISD) 79 as seen in FIG. 26D may be formed. Next, one or more functional units 391 may be provided to be bonded to the contact points of the topmost one of the interconnection metal layers 6 of the frontside interconnection scheme for a device (FISD) 101, wherein each of the functional units 391 may be any of (1) a semiconductor integrated-circuit (IC) chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip, having the same specification as the first type of semiconductor integrated-circuit (IC) chip 100 as illustrated in FIG. 3A but shown upside down in FIG. 26H with the micro-bumps or micro-pads 34 thereof shown at the bottom thereof each to be bonded to one of the micro-bumps or micro-pads formed on one of the contact points of the topmost one of the interconnection metal layers 6 of the frontside interconnection scheme for a device (FISD) 101 to form a bonded metal bump or contact 168 therebetween, (2) a sub-system module having the same specification as the first type of sub-system module 190 as illustrated in FIGS. 13A and 13B but shown upside down in FIG. 21 with the micro-bumps or micro-pads 34 thereof shown at the bottom thereof each to be bonded to one of the micro-bumps or micro-pads formed on one of the contact points of the topmost one of the interconnection metal layers 6 of the frontside interconnection scheme for a device (FISD) 101 to form a bonded metal bump or contact 168 therebetween, and (3) a memory module having the same specification as the first type of memory module 159 illustrated in FIG. 11A with the micro-bumps or micro-pads 34 thereof shown at the bottom thereof each to be bonded to one of the micro-bumps or micro-pads formed on one of the contact points of the topmost one of the interconnection metal layers 6 of the frontside interconnection scheme for a device (FISD) 101 to form a bonded metal bump or contact 168 therebetween, by a step for one of the first through fourth cases as illustrated in FIGS. 11A, 12A and 12B in which said each of the micro bumps or micro-pads 34 of said each of the functional units 391 may be considered as the first, second, third or fourth type of micro-bumps or micro-pads 34 of the upper one of the memory chips 251 of the memory module 159 illustrated in FIGS. 11A, 12A and 12B, and said one of the micro-bumps or micro-pads formed on said one of the contact points of the topmost one of the interconnection metal layers 6 of the frontside interconnection scheme for a device (FISD) 101 may be considered as the first, second, third or fourth type of micro-bumps or micro-pads 570 of the lower one of the memory chips 251 or the control chip 688 of the memory module 159 illustrated in FIGS. 11A, 12A and 12B. Next, an underfill 169, e.g., polymer layer, may be filled into a gap between each of the functional units 391 and the frontside interconnection scheme for a device (FISD) 101, covering a sidewall of each of the bonded metal bumps or contacts 168 therebetween. Next, the passivation layer 14, each of the insulating dielectric layers 12 of the frontside interconnection scheme for a device (FISD) 101, the glass substrate 961 and each of the polymer layers 42 of the backside interconnection scheme for a device (BISD) 79 may be cut or diced to separate multiple individual units (only one is shown) each for an eighth type of chip package 518 for the second alternative as shown in FIG. 26H by a laser cutting process or mechanical cutting process.

In another aspect, an eighth type of chip package 518 for a third alternative may have a similar structure to the eighth type of chip package 518 for the second alternative illustrated in FIG. 26H. The difference between the eighth type of chip packages 518 for the second and third alternatives is that the frontside interconnection scheme for a device (FISD) 101 of the eighth type of chip package 518 for the third alternative may be formed with (1) one or more interconnection metal layers, each having the same specification as that of one of the interconnection metal layers 27 of the second interconnection scheme 588 of the first type of semiconductor integrated-circuit (IC) chip 100 as illustrated in FIG. 3A, to replace the interconnection metal layers 6 of the frontside interconnection scheme for a device (FISD) 101 of the eighth type of chip package 518 for the second alternative, and (2) one or more polymer layers, i.e., insulating dielectric layers, each having the same specification as that of one of the polymer layers 42 of the second interconnection scheme 588 of the first type of semiconductor integrated-circuit (IC) chip 100 as illustrated in FIG. 3A, each between neighboring two of the interconnection metal layers thereof to replace the insulating dielectric layers 12 of the frontside interconnection scheme for a device (FISD) 101 of the eighth type of chip package 518 for the second alternative.

9. Structure for Circuit Substrate and Process for Forming the Same

Figure 27A:
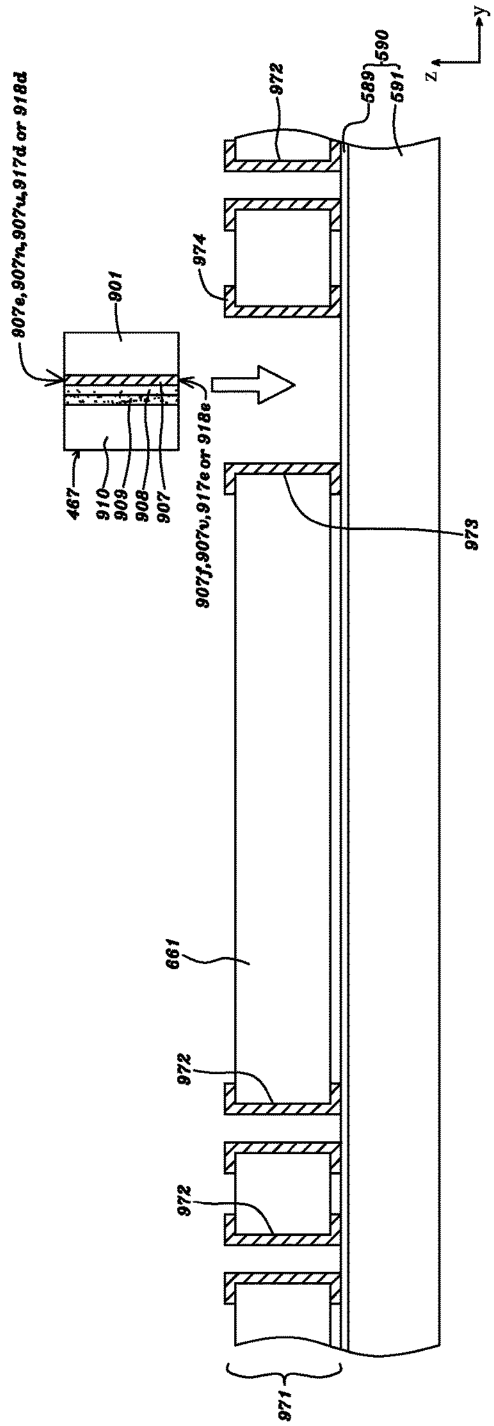
FIGS. 27A-27I are schematically cross-sectional views in a y-z plane showing a process for fabricating a circuit substrate in accordance with an embodiment of the present application.
Figure 27B:
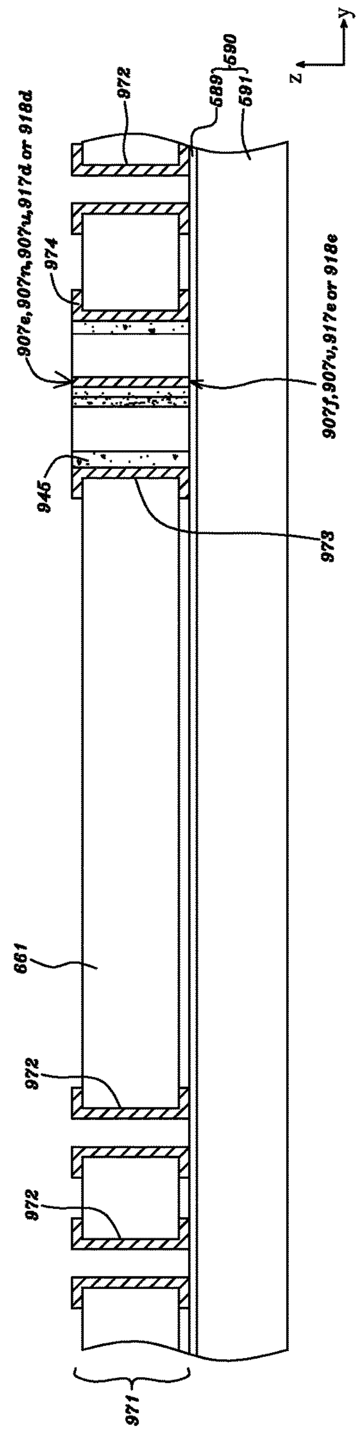
Figure 27C:
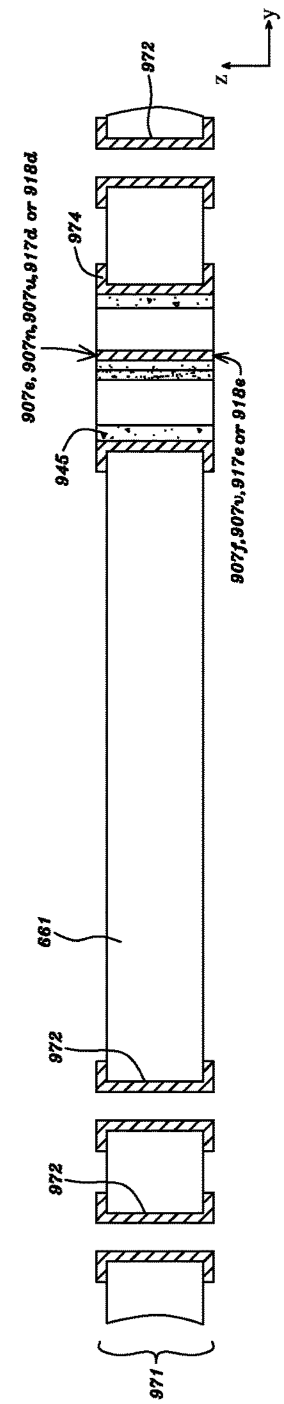
Figure 27D:
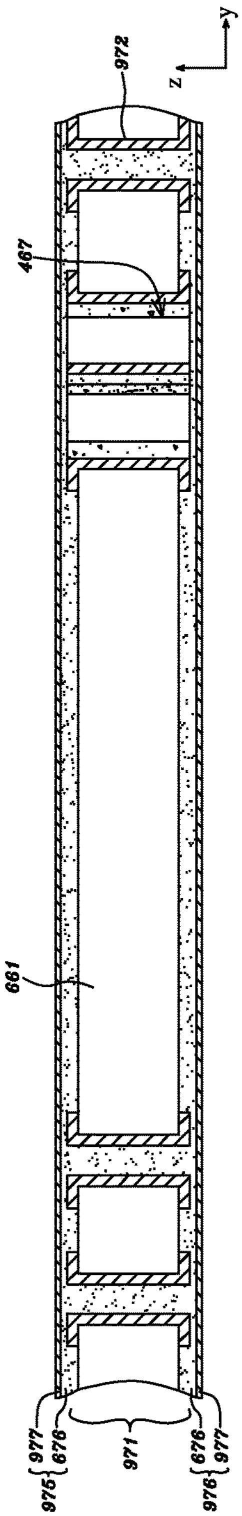
Figure 27E:
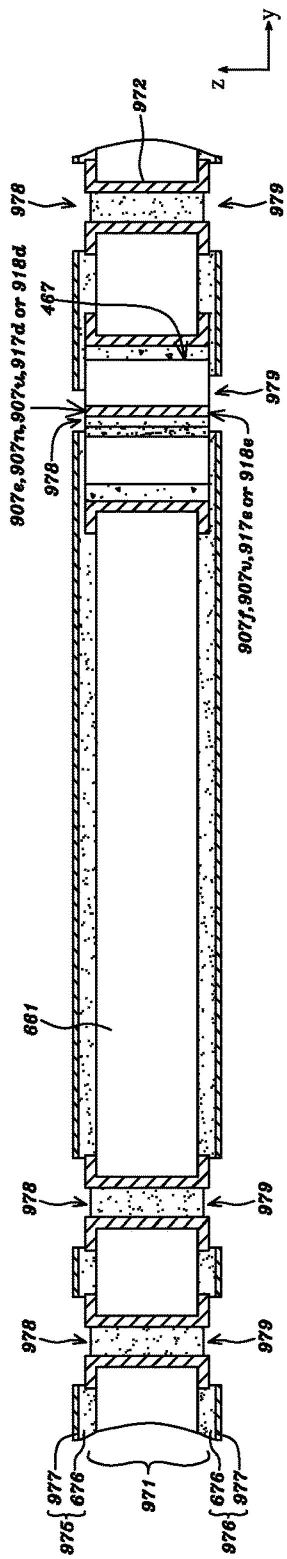
Figure 27F:
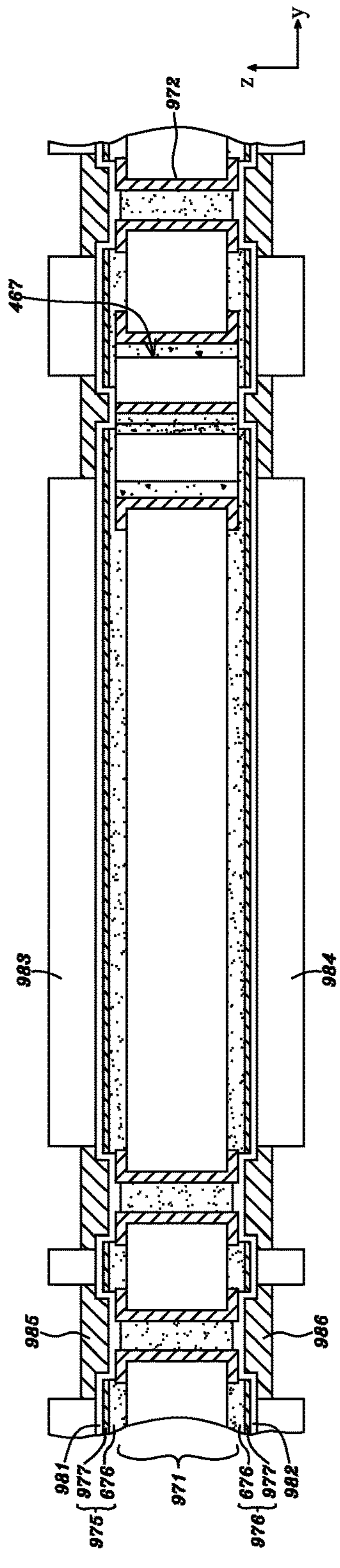
Figure 27G:
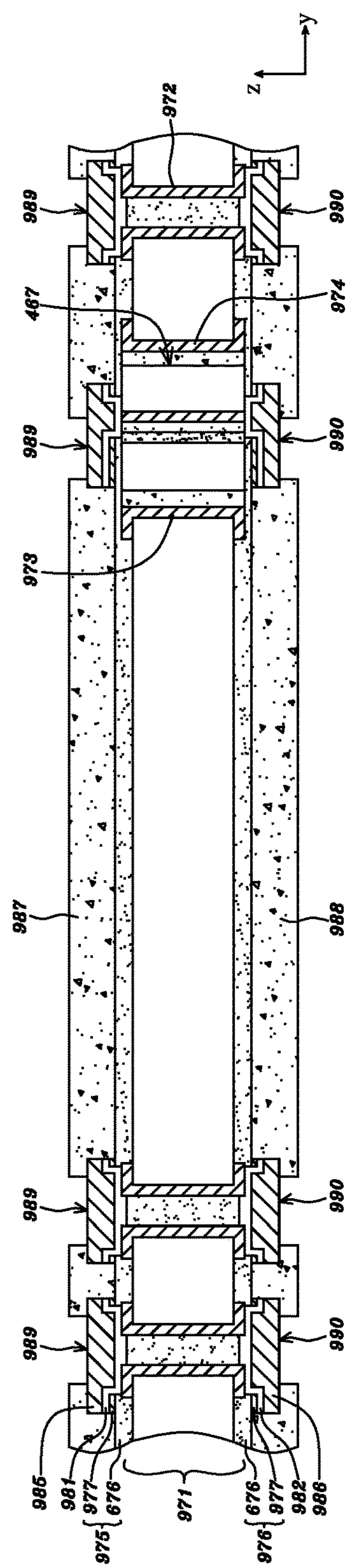
Figure 27H:
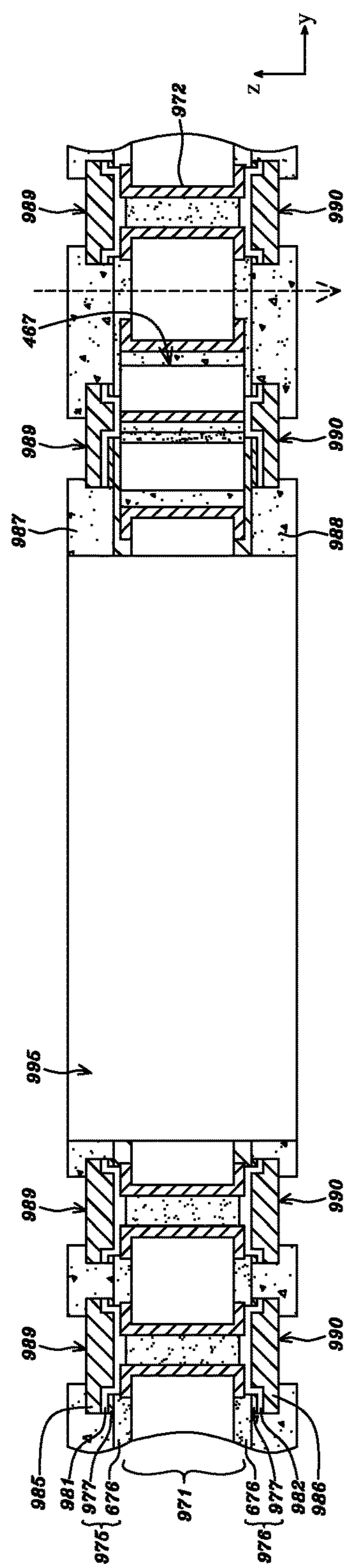
Figure 27I:
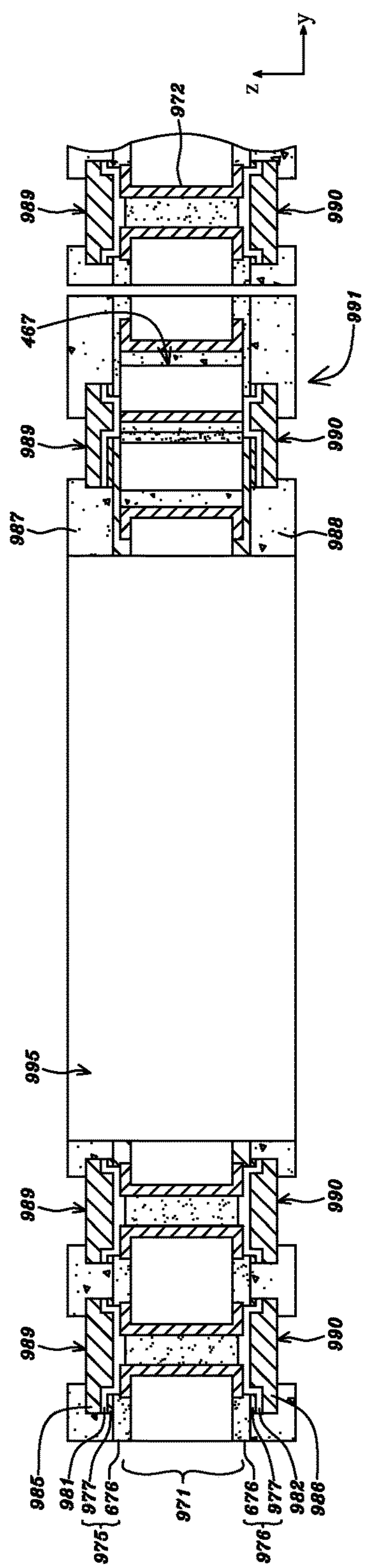
Figure 27J:
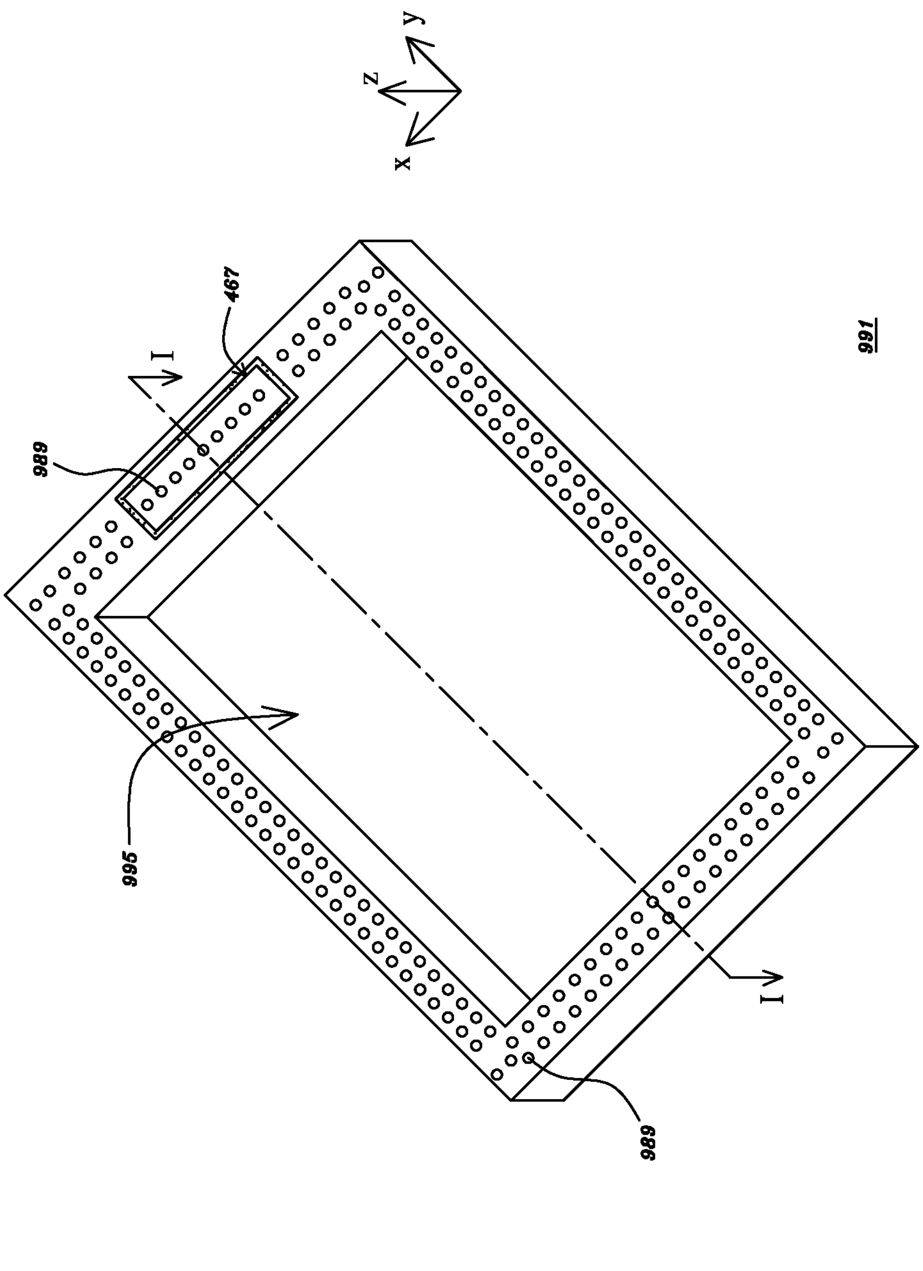
FIG. 27J is a schematically perspective view showing a circuit substrate in accordance with an embodiment of the present application.
Figure 27K:
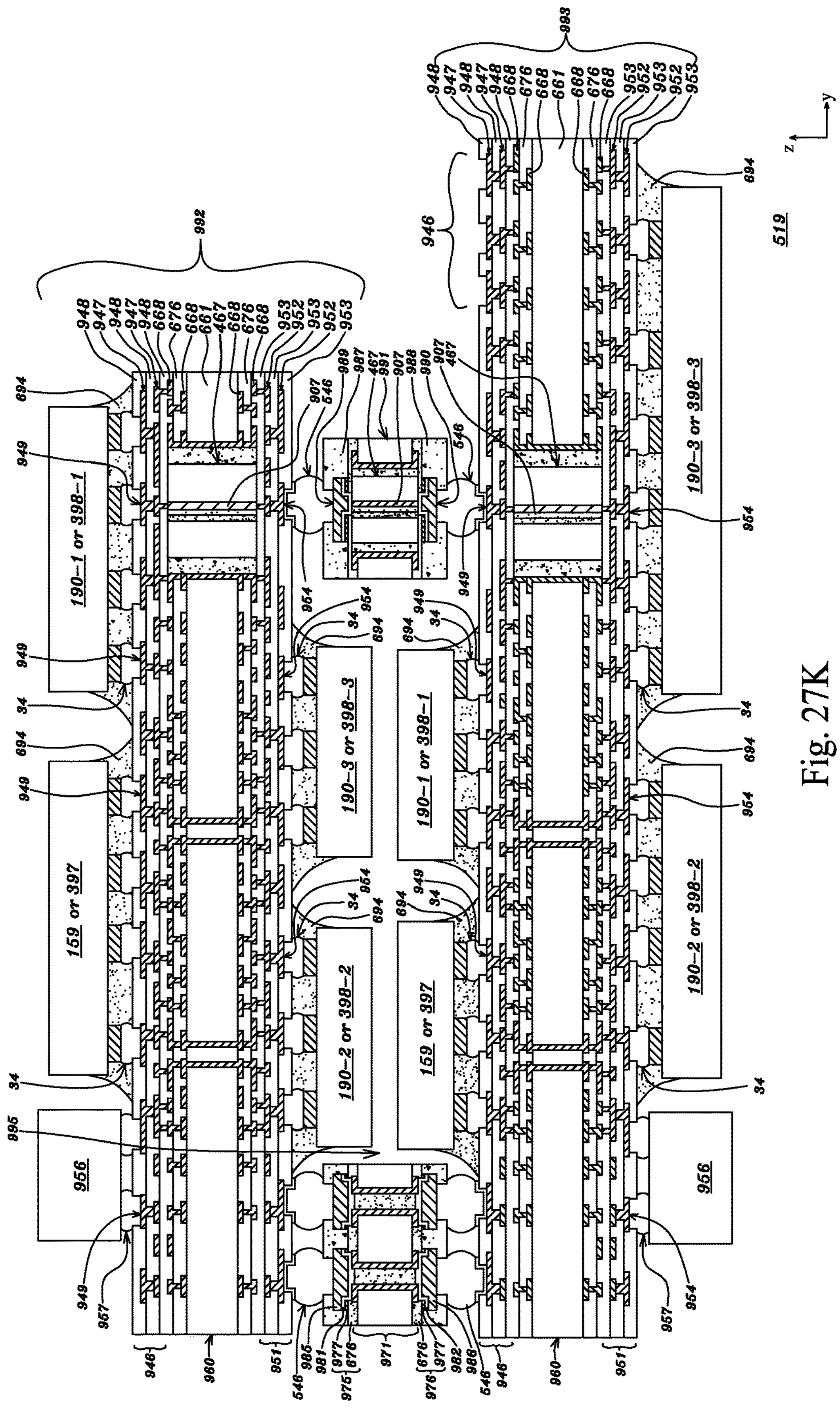
FIGS. 27K and 27L are schematically cross-sectional views in a y-z plane showing various chip assemblies in accordance with an embodiment of the present application.
Figure 27L:
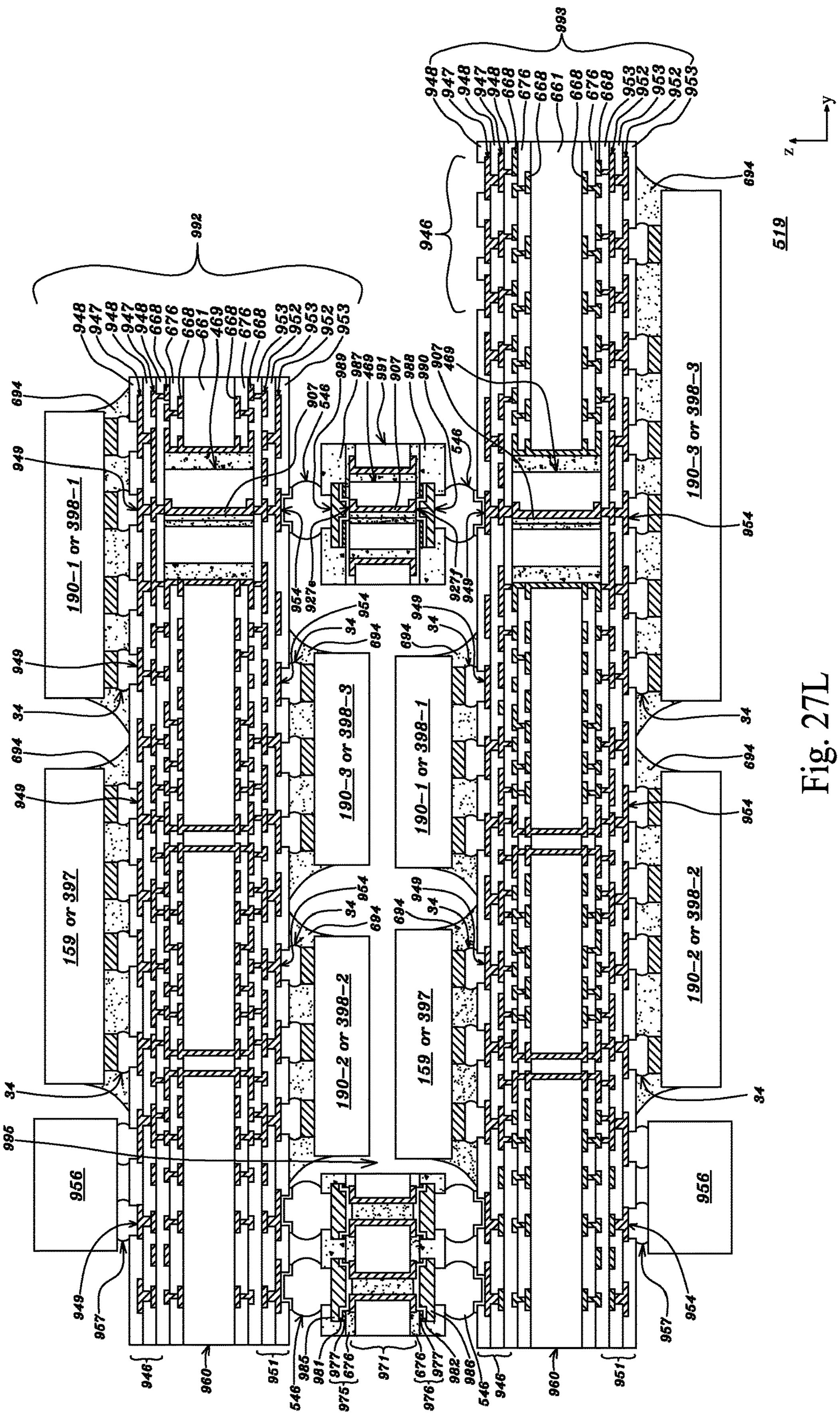

FIGS. 27A-27I are schematically cross-sectional views in a y-z plane showing a process for fabricating a circuit substrate in accordance with an embodiment of the present application. FIG. 27J is a schematically perspective view showing a circuit substrate in accordance with an embodiment of the present application, wherein FIG. 27I is a cross-sectional view along a cross-sectional line I-I of FIG. 27J. FIGS. 27K and 27L are schematically cross-sectional views in a y-z plane showing various chip assemblies in accordance with an embodiment of the present application. Referring to FIG. 27A, a temporary substrate 590 may be provided with the same specification as the temporary substrate 590 as illustrated in FIG. 10A. Next, a semifinished substrate 971 of printed circuit board (PCB) is provided with a bottom surface to be attached to a top surface of the sacrificial bonding layer 591 of the temporary substrate 590. The semifinished substrate 971 for a printed circuit board (PCB) may include (1) a core layer 661, such as FR4, containing epoxy or bismaleimide-triazine (BT) resin, wherein FR4 may be a composite material composed of woven fiberglass cloth and an epoxy resin binder, wherein the core layer 661 may have a thickness between 0.03 and 2.5 millimeters or between 0.1 and 2 millimeters, wherein multiple first through holes 972 may be formed each with a transverse dimension, e.g., width or diameter, between 0.05 and 1 millimeters by a mechanical drilling process or laser drilling process to vertically extend through the core layer 661, and multiple second through holes 973 may be formed by a mechanical drilling process or laser drilling process to vertically extend through the core layer 661, wherein each of the second through holes 973 may extend in the x direction to have a longitudinal or rectangular shape with a length between 1 and 100 millimeters, between 5 and 20 millimeters, between 8 and 50 millimeters or greater than 10, 30, 50, 80 or 100 millimeters and a width between 0.2 and 3 millimeters, between 0.4 and 1 millimeters or between 0.8 and 2 millimeters, and alternatively, each of the second through holes 973 may have a circular or square shape with a diameter or width between 1 and 5 millimeters, between 5 and 10 millimeters, between 8 and 20 millimeters, or greater than 10, 30, 50, 80 or 100 millimeters, and (2) an interconnection metal layer 974, made of copper, on top and bottom surfaces of the core layer 661 and on a sidewall of each of the first and second through holes 972 and 973, wherein the interconnection metal layer 974 may have a thickness between 1 and 80 micrometers or between 3 and 50 micrometers, wherein the interconnection metal layer 974 on the bottom surface of the core layer 661 may have a bottom surface to be attached to the top surface of the sacrificial bonding layer 591 of the temporary substrate 590.

Next, referring to FIGS. 27A and 27B, multiple vertical-through-via (VTV) connectors 467, each of which may have the same specification as any type of the first through tenth types of vertical-through-via (VTV) connectors 467 as illustrated in FIGS. 4A-4I, 5A-5C, 6A-6F, 7A-7I, 8A-8F and 9A-9D, each may be placed in one of the second through holes 973 in the core layer 661 and provided with the bottom surface attached to the top surface of the sacrificial bonding layer 591 of the temporary substrate 590. In particular, FIGS. 27A-27K show each of the vertical-through-via (VTV) connectors 467 may be formed of any of the first through seventh types as seen in FIGS. 4A-4I, 5A-5C and 6A-6F. Each of the vertical-through-via (VTV) connectors 467 may be alternatively replaced with one of the first through second types of pad-enlarged vertical-through-via (VTV) connector 469 illustrated in FIGS. 4J-4P, 5D-5E and 8G-8I, each may be placed in one of the second through holes 973 in the core layer 661 and provided with the bottom surface attached to the top surface of the sacrificial bonding layer 591 of the temporary substrate 590. In particular, FIG. 27L show each of the pad-enlarged vertical-through-via (VTV) connectors 469 may be formed of the first type as seen in FIGS. 4J-4P and 5D-5E. Next, an adhesive polymer material 945, such as epoxy-based polymer, may be filled into a gap between a sidewall of said each of the vertical-through-via (VTV) connectors 467 or pad-enlarged vertical-through-via (VTV) connectors 469 and the interconnection metal layer 974 on the sidewall of said one of the second through holes 973. Next, when each of the vertical-through-via (VTV) connectors 467 or pad-enlarged vertical-throughvia (VTV) connectors 469 has the top surface higher than a level of a top surface of the interconnection metal layer 974 on the top surface of the core layer 661, a polishing or grinding process may be performed to remove a top portion of each of the vertical-through-via (VTV) connectors 467 or pad-enlarged vertical-through-via (VTV) connectors 469 such that the top surface of the interconnection metal layer 974 on the top surface of the core layer 661 may be coplanar with the top surface of each of the vertical-through-via (VTV) connectors 467 or pad-enlarged vertical-through-via (VTV) connectors 469, that is, the top metal pads or contacts 907*e*, 907*n*, 907*u*, 917*d*, 918*d*, 919*a* and/or 919*c* of each of the vertical-through-via (VTV) connectors 467, or the top metal pads or contacts 927*e* of each of the pad-enlarged vertical-through-via (VTV) connectors 469, the top surface of each of the supporting substrates 901 of each of the vertical-through-via (VTV) connectors 467 or pad-enlarged vertical-through-via (VTV) connectors 469, i.e., the top surface of the glass substrate for said each of the supporting substrates 901 or the top surface of the silicon substrate for said each of the supporting substrates 901, and the top surface of the covering substrate 910 of each of the vertical-through-via (VTV) connectors 467 or pad-enlarged vertical-through-via (VTV) connectors 469, i.e., the top surface of the glass substrate for the covering substrate 910 of said each of the vertical-through-via (VTV) connectors 467 or pad-enlarged vertical-through-via (VTV) connectors 469 or the top surface of the silicon substrate for the covering substrate 910 of said each of the vertical-through-via (VTV) connectors 467 or pad-enlarged vertical-through-via (VTV) connectors 469.

Next, the glass or silicon substrate 589 as seen in FIG. 27B may be released from the sacrificial bonding layer 591, which may be referred to the step as illustrated in FIG. 10E. Next, the remainder of the sacrificial bonding layer 591 may be pulled off, which may be referred to the step as illustrated in FIG. 10E such that, as seen in FIGS. 27C and 27L, the bottom surface of each of the vertical-through-via (VTV) connectors 467 or pad-enlarged vertical-through-via (VTV) connectors 469 and the bottom surface of the interconnection metal layer 974 on the bottom surface of the core layer 661 may be exposed; for each of the vertical-through-via (VTV) connectors 467 or pad-enlarged vertical-through-via (VTV) connectors 469, the bottom surface of each of its bottom metal pads or contacts 907*f*, 907*v*, 917*e*, 918*e*, 919*b* and/or 919*d*, or the bottom surface of each of its bottom metal pads or contacts 927*f*, the bottom surface of each of its supporting substrate(s) 901, i.e., the bottom surface of the glass substrate for each of its supporting substrate(s) 901 or the bottom surface of the silicon substrate for each of its supporting substrate(s) 901, and the bottom surface of its covering substrate 910, i.e., the bottom surface of the glass substrate for its covering substrate 910 or the bottom surface of the silicon substrate for its covering substrate 910, may be exposed and coplanar with the bottom surface of the interconnection metal layer 974 on the bottom surface of the core layer 661.

Next, referring to FIGS. 27D and 27L, a top laminate layer 975 may be provided with a polymer layer 676, i.e., prepreg, at a bottom thereof and a metal foil 977 on a top surface of the polymer layer 676, and a bottom laminate layer 976 may be provided with a polymer layer 676, i.e., prepreg, at a top thereof and a metal foil 977 on a bottom surface of the polymer layer 676. The top laminate layer 975 may be laminated on the top surface of the core layer 661, on the top surface of each of the vertical-through-via (VTV) connectors 467 or pad-enlarged vertical-through-via (VTV) connectors 469 and on the top surface of the interconnection metal layer 974 on the top surface of the core layer 661, that is, the polymer layer 676 of the top laminate layer 975 being attached to the top surface of the core layer 661, the top surface of each of the vertical-through-via (VTV) connectors 467 or pad-enlarged vertical-through-via (VTV) connectors 469 and the top surface of the interconnection metal layer 974 on the top surface of the core layer 661 and filled into the first through holes 972 in the core layer 661. The bottom laminate layer 976 may be laminated on the bottom surface of the core layer 661, on the bottom surface of each of the vertical-through-via (VTV) connectors 467 or pad-enlarged vertical-through-via (VTV) connectors 469 and on the bottom surface of the interconnection metal layer 974 on the bottom surface of the core layer 661, that is, the polymer layer 676 of the bottom laminate layer 976 being attached to the bottom surface of the core layer 661, the bottom surface of each of the vertical-through-via (VTV) connectors 467 or pad-enlarged vertical-through-via (VTV) connectors 469 and the bottom surface of the interconnection metal layer 974 on the bottom surface of the core layer 661 and filled into the first through holes 972 in the core layer 661. The polymer layer 676 of the top laminate layer 975 may be made of epoxy, glass fiber, bismaleimide triazine (BT), Ajinomoto build-up film (ABF) or a combination of two or more of the above materials and have a thickness, between 0.01 and 0.4 millimeters or between 0.05 and 0.3 millimeters, between the metal foil 977 of the top laminate layer 975 and the top surface of the interconnection metal layer 974 on the top surface of the core layer 661, and the metal foil 977 of the top laminate layer 975 may be a copper foil having a thickness between 0.5 and 50 micrometers, between 1 and 20 micrometers or between 2 and 10 millimeters. The polymer layer 676 of the bottom laminate layer 976 may be made of epoxy, glass fiber, bismaleimide triazine (BT), Ajinomoto build-up film (ABF) or a combination of two or more of the above materials and have a thickness, between 0.01 and 0.4 millimeters or between 0.05 and 0.3 millimeters, between the metal foil 977 of the bottom laminate layer 976 and the bottom surface of the interconnection metal layer 974 on the bottom surface of the core layer 661, and the metal foil 977 of the bottom laminate layer 976 may be a copper foil having a thickness between 0.5 and 50 micrometers, between 1 and 20 micrometers or between 2 and 10 millimeters.

Next, referring to FIGS. 27E and 27L, the polymer layer 676 and metal foil 977 of the top laminate layer 975 may be patterned with multiple openings 978 therein by etching the metal foil 977 of the top laminate layer 975 and then drilling the polymer layer 676 of the top laminate layer 975 using a laser each to expose (1) the top surface of the interconnection metal layer 974 on the top surface of the core layer 661 around one of the first through holes 972 in the core layer 661, or (2) one of the top metal pads or contacts 907*e*, 907*n*, 907*u*, 917*d*, 918*d*, 919*a* and/or 919*c* of one of the vertical-through-via (VTV) connectors 467 or one of the top metal pads or contacts 927*e* of one of the pad-enlarged vertical-through-via (VTV) connectors 469. The polymer layer 676 and metal foil 977 of the bottom laminate layer 976 may be patterned with multiple openings 979 therein by etching the metal foil 977 of the bottom laminate layer 976 and then drilling the polymer layer 676 of the bottom laminate layer 976 using a laser each to expose (1) the bottom surface of the interconnection metal layer 974 on the bottom surface of the core layer 661 around one of the first through holes 972 in the core layer 661, or (2) one of the bottom metal pads or contacts 907*f*, 907*v*, 917*e*, 918*e*, 919*b* and/or 919*d* of one of the vertical-through-via (VTV) connectors 467 or one of the bottom metal pads or contacts 927*f* of one of the pad-enlarged vertical-through-via (VTV) connectors 469.

Next, referring to FIGS. 27F and 27L, a seed layer 981, such as copper layer, may be formed by a sputtering process, for example, with a thickness between 0.2 and 15 micrometers, between 0.5 and 12 micrometers or between 1 and 8 micrometers on a top surface of the metal foil 977 of the top laminate layer 975, the top surface of the interconnection metal layer 974 on the top surface of the core layer 661 around each of the first through holes 972 in the core layer 661, and each of the top metal pads or contacts 907*e*, 907*n*, 907*u*, 917*d*, 918*d*, 919*a* and/or 919*c* of each of the vertical-through-via (VTV) connectors 467 or each of the top metal pads or contacts 927*e* of each of the pad-enlarged vertical-through-via (VTV) connectors 469, and a seed layer 982, such as copper layer, may be formed by a sputtering process, for example, with a thickness between 0.2 and 15 micrometers, between 0.5 and 12 micrometers or between 1 and 8 micrometers on a bottom surface of the metal foil 977 of the bottom laminate layer 976, the bottom surface of the interconnection metal layer 974 on the bottom surface of the core layer 661 around each of the first through holes 972 in the core layer 661, and each of the bottom metal pads or contacts 907*f*, 907*v*, 917*e*, 918*e*, 919*b* and/or 919*d* of each of the vertical-through-via (VTV) connectors 467 or each of the bottom metal pads or contacts 927*f* of each of the pad-enlarged vertical-through-via (VTV) connectors 469. Next, a photoresist layer 983 may be formed on a top surface of the seed layer 981 and with multiple openings therein each exposing the seed layer 981, and a photoresist layer 984 may be formed on a bottom surface of the seed layer 982 and with multiple openings therein each exposing the seed layer 982. Next, a metal layer 985, such as copper layer, may be formed by an electroplating process, for example, with a thickness with a thickness between 2 and 70 micrometers, between 5 and 50 micrometers or between 10 and 30 micrometers on the top surface of the seed layer 981 at bottoms of the openings in the photoresist layer 983, and a metal layer 986, such as copper layer, may be formed by an electroplating process, for example, with a thickness between 2 and 70 micrometers, between 5 and 50 micrometers or between 10 and 30 micrometers on the bottom surface of the seed layer 983 at tops of the openings in the photoresist layer 984.

Next, the photoresist layer 983 may be stripped from the top surface of the seed layer 981, and the photoresist layer 984 may be stripped from the bottom surface of the seed layer 982. Next, the seed layer 981 and the metal foil 977 of the top laminate layer 975 not under the metal layer 985 may be removed by a wet etching process to expose the top surface of the polymer layer 676 of the top laminate layer 975, and the seed layer 982 and the metal foil 977 of the bottom laminate layer 976 not over the metal layer 986 may be removed by a wet etching process to expose the bottom surface of the polymer layer 676 of the bottom laminate layer 976.

Next, referring to FIGS. 27G and 27L, a solder mask 987, such as a polymer layer made of epoxy, may be formed with a thickness between 30 and 250 micrometers, between 50 and 200 micrometers or between 60 and 150 micrometers on the top surface of the polymer layer 676 of the top laminate layer 975 and a top surface of the metal layer 985 and with multiple openings therein each exposing the top surface of the metal layer 985, i.e., a top metal pad 989, and a solder mask 988, such as a polymer layer made of epoxy, may be formed with a thickness between 30 and 250 micrometers, between 50 and 200 micrometers or between 60 and 150 micrometers on the bottom surface of the polymer layer 676 of the bottom laminate layer 976 and a bottom surface of the metal layer 986 and with multiple openings therein each exposing the bottom surface of the metal layer 986, i.e., a bottom metal pad 990. Each of the top metal pads 989 may couples to the interconnection metal layer 974 on the sidewall of one of the first and second through holes 972 and 973 or one of the top metal pads or contacts 907*e*, 907*n*, 907*u*, 917*d*, 918*d*, 919*a* and/or 919*c* of one of the vertical-through-via (VTV) connectors 467, or one of the top metal pads or contacts 927*e* of one of the pad-enlarged vertical-through-via (VTV) connectors 469, and each of the bottom metal pads 990 may couples to the interconnection metal layer 974 on the sidewall of one of the first and second through holes 972 and 973 or one of the bottom metal pads or contacts 907*f*, 907*v*, 917*e*, 918*e*, 919*b* and/or 919*d* of one of the vertical-through-via (VTV) connectors 467, or one of the bottom metal pads or contacts 927*f* of one of the pad-enlarged vertical-through-via (VTV) connectors 469. Accordingly, each of the top metal pads 989 may couples to one of the bottom metal pads 990 through the interconnection metal layer 974 on the sidewall of one of the first and second through holes 972 and 973 or the interconnection metal layer 907 of one of the vertical-through-via (VTV) connectors 467 or pad-enlarged vertical-through-via (VTV) connectors 469.

Next, multiple third through holes 995 (only one is shown) may be formed by a cutting/routing process, each vertically extending through the solder masks 987 and 988, the polymer layers 676 of the top and bottom laminate layers 975 and 976 and the core layer 661, as seen in FIGS. 27H and 27L. Next, the solder masks 987 and 988, the polymer layers 676 of the top and bottom laminate layers 975 and 976 and the core layer 661 may be cut or diced to separate multiple individual units each for a circuit substrate 991 as shown in FIGS. 27I, 27J and 27L by a laser cutting process or mechanical cutting process. For example, the circuit substrate 991 may have a total thickness between 0.5 and 15 millimeters, between 1 and 10 millimeters, between 1.5 and 8 millimeters or between 2 and 6 millimeters.

Next, referring to FIGS. 27K and 27L, for forming a chip assembly 519, a top chip package 992 may be provided to be bonded to the top metal pads 989 of the circuit substrate 991 as illustrated in FIGS. 27A-27J, and a bottom chip package 993 may be provided to be bonded to the bottom metal pads 990 of the circuit substrate 991.

Referring to FIGS. 27K and 27L, the top chip package 992 of the chip assembly 519 may include (1) a circuit substrate 960 having the same specification as that illustrated in FIG. 24A-24C or 24D, (2) an application specific integrated-circuit (ASIC) chip 398-1, having the same specification as the first type of semiconductor integrated-circuit (IC) chip 100 illustrated in FIG. 3A, to be turned upside down with the micro-bumps or micro-pads 34 thereof turned to be at the bottom thereof, wherein each of the micro-bumps or micro-pads 34 of its application specific integrated-circuit (ASIC) chip 398-1 may have the same specification as the second type of micro-bump or micro-pad 34 as illustrated in FIG. 3A, having the solder cap 33 to be bonded to one of the rerouted metal pads 949 of its circuit substrate 960, wherein its application specific integrated-circuit (ASIC) chips 398-1 may be alternatively replaced with a sub-system module 190-1 having the same specification as the first type of sub-system module 190 as illustrated in each of FIGS. 13A and 13B, which may be turned upside down with the micro-bumps or micro-pads 34 thereof turned to be at the bottom thereof, wherein each of the micro-bumps or micro-pads 34 of its sub-system module 190-1, in case of replacing its application specific integrated-circuit (ASIC) chip 398-1, may have the same specification as the second type of micro-bumps or micro-pads 34 as illustrated in FIG. 3A, having the solder cap 33 to be bonded to one of the rerouted metal pads 949 of its circuit substrate 960, (3) a memory module 159, having the same specification as the first type of memory module 159 illustrated in FIG. 11A, provided with the micro-bumps or micro-pads 34 at the bottom thereof, wherein each of the micro-bumps or micro-pads 34 of its memory module 159 may have the same specification as the second type of micro bump or micro-pad 34 as illustrated in FIG. 3A, having the solder cap 33 to be bonded to one of the rerouted metal pads 949 of its circuit substrate 960, wherein its memory module 159 may be alternatively replaced with a known-good memory or application-specific-integrated-circuit (ASIC) chip 397 having the same specification as the first type of semiconductor integrated-circuit (IC) chip 100 illustrated in FIG. 3A, to be turned upside down with the micro-bumps or micro-pads 34 thereof turned to be at the bottom thereof, wherein each of the micro-bumps or micro-pads 34 of its known-good memory or application-specific-integrated-circuit (ASIC) chip 397 may have the same specification as the second type of micro-bump or micro-pad 34 as illustrated in FIG. 3A, having the solder cap 33 to be bonded to one of the rerouted metal pads 949 of its circuit substrate 960, (4) two application specific integrated-circuit (ASIC) chips 398-2 and 398-3, each having the same specification as the first type of semiconductor integrated-circuit (IC) chip 100 illustrated in FIG. 3A, provided with the micro-bumps or micro-pads 34 at the top thereof, wherein each of the micro-bumps or micro-pads 34 of each of its application specific integrated-circuit (ASIC) chips 398-2 and 398-3 may have the same specification as the second type of micro-bump or micro-pad 34 as illustrated in FIG. 3A, having the solder cap 33 to be bonded to one of the rerouted metal pads 954 of its circuit substrate 960, wherein its application specific integrated-circuit (ASIC) chips 398-2 and 398-3 may be alternatively replaced with two sub-system modules 190-2 and 190-3 respectively, each having the same specification as the first type of sub-system module 190 as illustrated in each of FIGS. 13A and 13B, which may be provided with the micro-bumps or micro-pads 34 at the top thereof, wherein each of the micro-bumps or micro-pads 34 of each of its sub-system modules 190-2 and 190-3 in case of replacing its application specific integrated-circuit (ASIC) chips 398-2 and 398-3 respectively may have the same specification as the second type of micro-bumps or micro-pads 34 as illustrated in FIG. 3A, having the solder cap 33 to be bonded to one of the rerouted metal pads 954 of its circuit substrate 960, (5) an underfill 694 between its circuit substrate 960 and each of its application specific integrated-circuit (ASIC) chips 398-1, 398-2 and 398-3, or between its circuit substrate 960 and each of its sub-system modules 190-1, 190-2 and 190-3 in case of replacing its application specific integrated-circuit (ASIC) chips 398-1, 398-2 and 398-3 respectively, and between its circuit substrate 960 and its memory module 159, or between its circuit substrate 960 and its known-good memory or application-specific-integrated-circuit (ASIC) chip 397 in case of replacing its memory module 159, covering a sidewall of each of the micro-bumps or micro-pads 34 of each of its application specific integrated-circuit (ASIC) chips 398-1, 398-2 and 398-3, or sub-system modules 190-1, 190-2 and 190-3 in case of replacing its application specific integrated-circuit (ASIC) chips 398-1, 398-2 and 398-3 respectively, and a sidewall of each of the micro-bumps or micro-pads 34 of its memory module 159, or known-good memory or application-specific-integrated-circuit (ASIC) chip 397 in case of replacing its memory module 159, (6) one or more passive devices 956 (only one is shown), each of which may be a resister, capacitor or inductor, bonded to two or more of the rerouted metal pads 949 of its circuit substrate 960 by a tin-containing solder 957 therebetween, and (7) multiple solder balls 546, such as a tin-containing alloy, each planted to or formed on a bottom surface of one of the rerouted metal pads 954 of its circuit substrate 960 to be bonded to a top surface of one of the top metal pads 989 of the circuit substrate 991 of the chip assembly 519 for coupling the top chip package 992 of the chip assembly 519 to the circuit substrate 991 of the chip assembly 519. For the top chip package 992 of the chip assembly 519, its application specific integrated-circuit (ASIC) chips 398-2 and 398-3, or sub-system modules 190-2 and 190-3 in case of replacing its application specific integrated-circuit (ASIC) chips 398-2 and 398-3 respectively, may be arranged in the third through hole 995 in the circuit substrate 991 of the chip assembly 519.

Referring to FIGS. 27K and 27L, for the top chip package 992 of the chip assembly 519, each of its application specific integrated-circuit (ASIC) chip 398-1, or its sub-system module 190-1 in case of replacing its application specific integrated-circuit (ASIC) chip 398-1, its memory module 159, or its known-good memory or application-specific-integrated-circuit (ASIC) chip 397 in case of replacing its memory module 159, and its passive devices 956 may couple to one or both of its application specific integrated-circuit (ASIC) chips 398-2 and 398-3, or sub-system modules 190-2 and 190-3 in case of replacing its application specific integrated-circuit (ASIC) chips 398-2 and 398-3 respectively, through, in sequence, each of the interconnection metal layers 947 of the top interconnection scheme 946 of its circuit substrate 960, one of the interconnection metal layers 907 of one of the vertical-through-via (VTV) connectors 467 or pad-enlarged vertical-through-via (VTV) connectors 469 of its circuit substrate 960, i.e., the power or ground metal line 907*a* or 907*c*, transmission metal line 907*b* or signal metal line 907*d* in case for the first type of vertical-through-via (VTV) connector 467 as seen in FIGS. 4A-4I and 5A-5C, and each of the interconnection metal layers 952 of the bottom interconnection scheme 951 of its circuit substrate 960. Each of its solder balls 546 may couple to one, more or all of its application specific integrated-circuit (ASIC) chip 398-1, or its sub-system module 190-1 in case of replacing its application specific integrated-circuit (ASIC) chip 398-1, its memory module 159, or its known-good memory or application-specific-integrated-circuit (ASIC) chip 397 in case of replacing its memory module 159, and its passive devices 956 through, in sequence, each of the interconnection metal layers 952 of the bottom interconnection scheme 951 of its circuit substrate 960, one of the interconnection metal layers 907 of one of the vertical-through-via (VTV) connectors 467 or pad-enlarged vertical-through-via (VTV) connectors 469 of its circuit substrate 960, i.e., the power or ground metal line 907*a* or 907*c*, transmission metal line 907*b* or signal metal line 907*d* in case for the first type of vertical-through-via (VTV) connector 467 as seen in FIGS. 4A-4I and 5A-5C, and each of the interconnection metal layers 947 of the top interconnection scheme 946 of its circuit substrate 960.

Referring to FIGS. 27K and 27L, the bottom chip package 993 of the chip assembly 519 may include (1) a circuit substrate 960 having the same specification as that illustrated in FIG. 24A-24C or 24D, (2) an application specific integrated-circuit (ASIC) chip 398-1, having the same specification as the first type of semiconductor integrated-circuit (IC) chip 100 illustrated in FIG. 3A, to be turned upside down with the micro-bumps or micro-pads 34 thereof turned to be at the bottom thereof, wherein each of the micro-bumps or micro-pads 34 of its application specific integrated-circuit (ASIC) chip 398-1 may have the same specification as the second type of micro-bump or micro-pad 34 as illustrated in FIG. 3A, having the solder cap 33 to be bonded to one of the rerouted metal pads 949 of its circuit substrate 960, wherein its application specific integrated-circuit (ASIC) chips 398-1 may be alternatively replaced with a sub-system module 190-1 having the same specification as the first type of sub-system module 190 as illustrated in each of FIGS. 13A and 13B, which may be turned upside down with the micro-bumps or micro-pads 34 thereof turned to be at the bottom thereof, wherein each of the micro-bumps or micro-pads 34 of its sub-system module 190-1, in case of replacing its application specific integrated-circuit (ASIC) chip 398-1, may have the same specification as the second type of micro-bumps or micro-pads 34 as illustrated in FIG. 3A, having the solder cap 33 to be bonded to one of the rerouted metal pads 949 of its circuit substrate 960, (3) a memory module 159, having the same specification as the first type of memory module 159 illustrated in FIG. 11A, provided with the micro-bumps or micro-pads 34 at the bottom thereof, wherein each of the micro-bumps or micro-pads 34 of its memory module 159 may have the same specification as the second type of micro bump or micro-pad 34 as illustrated in FIG. 3A, having the solder cap 33 to be bonded to one of the rerouted metal pads 949 of its circuit substrate 960, wherein its memory module 159 may be alternatively replaced with a known-good memory or application-specific-integrated-circuit (ASIC) chip 397 having the same specification as the first type of semiconductor integrated-circuit (IC) chip 100 illustrated in FIG. 3A, to be turned upside down with the micro-bumps or micro-pads 34 thereof turned to be at the bottom thereof, wherein each of the micro-bumps or micro-pads 34 of its known-good memory or application-specific-integrated-circuit (ASIC) chip 397 may have the same specification as the second type of micro-bump or micro-pad 34 as illustrated in FIG. 3A, having the solder cap 33 to be bonded to one of the rerouted metal pads 949 of its circuit substrate 960, (4) two application specific integrated-circuit (ASIC) chips 398-2 and 398-3, each having the same specification as the first type of semiconductor integrated-circuit (IC) chip 100 illustrated in FIG. 3A, provided with the micro-bumps or micro-pads 34 at the top thereof, wherein each of the micro-bumps or micro-pads 34 of each of its application specific integrated-circuit (ASIC) chips 398-2 and 398-3 may have the same specification as the second type of micro-bump or micro-pad 34 as illustrated in FIG. 3A, having the solder cap 33 to be bonded to one of the rerouted metal pads 954 of its circuit substrate 960, wherein its application specific integrated-circuit (ASIC) chips 398-2 and 398-3 may be alternatively replaced with two sub-system modules 190-2 and 190-3 respectively, each having the same specification as the first type of sub-system module 190 as illustrated in each of FIGS. 13A and 13B, which may be provided with the micro-bumps or micro-pads 34 at the top thereof, wherein each of the micro-bumps or micro-pads 34 of each of its sub-system modules 190-2 and 190-3, in case of replacing its application specific integrated-circuit (ASIC) chips 398-2 and 398-3 respectively, may have the same specification as the second type of micro-bumps or micro-pads 34 as illustrated in FIG. 3A, having the solder cap 33 to be bonded to one of the rerouted metal pads 954 of its circuit substrate 960, (5) an underfill 694 between its circuit substrate 960 and each of its application specific integrated-circuit (ASIC) chips 398-1, 398-2 and 398-3, or between its circuit substrate 960 and each of its sub-system modules 190-1, 190-2 and 190-3 in case of replacing its application specific integrated-circuit (ASIC) chips 398-1, 398-2 and 398-3 respectively, and between its circuit substrate 960 and its memory module 159, or between its circuit substrate 960 and its known-good memory or application-specific-integrated-circuit (ASIC) chip 397 in case of replacing its memory module 159, covering a sidewall of each of the micro-bumps or micro-pads 34 of each of its application specific integrated-circuit (ASIC) chips 398-1, 398-2 and 398-3, or sub-system modules 190-1, 190-2 and 190-3 in case of replacing its application specific integrated-circuit (ASIC) chips 398-1, 398-2 and 398-3 respectively, and a sidewall of each of the micro-bumps or micro-pads 34 of each of its memory module 159, or known-good memory or application-specific-integrated-circuit (ASIC) chip 397 in case of replacing its memory module 159, (6) one or more passive devices 956 (only one is shown), each of which may be a resister, capacitor or inductor, bonded to two or more of the rerouted metal pads 954 of its circuit substrate 960 by a tin-containing solder 957 therebetween, and (7) multiple solder balls 546, such as a tin-containing alloy, each planted to or formed on a top surface of one of the rerouted metal pads 949 of its circuit substrate 960 to be bonded to a bottom surface of one of the bottom metal pads 990 of the circuit substrate 991 of the chip assembly 519 for coupling the bottom chip package 993 of the chip assembly 519 to the circuit substrate 991 of the chip assembly 519. Furthermore, for the bottom chip package 993, some of the rerouted metal pads 949 of the top interconnection scheme 946 of its circuit substrate 960 may be used as an input/output port 958 arranged for connection with an external circuit. For the bottom chip package 993 of the chip assembly 519, its application specific integrated-circuit (ASIC) chip 398-1, or sub-system module 190-1 in case of replacing its application specific integrated-circuit (ASIC) chip 398-1, and its memory module 159, or known-good memory or application-specific-integrated-circuit (ASIC) chip 397 in case of replacing its memory module 159, may be arranged in the third through hole 995 in the circuit substrate 991 of the chip assembly 519.

Referring to FIGS. 27K and 27L, for the bottom chip package 992 of the chip assembly 519, each of its application specific integrated-circuit (ASIC) chip 398-1, or sub-system module 190-1 in case of replacing its application specific integrated-circuit (ASIC) chip 398-1, and its memory module 159, or known-good memory or application-specific-integrated-circuit (ASIC) chip 397 in case of replacing its memory module 159, may couple to one, more or all of its application specific integrated-circuit (ASIC) chips 398-2 and 398-3, or sub-system modules 190-2 and 190-3 in case of replacing its application specific integrated-circuit (ASIC) chips 398-2 and 398-3 respectively, and its passive devices 956 through, in sequence, each of the interconnection metal layers 947 of the top interconnection scheme 946 of its circuit substrate 960, one of the interconnection metal layers 907 of one of the vertical-through-via (VTV) connectors 467 or pad-enlarged vertical-through-via (VTV) connectors 469 of its circuit substrate 960, i.e., the power or ground metal line 907*a* or 907*c*, transmission metal line 907*b* or signal metal line 907*d* in case for the first type of vertical-through-via (VTV) connector 467 as seen in FIGS. 4A-4I and 5A-5C, and each of the interconnection metal layers 952 of the bottom interconnection scheme 951 of its circuit substrate 960. Each of its solder balls 546 may couple to one, more or all of its application specific integrated-circuit (ASIC) chips 398-2 and 398-3, or sub-system modules 190-2 and 190-3 in case of replacing its application specific integrated-circuit (ASIC) chips 398-2 and 398-3 respectively, and its passive devices 956 through, in sequence, each of the interconnection metal layers 947 of the top interconnection scheme 946 of its circuit substrate 960, one of the interconnection metal layers 907 of one of the vertical-through-via (VTV) connectors 467 or pad-enlarged vertical-through-via (VTV) connectors 469 of its circuit substrate 960, i.e., the power or ground metal line 907*a* or 907*c*, transmission metal line 907*b* or signal metal line 907*d* in case for the first type of vertical-through-via (VTV) connector 467 as seen in FIGS. 4A-4I and 5A-5C, and each of the interconnection metal layers 952 of the bottom interconnection scheme 951 of its circuit substrate 960.

In particular, referring to FIGS. 27K and 27L, the chip assembly 519 may provide a first vertical path to transmit signals in a high frequency greater than 10, 20, 30, or 50 GHz from the application specific integrated-circuit (ASIC) chip 398-1 of its top chip package 992, or one of the micro-bumps or micro-pads 34 of the sub-system module 190-1 of its top chip package 992 in case of replacing the application specific integrated-circuit (ASIC) chip 398-1 of its top chip package 992, to the application specific integrated-circuit (ASIC) chip 398-3 of its bottom chip package 993, or one of the micro-bumps or micro-pads 34 of the sub-system module 190-3 of its bottom chip package 993 in case of replacing the application specific integrated-circuit (ASIC) chip 398-3 of its bottom chip package 993, wherein the first vertical path may be composed of, from top to bottom, (1) one of the micro-bumps or micro-pads 34 of the application specific integrated-circuit (ASIC) chip 398-1 of its top chip package 992, or one of the micro-bumps or micro-pads 34 of the sub-system module 190-1 of its top chip package 992 in case of replacing the application specific integrated-circuit (ASIC) chip 398-1 of its top chip package 992, (2) one of the rerouted metal pads 949 of the circuit substrate 960 of its top chip package 992, (3) vertical stacked vias each provided by one of the interconnection metal layers 947 of the top interconnection scheme 946 of the circuit substrate 960 of its top chip package 992, (4) one of the transmission metal lines 907*b* of one of the vertical-through-via (VTV) connectors 467 of the circuit substrate 960 of its top chip package 992 in case for the first type of vertical-through-via (VTV) connector 467 as seen in FIGS. 4A-4I and 5A-5C, or one of the transmission metal lines 907*b* of one of the pad-enlarged vertical-through-via (VTV) connectors 469 of the circuit substrate 960 of its top chip package 992 in case for the first type of pad-enlarged vertical-through-via (VTV) connector 469 as seen in FIGS. 4J-4P and 5D-5E, (5) vertical stacked vias each provided by one of the interconnection metal layers 952 of the bottom interconnection scheme 951 of the circuit substrate 960 of its top chip package 992, (6) one of the rerouted metal pads 954 of the circuit substrate 960 of its top chip package 992, (7) one of the solder balls 546 of its top chip package 992, (8) one of the top metal pads 989 of its circuit substrate 991, (9) one of the transmission metal lines 907*b* of one of the vertical-through-via (VTV) connectors 467 of its circuit substrate 991 in case for the first type of vertical-through-via (VTV) connector 467 as seen in FIGS. 4A-4I and 5A-5C, or one of the transmission metal lines 907*b* of one of the pad-enlarged vertical-through-via (VTV) connectors 469 of its circuit substrate 991 in case for the first type of pad-enlarged vertical-through-via (VTV) connector 469 as seen in FIGS. 4J-4P and 5D-5E, (10) one of the bottom metal pads 990 of its circuit substrate 991, (11) one of the solder balls 546 of its bottom chip package 993, (12) one of the rerouted metal pads 949 of the circuit substrate 960 of its bottom chip package 993, (13) vertical stacked vias each provided by one of the interconnection metal layers 947 of the top interconnection scheme 946 of the circuit substrate 960 of its bottom chip package 993, (14) one of the transmission metal lines 907*b* of one of the vertical-through-via (VTV) connectors 467 of the circuit substrate 960 of its bottom chip package 993 in case for the first type of vertical-through-via (VTV) connector 467 as seen in FIGS. 4A-4I and 5A-5C, or one of the transmission metal lines 907*b* of one of the pad-enlarged vertical-through-via (VTV) connectors 469 of the circuit substrate 960 of its bottom chip package 993 in case for the first type of pad-enlarged vertical-through-via (VTV) connector 469 as seen in FIGS. 4J-4P and 5D-5E, (15) vertical stacked vias each provided by one of the interconnection metal layers 952 of the bottom interconnection scheme 951 of the circuit substrate 960 of its bottom chip package 993, (16) one of the rerouted metal pads 954 of the circuit substrate 960 of its bottom chip package 993, and (17) one of the micro-bumps or micro-pads 34 of the application specific integrated-circuit (ASIC) chip 398-3 of its bottom chip package 993, or one of the micro-bumps or micro-pads 34 of the sub-system module 190-3 of its bottom chip package 993 in case of replacing the application specific integrated-circuit (ASIC) chip 398-3 of its bottom chip package 993, all of which are vertically aligned in a line and coupled to one another.

In particular, referring to FIGS. 27K and 27L, the chip assembly 519 may further provide a second vertical path to deliver a voltage (Vcc or Vss) of power supply or ground reference from the application specific integrated-circuit (ASIC) chip 398-1 of its top chip package 992, or one of the micro-bumps or micro-pads 34 of the sub-system module 190-1 of its top chip package 992 in case of replacing the application specific integrated-circuit (ASIC) chip 398-1 of its top chip package 992, to the application specific integrated-circuit (ASIC) chip 398-3 of its bottom chip package 993, or one of the micro-bumps or micro-pads 34 of the sub-system module 190-3 of its bottom chip package 993 in case of replacing the application specific integrated-circuit (ASIC) chip 398-3 of its bottom chip package 993, wherein the second vertical path may be composed of, from top to bottom, (1) one of the micro bumps or micro-pads 34 of the application specific integrated-circuit (ASIC) chip 398-1 of its top chip package 992, or one of the micro-bumps or micro-pads 34 of the sub-system module 190-1 of its top chip package 992 in case of replacing the application specific integrated-circuit (ASIC) chip 398-1 of its top chip package 992, (2) one of the rerouted metal pads 949 of the circuit substrate 960 of its top chip package 992, (3) vertical stacked vias each provided by one of the interconnection metal layers 947 of the top interconnection scheme 946 of the circuit substrate 960 of its top chip package 992, (4) one of the power or ground metal lines 907*a* and 907*c* of the same one or another of the vertical-through-via (VTV) connectors 467 of the circuit substrate 960 of its top chip package 992 in case for the first type of vertical-through-via (VTV) connector 467 as seen in FIGS. 4A-4I and 5A-5C, or one of the power or ground metal lines 907*a* and 907*c* of the same one or another of the pad-enlarged vertical-through-via (VTV) connectors 469 of the circuit substrate 960 of its top chip package 992 in case for the first type of pad-enlarged vertical-through-via (VTV) connector 469 as seen in FIGS. 4J-4P and 5D-5E, (5) vertical stacked vias each provided by one of the interconnection metal layers 952 of the bottom interconnection scheme 951 of the circuit substrate 960 of its top chip package 992, (6) one of the rerouted metal pads 954 of the circuit substrate 960 of its top chip package 992, (7) one of the solder balls 546 of its top chip package 992, (8) one of the top metal pads 989 of its circuit substrate 991, (9) one of the power or ground metal lines 907*a* and 907*c* of the same one or another of the vertical-through-via (VTV) connectors 467 of its circuit substrate 991 in case for the first type of vertical-through-via (VTV) connector 467 as seen in FIGS. 4A-4I and 5A-5C, or one of the power or ground metal lines 907*a* and 907*c* of the same one or another of the pad-enlarged vertical-through-via (VTV) connectors 469 of its circuit substrate 991 in case for the first type of pad-enlarged vertical-through-via (VTV) connector 469 as seen in FIGS. 4J-4P and 5D-5E, (10) one of the bottom metal pads 990 of its circuit substrate 991, (11) one of the solder balls 546 of its bottom chip package 993, (12) one of the rerouted metal pads 949 of the circuit substrate 960 of its bottom chip package 993, (13) vertical stacked vias each provided by one of the interconnection metal layers 947 of the top interconnection scheme 946 of the circuit substrate 960 of its bottom chip package 993, (14) one of the power or ground metal lines 907*a* and 907*c* of the same one or another of the vertical-through-via (VTV) connectors 467 of the circuit substrate 960 of its bottom chip package 993 in case for the first type of vertical-through-via (VTV) connector 467 as seen in FIGS. 4A-4I and 5A-5C, or one of the power or ground metal lines 907*a* and 907*c* of the same one or another of the pad-enlarged vertical-through-via (VTV) connectors 469 of the circuit substrate 960 of its bottom chip package 993 in case for the first type of pad-enlarged vertical-through-via (VTV) connector 469 as seen in FIGS. 4J-4P and 5D-5E, (15) vertical stacked vias each provided by one of the interconnection metal layers 952 of the bottom interconnection scheme 951 of the circuit substrate 960 of its bottom chip package 993, (16) one of the rerouted metal pads 954 of the circuit substrate 960 of its bottom chip package 993, and (17) one of the micro-bumps or micro-pads 34 of the application specific integrated-circuit (ASIC) chip 398-3 of its bottom chip package 993, or one of the micro bumps or micro-pads 34 of the sub-system module 190-3 of its bottom chip package 993 in case of replacing the application specific integrated-circuit (ASIC) chip 398-3 of its bottom chip package 993, all of which are vertically aligned in a line and coupled to one another.

Referring to FIGS. 27K and 27L, for the chip assembly 519, each of the application specific integrated-circuit (ASIC) chips 398-1, 398-2 and 398-3 of each of its top and bottom chip packages 992 and 993 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, digital-signal-processing (DSP) integrated-circuit (IC) chip or radio-frequency (RF) integrated-circuit (IC) chip, for example. The known-good memory or application-specific-integrated-circuit (ASIC) chip 397 of each of its top and bottom chip packages 992 and 993 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, power-management integrated-circuit (IC) chip or analog integrated-circuit (IC) chip. For an application for the chip assembly 519, the application specific integrated-circuit (ASIC) chip 398-1 of its top chip package 992 may be a radio-frequency (RF) integrated-circuit (IC) chip to transmit or receive signals in a high frequency greater than 10, 20, 30, or 50 GHz to or from the application specific integrated-circuit (ASIC) chip 398-3, e.g., digital-signal-processing (DSP) integrated-circuit (IC) chip, of its bottom chip package 993 through its first vertical path.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A connector comprising:

a first substrate having a top surface, a bottom surface opposite to the top surface of the first substrate and a side surface joining an edge of the top surface of the first substrate and joining an edge of the bottom surface of the first substrate;

a second substrate having a top surface, a bottom surface opposite to the top surface of the second substrate and a side surface joining an edge of the top surface of the second substrate and joining an edge of the bottom surface of the second substrate, wherein the side surface of the second substrate faces the side surface of the first substrate, wherein the top surfaces of the first and second substrates are coplanar with each other at a top of the connector and the bottom surfaces of the first and second substrates are coplanar with each other at a bottom of the connector; and a plurality of metal traces between, in a horizontal direction, the side surfaces of the first and second substrates, wherein the plurality of metal traces are on a same plane perpendicular to the horizontal direction, wherein each of the plurality of metal traces has a top end at the top of the connector and a bottom end at the bottom of the connector, wherein each of the plurality of metal traces comprises a copper layer between the side surfaces of the first and second substrates and an adhesion metal layer at a side of the copper layer and between the copper layer and the side surface of the first substrate.

2. The connector of claim 1, wherein a vertical distance between the top and bottom surfaces of the first substrate is between 20 and 500 micrometers.

3. The connector of claim 1, wherein the copper layer of each of the plurality of metal traces has a thickness between 3 and 50 micrometers in the horizontal direction.

4. The connector of claim 1, wherein a space between neighboring two of the plurality of metal traces is between 3 and 60 micrometers.

5. The connector of claim 1, wherein the first substrate comprises between 60 and 95 percent by weight of silicon dioxide.

6. The connector of claim 1, wherein each of the first and second substrates is a glass substrate.

7. The connector of claim 1 further comprising a first and a second metal layer between, in the horizontal direction, the side surfaces of the first and second substrates and coupling to each other, wherein the plurality of metal traces are between, in the horizontal direction, the first and second metal layers.

8. The connector of claim 1, wherein the plurality of metal traces are provided by a metal layer of the connector between, in the horizontal direction, the side surfaces of the first and second substrates.

9. The connector of claim 1, wherein the plurality of metal traces comprises two ground traces and a signal trace on the same plane, wherein the signal trace is between the two ground traces.

10. The connector of claim 1 further comprising a polymer layer between, in the horizontal direction, the side surfaces of the first and second substrates and between, in the horizontal direction, each of the plurality of metal traces and the side surface of the second substrate.

11. The connector of claim 10, wherein the polymer layer comprises polyimide.

12. The connector of claim 1 further comprising a silicon-oxide-containing layer between, in the horizontal direction, the side surfaces of the first and second substrates, wherein the silicon-oxide-containing layer is in a gap between each neighboring two of the plurality of metal traces.

13. The connector of claim 12, wherein the silicon-oxide-containing layer comprises between 60 and 95 percent by weight of silicon dioxide.

14. The connector of claim 1, wherein each of the plurality of metal traces extends, from its top end to its bottom end, in a straight line.

15. The connector of claim 1, wherein the adhesion metal layer comprises titanium.

16. A connector comprising:

a first substrate having a top surface, a bottom surface opposite to the top surface of the first substrate and a side surface joining an edge of the top surface of the first substrate and joining an edge of the bottom surface of the first substrate;

a second substrate having a top surface, a bottom surface opposite to the top surface of the second substrate and a side surface joining an edge of the top surface of the second substrate and joining an edge of the bottom surface of the second substrate, wherein the side surface of the second substrate faces the side surface of the first substrate, wherein the top surfaces of the first and second substrates are coplanar with each other and the bottom surfaces of the first and second substrates are coplanar with each other;

a first metal layer between, in a horizontal direction, the side surfaces of the first and second substrates, wherein the first metal layer comprises a first, a second and a third metal trace on a same plane perpendicular to the horizontal direction, wherein the third metal trace is between the first and second metal traces, wherein the third metal trace is a signal trace and each of the first and second metal traces is a ground trace;

a first polymer layer comprising a first portion and a second portion opposite, in the first horizontal direction, to the first portion of the first polymer layer, wherein the first and second substrates are between, in the horizontal direction, the first and second portions of the first polymer layer, wherein the first polymer layer has a top surface substantially coplanar with the top surfaces of the first and second substrates and a bottom surface substantially coplanar with the bottom surfaces of the first and second substrates; and a second metal layer on a top end of the first metal layer and over the top surfaces of the first and second substrates.

17. The connector of claim 16, wherein a vertical distance between the top and bottom surfaces of the first substrate is between 20 and 500 micrometers.

18. The connector of claim 16, wherein the first metal layer comprises a copper layer having a thickness between 3 and 50 micrometers in the horizontal direction.

19. The connector of claim 16, wherein each of the first and second substrates is a glass substrate.

20. The connector of claim 16, wherein the first polymer layer comprises a molding compound.

21. The connector of claim 16 further comprising a third and a fourth metal layer between, in the horizontal direction, the side surfaces of the first and second substrates and coupling to each other, wherein the first metal layer is between, in the horizontal direction, the third and fourth metal layers.

22. The connector of claim 16 further comprising a second polymer layer over the second metal layer, the top surfaces of the first and second substrates and the top surface of the first polymer layer, wherein an opening in the second polymer layer is over the second metal layer.

23. The connector of claim 22 further comprising a metal contact at a top of the connector and coupling to the top end of the first metal layer through the second metal layer, wherein the metal contact couples to the second metal layer through the opening.

24. The connector of claim 23, wherein the metal contact comprises a tin-containing bump.

25. The connector of claim 16 further comprising a third metal layer on a bottom end of the first metal layer and under the bottom surfaces of the first and second substrates, wherein the third metal layer couples to the second metal layer through the first metal layer.

26. The connector of claim 16, wherein the first metal layer comprises a copper layer between the side surfaces of the first and second substrates and an adhesion metal layer at a side of the copper layer and between the copper layer and the side surface of the first substrate.

27. The connector of claim 26, wherein the adhesion metal layer comprises titanium.

* * * * *